United States Patent
Oda et al.

(10) Patent No.: US 9,111,803 B2
(45) Date of Patent: Aug. 18, 2015

(54) THIN-FILM DEVICE, THIN-FILM DEVICE ARRAY, AND METHOD OF MANUFACTURING THIN-FILM DEVICE

(71) Applicant: JOLED INC., Tokyo (JP)

(72) Inventors: Tomohiko Oda, Osaka (JP); Takahiro Kawashima, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/346,989

(22) PCT Filed: Sep. 26, 2012

(86) PCT No.: PCT/JP2012/006145
§ 371 (c)(1),
(2) Date: Mar. 25, 2014

(87) PCT Pub. No.: WO2013/051221
PCT Pub. Date: Apr. 11, 2013

(65) Prior Publication Data
US 2014/0231813 A1    Aug. 21, 2014

(30) Foreign Application Priority Data

Oct. 3, 2011  (JP) ................................. 2011-219580
Oct. 3, 2011  (JP) ................................. 2011-219581
Oct. 3, 2011  (JP) ................................. 2011-219582
Oct. 3, 2011  (JP) ................................. 2011-219583
Jan. 24, 2012  (JP) ................................. 2012-011657
Jan. 24, 2012  (JP) ................................. 2012-011822

(51) Int. Cl.
*H01L 27/105*  (2006.01)
*H01L 27/12*  (2006.01)
(Continued)

(52) U.S. Cl.
CPC ...... *H01L 27/1222* (2013.01); *H01L 21/02532* (2013.01); *H01L 21/02595* (2013.01);
(Continued)

(58) Field of Classification Search
CPC ............ H01L 27/1222; H01L 27/1274; H01L 27/1281; H01L 27/1285; H01L 27/1229
USPC ............................................ 257/66; 438/487
See application file for complete search history.

(56) References Cited

U.S. PATENT DOCUMENTS 5,529,951 A  6/1996 Noguchi et al.
5,869,803 A  2/1999 Noguchi et al.
(Continued)

FOREIGN PATENT DOCUMENTS

JP  07-235490  9/1995
JP  08-340118  12/1996
(Continued)

OTHER PUBLICATIONS

International Search Report, mailed Dec. 25, 2012, in corresponding International Application No. PCT/JP2012/006145.

*Primary Examiner* — Allan R Wilson
(74) *Attorney, Agent, or Firm* — Greenblum & Bernstein, P.L.C.

(57) ABSTRACT

A thin-film device includes: a first device unit having a first gate electrode and a first crystalline silicon thin film located opposite to the first gate electrode; and a second device unit having a second gate electrode and a second crystalline silicon thin film located opposite to the second gate electrode. The first crystalline silicon thin film includes a strip-shaped first area and a second area smaller than the strip-shaped first area in average grain size. The first device unit has, as a channel, at least a part of the strip-shaped first area. The second silicon thin film includes a second crystalline area smaller than the strip-shaped first area in average grain size. The second device unit has the second crystalline area as a channel. The strip-shaped first area includes crystal grains in contact with the second area on each side of the strip-shaped first area.

17 Claims, 56 Drawing Sheets

(51) Int. Cl.
  *H01L 21/02* (2006.01)
  *H01L 21/324* (2006.01)
  *H01L 21/268* (2006.01)

(52) U.S. Cl.
  CPC .... *H01L21/02612* (2013.01); *H01L 21/02683* (2013.01); *H01L 21/02691* (2013.01); *H01L 21/268* (2013.01); *H01L 21/324* (2013.01); *H01L 27/1229* (2013.01); *H01L 27/1274* (2013.01); *H01L 27/1281* (2013.01); *H01L 27/1285* (2013.01); *H01L 27/1296* (2013.01)

(56) References Cited

U.S. PATENT DOCUMENTS

| | | | |
|---|---|---|---|
| 6,020,224 A | 2/2000 | Shimogaichi et al. | |
| 6,071,765 A | 6/2000 | Noguchi et al. | |
| 6,756,614 B2 | 6/2004 | Hatano et al. | |
| 7,078,322 B2 | 7/2006 | Tanada et al. | |
| 7,115,454 B2 | 10/2006 | Hatano et al. | |
| 7,172,932 B2 | 2/2007 | Hatano et al. | |
| 7,517,773 B2 | 4/2009 | Tanada et al. | |
| 7,556,993 B2 | 7/2009 | Hatano et al. | |
| 7,859,016 B2 | 12/2010 | Hatano et al. | |
| 8,362,478 B2* | 1/2013 | Yamazaki et al. | 257/43 |
| 8,735,233 B2* | 5/2014 | Oda et al. | 438/158 |
| 2002/0119609 A1 | 8/2002 | Hatano et al. | |
| 2003/0166315 A1 | 9/2003 | Tanada et al. | |
| 2004/0063337 A1 | 4/2004 | Hatano et al. | |
| 2004/0224453 A1 | 11/2004 | Hatano et al. | |
| 2007/0015318 A1 | 1/2007 | Tanada et al. | |
| 2007/0105263 A1 | 5/2007 | Hatano et al. | |
| 2007/0290200 A1* | 12/2007 | Asano | 257/40 |
| 2008/0050893 A1* | 2/2008 | Shimmoto et al. | 438/487 |
| 2008/0171409 A1* | 7/2008 | Cheng et al. | 438/160 |
| 2008/0173871 A1 | 7/2008 | Noda et al. | |
| 2009/0269892 A1 | 10/2009 | Hatano et al. | |
| 2010/0258808 A1* | 10/2010 | Cheng et al. | 257/66 |
| 2010/0264412 A1* | 10/2010 | Yamazaki et al. | 257/43 |
| 2011/0133195 A1* | 6/2011 | Park et al. | 257/59 |
| 2011/0157113 A1* | 6/2011 | Miyamoto et al. | 345/205 |
| 2014/0167049 A1* | 6/2014 | Oda et al. | 257/57 |

FOREIGN PATENT DOCUMENTS

| | | |
|---|---|---|
| JP | 09-266316 | 10/1997 |
| JP | 10-229202 | 8/1998 |
| JP | 11-017191 | 1/1999 |
| JP | 11-214306 | 8/1999 |
| JP | 2002-222959 | 8/2002 |
| JP | 2003-229359 | 8/2003 |
| JP | 2005-072461 | 3/2005 |
| JP | 2007-115841 | 5/2007 |
| JP | 2008-016717 | 1/2008 |
| JP | 2008-124266 | 5/2008 |
| WO | 2010/038511 | 4/2010 |

\* cited by examiner (a)

(b)

(c)

(d)

20 μm

20 μm

|  | Strip-shaped areas are formed (Driver transistor) | No strip-shaped area is formed (Switching transistor) |
| --- | --- | --- |
| Ion (A) | $7.01 \times 10^{-4}$ | $2.14 \times 10^{-4}$ |
| Ioff (A) | $6.77 \times 10^{-11}$ | $4.21 \times 10^{-11}$ |

(a)

(b)

(c)

(d)

(e)

FIG. 37
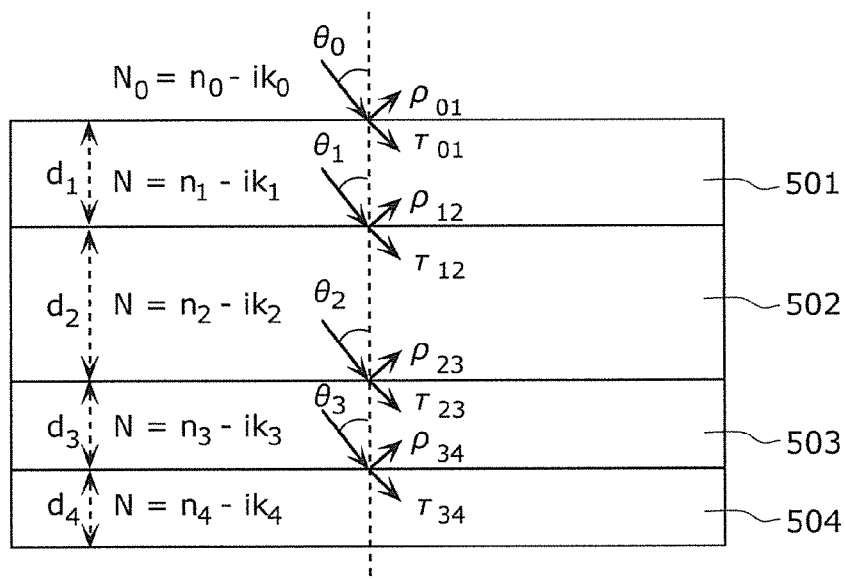
FIG. 38A
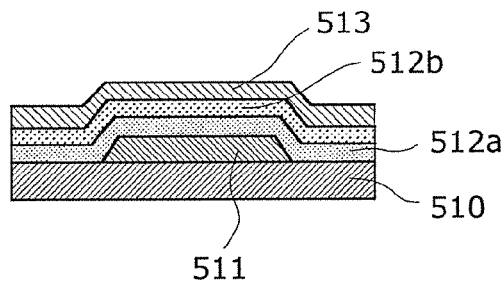
FIG. 38B
|  | Light absorptivity (%) of first layer (a-Si film) | Thickness (nm) of first layer (a-Si film) | Thickness (nm) of second layer (SiO film) | Thickness (nm) of third layer (SiN film) | Thickness (nm) of fourth layer (Mow film) |
|---|---|---|---|---|---|
| Condition 1 | 44.9 | 60 | 80 | 70 | 50 |
| Condition 2 | 59.0 | 60 | 90 | 70 | 50 |
| Condition 3 | 63.1 | 60 | 95 | 80 | 50 |
| Condition 4 | 70.1 | 60 | 90 | 95 | 50 |

(Scanning speed: 700 mm/s)

|  |  | Refractive index (n) | Extinction coefficient (k) |
|---|---|---|---|
| Amorphous semiconductor thin film | a-Si | 4.979 | 0.688 |
| Gate insulating film | SiO | 1.46 | - |
|  | SiN | 1.9 | - |
| Gate electrode | Al | 0.867 | 6.42 |
|  | Cu | 1.04 | 2.59 |
|  | Mo | 3.79 | 3.3 |

(Dr.-TFT)

(Sw.-TFT)

FIG. 51A
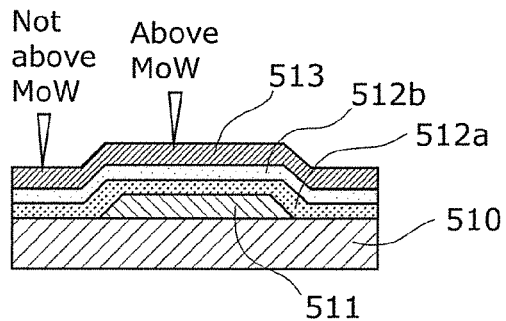
FIG. 51B
| | | No. 1 | No. 2 | No. 3 | No. 4 | No. 5 | No. 6 | No. 7 |
|---|---|---|---|---|---|---|---|---|
| Film thickness [μm] (Actual measured value) | a-Si (413) | 58.3 | 57.9 | 58.0 | 57.7 | 60.9 | 58.0 | 57.9 |
| | SiO (412b) | 72.2 | 81.4 | 74.0 | 93.6 | 93.4 | 96.1 | 89.8 |
| | SiN (412a) | 70.3 | 72.1 | 80.5 | 72.5 | 71.8 | 80.6 | 94.1 |
| Light absorptivity of a-Si film [%] | Above MoW | 36.2 | 44.9 | 50.4 | 55.3 | 55.7 | 64.9 | 70.1 |
| | Not above MoW | 57.9 | 58.4 | 58.1 | 57.6 | 52.5 | 55.8 | 54.7 |
| | Not above MoW - above MoW | 21.7 | 13.5 | 7.7 | 2.3 | -3.2 | -9.1 | -15.4 |
FIG. 51C
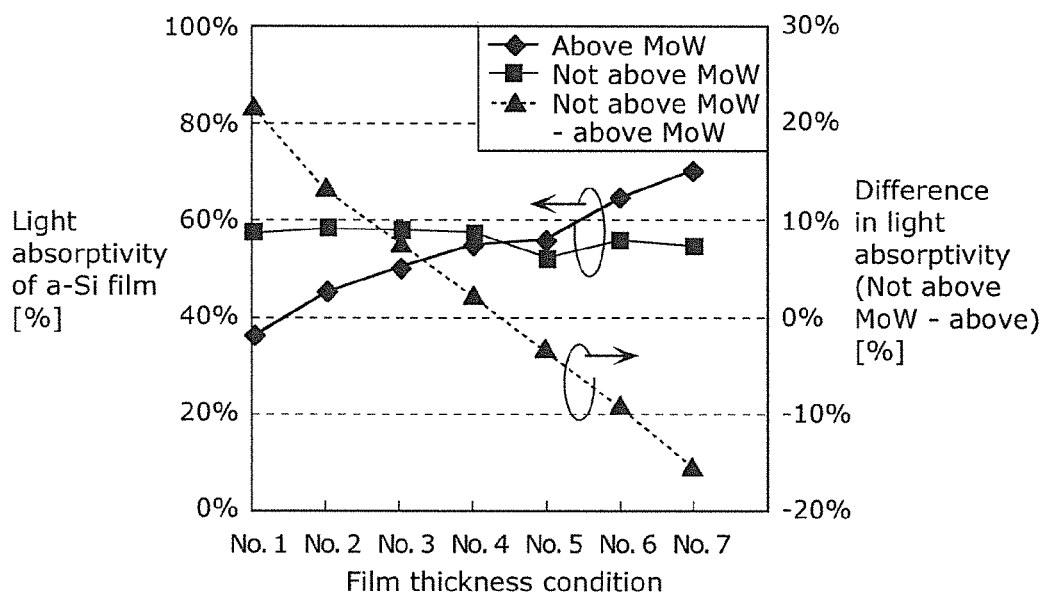

d = +15 μm

First areas are formed (at regular pitches)

d = +10 μm

First areas are formed (at regular pitches)

d = +5 μm

First area is not formed.

d = −5 μm

First area is not formed.

THIN-FILM DEVICE, THIN-FILM DEVICE ARRAY, AND METHOD OF MANUFACTURING THIN-FILM DEVICE

TECHNICAL FIELD

The present invention relates to a thin-film device, a thin-film device array, and a method of manufacturing a thin-film device.

BACKGROUND ART

Active-matrix-driven organic electro luminescence (or organic light-emitting diode (OLED)) display devices and active-matrix-driven liquid-crystal display devices include thin-film semiconductor devices referred to as thin film transistors (TFTs).

A display device of this type includes a TFT array device having TFTs arranged in an array. For each pixel, a TFT for driving the pixel (a driver transistor) and a TFT for selecting the pixel (a switching transistor) are formed.

Among transistors in a self-emitting OLED display device including an OLED device, the driver transistor and the switching transistor are required to be different from each other in performance capabilities. More specifically, the driver transistor is required to have excellent ON-state current characteristics to increase the drive performance of the OLED device whereas the switching transistor is required to have excellent OFF-state current characteristics.

The TFT includes a gate electrode, a semiconductor layer (a channel layer), a source electrode, and a drain electrode which are formed on a substrate. In general, a silicon thin film is used as the channel layer. Here, silicon thin films are roughly classified into a group of silicon thin films that are non-crystalline (amorphous silicon films) and a group of silicon thin films that have crystallinity (crystalline silicon thin films).

A TFT including a crystalline silicon thin film as a channel layer is higher in carrier mobility and more excellent in ON-state current characteristics, as compared with a TFT including an amorphous silicon thin film as a channel layer. Thus, a crystalline silicon thin film is known to be used as a channel layer of a driver transistor.

One of the conventional methods for forming a crystalline silicon thin film is to add a metal catalyst to an amorphous silicon film formed on a substrate to polycrystallize the amorphous silicon film by the application of heat. This method has the advantage of achieving crystallization at low temperature, but has the disadvantage of increasing the cost due to an increase in the number of processes and also has a difficulty in complete removal of metal elements after crystallization.

Moreover, another one of the conventional methods for forming a crystalline silicon thin film is to form a crystalline silicon thin film on a substrate by chemical vapor deposition (CVD). With this method, although the cost can be reduced because of a decrease in the number of processes, it is difficult to satisfy the aforementioned ON-state current characteristics required for the driver transistor since the resulting grain structure is a microlite structure.

Furthermore, another one of the conventional methods for forming a crystalline silicon thin film is to polycrystallize an amorphous silicon thin film by irradiating the amorphous silicon film with a beam of an excimer laser having a predetermined energy density at a predetermined film-formation temperature (Patent Literature (PTL) 1). With this method, however, the beam obtained as a result of the gas discharge in the vapor state is shaped. For this reason, the frequency with which the device needs an overhaul is high, and the running cost is accordingly high.

In addition, as an example of a method for crystallizing amorphous silicon using a laser, an amorphous silicon thin film is irradiated with a pulsed laser having a wavelength of 532 nm, to form a polycrystalline silicon thin film (PTL 2).

CITATION LIST

Patent Literature

[PTL 1]
Japanese Unexamined Patent Application Publication No. 7-235490
[PTL 2]
Japanese Unexamined Patent Application Publication No. 2008-016717

SUMMARY OF INVENTION

Technical Problem

It may be required in some cases to more characteristically form, for a single device, crystalline semiconductor thin films different in characteristics using a simple method. However, it is difficult to form, in the same process, two device units which are different in device characteristics without further increasing input energy.

The present invention is conceived in view of the stated problems and has an object to provide a thin-film device including two device units which are different in device characteristics, a thin-film device array, and a method of manufacturing a thin-film device.

Solution to Problem

In order to achieve the aforementioned object, a thin-film device according to an aspect of the present invention is a thin-film device including: a substrate; and a first device unit and a second device unit which are located above the substrate, the first device unit including: a first gate electrode formed above the substrate; a first gate insulating film covering the first gate electrode; and a first thin film located opposite to the first gate electrode with the first gate insulating film in between, and the second device unit including: a second gate electrode located at a position different from a position where the first gate electrode is formed; a second gate insulating film covering the second gate electrode; and a second thin film located opposite to the second gate electrode with the second gate insulating film in between, wherein the first thin film includes a strip-shaped first area and a second area located on each widthwise side of the strip-shaped first area, the second area including crystal grains having an average grain size smaller than an average grain size of crystal grains included in the strip-shaped first area, the first device unit has a channel which is at least a part of the strip-shaped first area of the first thin film, the second thin film includes a third area including crystal grains having an average grain size smaller than the average grain size in the strip-shaped first area, the second device unit has a channel which is the third area, and the strip-shaped first area includes crystal grains which are in contact with the second area on the each side of the strip-shaped first area.

Advantageous Effects of Invention

The present invention can implement a thin-film device including a first device unit and a second device unit which are different in device characteristics.

BRIEF DESCRIPTION OF DRAWINGS

FIG. 37 is a diagram explaining a method of calculating amplitude reflectance and amplitude transmittance.

FIG. 38A is a cross-sectional view of a model structure of a thin-film semiconductor device according to Embodiment 3 of the present invention.

FIG. 38B is a diagram showing the light absorptivities of the amorphous silicon films, under four conditions, included in the thin-film semiconductor device shown in FIG. 38A.

FIG. 51A is a cross-sectional view of a model structure of a thin-film device according to Embodiment 5 of the present invention.

FIG. 51B is a diagram showing the light absorptivities of the amorphous silicon films having seven film-thickness conditions in the case of the model structure shown in FIG. 51A.

FIG. 51C is a diagram that is obtained by graphing the result shown in FIG. 51B and shows the light absorptivities or light absorptivity difference between the amorphous silicon films under the seven film-thickness conditions.

DESCRIPTION OF EMBODIMENTS

Figure 1:
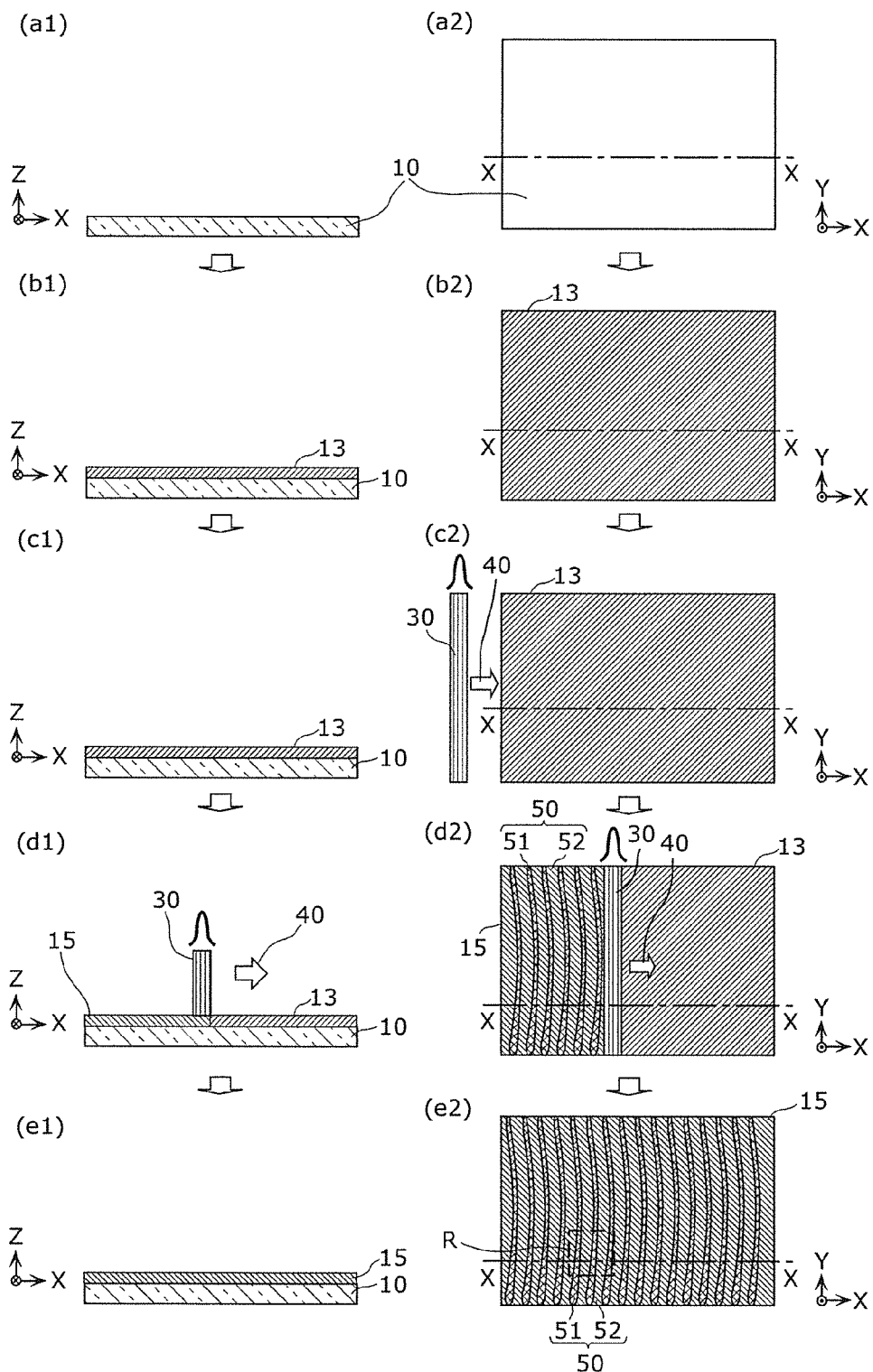
FIG. 1 (a1)-(e2) shows cross-sectional views schematically showing steps of a method of forming a crystalline thin film according to Embodiment 1 of the present invention.

Underlying Knowledge Forming Basis of the Present Invention

In recent years, with an increasing demand for higher-definition displays driven at higher speed, further enhancement of the ON-state current characteristics of TFTs is required. One way of enhancing the ON-state current characteristics of a TFT is to increase the grain size of a crystalline semiconductor thin film serving as a channel layer. For example, in the case where an amorphous silicon film is crystallized by laser irradiation to form a crystalline silicon thin film, the crystalline silicon thin film can have the lager grain size when the maximum intensity of the laser light for crystallization is increased. However, simply increasing the maximum intensity of the laser light leads to a corresponding increase in the output energy of the laser light. This results in problems that the input energy needs to be increased and that high-power laser equipment is thus required.

Moreover, it may be required in some cases to form, for a single device, crystalline semiconductor thin films that are different in characteristics. For example, a single device may be required to include a TFT excellent in ON-state current characteristics and a TFT excellent in OFF-state current characteristics.

As described, in order to enhance the ON-state current characteristics, it is desirable for the grain size in a crystalline semiconductor thin film serving as a channel layer to be larger. On the other hand, in order to enhance the OFF-state current characteristics, it is desirable for the grain size in a crystalline semiconductor thin film serving as a channel layer to be smaller. On this account, it is difficult to form, in a single device, a thin film device excellent in ON-state current characteristics and a thin film device excellent in OFF-state current characteristics in the single and same process.

Furthermore, in the case of an OLED display device, a driver transistor and a switching transistor are different in the required characteristics as described above. Therefore, it is preferable that crystalline semiconductor thin films different in grain structure be formed in a single pixel and thus that the pixel has two TFTs different in characteristics. Here, suppose that the output state of the laser light is changed for each of the driver transistor and the switching transistor to crystallize an amorphous semiconductor thin film. This case result in problems that variation in characteristics is caused to the transistors between the pixels, that the in-plane uniformity of the grain structure is reduced, and that the laser equipment increases in complexity. Moreover, such applications of the laser irradiation at different timings cause a problem of reduced throughput.

Similarly, for example, in the case of a display device including low temperature poly silicon (LTPS), such as a liquid crystal display device, a TFT provided in a peripheral circuit area and a TFT provided in a pixel area are different in the required characteristics as described above. Therefore, it is preferable that crystalline semiconductor thin films different in grain structure be formed in a single pixel and thus that the pixel has two TFTs different in characteristics. Here, suppose that the output state of the laser light is changed for each of the TFT provided in the peripheral circuit area and the TFT provided in the pixel area to crystallize an amorphous semiconductor thin film. This case result in problems that variation in characteristics is caused to the transistors between the peripheral circuit area and the pixel area, that the in-plane uniformity of the grain structure is reduced, and that the laser equipment increases in complexity. Moreover, such applications of the laser irradiation at different timings cause a problem of reduced throughput.

The present invention is conceived on the basis of the stated knowledge, and has an object to provide, by forming a crystalline thin film including areas different in crystalline state without further increasing an input energy, a thin-film device including two device units which are different in device characteristics and a method of manufacturing a thin-film device.

In order to achieve the aforementioned object, a thin-film device according to an aspect of the present invention is a thin-film device including: a substrate; and a first device unit and a second device unit which are located above the substrate, the first device unit including: a first gate electrode formed above the substrate; a first gate insulating film covering the first gate electrode; and a first thin film located opposite to the first gate electrode with the first gate insulating film in between, and the second device unit including: a second gate electrode located at a position different from a position where the first gate electrode is formed; a second gate insulating film covering the second gate electrode; and a second thin film located opposite to the second gate electrode with the second gate insulating film in between, wherein the first thin film includes a strip-shaped first area and a second area located on each widthwise side of the strip-shaped first area, the second area including crystal grains having an average grain size smaller than an average grain size of crystal grains included in the strip-shaped first area, the first device unit has a channel which is at least a part of the strip-shaped first area of the first thin film, the second thin film includes a third area including crystal grains having an average grain size smaller than the average grain size in the strip-shaped first area, the second device unit has a channel which is the third area, and the strip-shaped first area includes crystal grains which are in contact with the second area on the each side of the strip-shaped first area.

In this aspect, the first thin film of the first device unit includes the strip-shaped first area and the second area that is smaller than the strip-shaped first area in average grain size. The second thin film of the second device unit includes the third area smaller than the strip-shaped first area in average grain size. Thus, the thin-film device including the first device unit and the second device unit different in the device characteristics can be easily implemented.

Moreover, in this aspect, the strip-shaped first area includes the crystal grains which are in contact with the second area on each side of the strip-shaped first area. To be more specific, the strip-shaped first area includes the crystal grains each of which stretches from one end of the strip-shaped first area to the other end in a short-side direction (or a width direction). Hence, as the first device unit, a TFT that is excellent in ON-state current characteristics and in uniformity with less variation in charge carrier mobility can be implemented.

Furthermore, in the thin-film device according to the present invention, the crystal grains included in the strip-shaped first area and in contact with the second area on the each side of the strip-shaped first area may account for at least 80% of the strip-shaped first area in a longitudinal direction.

With this, as the first device unit, a TFT that is excellent in ON-state current characteristics and in uniformity with less variation in charge carrier mobility can be implemented.

Moreover, in the thin-film device according to the present invention, each of the first thin film and the second thin film may be crystallized by predetermined light having a wavelength of 405 nm to 632 nm, inclusive, and the first thin film before crystallization may have a higher light absorptivity with respect to the predetermined light than the second thin film before crystallization.

In this aspect, the first thin film with respect to the predetermined light before being crystallized is higher in light absorptivity than the second thin film with respect to the predetermined light before being crystallized. Thus, the first thin film crystallized by the predetermined light includes the crystallized area different in crystalline structure from the crystallized area included in the second thin film crystallized by the predetermined light. Hence, the thin-film device including the first device unit and the second device unit different in device characteristics can be implemented.

Furthermore, in the thin-film device according to the present invention, when the channel of the first device unit has a channel direction crossing a first direction, the second gate electrode may be longer than the first gate electrode in the first direction.

In this aspect, the first gate electrode and the second gate electrode are different in length. This can produce a difference between an effect on the amorphous silicon thin film by the laser light around above the first gate electrode and an effect on the amorphous silicon thin film by the laser light around above the second gate electrode. Therefore, by crystallizing the amorphous thin film by the laser light to form a crystalline thin film, crystallized areas different in grain structure can be generated. Hence, the thin-film device including the first device unit and the second device unit different in device characteristics can be implemented.

Moreover, in the thin-film device according to the present invention, the average grain size in the third area of the second thin film may be smaller than or equal to the average grain size in the second area of the first thin film.

In this aspect, as compared with the second device unit, the charge carrier mobility of the channel in the first device unit is higher. Thus, the TFT excellent in ON-state current characteristics can be obtained.

Furthermore, in the thin-film device in the present invention, the first gate insulating film and the second gate insulating film may be continuous with each other.

In this aspect, the first gate insulating film of the first device unit and the second gate insulating film of the second device unit can be formed into one common gate insulating film.

Moreover, in the thin-film device according to the present invention, the strip-shaped first area of the first device unit may be continuous within a length of the channel.

In this aspect, the charge carrier mobility in the first thin film can be made higher. This can enhance the ON-state current characteristics of the first device unit.

Furthermore, in the thin-film device according to the present invention, the second thin film may not include the strip-shaped first area.

In this aspect, as compared with the second device unit, the charge carrier mobility of the channel in the first device unit is higher. Thus, the TFT excellent in ON-state current characteristics can be obtained.

Moreover, in the thin-film device according to the present invention, the channel of the first device unit may have a channel direction substantially parallel to the longitudinal direction of the strip-shaped first area.

In this aspect, since charge carriers pass through the first area that is larger in average grain size, the probability that the charge carriers are trapped is reduced. This can accordingly increase the charge carrier mobility.

Furthermore, in the thin-film device according to the present invention, the channel of the first device unit may have a channel direction crossing the longitudinal direction of the strip-shaped first area.

In this aspect, the probability that the charge carriers are trapped increases. This can accordingly reduce the charge carrier mobility.

Moreover, the thin-film device according to the present invention may include a plurality of the strip-shaped first areas, wherein pitches between the strip-shaped first areas may be approximately regular.

With this, the grain structure in the substrate is excellent in-plane uniformity. Therefore, a device with less variation in characteristics can be implemented.

Furthermore, in the thin-film device according to the present invention, the regular pitch between adjacent ones of the strip-shaped first areas may be 2.0 μm or shorter.

With this, the strip-shaped first areas can be formed at regular pitches in the plane of the substrate. Thus, a device excellent in in-plane uniformity can be implemented.

Moreover, in the thin-film device according to the present invention, the average grain size of the crystal grains included in the strip-shaped first area may be 100 nm to 500 nm, inclusive.

With this, the charge carrier mobility can be increased. Thus, since the TFT including the first thin film having the strip-shaped first areas is manufactured, the TFT excellent in ON-state current characteristics can be implemented.

Furthermore, in the thin-film device according to the present invention, the strip-shaped first area may have a Raman shift peak having a full width at half maximum of 4.8 $cm^{-1}$ to 5.5 $cm^{-1}$, inclusive, in a Raman scattering spectrum measured using Raman spectroscopy.

With this, the grain size can be increased in the grain structure of the strip-shaped first area. Thus, the charge carrier mobility can be further increased.

Moreover, in the thin-film device according to the present invention, the substrate may have a plurality of pixels in a matrix, the first device unit and the second device unit may be included in each of the pixels, the first device unit may be a driver transistor that drives the pixel, and the second device unit may be a switching transistor that selectively switches pixels to be driven among the pixels arranged in the matrix.

This can easily satisfy the requirement for a device (such as an OLED display device) that needs TFTs different in current characteristics in a single pixel. For example, the first device unit that is high in charge carrier mobility and excellent in ON-state current characteristics can be used as the driver transistor for driving an OLED device. Moreover, the second device unit that has a reduced carrier mobility and is more excellent in OFF-state current characteristics than the first device unit can be used as the switching transistor.

Furthermore, a thin-film device array according to an aspect of the present invention is a thin-film device array including the aforementioned thin-film device, the thin-film device array including a plurality of the thin-film devices formed above the substrate.

In this way, the thin-film device according to the present invention can be implemented as the thin-film device array.

Moreover, in the thin-film device array according to the present invention, the first thin film may be located in a peripheral area above the substrate, and the second thin film may be located in an inner area surrounded by the peripheral area above the substrate.

This aspect can easily satisfy the requirement for a device (such as an LTPS) that needs TFTs different in current characteristics between a peripheral area and an inner area of the substrate.

Furthermore, a method of manufacturing a thin-film device according to a first aspect of the present invention is a method of manufacturing a thin-film device, the method including: preparing a substrate; forming a thin film above the substrate; crystallizing a part of the thin film through relative scan of the thin film irradiated with a first light beam at a predetermined speed; and crystallizing another part of the thin film through relative scan of the thin film irradiated with a second light beam at a predetermined speed, wherein each projection of the first light beam and the second light beam on the thin film has a major axis in a direction crossing a direction of the relative scan, and the first light beam is shorter than the second light beam in width in the direction of the relative scan.

In the method of manufacturing a thin-film device, the first light beam and the second light beam different in the minor axis width are used for crystallizing the amorphous thin film. Thus, even when the first light beam and the second light beam are equal to each other in the scanning speed, the crystalline thin films different in grain structure can be easily separately formed.

Moreover, a method of manufacturing a thin-film device according to a second aspect of the present invention is a method of manufacturing a thin-film device, the method including: preparing a substrate; forming a first gate electrode above the substrate; forming a second gate electrode apart from the first gate electrode above the substrate; forming a gate insulating film above the first gate electrode and the second gate electrode; forming a thin film above the gate insulating film; crystallizing the thin film above the first gate electrode through relative scan of the thin film irradiated with a first laser beam from above the first gate electrode at a predetermined speed; and crystallizing the thin film above the second gate electrode through relative scan of the thin film irradiated with a second laser beam from above the second gate electrode at a predetermined speed, wherein each projection of the first light beam and the second light beam on the thin film has a major axis in a direction crossing a direction of the relative scan, and a light absorptivity of the thin film above the first gate electrode with respect to the first light beam is higher than a light absorptivity of the thin film above the second gate electrode with respect to the second light beam.

In the method of manufacturing a thin-film device according to the present invention, the first thin film with respect to the predetermined light before being crystallized is higher in light absorptivity than the second thin film with respect to the predetermined light before being crystallized. With this, since the thin film is irradiated through the relative scan using the predetermined light, the first thin film and the second thin film different in grain structure can be formed.

Furthermore, a method of manufacturing a thin-film device according to a third aspect of the present invention is a method of manufacturing a thin-film device, the method including: preparing a substrate; forming a first gate electrode and a second gate electrode above the substrate; forming an insulating film above the first gate electrode and the second gate electrode; and forming, above the insulting film, a first channel area above the first gate electrode and a second channel area above the second gate electrode, wherein the forming of channel areas includes forming a precursor film above the insulating film, and emitting laser light to the precursor film through relative scan of the substrate irradiated with the laser light, the laser light is emitted in the emitting under a condition that a strip-shaped first area is formed on the precursor film that is not above the first gate electrode, when the laser light is positioned above the first gate electrode in the emitting, at least one of both end portions of the first gate electrode in a first direction is located within an emission width of the laser light in the first direction, the first direction crossing a scanning direction of the laser light, when the laser light is positioned above the second gate electrode in the emitting, both end portions of the second gate electrode in the first direction are located outside the emission width of the laser light in the first direction, the precursor film above the first gate electrode is lower in absorptivity with respect to the laser light than the precursor film that is not above the first gate electrode, and the precursor film above the second gate electrode is lower in absorptivity with respect to the laser light than the precursor film that is not above the second gate electrode.

In the method of manufacturing a third thin-film device, the first thin film and the second thin film different in grain structure can be easily formed separately.

Moreover, in the method of manufacturing a thin-film device according to the first to third aspects of the present invention, the first thin film may include a strip-shaped first area and a second area located on each widthwise side of the strip-shaped first area, the second area including crystal grains having an average grain size smaller than an average grain size of crystal grains included in the strip-shaped first area, the first device unit may have a channel which is at least a part of the strip-shaped first area of the first thin film, the second thin film may include a third area including crystal grains having an average grain size smaller than the average grain size in the strip-shaped first area, the second device unit may have a channel which is the third area, and the strip-shaped first area may include crystal grains which are in contact with the second area on the each side of the strip-shaped first area.

In the method of manufacturing first to third thin-film devices, the thin-film device including the first device unit and the second device unit different in device characteristics can be easily implemented. Moreover, as the first device unit, a TFT that is excellent in ON-state current characteristics and in uniformity with less variation in charge carrier mobility can be implemented.

In the method of manufacturing a thin-film device according to the first to third aspects of the present invention, the crystal grains included in the strip-shaped first area and in contact with the second area on the each side of the strip-shaped first area may account for at least 80% of the strip-shaped first area in a longitudinal direction.

With this, as the first device unit, a TFT that is excellent in ON-state current characteristics and in uniformity with less variation in charge carrier mobility can be implemented.

In the method of manufacturing a thin-film device according to the first aspect of the present invention, the predetermined speed in the crystallizing with a first light beam may be equal to the predetermined speed in the crystallizing with a second light beam.

In this way, even when the light scanning speed in the step of crystallizing with a first light beam is equal to the light scanning speed in the step of crystallizing with a second light beam, the first thin film and the second thin film different in grain structure can be formed by setting the conditions for light irradiation as desired.

In the method of manufacturing a thin-film device according to the second aspect of the present invention, each of the first gate electrode and the second gate electrode may be formed using a different material.

In this aspect, based on the difference in light absorptivity between the materials used for the gate electrodes, the first thin film with respect to the predetermined light before being crystallized may be higher in light absorptivity than the second thin film with respect to the predetermined light before being crystallized.

In the method of manufacturing a thin-film device according to the third aspect of the present invention, when the emission width of the laser light, a width of the first gate electrode in the first direction, and a width of the second electrode in the first direction are represented by $W_L$, $W_{G1}$, and $W_{G2}$, respectively, $W_{G1} < W_L < W_{G2}$ is satisfied.

With this, the strip-shaped first areas extend from both sides of the first gate electrode. Thus, the strip-shaped first areas can be formed above the first gate electrode more reliably and more uniformly.

Moreover, in the method of manufacturing a thin-film device according to the first to third aspects of the present invention, in the emitting, the precursor film that is not located above the first gate electrode is higher in temperature reached through irradiation with the laser light than the precursor film above the first gate electrode, according to a reflectivity of the first gate electrode with respect to the laser light, an optical film thickness of the insulating film with respect to the laser light, and an absorptivity of the precursor film with respect to the laser light.

With this, the crystallized area can be formed without inconsistencies in crystallization.

Embodiments

The following is a description of embodiments according to the present invention, with reference to the drawings. Each of the embodiments described below shows a preferred specific example of the present invention. Therefore, the numerical values, shapes, materials, structural elements, the arrangement and connection of the structural elements, steps (processes), the processing order of the steps etc. shown in the following exemplary embodiments are meter examples, and therefore do not limit the scope of the present invention. Thus, among the structural elements described in the following exemplary embodiments below, the structural elements that are not described in any one of independent claims indicating top concepts in the present invention are described as arbitrary structural elements.

It should be noted that each of the accompanying drawings is a schematic diagram and does not necessarily illustrate the precise view. Moreover, it should also be noted that the same reference sign is assigned to the identical structural elements in the drawings.

Embodiment 1

As one embodiment of a method of forming a crystalline thin film to be used for manufacturing a thin-film device according to the present invention, a method of forming a crystalline silicon thin film on a substrate is firstly described with reference to FIG. 1. FIG. 1 shows a schematic cross-sectional view and a schematic plan view for each step of the method of forming a crystalline thin film according to Embodiment 1 of the present invention. In FIG. 1, (a2) to (e2) are plan views, and (a1) to (e1) are cross-sectional views along the lines X-X shown in (a2) to (e2), respectively.

As shown in (a1) and (a2) of FIG. 1, a substrate 10 is firstly prepared (a step of preparing a substrate). As the substrate 10, a glass substrate can be used for example. Here, the step of preparing a substrate may include, as an example, washing of the glass substrate to remove extraneous matter from the surface of the glass substrate, etching of the surface of the glass substrate to remove alkali metal components, or forming an undercoat film such as a silicon nitride (SiN) film on the surface of the glass substrate in order to prevent the alkali metal components included in the glass substrate from diffusing into, for example, a semiconductor film.

Next, as shown in (b1) and (b2) of FIG. 1, a thin film such as an amorphous semiconductor thin film is formed on the substrate 10 (step of forming a thin film). For example, an amorphous silicon film is formed as an amorphous amorphous silicon thin film 13 on the substrate 10.

Next, as shown in (c1) and (c2) of FIG. 1, light having a predetermined wavelength is prepared to crystallize the amorphous silicon thin film 13, and this predetermined light is thus prepared to irradiate the amorphous silicon thin film 13. As the light having the predetermined wavelength according to the present embodiment, a laser light 30 having a predetermined light intensity distribution is used as described later. The intensity distribution profile of the laser light 30 on the surface of the amorphous silicon thin film 13 has a substantially rectangular shape where the minor axis corresponds to a scanning direction 40 of the laser light 30 and the major axis corresponds to the direction crossing the scanning direction 40. On this account, the projection of the laser light 30 on the surface of the amorphous silicon thin film 13 also has a substantially rectangular shape where the minor axis corresponds to the scanning direction 40 of the laser light 30 and the major axis corresponds to the direction crossing the scanning direction 40. Here, the curve shown above the laser light 30 in (c2) of FIG. 1 is an example of the intensity distribution of the laser light 30 in the minor axis direction and has, for instance, the intensity distribution of a Gaussian curve.

Next, as shown in (c1) and (c2) to (d1) and (d2) of FIG. 1, relative scan with the laser light 30 is performed on the amorphous silicon thin film 13 in the scanning direction 40 at a predetermined speed, and the amorphous silicon thin film 13 is thus irradiated with the laser light 30. As a result, since an area irradiated with the laser light 30 on the amorphous silicon thin film 13 is crystallized, a crystalline silicon thin film 15 that is a polycrystalline silicon thin film including a crystallized area (crystalline area) 50 is formed (a step of laser light irradiation (or a step of crystallization)). To be more specific, the area irradiated with the laser light 30 on the amorphous silicon thin film 13 is annealed with heat energy of the laser light 30 and thus crystallized into the crystalline silicon thin film 15. After this, the amorphous silicon thin film 13 continues to be irradiated with the laser light 30 up to a predetermined position of the amorphous silicon thin film 13. Then, crystallization of a predetermined region on the amorphous silicon thin film 13 is completed as shown in (e1) and (e2) of FIG. 1.

In this step, by adjusting a condition for irradiation using the laser light, strip-shaped first areas (bead lines) 51 and second areas 52 adjacent to the first areas 51 can be formed in the crystallized area 50 as shown in (d2) and (e2) of FIG. 1. Each of the first areas 51 extends in a direction crossing the direction of the relative scan (or the scanning direction 40) of the laser light 30. In (d2) and (e2) of FIG. 1, the strip-shaped first areas 51 and second areas 52 are illustrated, as an example, to be curved in the Y axis direction. However, the first areas 51 and the second areas 52 may be, for example, linear as long as the first areas 51 and the second areas 52 extend in shape in a direction crossing the scanning direction of the laser light 30. Moreover, as shown in (d2) of FIG. 1 for instance, when the scanning direction of the laser light 30 corresponds to the X axis direction, the direction crossing the scanning direction of the laser light includes: not only the direction perpendicular to the X axis direction (i.e., the Y axis direction); but also the direction tilting at any given angle from the X axis direction to the Y axis direction. More specifically, the direction crossing the scanning direction of the laser light may be any direction crossing the X axis direction.

Figure 2:
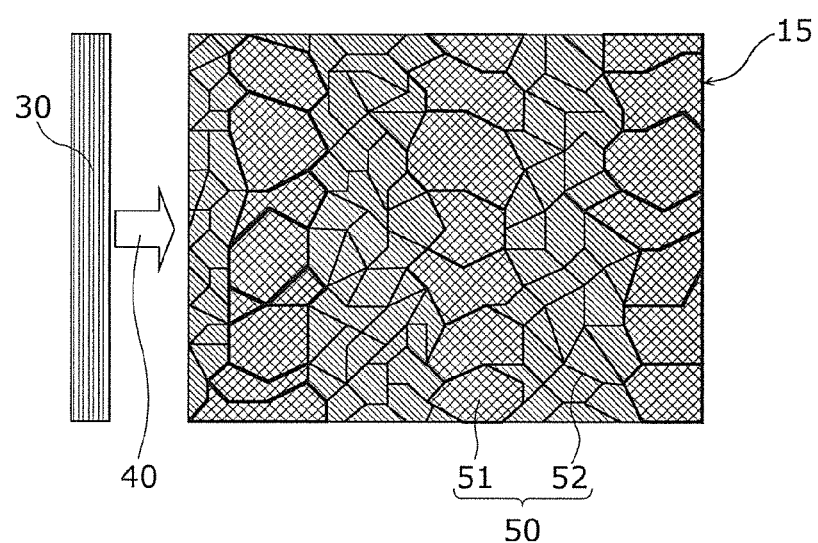
FIG. 2 is a plan view schematically showing the state of a grain structure of a crystallized area of a crystalline silicon thin film according to Embodiment 1 of the present invention.

Here, the grain structure of the crystallized area 50 in the crystalline silicon thin film 15 is described in detail with reference to FIG. 2. FIG. 2 is a plan view schematically showing the state of the grain structure of the crystallized area 50 in the crystalline silicon thin film 15 according to Embodiment 1 of the present invention, and is a magnified view of the region R enclosed by the dashed line in (e2) of FIG. 1.

As shown in FIG. 2, the crystalline silicon thin film 15 includes crystal grains (crystal particles) which are different in grain size, and an interface between the crystal grains forms a crystal grain boundary. The crystallized area 50 of the cry silicon thin film 15 according to the present embodiment has a grain structure where the first areas (or the strip-shaped first areas) 51 and the second areas (or the strip-shaped second areas) 52 coexist. Each of the first areas 51 is strip-shaped and extends in the direction substantially perpendicular to the scanning direction 40 of the laser light 30. Each of the second area 52 is strip-shaped and extends in the direction substantially perpendicular to the scanning direction 40 of the laser light 30. Here, the direction substantially perpendicular to the scanning direction 40 of the laser light 30 is an example of the direction crossing the scanning direction 40 of the laser light 30.

The first area 51 and the second area 52 are adjacent to each other in the scanning direction 40. Moreover, the first area 51 and the second area 52 which are strip-shaped are formed to appear alternately. The grain structure in which the first area 51 and the second area 52 coexist is formed in stripes extending in the direction substantially perpendicular to the scanning direction 40, in the step of crystallizing the amorphous silicon thin film 13 with the laser light 30 scanning at a predetermined scanning speed in the scanning direction 40.

Each of the first areas 51 is a band of crystal grains that are relatively large in average grain size. Moreover, the second area 52 is a band of crystal grains that are relatively small in average grain size. To be more specific, the first area 51 and the second area 52 are formed so that the average grain size of silicon particles in the first area 51 is larger than the average grain size of silicon particles in the second area 52. According to the present embodiment, the average grain size of the silicon crystal grains in the first area 51 is 100 nm to 500 nm, inclusive, whereas the average grain size of the silicon crystal grains in the second area 52 is 30 nm or larger and smaller than 100 nm. It should be noted that the second area 52 may have amorphous silicon including crystal grains having the average grain size smaller than the average grain size of the crystal grains included in the first area 51. This aspect is useful for implementing a switching TFT excellent in OFF-state current characteristics, for example.

Furthermore, as shown in FIG. 2, each of the strip-shaped first areas 51 includes crystals (crystal grains) that are in contact with each of the second areas 52 located on both sides of the strip-shaped first area 51. To be more specific, each of the first areas 51 includes a large number of crystals each of which connects to both of the two adjacent second areas 52 and thus has a width substantially equal to the width of the first area 51. Moreover, such crystal grains included in the strip-shaped first area 51 account for at least 80% in the longitudinal direction of the strip-shaped first area.

With this structure, variation can be less among the first areas 51. Moreover, since the number of crystal grain boundaries present in the first area 51 is small, the TFTs excellent in ON-state current characteristics and less varied in charge carrier mobility can be implemented as described later. This point is described in detail later.

Here, description is given about charge carriers, such as electrons and holes, moving in the crystalline silicon thin film 15. The charge carriers moving in the crystalline silicon thin film 15 pass through a plurality of crystal grains (pass through the crystal grain boundaries present between the crystal grains). Here, since crystal grain boundaries are defects in a crystal structure, the charge carriers are easily trapped at the crystal grain boundaries. When the grain size is larger, the number of crystal grain boundaries is smaller. Thus, when the grain size is larger, the probability that the charge carrier is trapped is reduced and, as a result, the charge carrier mobility is increased. Therefore, in the crystalline silicon thin film 15, the charge carriers are more likely to pass through the first area 51 having the relatively larger grain size as compared to the second area 52. In this way, by forming the first area 51 in the crystalline silicon thin film 15, the charge carrier mobility can be increased.

According to the present embodiment, a plurality of the strip-shaped first areas 51 are formed in the substantially same width, as shown in FIG. 1 and FIG. 2. However, note that the number of strip-shaped first areas 51 to be formed may be only one by an adjustment made to the condition for irradiation using the laser light. Moreover, when a plurality of the first areas 51 are to be formed, the pitches between the adjacent first areas 51 can be made regular as shown in FIG. 1 by an adjustment made to the scanning speed of the laser light 30. In other words, the first areas 51 can be formed at regular pitches.

As described, in the method of forming a crystalline thin film according to the present embodiment, the first areas 51 which are strip-shaped and have the large average grain size can be formed by irradiating the amorphous silicon thin film 13 (the amorphous silicon film) with the laser light at the predetermined scanning speed.

To be more specific, according to the present embodiment, the amorphous silicon thin film 13 is irradiated with the laser light by high-speed scanning at a speed faster than the scanning speed employed in the case where the whole area of the amorphous silicon thin film 13 is to be formed into the crystalline silicon thin film having the aforementioned average grain size of the second area 52. As a result, the crystallized area 50 is formed to include, between the second areas 52, the first areas 51 that is strip-shaped and has the large grain size. The reason that the strip-shaped first areas 51 are formed by laser irradiation at a higher scanning speed is examined as follows.

When laser irradiation is performed at a higher scanning speed, the temperature profile at a point (location) on the thin film (the silicon thin film) in the laser scanning direction shows a steep change within a short period of time (the point reaches a high temperature and is then cooled down within a short period of time), as compared to the case where laser irradiation is performed at a lower scanning speed. On the other hand, the temperature profile in the direction crossing the laser scanning direction (the direction substantially perpendicular to the scanning direction in the present embodiment) is approximately flat. In this case, in the scanning direction, the thin film is rapidly heated and rapidly cooled down in a short period of time as indicated by the steep temperature gradient. In the direction crossing the scanning direction, since almost no temperature gradient is present, the temperature of the thin film is maintained high for a period of time long enough for crystals to grow. In this way, when laser scanning is performed at a higher speed, the temperature gradient as described above occurs in a lateral direction on the substrate that corresponds to the laser scanning direction (this direction is simply referred to as the lateral direction hereafter). Crystal growth in the thin film is induced according to such a temperature gradient, and the crystals grow in the lateral direction. As a result, the grain size of the crystal grains increases in the direction crossing the laser scanning direction. It should be noted that, with a further increase in the scanning speed, the crystals in the thin film more uniformly grow in the lateral direction depending on the balance between the temperature distribution and the crystal growth rate.

In this way, when the temperature gradient at a certain level or above occurs in the laser scanning direction, the crystal growth is induced in the direction crossing the laser scanning direction and, as a result, the crystallized area having the large grain size is generated. In the present embodiment, growth of silicon crystals in the crystalline silicon thin film 13 is induced in the direction substantially perpendicular to the scanning direction of the laser light. Then, as shown in FIG. 2, the strip-shaped first areas 51 extending in the direction crossing the laser scanning direction are formed. Here, the silicon crystal grains grow and thus increase in volume. In the present embodiment, the crystal grains in the first areas 51 are more induced to grow than the crystal grains in the second areas 52 as described above. Therefore, the crystal grains in the first area 51 increase more in volume than the crystal grains in the second area 52. For this reason, the crystal grains collide with each other at the crystal grain boundaries in the first area 51, causing lifts.

As described, with an increase in the scanning speed of the laser light used for irradiating the silicon thin film for crystallization, the strip-shaped first areas 51 can be formed. Here, this is obtained by the present inventors as a result of earnest study. Based on this result, the present inventors found out that the crystallized areas (the first areas 51) having the large grain size could be generated in the direction crossing the laser scanning direction by a temperature gradient at a certain level or above in the laser scanning direction. The steep temperature gradient for generating the crystallized areas having the large grain size (i.e., the first areas 51) can be caused by reducing the irradiation time of the laser light. It is assumed that the steep temperature gradient can also be caused not only by increasing the scanning speed of the laser light as described above but also by reducing the minor axis width in the intensity distribution of the laser light.

In addition, it is usually thought that the strip-shaped first areas 51 as described result from variation in device characteristics. However, as a result of further study, the present inventors found out that the strip-shaped first areas 51 could be formed at regular pitches by adjusting the irradiation condition (such as the laser scanning speed) of the laser light as described later. This led to a new idea for implementing a device having less variation in characteristics.

Figure 3A:
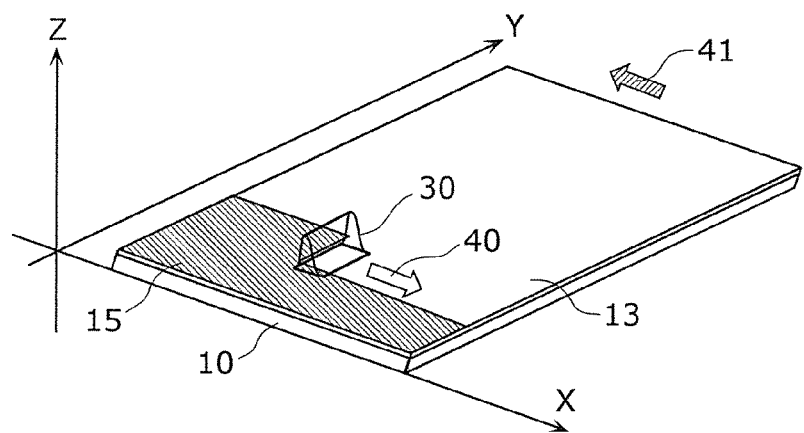
FIG. 3A is a perspective view schematically showing that a silicon thin film is irradiated with laser light in the method of forming a crystalline thin film according to Embodiment 1 of the present invention.
Figure 3B:
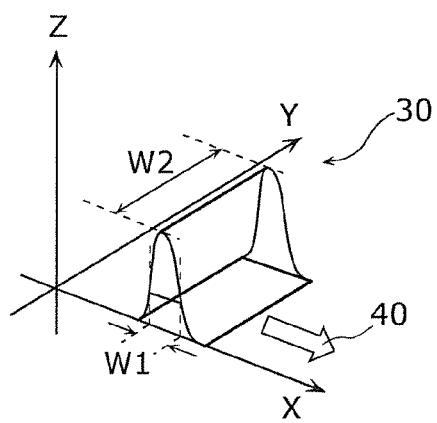
FIG. 3B is a diagram showing an intensity distribution of the laser light used in a step of crystallization in the method of forming a crystalline thin film according to Embodiment 1 of the present invention.

Next, crystallization of the amorphous silicon thin film 13 is described in more detail, with reference to FIG. 3A and FIG. 3B. FIG. 3A is a perspective view schematically showing that the amorphous silicon thin film 13 is irradiated with the laser light 30 by the method of forming a crystalline thin film according to Embodiment 1 of the present invention. FIG. 3B is a diagram showing an intensity distribution (or a beam profile) of the laser light 30 used in a step of crystallization in the method of forming a crystalline thin film according to Embodiment 1 of the present invention.

As shown in FIG. 3A, when the amorphous silicon thin film 13 formed on the substrate 10 is to be crystallized using the laser light, relative scan with the laser light 30 is performed on the amorphous silicon thin film 13 in a predetermined direction of relative scan. To be more specific, by moving at least one of the laser light 30 and the substrate 10 on which the amorphous silicon thin film 13 is formed, relative scan with the laser light 30 is performed on the amorphous silicon thin film 13. In the present embodiment, the laser light 30 is positionally fixed, and the substrate 10 on which the amorphous silicon thin film 13 is formed is moved in a first direction 41 in the X axis direction as shown in FIG. 3A. As a result, the laser light 30 scans the amorphous silicon thin film 13 in the scanning direction 40 (that is a second direction opposite to the first direction 41 in the X axis direction). It should be noted that, by repeatedly performing scanning a plurality of times on the substrate 10 in the X axis direction while moving the substrate 10 in the Y axis direction, the whole area of the amorphous silicon thin film 13 can be irradiated with the laser light 30.

Moreover, it is preferable for the laser used in the present embodiment to be a continuous wave laser (CW laser). The CW laser continuously oscillates laser light, and is thus capable of high-speed irradiation as compared with a pulsed laser. Furthermore, since the scanning speed of the CW laser is faster than that of the pulsed laser by one digit or more, throughput can be easily increased.

Furthermore, it is preferable for the laser used in the present embodiment to have a wavelength of 405 nm to 632 nm. Examples of semiconductor lasers in an applicable range include a semiconductor laser emitting blue laser light having a wavelength of 405 nm and a semiconductor laser emitting green laser light having a wavelength of 632 nm. The reason for this is as follows. In the case of an excimer laser having a wavelength of 308 nm for example, the whole light is absorbed by the surface of the amorphous silicon film. Thus, since crystal growth becomes prominent due to the temperature gradient in the film thickness direction downward from the surface of the film, it is difficult to form the first areas 51 obtained through crystal growth in the lateral direction. It should be noted that, even in the case of a pulsed laser, when the wavelength is 405 nm to 632 nm, the crystal growth of the thin film in the lateral direction can be induced by this laser light passing through the amorphous silicon film fully in the film thickness direction. On this account, it is assumed that the first areas 51 can be easily formed.

As shown in FIG. 3B, the laser light used in the present embodiment is shaped to have: a bell-shaped distribution that is the Gaussian distribution, as the light intensity distribution in the minor axis (X axis) direction; and a flat-top distribution as the light intensity distribution in the major axis (Y axis) direction perpendicular to the minor axis direction. The beam minor axis width W1 in FIG. 3B denotes a full width at half maximum (FWHW) of the intensity distribution in the minor axis direction of the laser light 30. Moreover, the beam major axis width W2 in FIG. 3B denotes the width in the major axis direction of the intensity distribution in the major axis direction of the laser light (the flat width). When the amorphous silicon thin film 13 is irradiated with the laser light 30 configured as described, the laser light 30 relatively scans the amorphous silicon thin film 13 in the minor axis direction of the intensity distribution of the laser light 30 as the scanning direction 40. By irradiating the amorphous silicon thin film 13 with the laser light 30 having the intensity distribution shown in FIG. 3B in this way, the projection of the laser light 30 on the amorphous silicon thin film 13 can be made substantially rectangular in shape.

In the present embodiment, a CW laser configured with a semiconductor laser emitting green light having a wavelength of 532 nm is used. Moreover, the beam minor axis width W1 is 32 µm, and the beam major axis width W2 is 300 µm. Thus, the beam major axis width W2 is set to be longer than the beam minor axis width W1.

In the present embodiment, the laser irradiation is performed on the amorphous silicon thin film 13 using the laser light 30 that is shaped as described above. As mentioned above, the present inventors found out that the grain structure of the resulting crystalline silicon thin film 15 changed according to the irradiation time of the laser light 30 (or more specifically, according to the scanning speed of the laser light 30 and the beam minor axis width W1 of the laser light 30).

Figure 4:
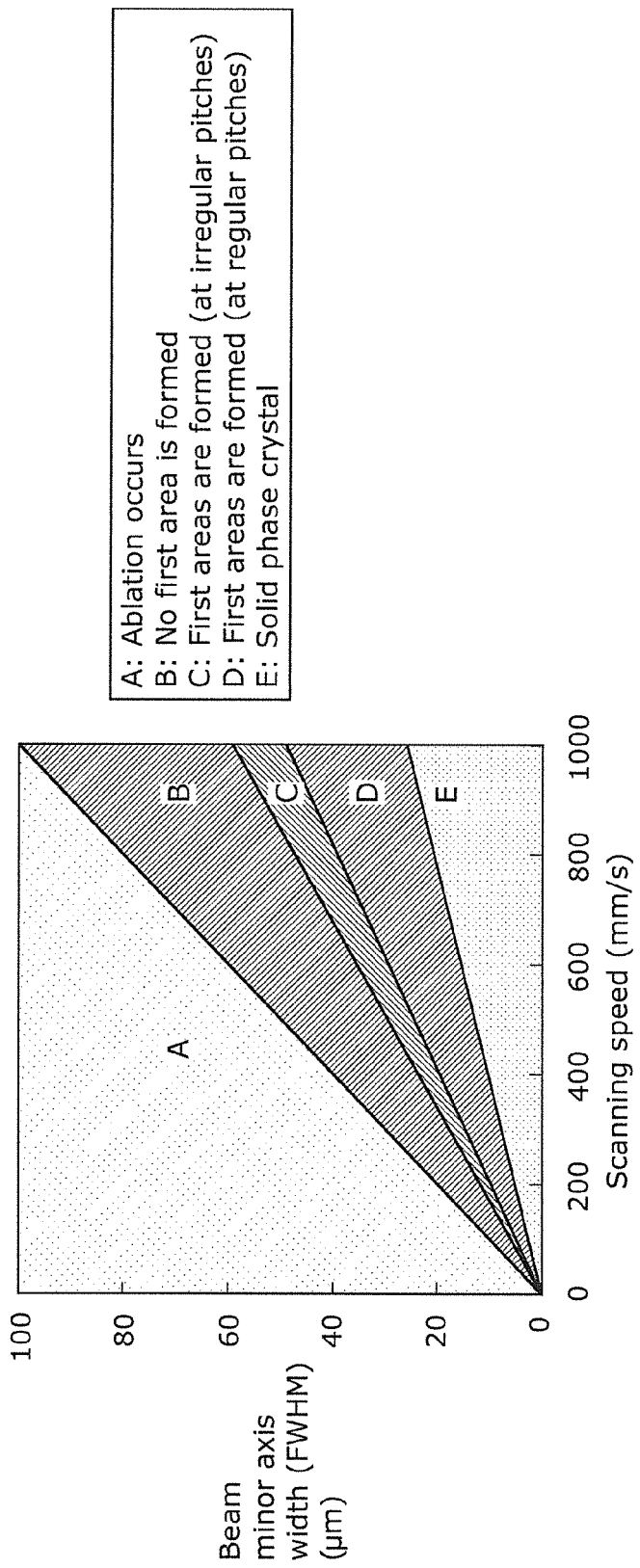
FIG. 4 is a diagram showing a relationship between conditions (such as the scanning speed and the beam minor axis width) of the laser light and the grain structure of the crystalline silicon thin film in the step of crystallization in the method of forming a crystalline thin film according to Embodiment 1 of the present invention.

The following describes a relationship between the irradiation conditions of the laser light 30 and the grain structure of the crystalline silicon thin film 15, with reference to FIG. 4 and FIG. 5A to FIG. 5E. More specifically, the following describes the irradiation conditions of the laser light 30 (the laser scanning speed and the minor axis width of the laser) used for forming the strip-shaped crystallized areas (the first areas 51) where the large grain size is large. FIG. 4 is a diagram showing a relationship between the irradiation conditions of the laser light 30 (the laser scanning speed and the beam minor axis width of the laser) and the grain structure of the crystalline silicon thin film 15 in the step of crystallization in the method of forming a crystalline thin film according to Embodiment 1 of the present invention. FIG. 5A to FIG. 5E are diagrams schematically showing the respective grain structures of the crystalline silicon thin film 15 formed under the conditions for laser irradiation corresponding to the regions A to E shown in FIG. 4. It should be noted that the irradiation time of the laser light 30 is calculated by dividing the beam minor axis width W1 (FWHM) of the laser light 30 by the scanning speed and thus can be expressed as "irradiation time=minor axis width/scanning speed".

Figure 5A:
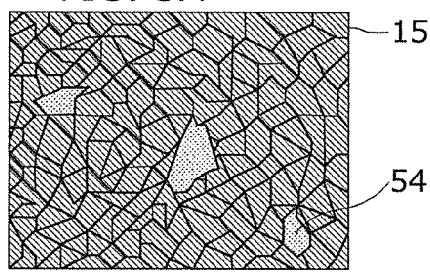
FIG. 5A is a diagram schematically showing the grain structure of the crystalline silicon thin film formed under the conditions for laser irradiation of the region A shown in FIG. 4.

Suppose that the amorphous silicon thin film 13 comprising an amorphous silicon film is crystallized by irradiation with the laser light 30 under the conditions for laser irradiation corresponding to the region A shown in FIG. 4. In this case, an ablation 54 occurs to the amorphous silicon film as shown in FIG. 5A. This causes film peeling or the like to the crystalline silicon thin film 15. It is thought that the ablation 54 occurs in this way because the irradiation energy applied to the amorphous silicon thin film 13 is excessively large due to excessively low scanning speed of the laser light or excessively wide beam minor axis width W1 of the laser light.

Figure 5B:
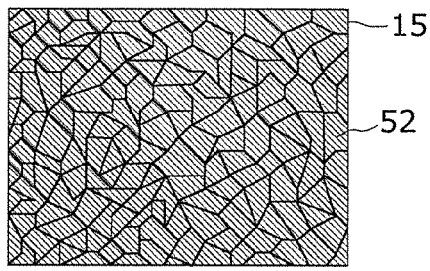
FIG. 5B is a diagram schematically showing the grain structure of the crystalline silicon thin film formed under the conditions for laser irradiation of the region B shown in FIG. 4.

On the other hand, suppose that the amorphous silicon thin film 13 comprising an amorphous silicon film is crystallized by irradiation with the laser light 30 under the conditions for laser irradiation corresponding to the region E shown in FIG. 4. In this case, as shown in FIG. 5E, the resulting crystalline silicon thin film 15 has a solid phase crystallization (SPC) grain structure 53 including, instead of molten silicon crystals, crystal grains formed by SPC and smaller in grain size. It is thought that the SPC grain structure 53 is formed in this way because the irradiation energy applied to the amorphous silicon thin film 13 is excessively small due to excessively high scanning speed of the laser light or excessively narrow beam minor axis width W1 of the laser light. This accordingly causes the amorphous silicon thin film 13 to crystallize at the melting point of silicon, that is, 1414° C., or below.

Moreover, suppose that the amorphous silicon thin film 13 comprising an amorphous silicon film is crystallized by irradiation with the laser light 30 under the conditions for laser irradiation corresponding to the regions B to D between the regions A and E shown in FIG. 4. In each of the cases under the conditions corresponding to the regions B to D, molten silicon crystals are formed. However, under the conditions for laser irradiation corresponding to the region B where the scanning speed of the laser light is relatively slow or the beam minor axis width W1 is relatively wide, the resulting crystalline silicon thin film 15 has a grain structure where the strip-shaped first area is not formed as shown in FIG. 5B. It should be noted that the crystalline silicon thin film 15 shown in FIG. 5B has the grain structure including only silicon particles having an average grain size corresponding to the average grain size of the second area 52.

Here, suppose that irradiation is performed under irradiation conditions where the scanning speed is faster or the beam minor axis width W1 is narrower as compared to the irradiation conditions of the laser light 30 corresponding to the region B. In this case, the resulting crystalline silicon thin film 15 has a grain structure where the first areas 51 are formed. The first areas are strip-shaped areas extending in the direction substantially perpendicular to the scanning direction 40 of the laser light 30 and larger in average grain size than the other areas (i.e., the second areas 52).

Figure 5C:
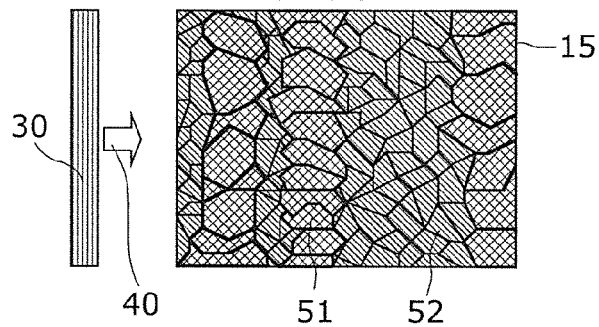
FIG. 5C is a diagram schematically showing the grain structure of the crystalline silicon thin film formed under the conditions for laser irradiation of the region C shown in FIG. 4.
Figure 5D:
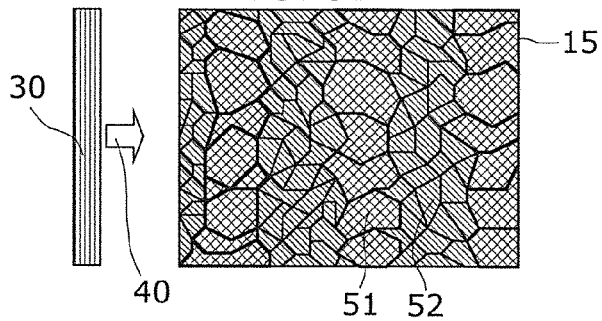
FIG. 5D is a diagram schematically showing the grain structure of the crystalline silicon thin film formed under the conditions for laser irradiation of the region D shown in FIG. 4.
Figure 5E:
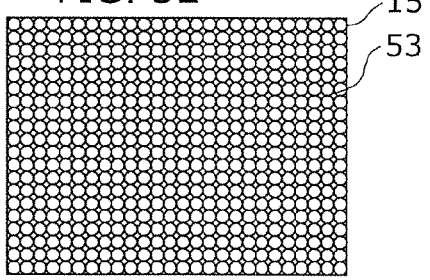
FIG. 5E is a diagram schematically showing the grain structure of the crystalline silicon thin film formed under the conditions for laser irradiation of the region E shown in FIG. 4.

In this case, when irradiation with the laser light 30 is performed under the conditions for laser irradiation corresponding to the region C shown in FIG. 4, the strip-shaped first areas 51 are randomly formed at irregular pitches as shown in FIG. 5C. However, when irradiation with the laser light 30 is performed under the conditions for laser irradiation corresponding to the region D shown in FIG. 4 where the scanning speed is even faster or the beam minor axis width W1 of is narrower as compared with the conditions for laser irradiation corresponding to the region C, the strip-shaped first areas 51 are formed at regular pitches as shown in FIG. 5D.

Figure 6A:
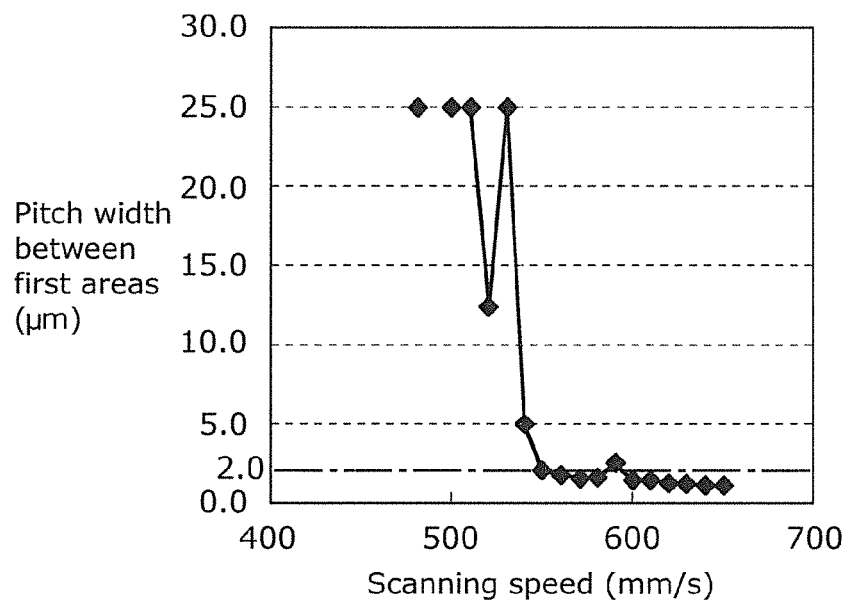
FIG. 6A is a diagram showing a relationship between the scanning speed of the laser light and the pitch between first areas, in the step of crystallization in the method of forming a crystalline thin film according to Embodiment 1 of the present invention.
Figure 6B:
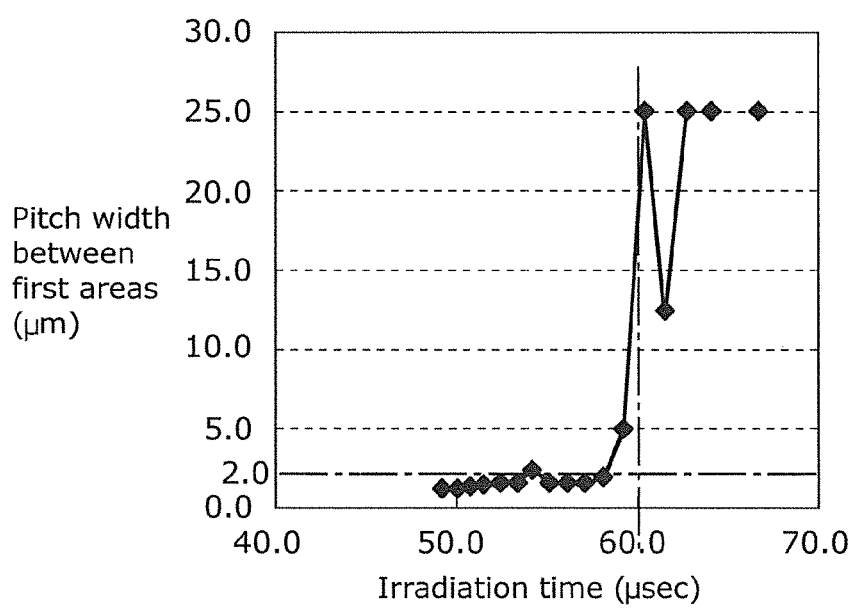
FIG. 6B is a diagram showing a relationship between the irradiation time of the laser light and the pitch between the first areas, in the step of crystallization in the method of forming a crystalline thin film according to Embodiment 1 of the present invention.

Here, a relationship between the intervals (or pitches) of the adjacent first areas 51 and the irradiation time of the laser light is described, with reference to FIG. 6A and FIG. 6B. FIG. 6A is a diagram showing the pitch between the first areas 51 with respect to the scanning speed of the laser light 30, in the step of crystallization in the method of forming a crystalline thin film according to Embodiment 1 of the present invention. FIG. 6B is a diagram where the scanning speed as the horizontal axis in FIG. 6A is replaced by the laser irradiation time. To be more specific, the laser irradiation time can be expressed as follows: "laser irradiation time=minor axis width/scanning speed=32 (μm)/scanning speed (mm/s)". For example, a laser irradiation time of 60 (μsec) in FIG. 6B corresponds to the scanning speed of about 533 (mm/s) in FIG. 6A. It should be noted that data shown in FIG. 6A and FIG. 6B is obtained by measuring the pitches between the first areas 51 above a gate electrode having the width of 25 μm. Moreover, note that when the width of the strip-shaped first area 51 exceeds the width of the gate electrode (25 μm), the pitch of the first area 51 is plotted as 25 μm.

As shown in FIG. 6A and FIG. 6B, when the scanning speed of the laser light 30 for crystallization reaches 550 mm/s or higher, or more specifically, when the irradiation time of the laser light 30 is about 58.2 (μsec) or shorter, the pitch between the adjacent first areas 51 is nearly saturated at 2.0 μm or shorter. In other words, the adjacent first areas 51 can be formed at regular pitches when formed to have pitches of 2.0 μm or shorter in between. In this way, the first areas 51 are formed at regular pitches as shown in FIG. 5D by determining the conditions of the beam minor axis width W1 and the scanning speed of the laser light 30 in order for the irradiation time (minor axis width/scanning speed) of the laser light 30 to be 60 (μsec) or shorter. Here, the interval (or the pitch) between the adjacent first areas 51 refers to a distance from the center of one of the first areas 51 in the width direction to the center of the other first area 51 in the width direction.

Figure 7:
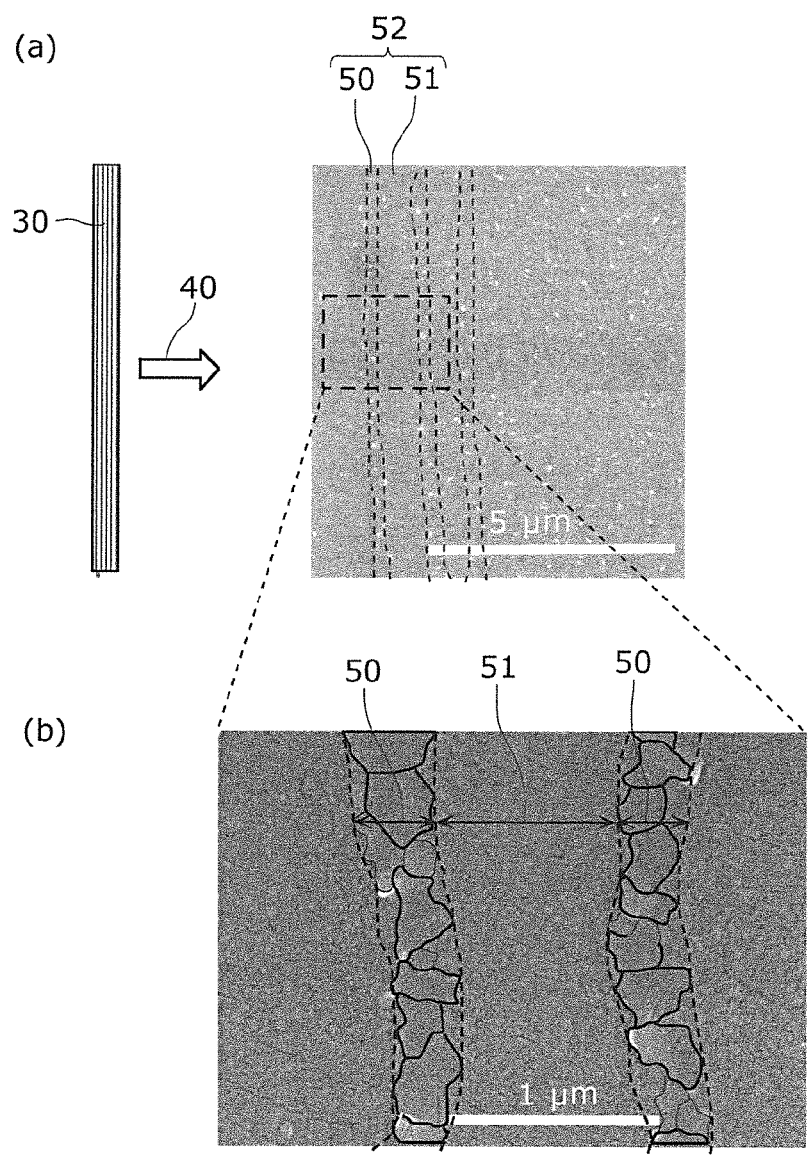
FIG. 7 (a)-(b) shows plane scanning electron microscope (SEM) images of the crystalline silicon thin film obtained under the conditions for laser irradiation according to Embodiment 1 of the present invention.
Figure 8:
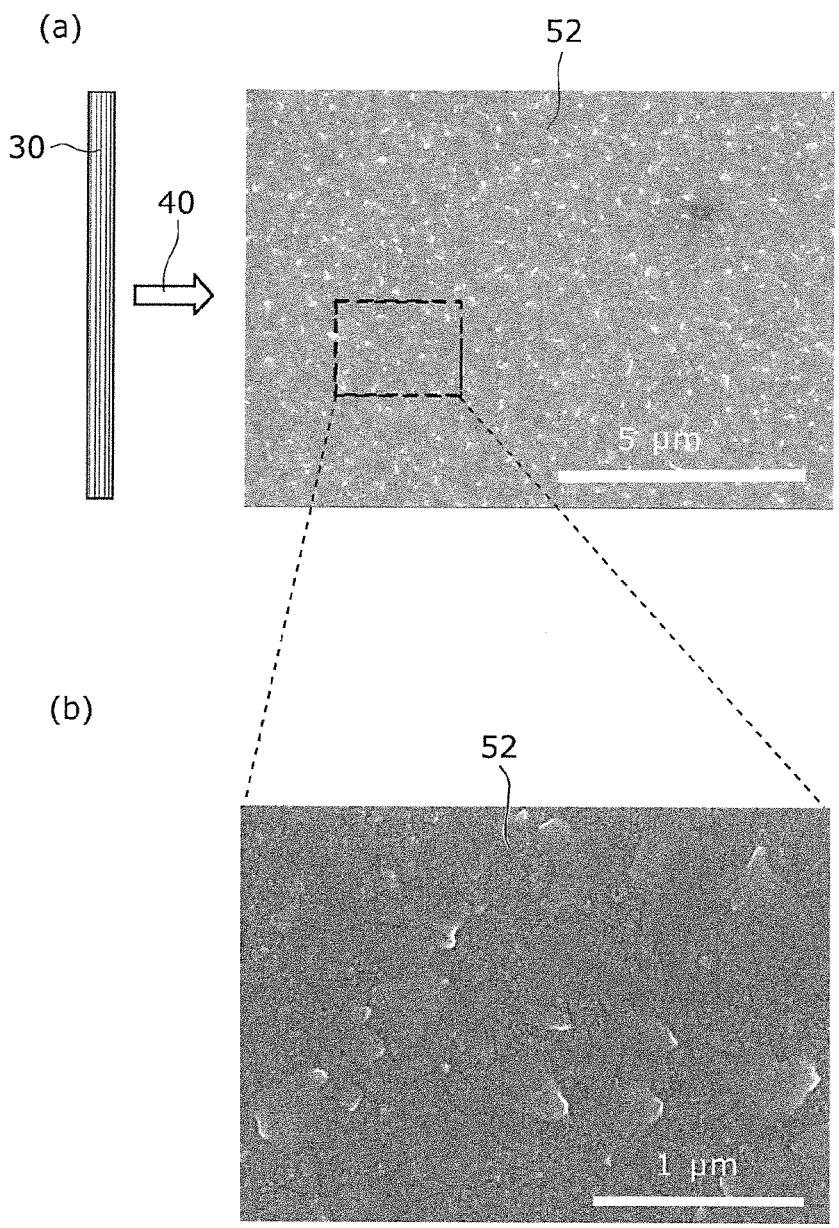
FIG. 8 (a)-(b) shows plane SEM images of the crystalline silicon thin film obtained under the conditions for laser irradiation according to a comparative example.

Next, the grain structure of the crystalline silicon thin film 15 formed by using the aforementioned method of forming a crystalline thin film is described, with reference to FIG. 7 and FIG. 8.

In FIG. 7, (a) and (b) are plane scanning electron microscope (SEM) images obtained by observing, using an SEM, the grain structure of the crystalline silicon thin film 15 formed under the conditions for laser irradiation (the power density: 70.0 kW/cm$^2$, the stage scanning speed: 580 mm/s, the irradiation time: 49.0 μsec, and the input energy density: 3.5 J/cm$^2$) according to Embodiment 1 of the present invention. Here, (b) is a magnified view of the region indicated by the dashed line in (a). Note that the beam minor axis width W1 (FWHM) is 32.0 μm.

As can be seen from (a) and (b) of FIG. 7, the crystalline silicon thin film 15 formed under the conditions for laser irradiation according to the present embodiment includes both the strip-shaped first areas 51 and the strip-shaped second areas 52. In (b) of FIG. 7, the whitish spots are lifts caused by the collision of the silicon crystal grains due to the volume expansion. The crystalline silicon thin film 15 formed in this way includes the first areas 51 having the silicon crystal grains that are 440 nm in average grain size and the second areas 52 having the silicon crystal grains that are 80 nm in average grain size. Moreover, the pitches between the first areas 51 are uniformly 1.8 μm.

On the other hand, in FIG. 8, (a) and (b) are plane SEM images obtained by observing, using an SEM, the grain structure of the crystalline silicon thin film formed under the conditions for laser irradiation (the power density: 60 kW/cm², the stage scanning speed: 400 mm/s, the irradiation time: 80.0 μsec, and the input energy density: 4.8 J/cm²) in a comparative example. Here, (b) is a magnified view of the region indicated by the dashed line in (a). Note that the beam minor axis width (FWHM) W1 is 32.0 μm.

As can be seen from (a) and (b) of FIG. 8, the crystalline silicon thin film formed under the conditions for laser irradiation in the comparative example has the grain structure that includes only the second area 52 with no first area 51 since the irradiation time is as long as 60.0 μsec or longer. The average grain size of the silicon crystal grains included in this grain structure is 75 nm.

It can be understood from the results shown in FIG. 7 and FIG. 8 that, under the conditions for laser irradiation according to the present embodiment as shown in FIG. 7, the strip-shaped first areas 51 having the average grain size of 100 nm to 500 nm can be formed at a pitch of 2.0 μm or shorter regardless of the faster scanning speed and the less input energy density.

Moreover, as can be seen from (b) of FIG. 7, each of the strip-shaped first areas 51 includes crystal grains that are in contact with each of the second areas 52 located on both sides of the strip-shaped first area 51. To be more specific, the strip-shaped first area includes the crystal grains each of which stretches from one end of the strip-shaped first area to the other end in a short-side direction (or a width direction) of the strip-shaped first area 51 (i.e., the crystal grains each of which connects to the two adjacent second areas 52 on both sides).

An ON-state current of a TFT is larger when the number of grain boundaries (trap sites) is smaller. Therefore, a TFT including the crystalline silicon thin film 15 as a channel layer is excellent in ON-state current characteristics. In the case where crystallization is performed using a pulsed laser, a larger-grain area includes a plurality of crystal grains in the scanning direction and thus has more grain boundaries (trap sites) as described above. On this account, as compared with the crystalline silicon thin film formed using the CW laser, the crystalline silicon thin film formed using the pulsed laser cannot implement the TFT excellent in ON-state current characteristics.

Moreover, the crystal grains included in the strip-shaped first area 51 that are in contact with the second areas 52 on both sides account for at least 80% in the longitudinal direction of the strip-shaped first area 51. In other words, at least 80% of the crystal grains in the longitudinal direction of the strip-shaped first area grows laterally. In the present embodiment, each of the strip-shaped first area 51 includes a large number of crystals connecting to the two adjacent second areas 52 on both sides as described. Thus, TFTs can be implemented that are excellent in ON-state current characteristics and less varied in charge carrier mobility as described later.

Furthermore, when the pulsed laser is used, each of the larger-grain areas includes a plurality of crystal grains in the scanning direction. For this reason, the amount of current may vary depending on a current path. Thus, when a comparison is made between transistors arranged on a surface of the substrate, this may result in variation in ON-state current of the larger-grain area between the transistors.

On the other hand, the larger-grain area according to the present invention includes a crystal grain stretching from one end to the other. Therefore, variation due to variation in the number of crystalline grain boundaries is smaller in each of the larger-grain areas as compared with the case where the pulsed laser is used. This can reduce the variation in ON-state current on the surface of the substrate.

Figure 9A:
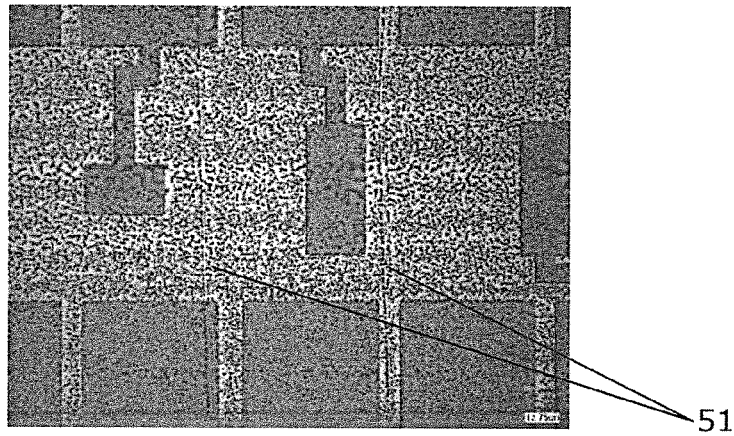
FIG. 9A shows an optical microscopic image of the grain structure of the crystalline silicon thin film obtained under the conditions for laser irradiation according to Embodiment 1 of the present invention (where the stage scanning speed is 460 mm/s).
Figure 9B:
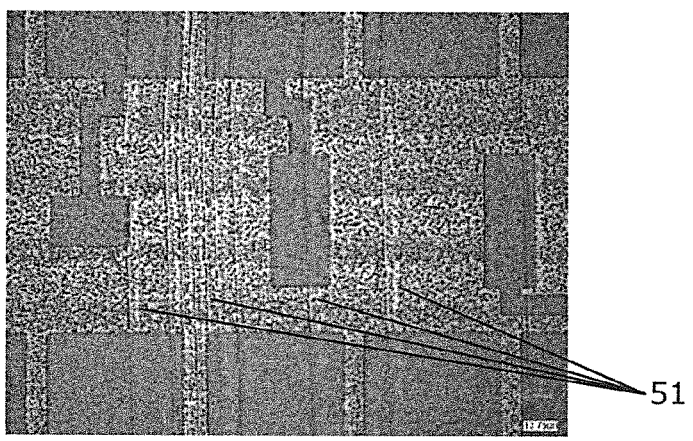
FIG. 9B shows an optical microscopic image of the grain structure of the crystalline silicon thin film obtained under the conditions for laser irradiation according to Embodiment 1 of the present invention (where the stage scanning speed is 480 mm/s).
Figure 9C:
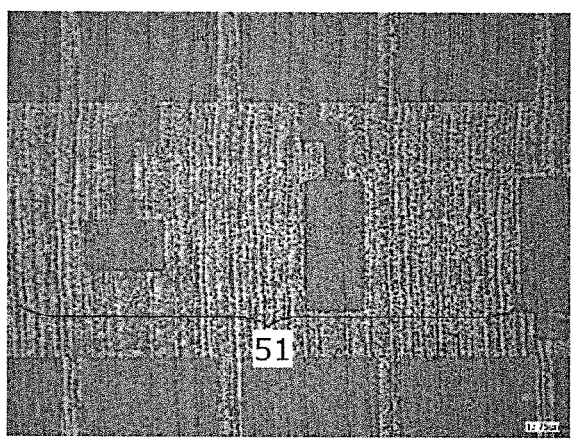
FIG. 9C shows an optical microscopic image of the grain structure of the crystalline silicon thin film obtained under the conditions for laser irradiation according to Embodiment 1 of the present invention (where the stage scanning speed is 520 mm/s).

The above describes the case where the stage scanning speed is 580 mm/s as the condition for laser irradiation (FIG. 7) according to the present embodiment. However, the strip-shaped first areas 51 are also formed in the cases where the stage scanning speeds are 460 mm/s, 480 mm/s, and 520 mm/s as shown in FIG. 9A to FIG. 9C. Each of FIG. 9A to FIG. 9C shows an optical microscopic image of the grain structure of the crystalline silicon thin film 15 formed under the conditions for laser irradiation according to Embodiment 1 of the present invention. FIG. 9A, FIG. 9B, and FIG. 9C correspond to the cases where the stage scanning speeds are 460 mm/s, 480 mm/s, and 520 mm/s, respectively.

As can be seen from FIG. 9A and FIG. 9B, when the stage scanning speeds are 460 mm/s and 480 mm/s, the strip-shaped first areas 51 are formed at irregular pitches. Moreover, as can be seen from FIG. 9C, when the stage scanning speed is 520 mm/s, the strip-shaped first areas 51 are formed at regular pitches similarly to the case shown in FIG. 7. It should be noted that the conditions other than the stage scanning speed in FIG. 9A to FIG. 9C are the same as those for laser irradiation according to the present embodiment shown in FIG. 7.

As described thus far, by using the method of forming a crystalline thin film according to Embodiment 1 of the present invention, the crystalline thin film including the regions different in crystalline state can be formed in the same step at high speed without increasing the input energy of the laser light 30. Such crystalline thin film can be formed by crystallizing a thin film such as an amorphous silicon film under the irradiation conditions of the laser light 30 corresponding to the region C or D shown in FIG. 4. To be more specific, the present method can manufacture a substrate with a thin film thereabove having a crystalline thin film with the crystallized area 50 including the first areas 51 and the second areas 52 formed in the same process and different in average grain size. As a result, it is possible to easily manufacture, for a single device, two types of devices (such as TFTs) different in characteristics.

Moreover, according to the present embodiment, the crystalline thin film including the crystallized area having the large grain size (the first area 51) can be formed. Thus, for example, a TFT including, as a channel layer, the crystalline thin film according to the present embodiment is high in charge carrier mobility and excellent in ON-state current characteristics.

Furthermore, according to the present embodiment, the crystallized area 50 including the strip-shaped first areas 51 as described above can be formed through high-speed scanning using the CW laser light 30 for irradiation. Thus, as compared with the case of crystallization with the pulsed laser, high throughput can also be implemented. To be more specific, throughput can be increased as compared with the case where the crystalline silicon thin film 15 having the grain structure including only the crystal grains having the grain size corresponding to the grain size in the second area 52 is formed by laser crystallization.

Figure 10A:
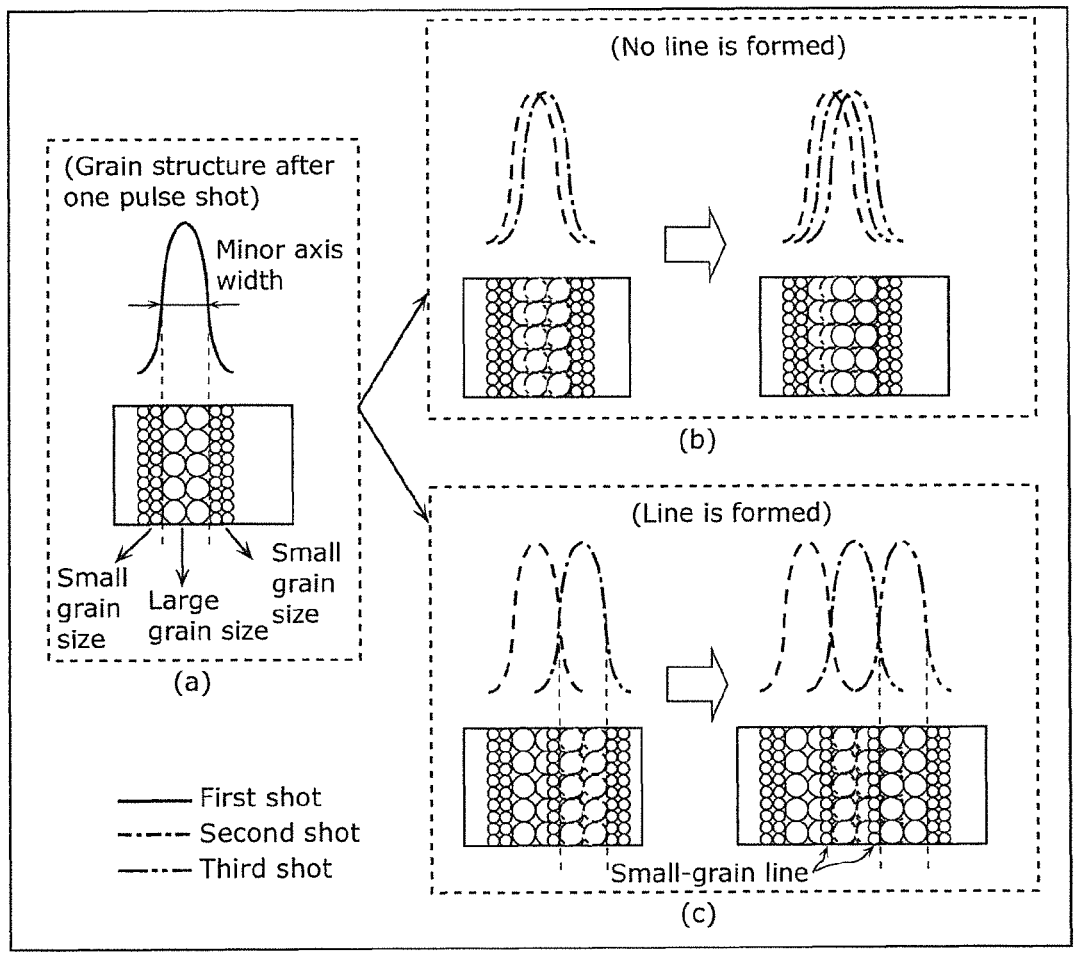
FIG. 10A is a diagram showing the case where an amorphous silicon thin film is crystallized by a pulsed laser.

The crystallization method using the CW laser light as in the present embodiment and the crystallization method using the pulsed laser are different in grain structure of the strip-shaped areas (lines), specifically in grain size. To be more specific, when the thin film is crystallized using the CW laser light as in the present embodiment, the temperature profile at a point on the thin film in the scanning direction shows a steeper change. Then, crystal growth is induced along the temperature gradient, resulting in the growth in the lateral direction and in an increase in grain size. On the other hand, when the thin film is crystallized using pulsed laser light, the uniform grain structure can be formed by overlapping the pulse oscillation shots because each shot is emitted for an extremely short period of time (on the order of nanoseconds per shot). Therefore, the temperature gradient is unlikely to be caused in the larger-grain area in the scanning direction, and the lateral growth as in the case of using the CW laser light cannot be obtained. For example, (a) of FIG. 10A shows the grain structure of the thin film formed after one pulse shot. When scanning is performed at low speed, energy is large and pitches between the shots are small. Therefore, the strip-shaped (linear) area is not formed as shown in (b) of FIG. 10A. When scanning is performed at high speed, energy is small and pitches between the shots are large. Therefore, the strip-shaped (linear) area is formed as shown in (c) of FIG. 10. In this case, however, although the strip-shaped areas are formed, the physical length of the grain size is extremely small even in the area where the crystals are relatively large in size. Hence, unlike the present embodiment, the strip-shaped area including the crystals large in the grain size is not formed when the pulsed laser is used.

As described, the case where crystallization is performed using the CW laser light and the case where crystallization is performed using the pulsed laser are different in the principle of the crystal growth in the thin film. Accordingly, in the present embodiment, the strip-shaped first area 51 that is a larger-grain area includes the crystal grains that are in contact with each of the second areas 52 located on both sides of the strip-shaped first area 51, as a result of the growth of the larger crystal grains. To be more specific, the strip-shaped first area 51 includes the crystal grains each of which stretches from one end of the strip-shaped first area to the other end in the short-side direction (or the width direction) (i.e., the crystal grains each of which connects to the two adjacent second areas 52 on both sides with the strip-shaped first area 51 in between). On the other hand, when the pulsed laser is used, the crystal growth is not induced and, therefore, the resulting larger-grain area includes no crystal grain stretching from one end to the other end in scanning direction (the width direction of the larger-grain area). Thus, a plurality of crystal grains are present in the scanning direction. Moreover, the minor axis width (FWHM) of the laser is on the order of a micrometer or more. On this account, in addition to the difficulty in the crystal growth, the width of the strip-shaped area is necessarily large. Thus, a crystal grain in contact with each of the areas on both sides of the strip-shaped area cannot be formed.

Figure 10B:
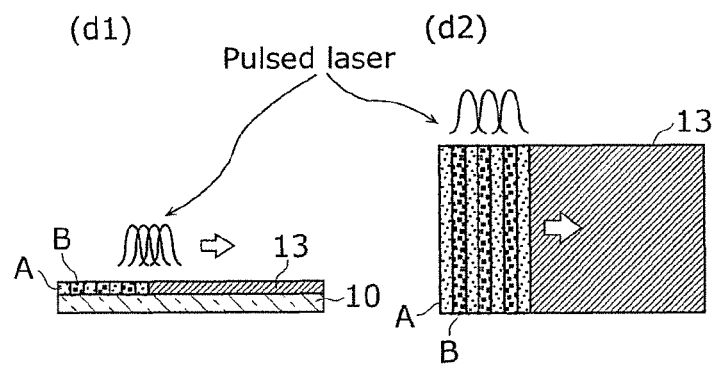
FIG. 10B is a diagram schematically showing the grain structure of the crystalline silicon thin film formed using the pulsed laser.

Moreover, as disclosed in PTL 2 (Japanese Unexamined Patent Application Publication No. 2008-016717), when high-speed scanning is performed using the pulsed laser, two types of longitudinal crystallized areas (a longitudinal area A and a longitudinal area B) extending in a direction crossing the laser scanning direction and different in grain size may be formed as shown in FIG. 10B. Here, in a wavelength range of visible light, the light absorptivity of a crystalline silicon thin film is about one-tenth of the light absorptivity of an amorphous silicon film. Thus, even when the grain structure formed by the first shot of pulsed laser is irradiated with the second shot of pulsed laser, it is difficult for the grain structure to absorb the laser light. On account of this, the grain structure formed by the first shot of pulsed laser irradiation is more likely to remain. For this reason, the aforementioned two areas are thought to be formed as described above. In this case, it is assumed that the grain structure of the area B including the grains in the smaller size in FIG. 10B also includes fine crystals having a size of 30 mn or smaller that is formed in an edge area by the first shot. This accordingly results in a problem that a difference between the area A and the area B in grain size is large. Moreover, as shown in FIG. 5 of PTL 2, the crystalline longitudinal areas formed by the pulsed laser are formed intermittently in the direction crossing the laser scanning direction and thus lack continuity. Charge carriers are trapped at a position where the longitudinal area is discontinued. The trap causes a decrease in the charge carrier mobility. Moreover, the discontinuity of the longitudinal area reduces the uniformity in thin film characteristics. In PTL 2, paragraphs [0048] to [0051] describes that the occurrence of such longitudinal areas is unfavorable. In the present embodiment, on the other hand, the strip-shaped first areas 51 are formed to be continuous within the length in the major axis direction (the Y direction) of the laser irradiation area. To be more specific, each of the strip-shaped first areas 51 is continuous within the length of the major axis of the laser light (or, the Y direction). This can increase the charge carrier mobility and also implement the crystalline silicon thin film excellent in uniformity.

Moreover, in the present embodiment, it is preferable for the crystalline silicon thin film 15 to be formed under the conditions for laser irradiation corresponding to the area D shown in FIG. 4. When the crystalline silicon thin film 15 is formed by crystallizing the amorphous silicon thin film 13 under the conditions for laser irradiation corresponding to the area D, the strip-shaped first areas 51 can be formed at regular pitches. Furthermore, the grain size in each of the first areas 51 of the crystalline silicon thin film 15 according to the present embodiment is not less than 100 nm and no more than 500 nm, and is smaller than the size on the order of micrometers. More specifically, the grain size in the first area 51 is not within a range of large grain size. In this way, the strip-shaped first areas 51 having the grain size of not less than 100 nm and not more than 500 nm are formed at regular pitches. Thus, the grain structure excellent in uniformity can be implemented on the substrate. In particular, when a TFT array substrate for a large-screen display device is to be formed for example, devices having less variation in characteristics can be easily manufactured.

Furthermore, in the present embodiment, it is preferable for the laser light used in the step of crystallization to be green laser light using a CW laser for the following reasons.

When the crystalline silicon thin film 15 is formed with the green laser light using the CW laser, a TFT including this crystalline silicon thin film as a channel layer is high in charge carrier mobility and excellent in ON-state current characteristics. On the other hand, in order to increase throughput, the number of times scanning is performed may be reduced by increasing the beam major axis width of the laser light. However, when the beam major axis width is increased in the case of the green laser light, it is difficult to ensure the uniformity in beam intensity in the major axis direction due to light interference. As another way to increase throughput, the number of times scanning is performed may be reduced by providing a plurality of lasers in a laser device. However, an increase in the number of lasers may significantly increase the initial cost of the device. In this way, it has conventionally been difficult to increase throughput when green laser light is used for crystallizing a thin film. In the present embodiment, on the other hand, since a desired crystallized area can be formed by performing scanning at high speed using the laser light, throughput can be increased. Hence, the method of manufacturing a substrate having a thin film thereabove according to the present embodiment is suitable for crystallizing a thin film using green laser light.

Figure 11:
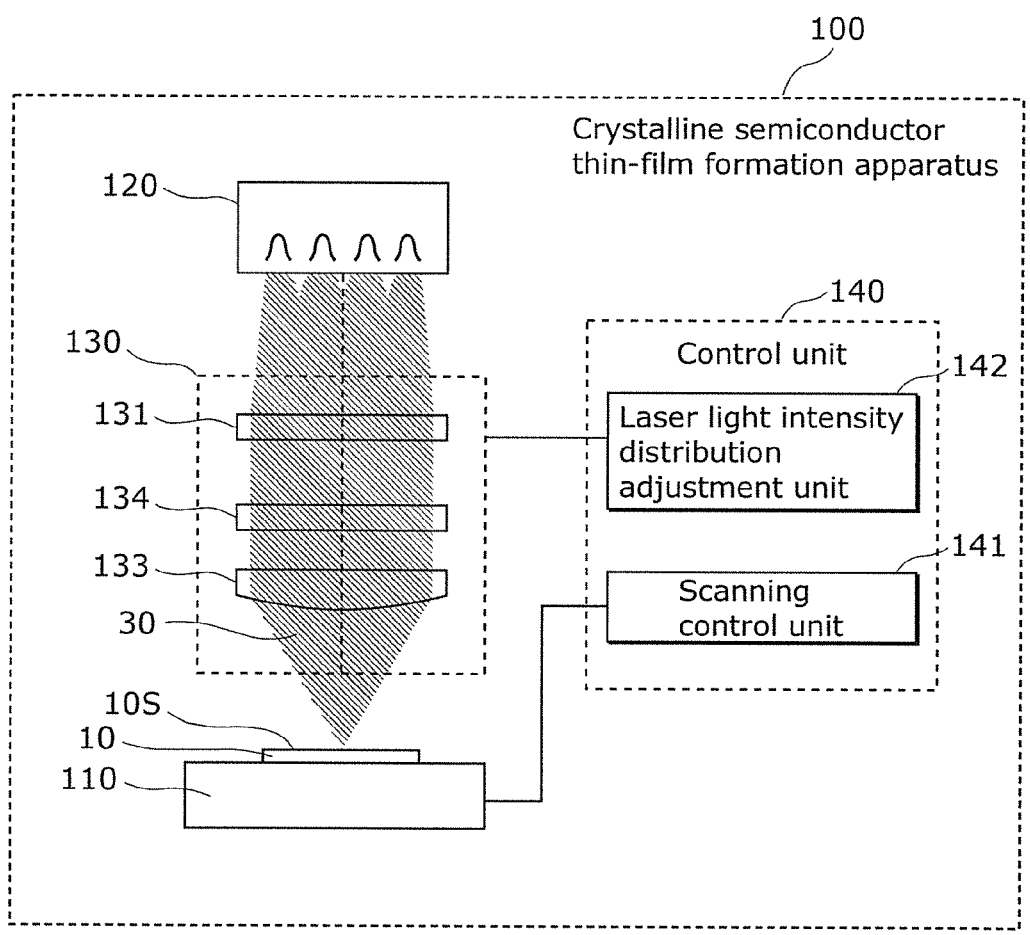
FIG. 11 is a diagram showing a configuration of a crystalline semiconductor thin film formation apparatus according to Embodiment 1 of the present invention.

The following describes a crystalline semiconductor thin film formation apparatus 100 to be used in the step of crystallization in the method of forming a crystalline thin film according to Embodiment 1 of the present invention, with reference to FIG. 11. FIG. 11 is a diagram showing a configuration of the crystalline semiconductor thin film formation apparatus according to Embodiment 1 of the present invention. The crystalline semiconductor thin film formation apparatus 100 according to the present embodiment crystallizes an amorphous semiconductor thin film such as the amorphous silicon thin film 13 using the laser light 30 shaped to have the light intensity distribution as shown in FIG. 3B and.

As shown in FIG. 11, the crystalline semiconductor thin film formation apparatus 100 is an apparatus for crystallizing a silicon thin film using a CW laser light, and includes a substrate support unit 110, a laser light oscillation unit 120, an optical system unit 130, and a control unit 140 having a scanning control unit 141 and a laser light intensity distribution adjustment unit 142.

The substrate support unit 110 is a stage supporting the substrate 10 on which an amorphous silicon thin film to be crystallized is formed. On a surface 10S of the substrate 10 that is an irradiation surface to be irradiated with the laser light 30, an amorphous silicon film (a non-crystalline silicon film) is formed as the amorphous silicon thin film, for example.

The laser light oscillation unit 120 is a laser light source that oscillates the laser light 30 used for crystallizing the amorphous silicon thin film. The laser light oscillation unit 120 according to the present embodiment includes four semiconductor laser devices. Each of the semiconductor laser devices oscillates laser light having a bilaterally-symmetric unimodal light intensity distribution. For example, the semiconductor laser device may continuously oscillate blue laser light or green laser light having a wavelength of 405 nm to 632 nm on the order of micro seconds (μsec), such as 10 (μsec) to 100 (μsec).

The optical system unit 130 includes a plurality of beam shaping lenses. The optical system unit 130 is configured to: shape the laser light 30 oscillated from the laser light oscillation unit 120 into a beam having a predetermined intensity distribution; and irradiate a predetermined area on the silicon thin film with the laser light 30. In the present embodiment, the optical system unit 130 includes a homogenizer 131, a condenser lens 132, and a diffractive optical element (DOE) lens 133. As the beam shaping lenses, a lens for shaping a beam profile in the major axis direction and a lens for shaping a beam profile in the minor axis direction may be separately provided.

The scanning control unit 141 of the control unit 140 controls the substrate support unit 110 or the optical system unit 130 in order for the laser light 30 used for irradiating the amorphous silicon thin film to relatively scan this silicon thin film. As shown in FIG. 3A, the scanning control unit 141 according to the present embodiment moves the substrate 10 by performing control to cause the substrate support unit 110 to move to a predetermined position.

Moreover, the laser light intensity distribution adjustment unit 142 performs beam shaping in order for the laser light 30 to have a predetermined intensity distribution. The laser light intensity distribution adjustment unit 142 according to the present embodiment adjusts the lenses included in the optical system unit 130 to shape the laser light 30 oscillated from the laser light oscillation unit 120, thereby causing the laser light 30 to have the light intensity distribution as shown in FIG. 3B.

The crystalline semiconductor thin film formation apparatus 100 may additionally include an optical component, such as a mirror or a condenser lens, and may also include a beam profiler for measuring a beam profile of the laser light. By measuring the beam profile using the beam profiler, the laser light intensity distribution adjustment unit 142 can adjust, for example, the positions of the lenses of the optical system unit 130 in order for the laser light used for irradiating the silicon thin film to have a desired light intensity distribution.

[Method for Manufacturing Thin-Film Device]

Figure 12A:
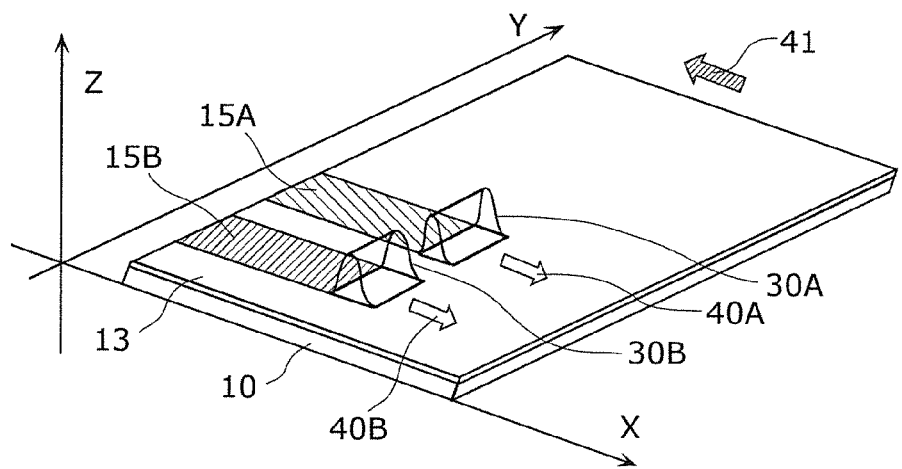
FIG. 12A is a perspective view schematically showing irradiation of a thin film to be crystallized with laser light in a method of manufacturing a thin-film device according to Embodiment 1 of the present invention.
Figure 12B:
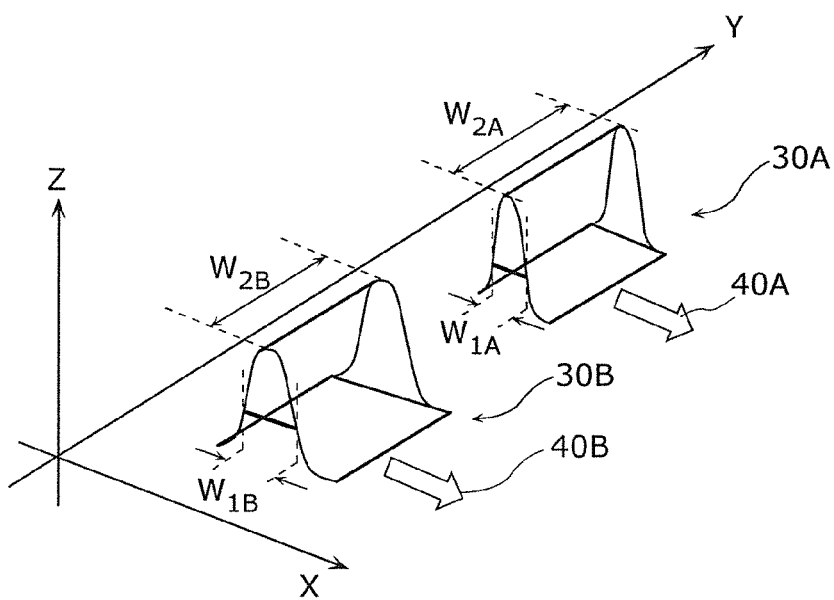
FIG. 12B is a diagram showing an intensity distribution of laser light used in a step of crystallization in the method of manufacturing a thin-film device according to Embodiment 1 of the present invention.

Next, a method of manufacturing a thin-film device according to Embodiment 1 of the present invention is described, with reference FIG. 12A and FIG. 12B. FIG. 12A is a perspective view schematically showing irradiation of a thin film to be crystallized with laser light in the method of manufacturing a thin-film device according to Embodiment 1 of the present invention. FIG. 12B is a diagram showing an intensity distribution of laser light used in a step of crystallization in the method of manufacturing a thin-film device according to Embodiment 1 of the present invention.

The method of manufacturing a thin-film device according to the present embodiment includes: a step of preparing a substrate; a step of forming an amorphous silicon thin film on the substrate; a step of crystallizing a part of the amorphous silicon thin film through relative scan of the amorphous silicon thin film irradiated with first light (a first light beam) at a predetermined speed; and a step of crystallizing another part of the amorphous thin film through relative scan of the amorphous thin film irradiated with second light (a second light beam) at a predetermined speed.

The step of crystallizing with a first light beam and the step of crystallizing with a second light beam can be performed using the above method of forming a crystalline thin film. In the step of crystallizing with a first light beam, irradiation is performed on the crystalline silicon thin film 13 through relative scan of the crystalline silicon thin film 13 irradiated with a first laser light 30A in a predetermined scanning direction as shown in FIG. 12A. In the present embodiment, as shown in this diagram, the position of the first laser light 30A is positionally fixed, and the first laser light 30A performs scanning in a first scanning direction 40A while the substrate 10 is moved in the first direction 41 in the X axis direction.

Moreover, in the step of crystallizing with a second light beam, a part of the amorphous silicon thin film 13 that is different from the part irradiated with the first laser light 30A is irradiated, while being relatively scanned, with second laser light 30B in a predetermined scanning direction. In the present embodiment, the position of the second laser light 30B is fixed, and the second laser light 30B performs scanning in a second scanning direction 40B while the substrate 10 is moved in the first direction 41 in the X axis direction.

In the present embodiment, the first scanning direction 40A and the second scanning direction 40B are the same direction, and each of the first and second scanning directions 40A and 40B is a second direction opposite to the first direction 41 in the X axis direction.

As shown in FIG. 12B, each of the first laser light 30A and the second laser light 30B is shaped similarly to the case shown in FIG. 3B. The light intensity distribution in the minor axis (X axis) direction is a bell-shaped distribution that is the Gaussian distribution. The light intensity distribution in the major axis (Y axis) direction is a flat-top distribution. For example, a CW laser configured with a semiconductor laser emitting green light having a wavelength of 532 nm can be used for each of the first laser light 30A and the second laser light 30B.

Moreover, the width of the first laser light 30A in the first scanning direction 40A is set to be smaller than the width of the second laser light in the second scanning direction 40B. To be more specific, a beam minor axis width (FWHM) $W_{1A}$ of the first laser light 30A is smaller than a beam minor axis width (FWHM) $W_{1B}$ of the second laser light 30B. Note here that a major axis width $W_{2A}$ of the first laser light 30A and a major axis width $W_{2B}$ of the second laser light 30B are equal to each other.

When laser irradiation is performed on the amorphous silicon thin film 13 using the first laser light 30A and the second laser light 30B structured as described above, each of projections of the first laser light 30A and the second laser light 30B on the amorphous silicon thin film 13 has a substantially rectangular shape having a major axis in the direction perpendicular to the first scanning direction 40A (to the second scanning direction 40B).

Then, in the step of crystallizing with a first light beam, a part of the amorphous silicon thin film 13 is irradiated with the first laser light 30A to be crystallized into a first crystalline silicon thin film 15A. As with the crystalline silicon thin film 15 shown in FIG. 2, the first crystalline silicon thin film 15A includes a first crystallized area having: a strip-shaped first area 51 extending in the direction crossing the first scanning direction 40A of the first laser light 30A; and a second area 52 adjacent to the strip-shaped first area 51 and different from the strip-shaped first area in average grain size.

In this case, the conditions for laser irradiation corresponding to the region D or D shown in FIG. 4 can be used for crystallizing the amorphous silicon thin film 13, for example. With this, the amorphous silicon thin film 13 is crystallized to have a grain structure including a crystallized area where the strip-shaped first areas 51 are formed at irregular pitches (the grain structure shown in FIG. 5C) or a grain structure including a crystallized area where the strip-shaped first areas 51 are formed at regular pitches (the grain structure shown in FIG. 5D).

For example, suppose that the first laser light 30A is emitted under the conditions for laser irradiation corresponding to the region D in FIG. 4, or more specifically, suppose that laser irradiation is performed under the conditions that the minor axis width $W_{1A}$ of the first laser light 30A satisfies the relationship expressed as "beam minor axis width $W_{1A} \leq 0.06*$scanning speed". In this case, the first crystalline silicon thin film 15A is formed to have the grain structure including the crystallized area where the strip-shaped first areas 51 are formed at regular pitches (the grain structure shown in FIG. 5D).

On the other hand, in the step of crystallizing with a second light beam, another part of the amorphous silicon thin film 13 is irradiated with the second laser light 30B to be crystallized into a second crystalline silicon thin film 15B. The second crystalline silicon thin film 15B includes a second crystallized area different from the first crystallized area in grain structure.

In this case, the conditions for laser irradiation corresponding to the region B or C shown in FIG. 4 can be used for crystallizing the amorphous silicon thin film 13, for example. With this, the amorphous silicon thin film 13 is crystallized to have a grain structure where the strip-shaped first area 51 is not formed (the grain structure shown in FIG. 5B) or a grain structure including a crystallized area where the strip-shaped first areas 51 are formed at irregular pitches (the grain structure shown in FIG. 5C).

For example, suppose that the second laser light 30B is emitted under the conditions for laser irradiation corresponding to the region B or C shown in FIG. 4, or more specifically, suppose that laser irradiation is performed under the conditions that the minor axis width $W_{1A}$ of the first laser light 30A satisfies the relationship expressed as "minor axis width $W_{1A} > 0.06*$scanning speed". In this case, the second crystalline silicon thin film 15B is formed to have the grain structure where the strip-shaped first area 51 is not formed (the grain structure shown in FIG. 5B) or the grain structure including the crystallized area where the strip-shaped first areas 51 are formed at irregular pitches (the grain structure shown in FIG. 5C). In the present embodiment, laser irradiation is performed under the conditions for laser irradiation corresponding to the region B shown in FIG. 4 and, as a result, the second crystalline silicon thin film 15B is formed to have the grain structure where the strip-shaped first area 51 is not formed (the grain structure shown in FIG. 5B).

With the method of forming a thin-film device according to Embodiment 1 of the present invention as described thus far, when an amorphous silicon thin film is crystallized, the first crystalline silicon thin film 15A and the second crystalline silicon thin film 15B different in grain structure can be easily formed by laser irradiation using the first laser light 30A and the second laser light 30B different in minor axis width, even when the scanning speed is the same between the first laser light 30A and the second laser light 30B. To be more specific, by adjusting the minor axis widths of the laser lights, the crystalline silicon thin film having different grain structures can be easily formed.

In the present embodiment, when the scanning speed of the laser and the power density of the laser are constant, the following can be separately formed by adjusting the size of the minor axis width with the irradiation time of 60 (μsec) being the limit as described above: the grain structure where the strip-shaped first areas 51 are formed at regular pitches (the grain structure shown in FIG. 5D); and the grain structure where the strip-shaped first areas 51 are formed at irregular pitches (the grain structure shown in FIG. 5C) or the grain structure where the strip-shaped first area 51 is not formed (the grain structure shown in FIG. 5B). To be more specific, in FIG. 4, with the condition satisfying "beam minor axis width=0.06*scanning speed" being the limit, the crystalline silicon thin film having different grain structures can be formed.

Accordingly, a first device unit including the first crystalline silicon thin film 15A and a second device unit including the second crystalline silicon thin film 15B are formed. Thus, the thin-film device including the first device unit and the second device unit different in device characteristics can be easily manufactured.

[Thin-Film Device]

Figure 13:
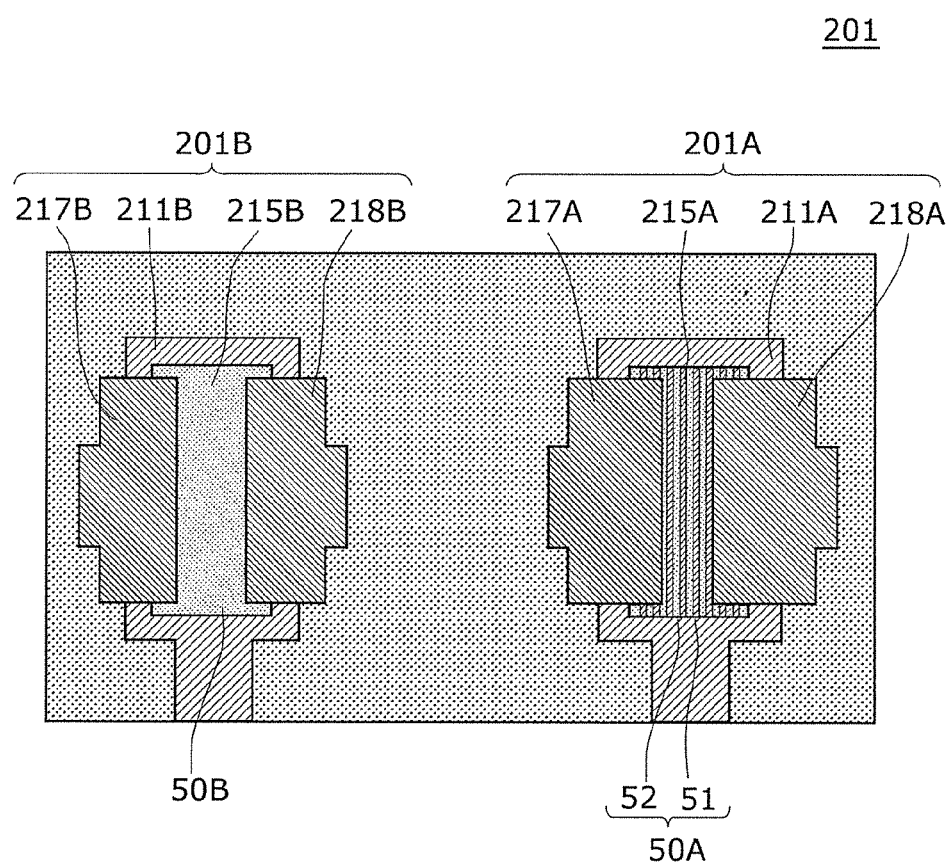
FIG. 13 is a plan view of a thin-film device according to Embodiment 1 of the present invention.

Next, the thin-film device according to Embodiment 1 of the present invention is described, with reference to FIG. 13. FIG. 13 is a plan view of the thin-film device according to Embodiment 1 of the present invention.

A thin-film device 201 according to the present embodiment can be manufactured by the aforementioned manufacturing method. As shown in FIG. 13, the thin-film device 201 includes a first device unit 201A and a second device unit 201B, and also includes a first crystalline silicon thin film (a first thin film) 215A and a second crystalline silicon thin film (a second thin film) 215B which are formed on a substrate.

The first crystalline silicon thin film 215A of the first device unit 201A has a first crystallized area 50A including a strip-shaped first area 51 and a second area 52 that is adjacent to the strip-shaped first area and different from the strip-shaped first area 51 in average grain size. The first crystalline silicon thin film 215A is formed by a method similar to the aforementioned method used for forming the first crystalline silicon thin film 15A. To be more specific, the first crystalline silicon thin film 215A can be formed by crystallizing an amorphous silicon thin film using the first laser light 30A.

On the other hand, the second crystalline silicon thin film 215B of the second device unit 201B has a second crystallized area 50B (a third area) that is different from the first crystallized area 50A in grain structure. The second crystalline silicon thin film 215B is formed by a method similar to the aforementioned method used for forming the second crystalline silicon thin film 15B. To be more specific, the second crystalline silicon thin film 215B can be formed by crystallizing an amorphous silicon thin film using the second laser light 30B.

In the present embodiment, the first device unit 201A is a TFT including, as a channel, at least a part of the strip-shaped first area 51 of the first crystalline silicon thin film 215A (the first crystallized area 50A). The first device unit 201A includes a first gate electrode 211A, a first source electrode 217A, and a first drain electrode 218A. Moreover, the second device unit 201B is a TFT including, as a channel, the second crystallized area 50B of the second crystalline silicon thin film 215B. The second device unit 201B includes a second gate electrode 211B, a second source electrode 217B, and a second drain electrode 218B. For example, a bottom-gate type or top-gate type TFT can be used for each of the first device unit 201A and the second device unit 201B.

Figure 14A:
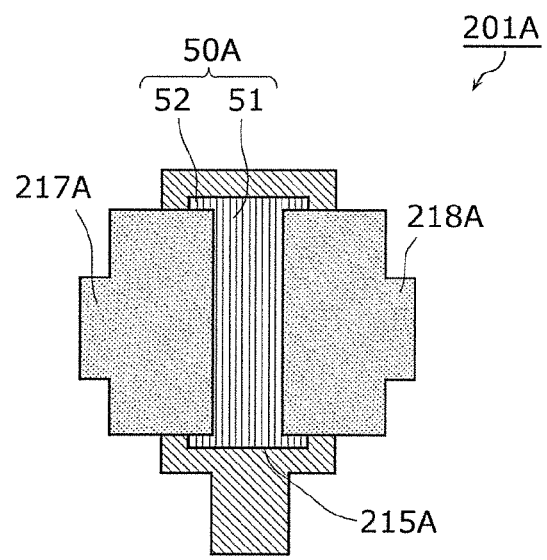
FIG. 14A is a schematic diagram showing a configuration of a first device unit of the thin-film device according to Embodiment 1 of the present invention.
Figure 14B:
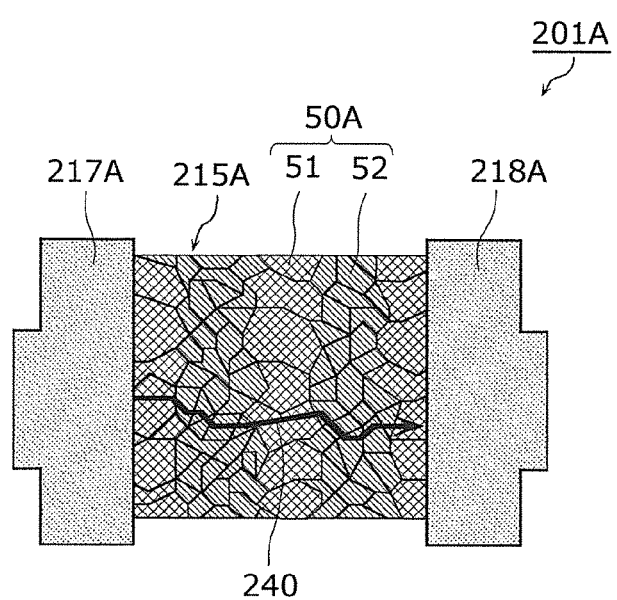
FIG. 14B is a diagram explaining the mobility of charge carriers in the first device unit of the thin-film device according to Embodiment 1 of the present invention.

Here, the first device unit 201A is described in detail, with reference to FIG. 14A and FIG. 14B. FIG. 14A is a schematic diagram showing a configuration of the first device unit of the thin-film device according to Embodiment 1 of the present invention. FIG. 14B is a diagram explaining the charge carrier mobility in this first device unit.

As shown in FIG. 14A, in the first device unit 201A according to the present embodiment, the first crystalline silicon thin film 215A is formed to have, as a channel direction, a direction crossing the longitudinal direction of the strip-shaped first area 51. Moreover, the direction in which the first source electrode 217A and the first drain electrode 218A are arranged side by side is substantially perpendicular to the longitudinal direction of the strip-shaped first area 51. Here, the channel direction refers to the direction in which the source electrode and the drain electrode are arranged side by side and is the horizontal direction on the plane of the diagram of FIG. 14A or FIG. 14B.

As shown in FIG. 14B, the first crystalline silicon thin film 215A of the first device unit 201A includes: the first areas 51 each of which is a band of crystal grains that are large in grain size; and the second areas 52 each of which is a band of crystal grains that are smaller in average grain size than in the first area 51. The first crystalline silicon thin film 215A includes a plurality of crystal grain boundaries each of which is a boundary between crystal grains. Here, when electrons (or charge carriers) pass through a plurality of crystal grains, this means that the electrons pass through the crystal grain boundaries existing between the crystal grains. The number of crystal grain boundaries is proportional to the number of crystal grains. Since crystal grain boundaries are defects in a crystal structure, the charge carriers are easily trapped at the crystal grain boundaries. When the grain size is larger, the number of crystal grain boundaries is smaller. Thus, the probability that the electrons are trapped is reduced and, as a result, the charge carrier mobility is increased. On the other hand, when the grain size is smaller, the number of crystal grain boundaries is larger. Thus, the probability that the electron is trapped is increased and, as a result, the charge carrier mobility is reduced.

In the present embodiment, since the first crystalline silicon thin film 215A includes the first area 51 where the grain size is larger as shown in FIG. 14B, the number of crystal grain boundaries can be reduced. As a result, the probability that the charge carriers are trapped is reduced and, therefore, the charge carrier mobility can be increased. In this way, in the first device unit 201A, the average grain size in the strip-shaped first area 51 is larger than the average grain size in the second area 52. Accordingly, the first device unit excellent in charge carrier mobility can be implemented.

Moreover, in the present embodiment, the channel direction of the first device unit 201A is substantially perpendicular to the strip-shaped first areas 51 formed in the first crystalline silicon thin film 215A as shown in FIG. 14B, the charge carriers moving in the first crystalline silicon thin film 215A pass through the second area 52 where the grain size is small. Here, the second area 52 having the small grain size includes a large number of crystal grain boundaries at which the charge carriers are to be trapped as described above. Thus, a large number of crystal grain boundaries are present in the second area 52 on a carrier transfer pathway 240 between the source electrode and the drain electrode. This increases the probability that the charge carriers may be trapped, thereby reducing the charge carrier mobility.

Figure 15A:
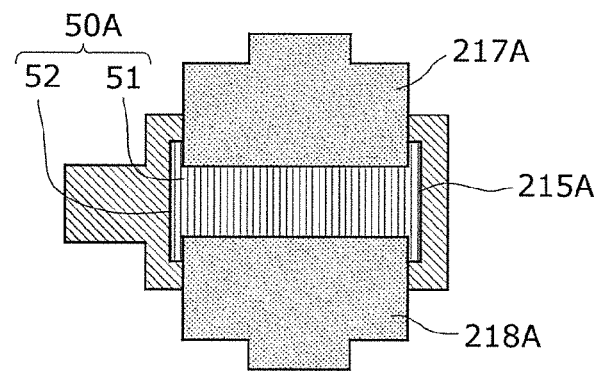
FIG. 15A is a schematic diagram showing a configuration of a first device unit of a thin-film device in a modification according to Embodiment 1 of the present invention.
Figure 15B:
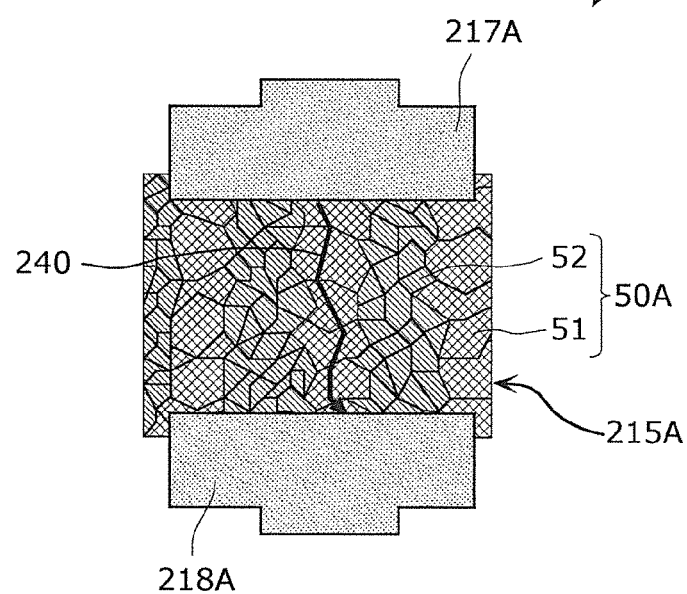
FIG. 15B is a diagram explaining the mobility of charge carriers in the first device unit of the thin-film device according to Embodiment 1 of the present invention.

On account of this, it is preferable for the first crystalline silicon thin film 215A to be formed to have, as the channel direction, a direction substantially parallel to the longitudinal direction of the strip-shaped first areas 51, as shown in FIG. 15A and FIG. 15B. FIG. 15A is a schematic diagram showing a configuration of a first device unit of a thin-film device in a modification according to Embodiment 1 of the present invention. FIG. 15B is a diagram explaining the charge carrier mobility in this first device unit.

As shown in FIG. 15A and FIG. 15B, in the first device unit 201A, the direction in which the first source electrode 217A and the first drain electrode 218A are arranged side by side is substantially parallel to the longitudinal direction of the strip-shaped first area 51 in order for the channel direction to be substantially parallel to the longitudinal direction of the strip-shaped first area 51 of the first crystalline silicon thin film 215A. Thus, the charge carriers moving in the first silicon thin film 215A can pass through the first area 51 where the grain size is large and the number of crystal grain boundaries is small, instead of passing through the second area 52 where the grain size is small and the number of crystal grain boundaries is large. Therefore, as compared with the case shown in FIG. 15A and FIG. 15B, the number of crystal grain boundaries is smaller on the carrier transfer pathway 240 between the source electrode and the drain electrode. This reduces the probability that the charge carriers may be trapped, thereby increasing the charge carrier mobility.

As described thus far, the first crystalline silicon thin film 215A has the first crystallized area 50A including the first areas 51 having the strip-shaped grain structure, and the second crystalline silicon thin film 215B has the second crystallized areas 50B different from the first crystallized areas 50A in grain structure. The thin-film device 201 according to the present embodiment includes the two device units which are: the first device unit 201A having the first crystalline silicon thin film 215A as the channel; and the second device unit 201B having the second crystalline silicon thin film 215B as the channel. As a result, the thin-film device including the first device unit 201A and the second device unit 201B different in device characteristics can be easily implemented.

Moreover, in the present embodiment, the average grain size of the crystal grains in the second crystallized area (the third area) 50B of the second crystalline silicon thin film 215B included in the second device unit 201B is smaller than the average grain size of the crystal grains in the strip-shaped first area 51 of the first crystalline silicon thin film 215A (the first crystallized area 50A) included in the first device unit 201A. Furthermore, in the present embodiment, the average grain size of the crystal grains in the second crystallized area (the third area) 50B of the second crystalline silicon thin film 215B included in the second device unit 201B is smaller than the average grain size of the crystal grains in the strip-shaped first area 51 of the first crystalline silicon thin film 215A (the first crystallized area 50A) included in the first device unit 201A. With this, the charge carrier mobility in the channel of the first device unit 201A can be increased. Therefore, the first device unit 201A can be implemented as a TFT superior to the second device unit 201B in ON-state current characteristics.

Furthermore, in the present embodiment, each of the strip-shaped first areas 51 includes the crystal grains that are in contact with each of the adjacent second areas 52. On this account, as the first device unit, a TFT that is excellent in ON-state current characteristics and in uniformity with less variation in charge carrier mobility can be implemented.

Moreover, in the present embodiment, the first crystallized area 50A of the first crystalline silicon thin film 215A included in the first device unit 201A has the grain structure where the strip-shaped first areas 51 are formed at regular pitches (the grain structure shown in FIG. 5D). Furthermore, the second crystallized area 50B of the second crystalline silicon thin film 215B included in the second device unit 201B has the grain structure where the strip-shaped first area 51 is not formed (the grain structure shown in FIG. 5B) or the grain structure where the strip-shaped first areas 51 are formed at irregular pitches (the grain structure shown in FIG. 5C). Thus, the first device unit 201A is superior to the second device unit 201B in charge carrier mobility characteristics. Hence, the thin-film device 201 including the TFT (the first device unit 201A) excellent in ON-state current characteristics can be implemented.

Here, it is more preferable for the first crystalline silicon thin film 215A of the first device unit 201A to be formed under the conditions for laser irradiation corresponding to the region D shown in FIG. 4. When the amorphous silicon thin film 213 is crystallized under the conditions corresponding to the region D to form the first crystalline silicon thin film 215A, the strip-shaped first areas 51 can be formed at regular pitches. With this, the TFT array including the TFTs having TFT characteristics excellent in in-plane uniformity can be implemented.

Moreover, it is preferable for the strip-shaped first areas 51 in the first device unit 201A to be continuous within the length of the channel area. With this, the charge carrier mobility can be further increased and, therefore, the ON-state current characteristics can be further enhanced. Furthermore, the crystalline silicon thin film excellent in uniformity can be implemented.

[OLED Display Device]

Figure 16:
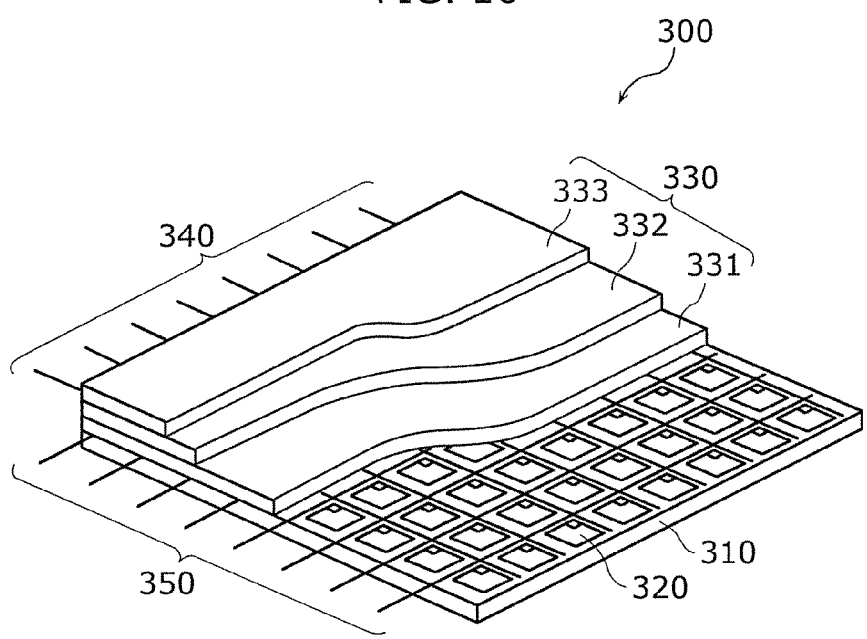
FIG. 16 is a partly-cutaway perspective view showing an OLED display device according to Embodiment 1 of the present invention.

The following describes an example where the thin-film device 201 described above according to Embodiment 1 is applied to a display device, with reference to FIG. 16. The present embodiment describes an example where the thin-film device 201 is applied to an OLED display device 300.

FIG. 16 is a partly-cutaway perspective view showing the OLED display device according to Embodiment 1 of the present invention. By forming, on a substrate, a plurality of thin-film devices 201 configured as described above, a thin-film device array substrate can be formed. The thin-film device array substrate can be used as an active matrix substrate of the OLED display device. The thin-film device 201 can be used as a TFT included in a pixel circuit.

As shown in FIG. 16, the OLED display device 300 includes: an active matrix substrate 310; a plurality of pixels 320 arranged in a matrix on the active matrix substrate 310; an OLED device 330 formed corresponding to each of the pixels 320; a plurality of scanning lines (gate lines) 340 formed along the direction of rows the pixels; a plurality of video signal lines (data lines) 350 perpendicular to the scanning lines 340 and formed along the direction of columns of the pixels 320; and power lines (current supply lines) 360 formed in parallel to the video signal lines 350. In FIG. 16, the power lines 360 are not illustrated.

The OLED device 330 includes an anode 331, an OLED layer 332, and a cathode (a transparent electrode) 333 which are laminated in this order on the active matrix substrate 310. Here, in reality, a plurality of anodes 331 are formed corresponding to the pixels 320. A plurality of OLED layers 332 are also formed corresponding to the pixels 320. Moreover, layers such as an electron transport layer, a light-emitting layer, and a hole transport layer are laminated.

Figure 17:
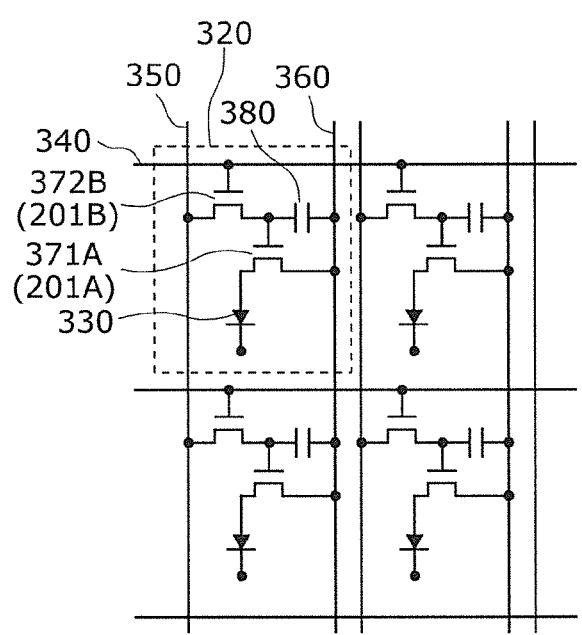
FIG. 17 is a diagram showing a circuit configuration of a pixel including a thin-film device according to Embodiment 1 of the present invention.
Figure 18:
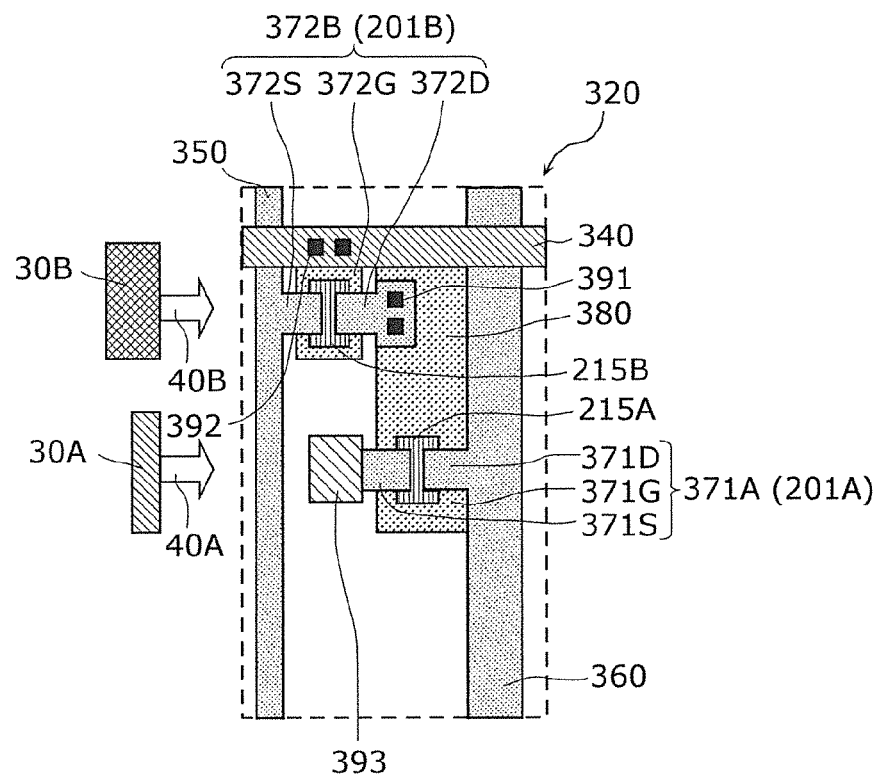
FIG. 18 is a plan view showing a configuration of a unit pixel included in the OLED display device according to Embodiment 1 of the present invention.

Next, the circuit configuration of the pixel 320 included in the OLED display device 300 described above is explained, with reference to FIG. 17 and FIG. 18. FIG. 17 is a diagram showing the circuit configuration of the pixel including the thin-film device according to Embodiment 1 of the present invention. FIG. 18 is a plan view showing a configuration of a unit pixel included in the OLED display device according to Embodiment 1 of the present invention.

As shown in FIG. 17 and FIG. 18, the pixels 320 are partitioned by the scanning lines 340 and the video signal lines 350 perpendicular to each other. Each of the pixels 320 includes a driver transistor 371A, a switching transistor 372B, a condenser (capacitor) 380, and an OLED device 330.

The driver transistor 371A is a transistor for driving the current pixel 320. The driver transistor 371A according to the present embodiment is the first device unit 201A included in the thin-film device 201 and drives the OLED device 330. As shown in FIG. 18, in the driver transistor 371A: a first gate electrode 371G is connected to a second drain electrode 372D of the switching transistor 372B via a contact hole 391; a first drain electrode 371D is connected to the power line 360; and a first source electrode 371S is connected to the anode of the OLED device 330 (see FIG. 16) via a relay electrode 393.

Moreover, the switching transistor 371B is a transistor for selectively switching the pixel to be driven among the pixels 320, or more specifically, a transistor for selecting the pixel 320 to be supplied with a video signal voltage among the pixels 320. The switching transistor 371B according to the present embodiment is the second device unit 201B included in the thin-film device 201 and selectively switches the OLED device 330 to emit light among the OLED devices 330. As shown in FIG. 18, in the switching transistor 372B: a second gate electrode 372G is connected to the scanning line 340 via a contact hole 392; a second source electrode 372S is connected to the video signal line 350; and a second drain electrode 372D is connected to the condenser 380 and the first gate electrode 371G of the driver transistor 371A.

With this configuration, when the scanning line 340 receives a gate signal and the switching transistor 372B is turned to the ON state, a video signal voltage supplied via the video signal line 350 is written to the condenser 380. The video signal voltage written to the condenser 380 is held during one frame period. With this held video signal voltage, the conductance of the driver transistor 371A is changes in an analog fashion. Then, a drive current corresponding to a luminous gradation flows from the anode to the cathode of the OLED device 330 and, as a result, the OLED device 330 emits light.

Figure 19:
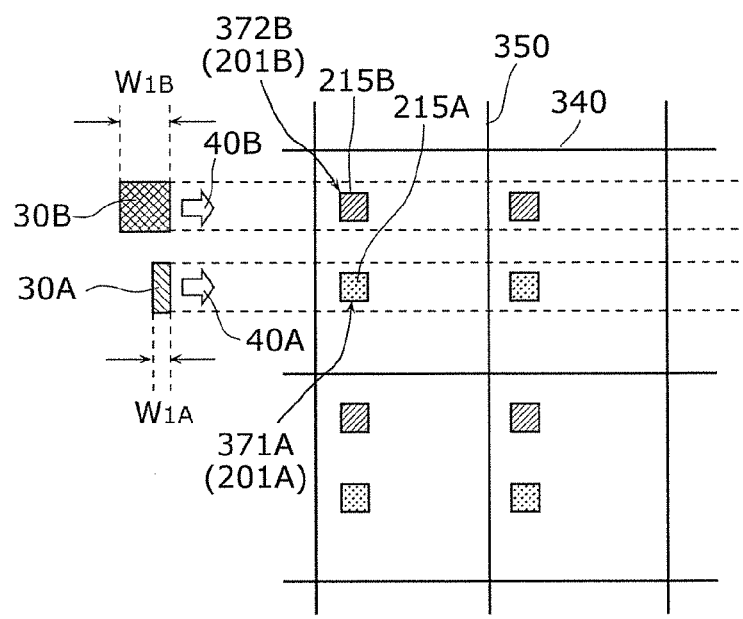
FIG. 19 is a schematic diagram showing a method of manufacturing a driver transistor and a switching transistor included in the OLED display device according to Embodiment 1 of the present invention.

Next, a method of manufacturing a driver transistor and a switching transistor included in an OLED display device according to Embodiment 1 of the present invention is described based on FIG. 19 with reference to FIG. 18. FIG. 19 is a schematic diagram showing the method of manufacturing a driver transistor and a switching transistor included in an OLED display device according to Embodiment 1 of the present invention.

In the method of manufacturing a driver transistor and a switching transistor according to the present embodiment, a crystalline silicon thin film included as a channel layer in each of the transistors is manufactured according to the aforementioned method of manufacturing a thin-film device.

To be more specific, as shown in FIG. 18 and FIG. 19, when a crystalline silicon thin film is formed as the channel layer of the driver transistor 371A (the first device unit 201A), an amorphous silicon thin film is crystallized using the first laser light 30A. On the other hand, when a crystalline silicon thin film is formed as the channel layer of the switching transistor 372B, an amorphous silicon thin film is crystallized using the second laser light 30B.

The conditions for laser irradiation for crystallizing the amorphous silicon thin film for the driver transistor 371A include the minor-axis width and the scanning speed that fall within the conditions corresponding to the region C or D shown in FIG. 4. With this, the driver transistor can be formed to include, as the channel layer, the first crystalline silicon thin film 215A having the grain structure where the strip-shaped first areas 51 are larger than the second areas 52 in average grain size (the grain structure shown in FIG. 5C or FIG. 5D).

Moreover, the conditions for laser irradiation for crystallizing the amorphous silicon thin film for the switching transistor 372B (the second device unit 201B) include the minor-axis width and the scanning speed that fall within the conditions corresponding to the region B or C shown in FIG. 4. With this, the switching transistor can be formed to include, as the channel layer, the second crystalline silicon thin film 215B having the grain structure where the strip-shaped first area 51 is not formed (the grain structure shown in FIG. 5B) or the grain structure including a crystallized area where the strip-shaped first areas 51 are formed at irregular pitches (the grain structure shown in FIG. 5C).

Then, in the present embodiment, laser irradiation is performed under the condition that the first laser light 30A is shorter in beam minor-axis width than the second laser light 30B. In the present embodiment, the amorphous silicon thin film is irradiated with the first and second laser lights 30A and 30B at the same time under the condition that the first laser light 30A is equal to the second laser light 30B in scanning speed.

As a result, the driver transistor 371A and the switching transistor 372B are accordingly manufactured. The driver transistor 371A includes, as the channel, the first crystalline silicon thin film 215A having the first crystallized area 50A including the strip-shaped first areas 51 larger in grain size. Moreover, the switching transistor 372B includes, as the channel, the second crystalline silicon thin film 215B having the second crystallized area 50B where the grain size is smaller than in the strip-shaped first areas 51.

Therefore, the driver transistor 371A excellent in ON-state current characteristics and the switching transistor 372B superior to the driver transistor 371A in OFF-state current characteristics can be manufactured. In this way, the method of manufacturing a thin-film device according to the present embodiment is based on the relationship shown in FIG. 4 between the minor axis width of the laser light and the grain structure of the resulting crystalline silicon thin film. Thus, by using the laser beams different in the minor axis width, the crystalline silicon thin film having different grain structures can be easily formed even when the scanning speeds of the laser beams are constant.

[Method of Manufacturing TFT]

Next, a method of manufacturing a TFT according to Embodiment 1 of the present invention is described. The method of manufacturing a TFT according to the present embodiment includes: preparing a substrate (a step of preparing a substrate); forming a gate electrode above the substrate (a step of forming a gate electrode); forming a gate insulating film above the substrate (a step of forming a gate insulating film); forming a source electrode and a drain electrode above the substrate (a step of forming a source electrode and a drain electrode); forming a silicon thin film above the substrate (a step of forming a silicon thin film); crystallizing the silicon thin film in a peripheral area on the substrate using a first light beam (a step of crystallizing with a first light beam); and crystallizing the silicon thin film in an inner area on the substrate using a second light beam (a step of crystallizing with a second light beam).

The step of crystallizing with a first light beam and the step of crystallizing with a second light beam included in the method of manufacturing a TFT according to the present embodiment are the same as the step of crystallizing with a first light beam and the step of crystallizing with a second light beam, respectively, included in the aforementioned method of manufacturing a thin-film device array substrate.

Moreover, TFTs are classified under two types in configuration which are, for example, the bottom-gate type configuration and the top-gate type configuration. A bottom-gate type TFT has a stack including, from the bottom, the gate electrode, the gate insulating film, and the channel layer (the silicon semiconductor film) in this order. On the other hand, a top-gate type TFT has a stack including, from the bottom, the channel layer, the gate insulating film, and the gate electrode in this order. Methods of manufacturing bottom-gate type and top-gate type TFTs are specifically described as follows, with reference to the drawings.

[Method of Manufacturing Bottom-Gate Type TFT]

Figure 20:
FIG. 20 (a)-(e) shows cross-sectional views schematically showing steps of a method of manufacturing a bottom-gate type TFT according to Embodiment 1 of the present invention.
Figure 20:
Figure 20:
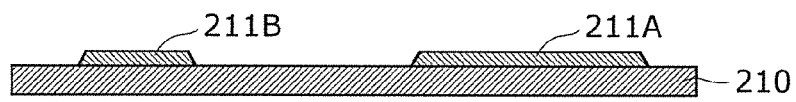
Figure 20:
Figure 20:
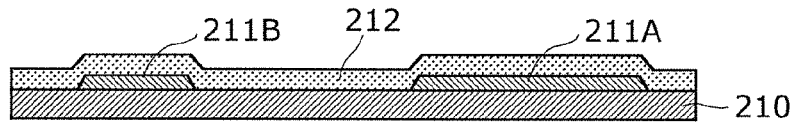
Figure 20:
Figure 20:
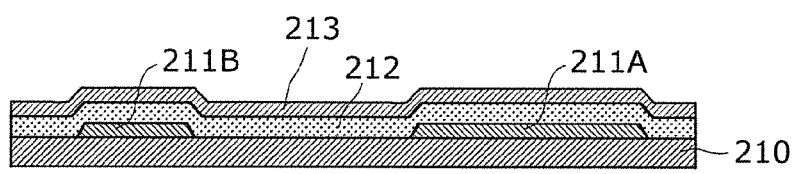
Figure 20:
Figure 20:
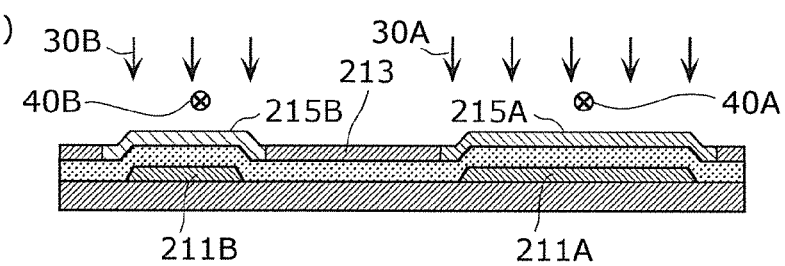
Figure 21:
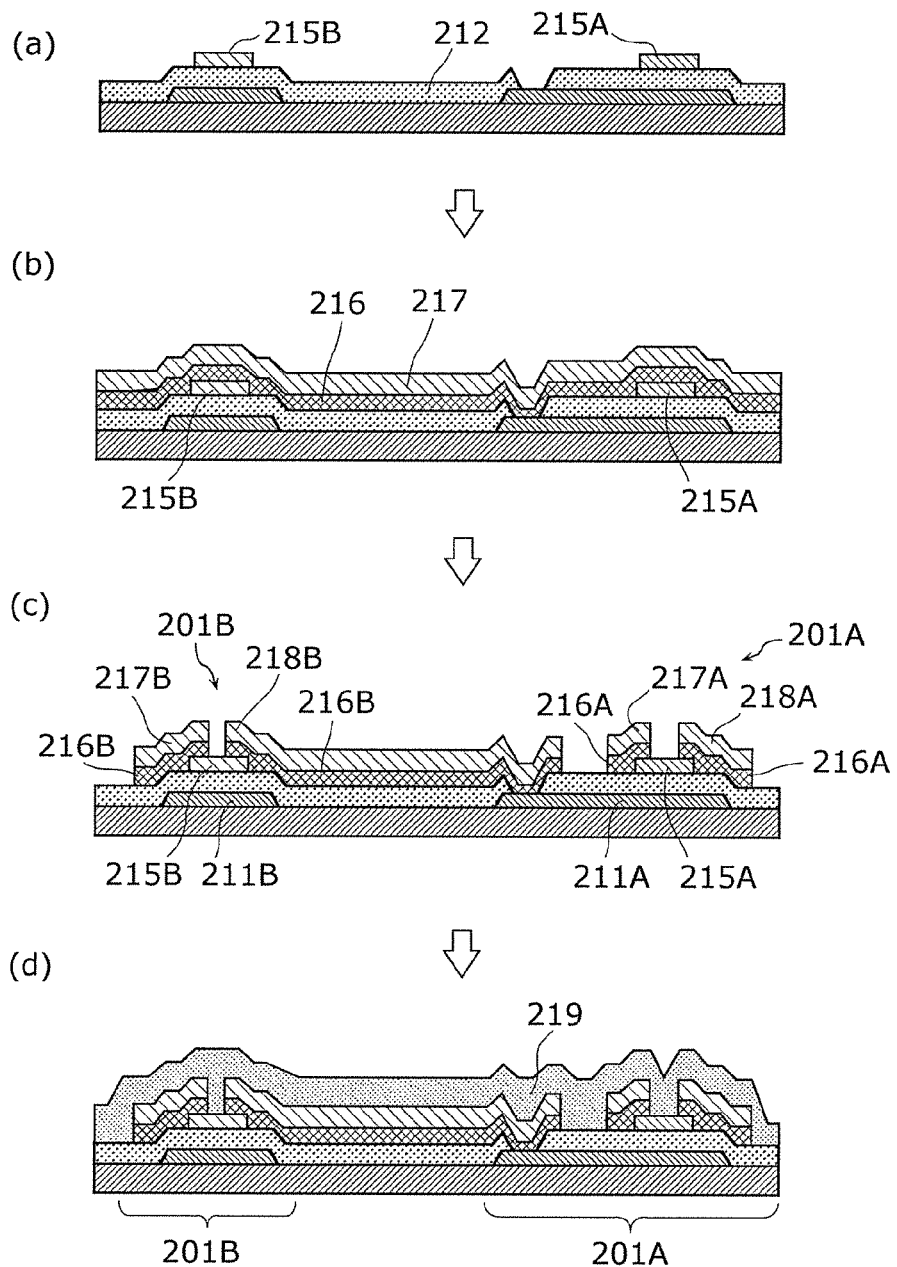
FIG. 21 (a)-(d) shows cross-sectional views schematically showing steps of a method of manufacturing a bottom-gate type TFT according to Embodiment 1 of the present invention.

Firstly, the method of manufacturing a bottom-gate type TFT according to Embodiment 1 of the present invention is described, with reference to FIG. 20 and FIG. 21. Each of FIG. 20 and FIG. 21 shows cross-sectional views schematically showing steps of the method of manufacturing a bottom-gate type TFT according to Embodiment 1 of the present invention. The present embodiment describes the case where a first TFT (the first device unit 201A) and a second TFT (the second device unit 201B) different in grain structure of the channel layer are manufactured.

As shown in (a) of FIG. 20, a substrate 210 is prepared (the step of preparing a substrate). As the substrate 210, a glass substrate can be used for example. In the step of preparing a substrate, an undercoat film comprising an insulating film such as a silicon oxide film or a silicon nitride film may be formed on the substrate 210.

Next, as shown in (b) of FIG. 20, a first gate electrode 211A and a second gate electrode 211B are formed by patterning performed above the substrate 210 (the step of forming a gate electrode). The first gate electrode 211A and the second gate electrode 211B are located at different positions and formed away from each other. For example, a gate metal film having a thickness of 10 nm to 500 nm is formed entirely above the substrate 210 by sputtering. The gate metal film comprises one of, or an alloy of, molybdenum (Mo), tungsten (W), copper (Cu), silver (Ag), aluminum (Al), chromium (Cr), titanium (Ti), and tantalum (Ta). Then, patterning is performed on the gate metal film by photolithography and wet etching to form the first gate electrode 211A and the second gate electrode 211B in predetermined shapes.

Next, as shown in (c) of FIG. 20, a gate insulating film 212 is formed above the substrate 210 (the step of forming a gate insulating film). For example, the gate insulating film 212 having a film thickness of 10 nm to 500 nm is formed entirely above the substrate 210 by plasma chemical-vapor deposition (CVD) to cover the first gate electrode 211A and the second gate electrode 211B. The gate insulating film 212 comprises an insulating film such as a silicon oxide ($SiO_x$) film, a silicon nitride ($SiN_y$) film, or a silicon oxynitride (SiON) film. Here, the gate insulating film may have a single-layer structure or a multilayer structure.

Next, as shown in (d) of FIG. 20, the amorphous silicon thin film 213 is formed above the substrate 210 (the step of forming a silicon thin film). The amorphous silicon thin film 213 is formed opposite to the first gate electrode 211A and the second gate electrode 211B with the gate insulating film 212 in between. For example, an amorphous silicon film having a thickness of 10 nm to 200 nm is formed as the amorphous silicon thin film 213 on the gate insulating film 212 by plasma CVD.

Next, as shown in (e) of FIG. 20, the amorphous silicon thin film 213 above the first gate electrode 211A is crystallized through relative scan with the first laser light 30A at a predetermined speed in the first scanning direction 40A while the amorphous silicon thin film 213 is being irradiated from above the first gate electrode 211A (the step of crystallizing with a first laser beam). Moreover, as shown in this diagram, the amorphous silicon thin film 213 above the second gate electrode 211B is crystallized through relative scan with the second laser light 30B at a predetermined speed in the second scanning direction 40B while the amorphous silicon thin film 213 is being irradiated from above the second gate electrode 211B (the step of crystallizing with a second laser beam). These steps can be performed similarly to the step of crystallizing with a first light beam and the step of crystallizing with a second light beam in the aforementioned method of manufacturing a thin-film device. To be more specific, laser irradiation is performed under the condition that the first laser light 30A is smaller in beam minor axis width than the second laser light 30B. Here, also in the present embodiment, the first laser light 30A is equal to the second laser light 30B in scanning speed, and the amorphous silicon thin film 213 is irradiated with these laser beams at the same time. For example, laser irradiation is performed using the first laser light 30A and the second laser light 30 B as shown in FIG. 18.

To be more specific, the amorphous silicon thin film 213 located above the first gate electrode 211A is irradiated with the first laser light 30A under the conditions for laser irradiation corresponding to the region C or D shown in FIG. 4. As a result, the amorphous silicon thin film 213 located above the first gate electrode 211A is crystallized into the first crystalline silicon thin film 215A having the crystallized area (the first crystallized area 50A) including the strip-shaped first areas 51 and the strip-shaped second areas 52 both extending in the direction crossing the scanning direction of the first laser light 30A as shown in FIG. 5C or FIG. 5D. To be more specific, the amorphous silicon thin film 213 located above the first gate electrode 211A is crystallized to have the grain structure including the crystallized area where the strip-shaped first areas 51 are formed at irregular pitches (the grain structure shown in FIG. 5C) or the grain structure including the crystallized area where the strip-shaped first areas 51 are formed at regular pitches (the grain structure shown in FIG. 5D). The first crystalline silicon thin film 215A according to the present embodiment is formed to have the grain structure including the crystallized area where the strip-shaped first areas 51 are formed at regular pitches (the grain structure shown in FIG. 5D).

On the other hand, in the step of crystallizing with a second light beam, the amorphous silicon thin film 213 located above the second gate electrode 211B is irradiated with the second laser light 30B under the conditions for laser irradiation corresponding to the region B or C shown in FIG. 4. As a result, the amorphous silicon thin film 213 located above the second gate electrode 211B is crystallized into the second crystalline silicon thin film 215B including the second crystallized area 50B having the grain structure as shown in FIG. 5B or FIG. 5C that is different from the first crystallized area 50A of the first crystalline silicon thin film 215A. The second crystalline silicon thin film 215B according to the present embodiment is formed to have the grain structure where the strip-shaped first area 51 is not formed (the grain structure shown in FIG. 5B).

Next, as shown in (a) of FIG. 21, pattering is selectively performed on the amorphous silicon thin film 213 crystallized with laser irradiation, by photolithography and wet etching to form each of the first crystalline silicon thin film 215A and the second crystalline silicon thin film 215B in the shape of an island. As a result, the first crystalline silicon thin film 215A is formed opposite to the first gate electrode 211A with the gate insulating film 212 in between. Moreover, the second crystalline silicon thin film 215B is formed opposite to the second gate electrode 211B with the gate insulating film 212 in between.

After this, as shown in this diagram, contact holes may be formed in the gate insulating film 212 in order for the first gate electrode 211A of the first TFT (the first device unit 201A) to be connected to the second drain electrode 218B of the second TFT (the second device unit 201B) as described later.

Next, as shown in (b) of FIG. 21, by doping the amorphous silicon film with dopant such as phosphorus in the film formation by plasma CVD, a contact layer 416 that is an $n^+$ layer doped with dopant and having a thickness of 10 nm to 100 nm is formed, as a first contact layer 216A and a second contact layer 216B. After this, as shown in this diagram, a source-drain metal film 217 having a three-layer structure of MoW, Al, and MoW is formed on the contact layer 416 by sputtering.

Next, as shown in (c) of FIG. 21, patterning is performed on the source-drain metal film 217 by photolithography and wet etching to form a pair of the first source electrode 217A and the first drain electrode 218A and a pair of the second source electrode 217B and the second drain electrode 218B (the step of forming a source electrode and a drain electrode).

After this, the contact layer 216 is divided by dry etching, leaving (or removing) a resist for patterning the source-drain metal film 217, to form a pair of first contact layers 216A opposite to each other and a pair of second contact layers 216B opposite to each other. As a result, the first TFT (the first device unit 201A) and the second TFT (the second device unit 201B) can be manufactured as shown in this diagram.

After this, as shown in (d) of FIG. 21, a passivation film 219 comprising an inorganic material such as SiN may be formed on the pair of the first source electrode 217A and the first drain electrode 218A and the pair of the second source electrode 217B and the second drain electrode 218B to entirely cover the first TFT and the second TFT.

The present embodiment describes, as an example, the method of manufacturing a channel-etched type TFT. However, the present embodiment can be applied to a channel-stopper type (channel protection type) TFT including a channel protection film formed on the first crystalline silicon thin film 215A and the second crystalline silicon thin film 215B.

Moreover, in the present embodiment, the gate insulating film of the first TFT (the first device unit 201A) and the gate insulting film of the second TFT (the second device unit 201B) are formed into the gate insulating film 212 as a single common film. However, a gate insulating film may be separately formed for each of the device units (such as a first insulating film and a second gate insulating film).

As described thus far, by using the method of manufacturing a TFT according to the present embodiment, the first TFT (the first device unit 201A) and the second TFT (the second device unit 201B) different in TFT characteristics can be easily manufactured based on the fact that the crystalline silicon thin film having different grain structures can be formed according to a difference in minor axis width between the laser beams.

Moreover, in the present embodiment, as the condition for laser irradiation to crystallize the amorphous silicon thin film 213, the beam minor axis widths of the two laser beams are controlled according to the condition corresponding to the regions B to D shown in FIG. 4. As a result, the first crystalline silicon thin film 215A can be formed to have the grain structure including the strip-shaped first areas 51 larger in average grain size than the second area 52 (the grain structure shown in FIG. 5C or FIG. 5D). At the same time, the second crystalline silicon thin film 215B can be formed to have the grain structure where the strip-shaped first area 51 is not formed (the grain structure shown in FIG. 5B). Thus, the following can be formed at the same time: the first crystalline silicon thin film 215A having the first crystallized area 50A including the strip-shaped first areas 51 larger in grain size; and the second crystalline silicon thin film 215B having the second crystallized area 50B where the grain size is smaller than in the strip-shaped first areas 51. Hence, the first TFT (the first device unit 201A) excellent in ON-state current characteristics and the second TFT (the second device unit 201B) superior to the first TFT in OFF-state current characteristics can be manufactured at a higher throughput.

[Method of Manufacturing Top-Gate Type TFT]

Figure 22:
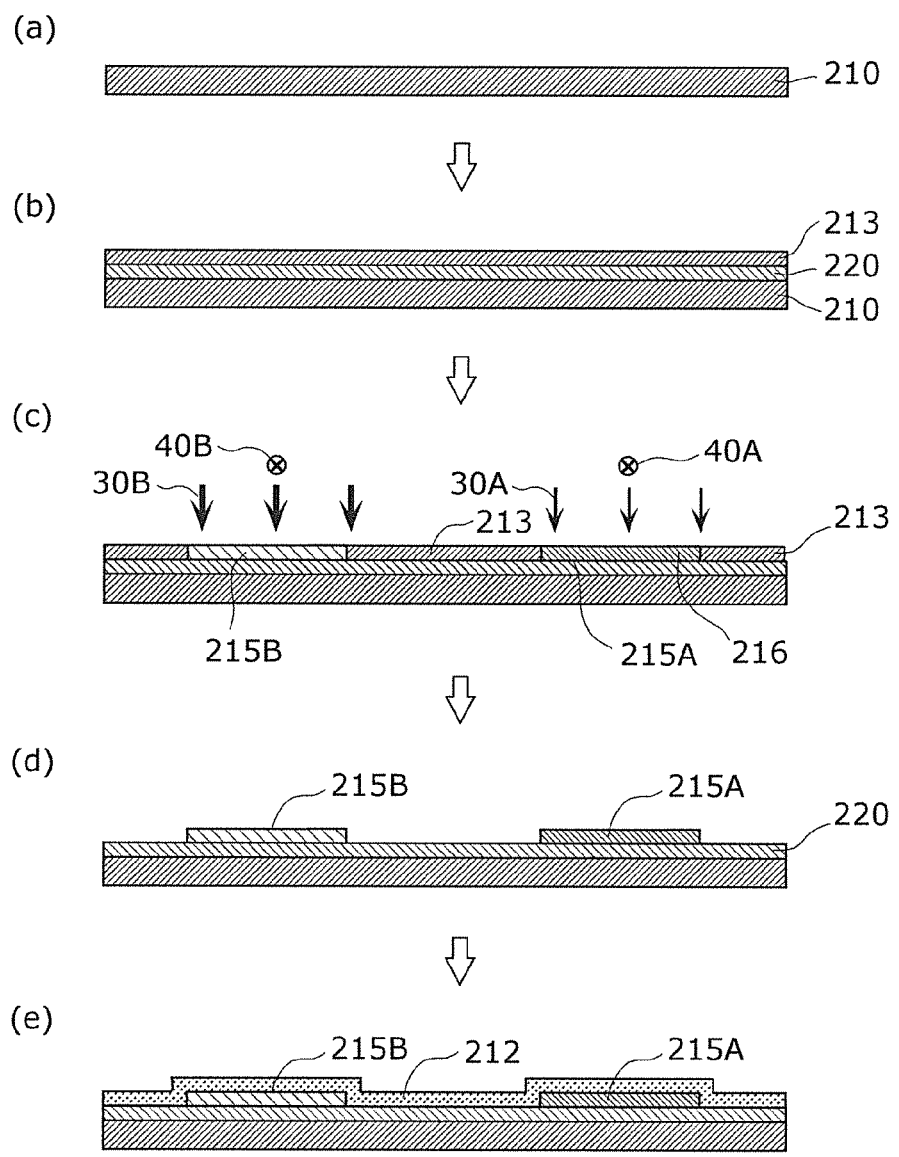
FIG. 22 (a)-(e) shows cross-sectional views schematically showing steps of a method of manufacturing a top-gate type TFT according to Embodiment 1 of the present invention.
Figure 23:
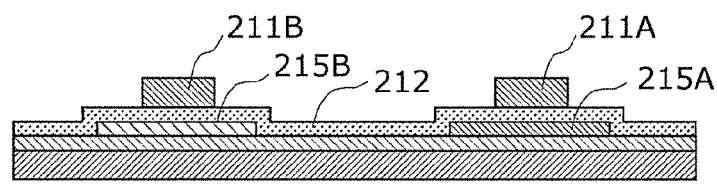
FIG. 23 (a)-(d) shows cross-sectional views schematically showing steps of a method of manufacturing a top-gate type TFT according to Embodiment 1 of the present invention.
Figure 23:
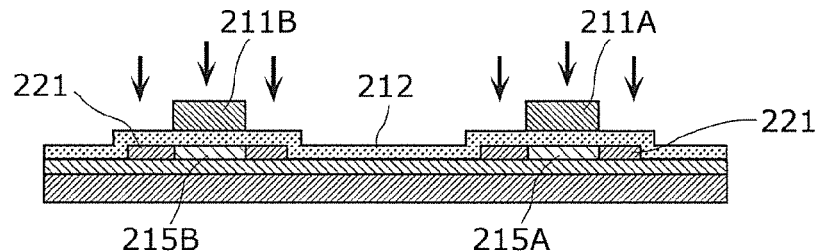
Figure 23:
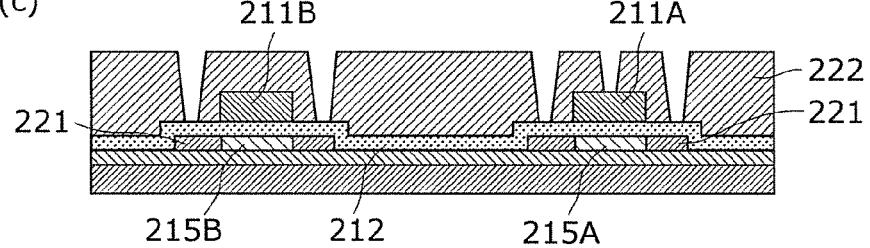
Figure 23:
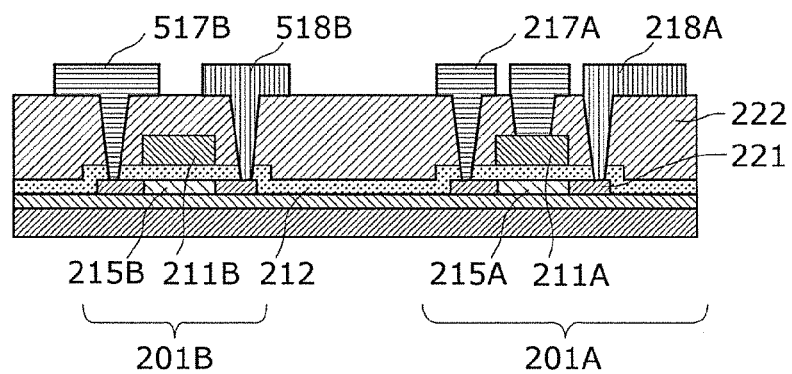

Next, a method of manufacturing a top-gate type TFT according to Embodiment 1 of the present invention is described, with reference FIG. 22 and FIG. 23. Each of FIG. 22 and FIG. 23 shows cross-sectional views schematically showing steps of the method of manufacturing a top-gate type TFT according to Embodiment 1 of the present invention.

As shown in (a) of FIG. 22, a substrate 210 is prepared (a step of preparing a substrate). As the substrate 210, a glass substrate can be used for example.

Next, as shown in (b) of FIG. 22, an undercoat film 220 comprising an insulating film such as a silicon oxide film or a silicon nitride film is formed above the substrate 210. After this, as shown in this diagram, an amorphous silicon thin film 213 is formed above the substrate 210 (a step of forming a silicon thin film). For example, an amorphous silicon film is formed as the amorphous silicon thin film 213 on the undercoat film 220 by plasma CVD or the like.

Next, as shown in (c) of FIG. 22, the amorphous silicon thin film 213 is crystallized through relative scan with the first laser light 30A and the second laser light 30B in the first scanning direction 40A and the second scanning direction 40B, respectively. The amorphous silicon thin film 213 is irradiated by the first laser light 30A and the second laser light 30B at respective predetermined regions on the amorphous silicon thin film 213. As a result, the amorphous silicon thin film 213 is crystallized to include a first crystalline silicon thin film 215A and a second crystalline silicon thin film 215B (a step of forming a silicon thin film). This step is performed similarly to the step of crystallizing with a first light beam and the step of crystallizing with a second light beam in the method of manufacturing a bottom-gate type TFT as shown in (e) of FIG. 20. Accordingly, the strip-shaped first areas 51 are formed in the first crystalline silicon thin film 215A and in the second crystalline silicon thin film 215B in the direction substantially perpendicular to the first scanning direction 40A and the second scanning direction 40B.

Next, as shown in (d) of FIG. 22, pattering is selectively performed on the amorphous silicon thin film 213 crystallized with laser irradiation, by photolithography and wet etching to form each of the first crystalline silicon thin film 215A and the second crystalline silicon thin film 215B in the shape of an island.

Next, as shown in (e) of FIG. 22, a gate insulating film 212 is formed above the substrate 210 (a step of forming a gate insulating film). For example, the gate insulating film 212 comprising an insulating film such as a silicon dioxide film is formed entirely above the substrate 210 by plasma CVD to cover the first gate electrode 211A and the second gate electrode 211B which are island-shaped.

Next, as shown in (a) of FIG. 23, a first gate electrode 211A and a second gate electrode 211B are formed by patterning performed on the substrate 210 (a step of forming a gate electrode). For example, a gate metal film comprising, for instance, molybdenum-tungsten (MoW) is formed entirely above the substrate 210 by sputtering. Then, pattering is performed on the gate metal film by photolithography and wet etching to form the first gate electrode 211A and the second gate electrode 211B in predetermined shapes above the first crystalline silicon thin film 215A and the second crystalline silicon thin film 215B, respectively, via the gate insulating film 212. As a result, the first silicon thin film 215A is formed opposite to the first gate electrode 211A with the gate insulating film in between. Moreover, the second crystalline silicon thin film 215B is formed opposite to the second gate electrode 211B with the gate insulating film 212 in between.

Next, as shown in (b) of FIG. 23, lightly doped drain (LDD) areas 221 are formed by lightly doping both end portions of each of the first crystalline silicon thin film 215A and the second crystalline silicon thin film 215B with dopant. Here, the first gate electrode 211A and the second gate electrode 211B serve as masks.

Next, as shown in (c) of FIG. 23, an interlayer insulating film 222 is formed above the substrate 210. For example, the interlayer insulating film 222 comprising an insulating film such as a silicon dioxide film is formed entirely above the substrate 210 by plasma CVD or the like to cover the first gate electrode 211A, the second gate electrode 211B, and the gate insulating film 212. After this, in order for the LDD areas 221 not to be exposed, contact holes are formed in the interlayer insulating film 222 as shown in this diagram.

Next, as shown in (d) of FIG. 23, a pair of a first source electrode 217A and a second drain electrode 218A and a pair of a second source electrode 217B and a second drain electrode 218B are formed on the interlayer insulating film 222 to fill in the contact holes of the interlayer insulating film 222. As a result, the first TFT (the first device unit 201A) and the second TFT (the second device unit 201B) can be manufactured as shown in this diagram.

Also in the case of the top-gate type TFT, the gate insulating film of the first TFT (the first device unit 201A) and the gate insulting film of the second TFT (the second device unit 201B) are formed into the gate insulating film 212 as a single common film. However, a gate insulating film may be separately formed for each of the device units (such as a first insulating film and a second gate insulating film).

As described thus far, the method of manufacturing a top-gate type TFT according to the present embodiment has an effect similar to the effect of the method of manufacturing a bottom-gate type TFT. To be more specific, the first TFT (the first device unit 201A) and the second TFT (the second device unit 201B) different in TFT characteristics can be easily manufactured also by the method of manufacturing a top-gate type TFT according to the present embodiment, based on the fact that the crystalline silicon thin film having different grain structures can be formed according to a difference in minor axis width between the laser beams.

Example of Embodiment 1

Next, an example of the method of manufacturing a bottom-gate type TFT according to Embodiment 1 of the present embodiment is explained, with reference to FIG. 20 and FIG. 21 described above. Here, although explained based on the steps of manufacturing a bottom-gate type TFT, the example can be applied to the steps of manufacturing a top-gate type TFT.

Firstly, as shown in (a) of FIG. 20, a glass substrate is prepared as the substrate 210. Then, an undercoat (not illustrated) comprising an insulating film of a silicon oxide film and having a thickness of 500 nm is formed on the glass substrate by plasma CVD. After this, a metal film comprising molybdenum-tungsten (MoW) is deposited with a thickness of 50 nm on the undercoat film by sputtering. Then, patterning is performed on the metal film to form the first gate electrode 211A and the second gate electrode 211B as shown in (b) of FIG. 20. Following this, as shown in (c) of FIG. 20, the gate insulating film 212 comprising a laminated film including a 65-nm-thick silicon oxide film and a 70-nm-thick silicon nitride film is formed on the first gate electrode 211A and the second gate electrode 211B by plasma CVD. On this film, as shown in (d) of FIG. 20, the amorphous silicon thin film 213 comprising an amorphous silicon film is further formed with a thickness of 55 nm by continuous deposition. After this, the hydrogen content atomic percentage of the amorphous silicon film is set to 3.0 atomic percent or lower by dehydrogenation treatment performed at 500° C.

After this, as shown in (e) of FIG. 20, the substrate 210 on which the amorphous silicon thin film 213 is formed is fixed onto the substrate support unit (stage) 110 of the crystalline semiconductor thin film formation apparatus 100 shown in FIG. 11 and then the amorphous silicon thin film 213 (the amorphous silicon film) is irradiated with the first laser light 30A and the second laser light 30B different in beam minor axis width. As a result, the amorphous silicon thin film 213 is selectively crystallized to include the first crystalline silicon thin film 215A and the second crystalline silicon thin film 215B.

In the present example, as the conditions for the first laser light 30A and the second laser light 30B, each of the power densities is 90 (kW/cm$^2$) and each of the scanning speed is 500 (mm/s). Moreover, as for the first laser light 30A, the beam minor axis width is 15 (μm) and the irradiation time is 35 (μsec). As for the second laser light 30B, the beam minor axis width is 32 (μm) and the irradiation time is 64 (μsec).

Figure 24A:
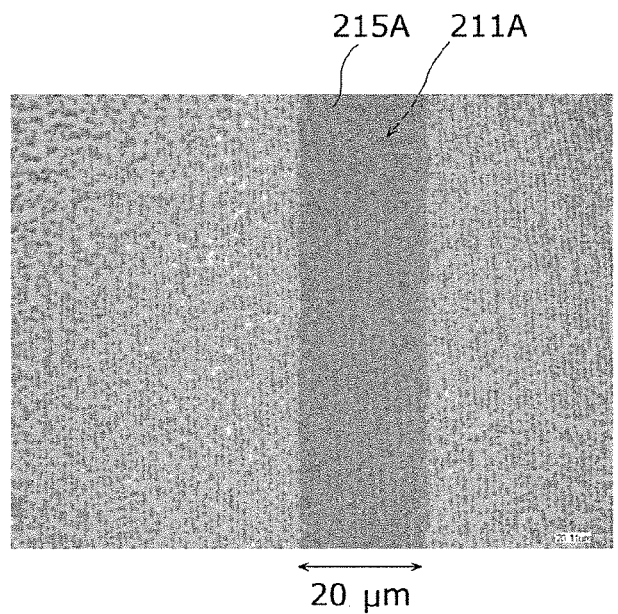
FIG. 24A shows an optical microscopic image of a crystalline silicon thin film crystallized by first laser light around a first gate electrode.
Figure 24B:
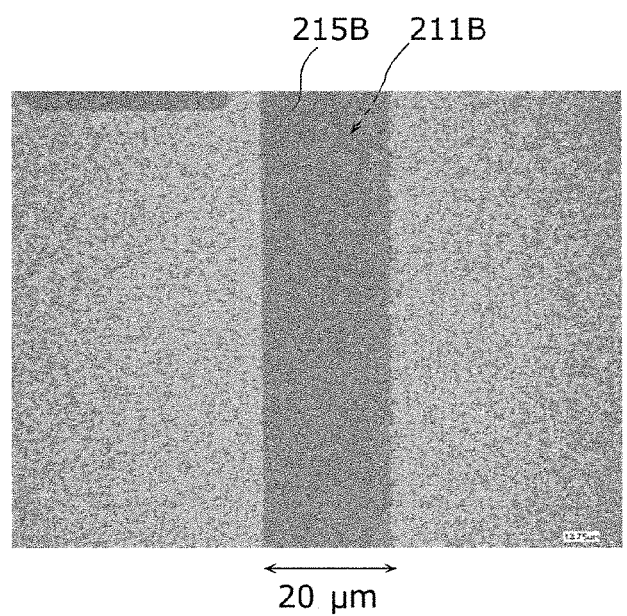
FIG. 24B shows an optical microscopic image of a crystalline silicon thin film crystallized by second laser light around a second gate electrode.

In this case, the crystalline silicon thin film 213 above the first gate electrode 211A is crystallized by the first laser light 30A to form the first crystalline silicon thin film 215A including the first crystallized area having the grain structure where the strip-shaped first areas 51 are formed at regular pitches (the grain structure shown in FIG. 5D) as shown in FIG. 24A. Moreover, the crystalline silicon thin film 213 above the second gate electrode 211B is crystallized by the second laser light 30B to form the second crystalline silicon thin film 215B including the second crystallized area having the grain structure where the strip-shaped first area 51 is not formed (the grain structure shown in FIG. 5B) as shown in FIG. 24B.

FIG. 24A shows an optical microscopic image of the crystalline silicon thin film crystallized by first laser light around the first gate electrode 211A (having a gate line width of 20 μm). FIG. 24B shows an optical microscopic image of the crystalline silicon thin film crystallized by the second laser light around the second gate electrode 211B (having a gate line width of 20 μm).

Figure 25A:
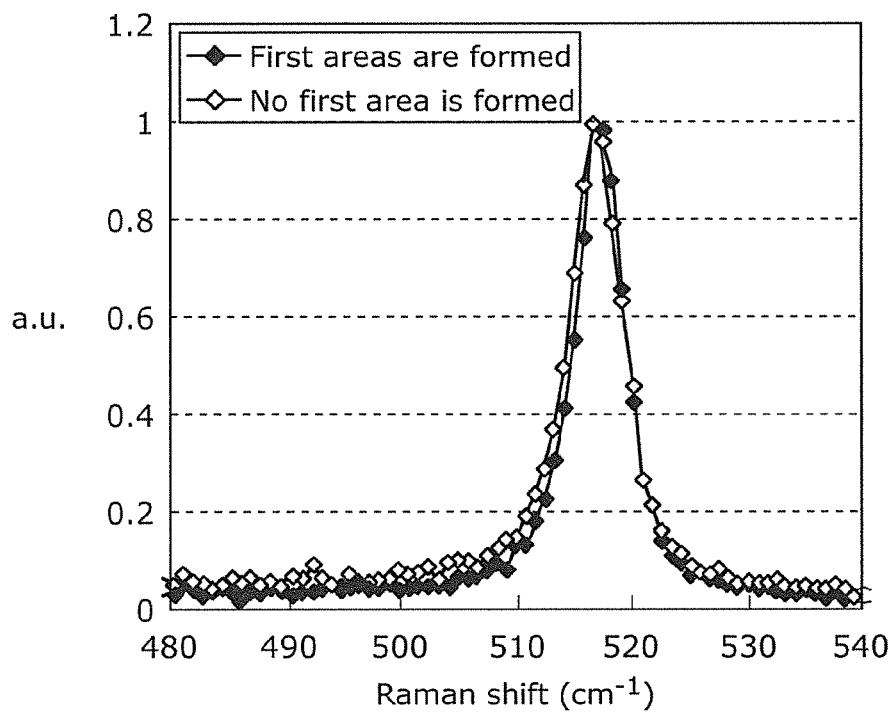
FIG. 25A is a diagram showing Raman shift spectra obtained by Raman spectroscopy, for each of a first crystalline silicon thin film (where first areas are formed) and a second crystalline silicon thin film (where no first area is formed).
Figure 25B:
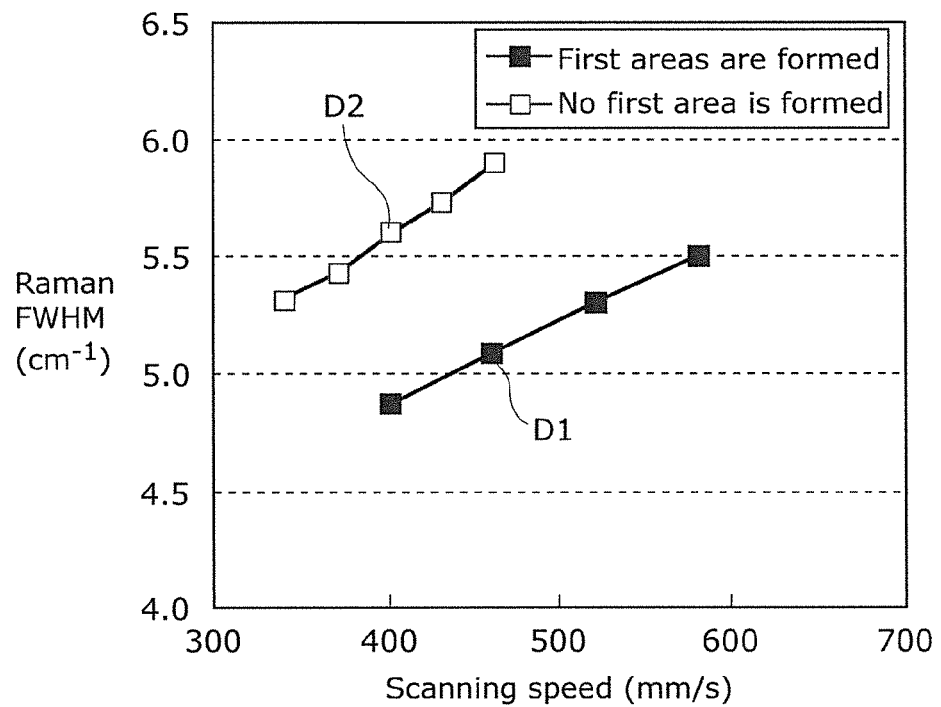
FIG. 25B is a diagram showing a relationship between the scanning speed of the laser and the full width at half maximum (FWHM) of a peak spectrum of a crystalline silicon component (c-Si) having around 520 cm$^{-1}$ as the Raman shift obtained by Raman spectroscopy as shown in FIG. 25A, for each of the first crystalline silicon thin film (where the first areas are formed) and the second crystalline silicon thin film (where no first area is formed).

Here, a Raman FWHM with respect to the scanning speed of the laser light is described in relation to the first crystalline silicon thin film 215A (where both the first areas 51 and the second areas 52 are formed) and the second silicon thin film 215B (where only the second area 52 is formed with no first area 51), with reference to FIG. 25A and FIG. 25B.

FIG. 25A is a diagram showing Raman shift spectra obtained by Raman spectroscopy, for each of the first crystalline silicon thin film 215A (where first areas are formed) and the second crystalline silicon thin film 215B (where no first area is formed). FIG. 25B is a diagram showing a relationship between the scanning speed of the laser and the full width at half maximum (FWHM) of a peak spectrum of a crystalline silicon component (c-Si) having around 520 cm$^{-1}$ as the Raman shift obtained by Raman spectroscopy as shown in FIG. 25A, for each of the first crystalline silicon thin film 215A (where the first areas are formed) and the second crystalline silicon thin film 215B (where no first area is formed).

In FIG. 25A, as the measurement conditions for Raman spectroscopic analysis: the measurement position is located on the crystalline silicon thin film above the gate electrode; the excitation wavelength is 532 nm; the measurement spot diameter is 1.3 μmφ; and the wavenumber resolution is 1.5 cm$^{-1}$. Note that each of data points shown in FIG. 25B indicates the average value of 120 points on the crystalline silicon thin film above the gate electrode. FIG. 25A shows an example of the result obtained for one point among the 120 points, at each of the point D1 and the point D2 shown in FIG. 25B.

As can be seen from the result shown in FIG. 25B, the first crystalline silicon thin film 25A is smaller than the second crystalline silicon thin film 215B in the FWHM of the Raman scattering peak spectrum. Such a smaller Raman FWHM indicates that the grain structure of the crystalline silicon thin film includes silicon particles larger in grain size.

Moreover, as shown in FIG. 25B, the FWHM of the Raman shift peak in the first crystalline silicon thin film 215A is 4.8 cm$^{-1}$ to 5.5 cm$^{-1}$, inclusive. To be more specific, when the FWHM of the Raman shift peak in the first crystalline silicon thin film 215A is 4.8 cm$^{-1}$ to 5.5 cm$^{-1}$, inclusive, the crystalline silicon thin film can have the grain structure including the strip-shaped first areas 51 where the grain size is large.

Next, referring back to FIG. 20, patterning is performed, by photolithography and wet etching, on the substrate on which the first crystalline silicon thin film 215A and the second crystalline silicon thin film 215B shown in (e) of FIG. 20 are formed. As a result, each of the first crystalline silicon thin film 215A and the second silicon thin film 215B is formed in the shape of an island, as shown in (a) of FIG. 21.

Next, as shown in (b) of FIG. 21, an intrinsic amorphous silicon film (not illustrated) is formed with a thickness of 50 nm by, for example, plasma CVD. Following this, also by plasma CVD, the contact layer 416 is formed with a thickness of 30 nm on the amorphous silicon film. The contact layer 416 is an n$^+$ layer comprising an amorphous silicon film doped with dopant such as phosphorus. After this, as shown in this diagram, the source-drain metal film 217 having a three-layer structure of MoW (50 nm), Al (400 nm), and MoW (50 nm) is formed on the contact layer 216 by sputtering.

Next, patterning is performed to divide the source-drain metal film 217 by photolithography and dry etching to form the pair of the first source electrode 217A and the first drain electrode 218A and the pair of the second source electrode 217B and the second drain electrode 218B.

Next, the contact layer 216 is divided by dry etching, leaving a resist for patterning the source-drain metal film 217, to form the pair of the first contact layers 216A opposite to each other and the pair of the second contact layers 216B opposite to each other as shown in (c) of FIG. 21. After this, the resist is removed. As a result, the bottom-gate type first TFT (the first device unit 201A) and the bottom-gate type second TFT (the second device unit 201B) can be manufactured.

After this, a silicon nitride film may be formed with a thickness of 400 nm by, for example, plasma CVD. Then, contact holes may be formed in the silicon nitride film by photolithography and dry etching. Following this, an indium tin oxide (ITO) film serving as a transparent electrode may be deposited with a thickness of 100 nm by sputtering, and then patterning may be performed on the ITO film by photolithography and dry etching.

The first TFT (the first device unit 201A) manufactured as described to have the grain structure where the strip-shaped first areas 51 are formed can be used as a driver transistor. Moreover, the second TFT (the second device unit 201B) that does not include the strip-shaped first area 51 can be used as a switching transistor.

Figures 26A, 26B:
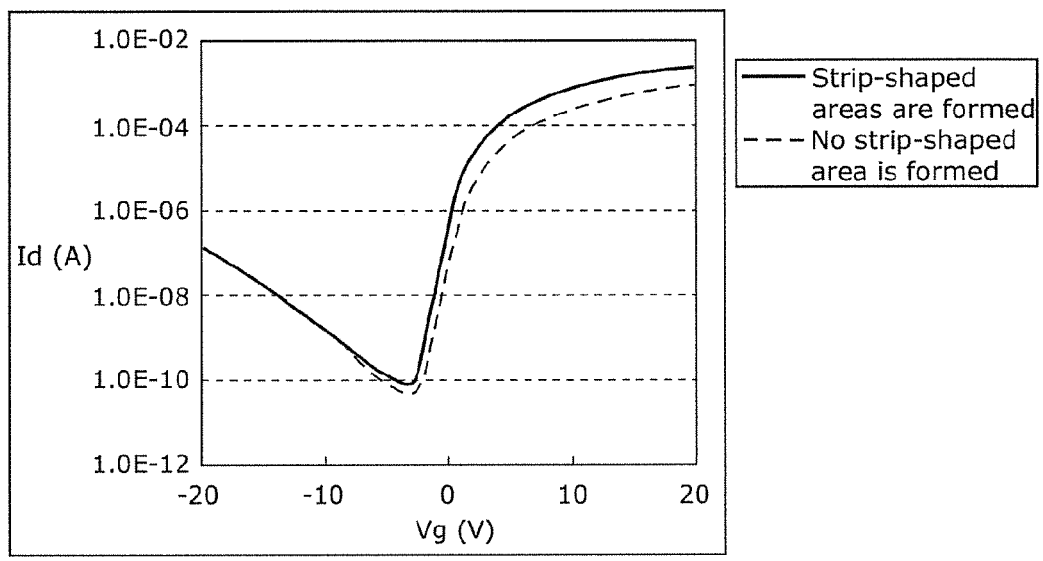
FIG. 26A is a diagram showing current/gate-voltage (Id-Vg) characteristics for each of a first TFT (having strip-shaped areas) and a second TFT (having no strip-shaped area).
FIG. 26B is a diagram showing Ion (Vg=10.0 V) and Ioff (the minimum value) for each of the first TFT (having strip-shaped areas) and the second TFT (having no strip-shaped area).

Here, the TFT characteristics of the driver transistor that is the first TFT (the first device unit 201A) and the switching transistor that is the second TFT (the second device unit 201B) according the present embodiment are described, with reference to FIG. 26A and FIG. 26B. FIG. 26A is a diagram showing current/gate-voltage (Id-Vg) characteristics for each of the first TFT (having strip-shaped areas) and the second TFT (having no strip-shaped area). FIG. 26B is a diagram showing Ion (Vg=10.0 V) and Ioff (the minimum value) for each of the first TFT (having strip-shaped areas) and the second TFT (having no strip-shaped area).

In FIG. 26A and FIG. 26B, as the conditions for laser irradiation: the beam minor axis width (FWHM) of the first laser light 30A is 15 μm; and the beam minor axis width (FWHM) of the second laser light 30B is 32 μm. Moreover, the laser power density and the scanning speed are the same between the first laser light 30A and the second laser light 30B. To be more specific, the power density is 70.0 kW/cm$^2$, and the scanning speed is 500 mm/s. Furthermore, each of the first TFT and the second TFT has a channel width of 20 μm and a channel length of 13 μm. Note that each of FIG. 26A and FIG. 26B shows the characteristics obtained when a voltage of 10.0 V is applied between the source electrode and the drain electrode.

As shown in FIG. 25A and FIG. 26B, when the gate voltage Vg is 10.0 V, the ON-state current Ion of the first TFT (having strip-shaped areas) is $7.01*10^{-4}$ A whereas the ON-state current Ion of the second TFT (having no strip-shaped area) is $2.14*10^{-4}$ A. Therefore, it can be understood that the first TFT (having strip-shaped areas) is excellent in ON-state current characteristics and thus more suitable for the driver transistor, as compared with the second TFT (having no strip-shaped area).

As shown in FIG. 25A and FIG. 26B, the OFF-state current Ioff (the minimum value) of the first TFT (having strip-shaped areas) is $6.77*10^{-11}$ A whereas the OFF-state current Ioff (the minimum value) of the second TFT (having no strip-shaped area) is $4.21*10^{-11}$ A. Therefore, it can be understood that the second TFT (having no strip-shaped area) is excellent in OFF-state current characteristics and thus more suitable for the switching transistor, as compared with the first TFT (having strip-shaped areas).

Next, the mobility in the TFTs are described with reference to FIGS. 27A and 27B. These TFTs are manufactured using the crystalline silicon thin films formed under the conditions for laser irradiation (where both the first areas and the second areas are formed) according to the present embodiment and the conditions for laser irradiation (where only the second area is formed with no strip-shaped first area) according to a comparative example.

Figure 27A:
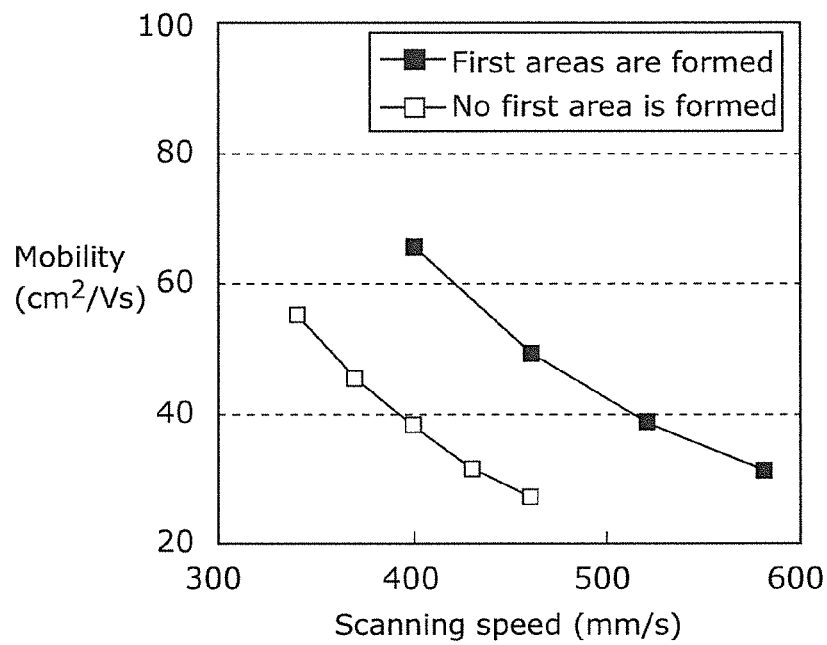
FIG. 27A is a diagram showing a relationship between the scanning speed at the time of laser irradiation and the mobility in the TFT, for each of the TFTs including the crystalline silicon thin films formed under the conditions for laser irradiation according to Embodiment 1 and the comparative example of the present invention.

FIG. 27A is a diagram showing a relationship between the scanning speed at the time of laser irradiation and the mobility in the TFT, for each of the TFTs including the crystalline silicon thin films formed under the conditions for laser irradiation according to Embodiment 1 and the comparative example of the present invention. FIG. 27B is a diagram showing a relationship between the energy intensity of the laser light and the mobility in the TFT, for each of the TFTs including the crystalline silicon thin films formed under the conditions for laser irradiation according to Embodiment 1 and the comparative example of the present invention. Here, each of FIG. 27A and FIG. 27B shows the result on the mobility in the case where the channel width of the channel layer (the crystalline silicon thin film) is 50 μm and the channel length of the channel layer (the crystalline silicon thin film) is 10 μm.

As can be seen from FIG. 27A, the TFT including the crystalline silicon thin film formed under the conditions for laser irradiation according to the present embodiment as the channel layer where both the first area 51 and the second area 52 are formed is higher in mobility than the TFT including the crystalline silicon thin film formed under the laser irradiation condition according to the comparative example as the channel layer where only the second area 52 is formed with no first area 51. It can be understood from this that the crystalline silicon thin film formed under the conditions for laser irradiation according to the present embodiment includes silicon particles larger in grain size. Moreover, the TFT including, as the channel layer, the crystalline silicon thin film formed under the conditions for laser irradiation according to the present embodiment is higher in mobility. It can be understood from this that the TFT excellent in ON-state current characteristics can be implemented according to the present embodiment.

Figure 27B:
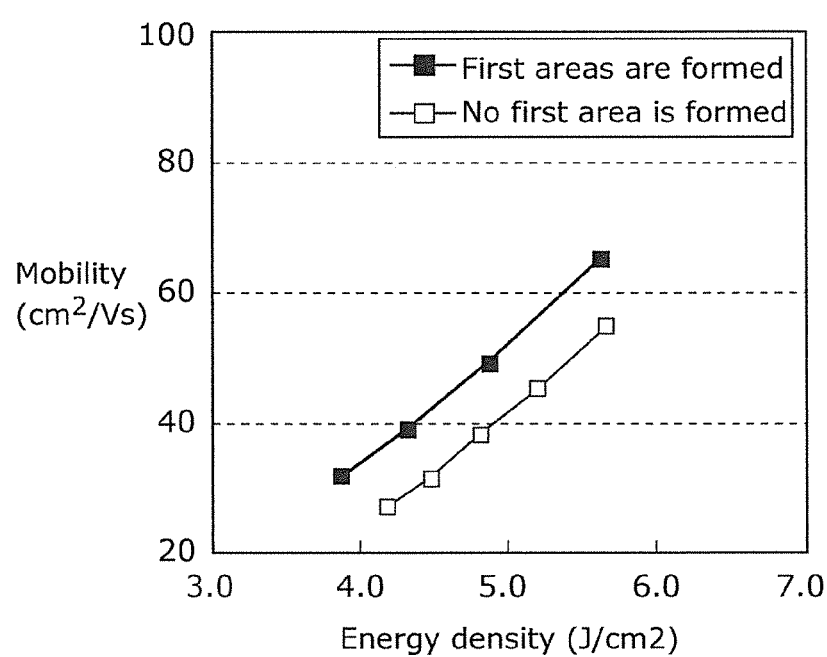
FIG. 27B is a diagram showing a relationship between the energy intensity of the laser light and the mobility in the TFT, for each of the TFTs including the crystalline silicon thin films formed under the conditions for laser irradiation according to Embodiment 1 and the comparative example of the present invention.

Moreover, as shown in FIG. 27B, when the energy density of the laser light is 5.0 J/cm$^2$, the TFT including the crystalline silicon thin film formed under the conditions for laser irradiation according to the present embodiment as the channel layer where both the first area 51 and the second area 52 are formed has the mobility of 39.0 (cm$^2$/V·sec). On the other hand, the TFT including the crystalline silicon thin film formed under the conditions for laser irradiation according to the comparative example as the channel layer where only the second area 52 is formed with no first area 51 has the mobility of 27.1 (cm$^2$/V·sec). To be more specific, when the crystalline silicon thin films are formed using the laser beams having the same energy density, the TFT including, as the channel layer, the crystalline silicon thin film crystallized under the laser irradiation condition according to the present embodiment is higher in mobility. Thus, the TFT excellent in ON-state current characteristics can be implemented. In other words, when a crystalline silicon thin film having a predetermined mobility is to be formed, the crystalline silicon thin film can be formed with the smaller energy density under the conditions for laser irradiation according to the present embodiment.

Figure 28:
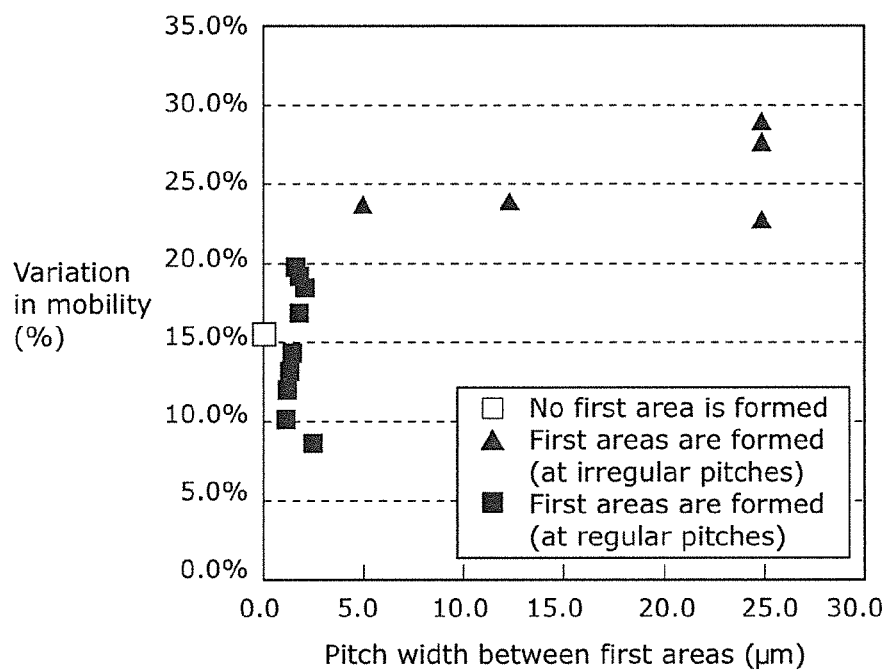
FIG. 28 is a diagram showing a relationship between the pitch between strip-shaped first areas and the variation in mobility in the TFT, for each of the TFTs including the crystalline silicon thin films formed under the conditions for laser irradiation according to Embodiment 1 and the comparative example of the present invention.

Next, with reference to FIG. 28, a relationship between the pitch between the strip-shaped first areas and the variation in mobility is described, for each of TFTs manufactured using the crystalline silicon thin films formed under the conditions for laser irradiation according to Embodiment 1 (where both the first area and the second area are formed) and the conditions for laser irradiation according to the comparative example (where only the second area is formed with no first area).

FIG. 28 is a diagram showing a relationship between the pitch between the strip-shaped first areas and the variation in mobility (3σ/Ave.) in the TFT, for each of the TFTs including the crystalline silicon thin films formed under the conditions for laser irradiation according to Embodiment 1 and the comparative example of the present invention.

As shown in FIG. 28, in the case of the TFT formed under the conditions for laser irradiation according to the comparative example where only the second area 52 is formed with no first area 51 (i.e, the conditions corresponding to the region B shown in FIG. 4), the variation in mobility is 15.5%. On the other hand, in the case of the TFT formed under the conditions for laser irradiation according to the present embodiment where the first areas 51 with irregular pitches and the second areas 52 are both formed (i.e., the conditions corresponding to the region C shown in FIG. 4), the variation in mobility is 20% or higher.

With this being the situation, suppose that the scanning speed is increased. In the case of the TFT formed under the conditions for laser irradiation according to the present embodiment where the first areas 51 with regular pitches and the second areas 52 are both formed (i.e., the conditions corresponding to the area D shown in FIG. 4), the variation in mobility can be reduced to 10% to 20%. Thus, even as compared with the case of the conditions for laser irradiation according to the comparative example, it can be understood that the favorable variation in mobility can be implemented.

Modification of Embodiment 1

Next, a modification of the method of manufacturing a thin-film device in a modification according to Embodiment 1 of the present invention is described, with reference to the drawing.

Figure 29:
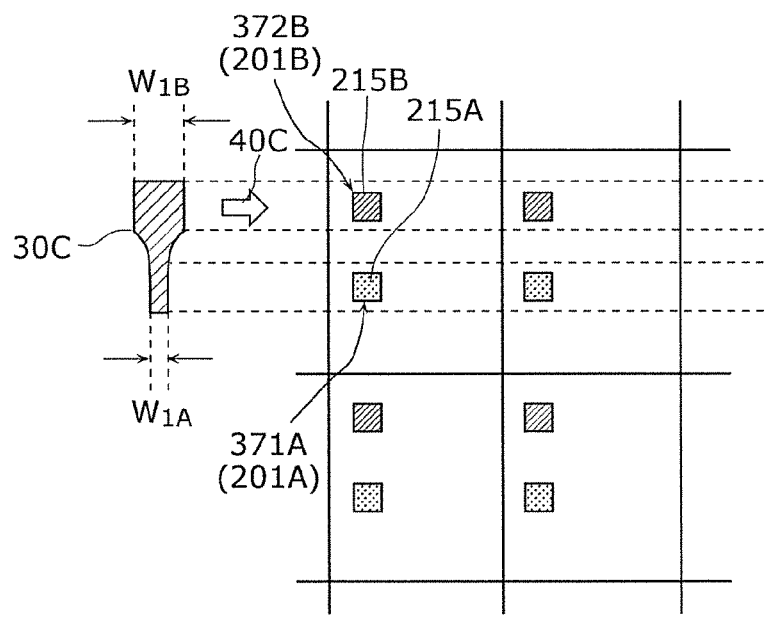
FIG. 29 is a diagram explaining a method of manufacturing a thin-film device in a modification according to Embodiment 1 of the present invention.

FIG. 29 is a diagram explaining the method of manufacturing a thin-film device in the modification according to Embodiment 1 of the present invention.

As shown in FIG. 29, in the present modification, an amorphous silicon thin film is crystallized using a single laser beam having parts different in minor axis width.

In the above embodiment, the crystalline silicon thin film having different grain structures is formed by using two lasers, i.e., the first laser light 30A and the second laser light 30B different in beam minor axis width. However, as in the present modification, the crystalline silicon thin film having different grain structures can also be formed using only a laser light 30C having parts different in minor axis width as shown in FIG. 29.

In the present modification, the light intensity distribution of the laser light 30C in the minor axis direction includes a first part having a beam minor axis width $W_{1A}$ and a second part having a beam minor axis width $W_{1B}$. Moreover, beam shaping is performed, thereby making the beam minor axis width $W_{1A}$ smaller than the beam minor axis width $W_{1B}$.

Then, the amorphous silicon thin film is irradiated through relative scan with the laser light 30C in a scanning direction 40C. Here, the amorphous silicon thin film corresponding to the driver transistor 371A (the first device unit 201A) is irradiated with the first part having the beam minor axis width $W_{1A}$ whereas the amorphous silicon thin film corresponding to the switching transistor 372B (the second device unit 201B) is irradiated with the second part having the beam minor axis width $W_{1B}$. As a result, the first crystalline silicon thin film 215A and the second crystalline silicon thin film 215B different in grain structure can be formed using the single laser in the same step. Hence, throughput can be increased.

Embodiment 2

Figure 30A:
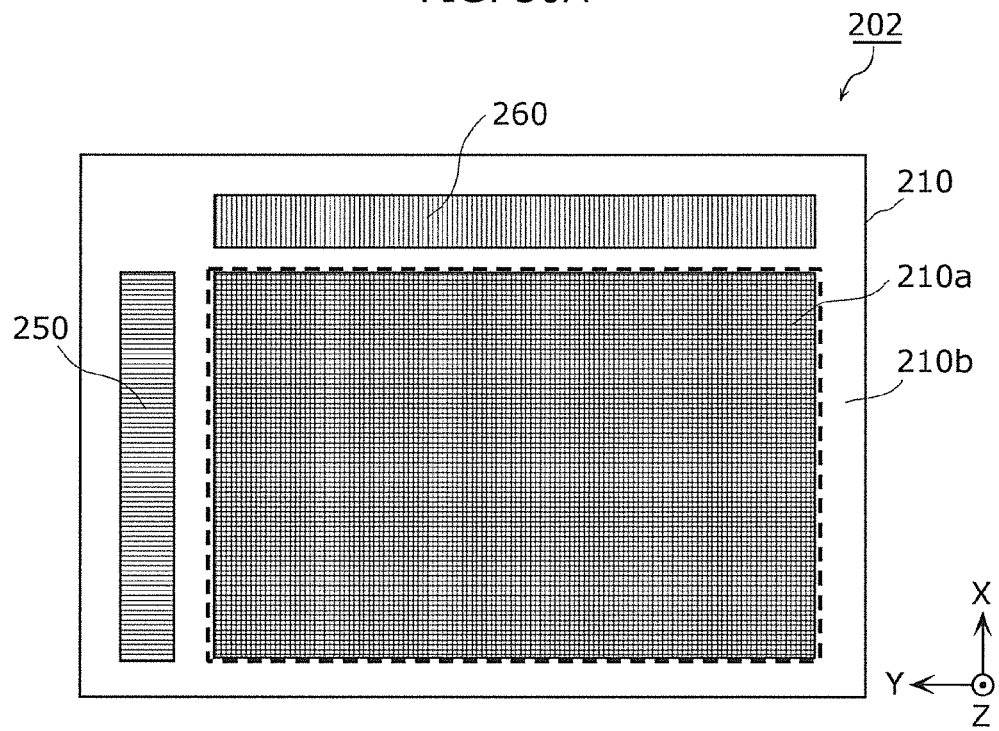
FIG. 30A is a schematic plan view showing a configuration of a thin-film device array substrate according to Embodiment 2 of the present invention.

The following describes Embodiment 2 of the present invention. The present embodiment describes a thin-film device array substrate (a thin-film device array) including the first device unit 201A and the second device unit 201B of the thin-film device 201 according to Embodiment 1. The thin-film device array substrate according to the present embodiment can be formed using the method of forming a crystalline thin film according to Embodiment 1. FIG. 30A is a schematic plan view showing a configuration of the thin-film device array substrate according to Embodiment 2 of the present invention.

As shown in FIG. 30A, the thin-film device array substrate 202 according to the present embodiment includes a substrate 210 having a plane area that is divided into an inner area 210a and a peripheral area 210B, a gate driver circuit 250, and a source driver circuit 260. In FIG. 30A, the inner area 210a refers to the area inside the dashed-line box and the peripheral area 210b refers to the area outside the dashed-line box.

In the present embodiment, the inner area 210a is a rectangular area that corresponds to a pixel area (a display area) where a plurality of pixels are arranged in a matrix (with rows and columns) on the substrate 210 and is surrounded by the peripheral area 210b. On the other hand, the peripheral area 210b surrounds the pixel area (the inner area 210a) on the substrate 210 and is in the shape of a picture frame (a frame-like area). Here, note that each of the pixels in the inner area 210a includes TFTs such as a switching transistor.

The gate driver circuit 250 is connected to a plurality of gate lines (not illustrated) formed along the rows of the pixels on the substrate 210, and supplies each of the pixels included in the inner area 210a with a gate signal to drive the switching transistor of the pixel. The gate driver circuit 250 includes: driver transistors which are TFTs such as a complementary metal oxide semiconductor (CMOS) and a P-channel metal oxide semiconductor (PMOS); and other circuit elements.

The source driver circuit 260 is connected to a plurality of source lines (not illustrated) formed along the columns of the pixels on the substrate 210, and supplies each of the pixels included in the inner area 210a with a video signal. The source driver circuit 260 also includes: driver transistors which are TFTs such as a CMOS and a PMOS; and other circuit elements.

Each of the TFTs in the pixels of the inner area 210a, the gate driver circuit 250, and the source driver circuit 260 in the thin-film device array substrate 202 according to the present embodiment is formed using low temperature poly-silicon (LTPS) technology. On this account, the gate driver circuit 250 and the source driver circuit 260 may be formed directly on the substrate 210 using, for example, chip-on-glass (COG) technology.

Figure 30B:
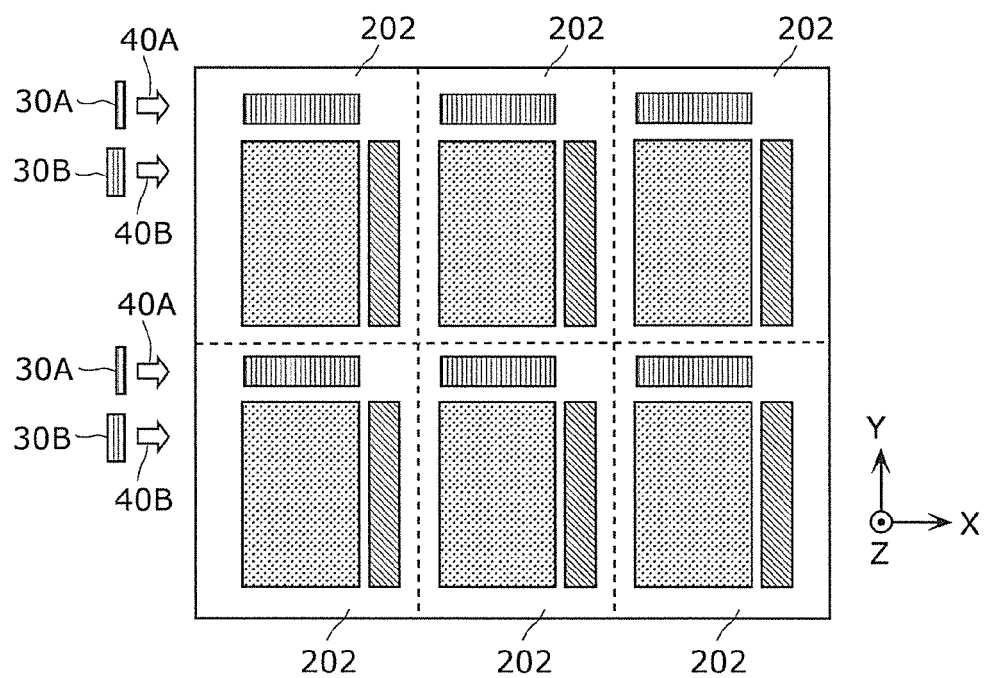
FIG. 30B is a diagram showing a mother substrate of thin-film device array substrates according to Embodiment 2 of the present invention.

FIG. 30B is a diagram showing a mother substrate of thin-film device array substrates according to the present embodiment. FIG. 30B shows an example where six substrate pieces are to be cut out. By cutting this mother substrate, six thin-film device array substrates 202 can be obtained.

In the present embodiment, an amorphous silicon thin film formed on a mother substrate before cutting is irradiated with a first laser light 30A and a second laser light 30B as shown in FIG. 30B. As a result, a first crystalline silicon thin film and a second crystalline silicon thin film are formed. The steps of crystallizing with the first laser light 30A and the second laser light 30B are described in detail later.

Figure 31:
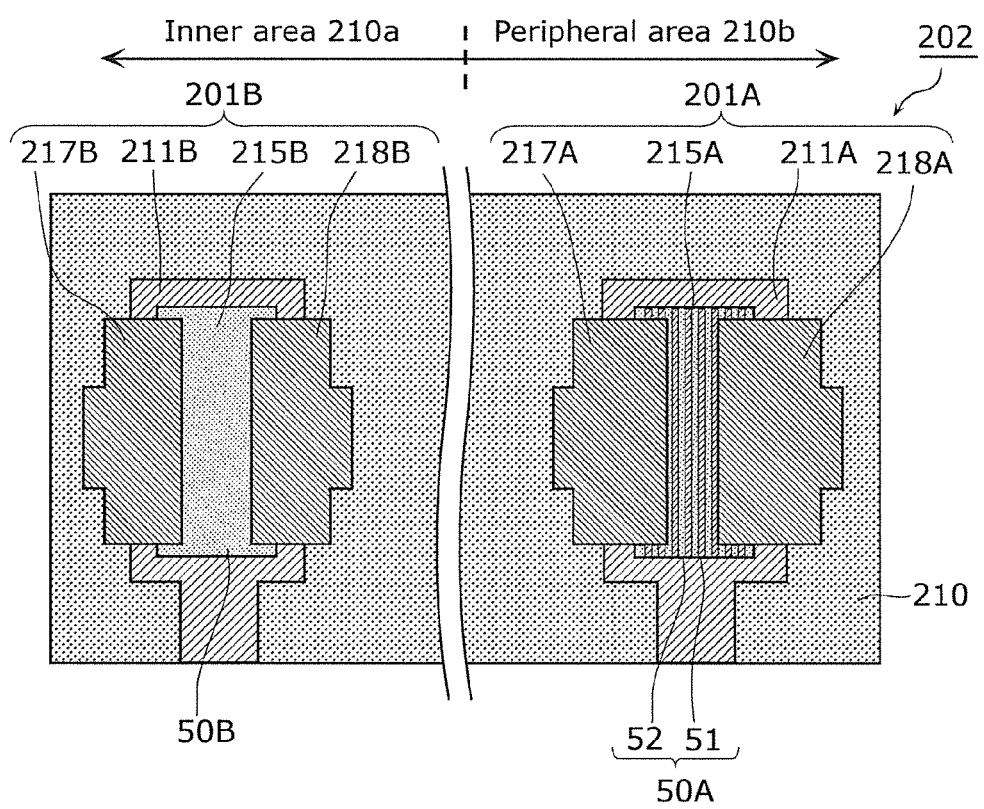
FIG. 31 is a plan view showing device units and surrounding areas on the thin-film device array substrate according to Embodiment 2 of the present invention.

Next, device units of the thin-film device array substrate according to Embodiment 2 of the present invention are described, with reference FIG. 31. FIG. 31 is a plan view showing the device units and surrounding areas on the thin-film device array substrate according to Embodiment 2 of the present invention.

As shown in FIG. 31, the thin-film device array substrate 202 according to the present embodiment includes a first device unit 201A formed in the peripheral area 210b of the substrate 210 and a second device unit 201B formed in the inner area 210a of the substrate 210. In the present embodiment, the first device unit 201A is a driver transistor included in each of the gate driver circuit 250 and the source driver circuit 260 provided in the peripheral area 210b of the substrate 210. Moreover, the second device unit 201B is a switching transistor provided for each pixel included in the inner area 210a of the substrate 210.

The first crystalline silicon thin film 215A of the first device unit 201A has a first crystallized area 50A including a strip-shaped first area 51 and a second area 52 that is adjacent to the strip-shaped first area and different from the strip-shaped first area 51 in average grain size. The first crystalline silicon thin film 215A is formed by a method similar to the aforementioned method used for forming the first crystalline silicon thin film 15A in Embodiment 1. To be more specific, the first crystalline silicon thin film 215A can be formed by crystallizing an amorphous silicon thin film using the first laser light 30A.

On the other hand, the second crystalline silicon thin film 215B of the second device unit 201B has a second crystallized area 50B (a third area) that is different from the first crystallized area 50A in grain structure. The second crystalline silicon thin film 215B is formed by a method similar to the aforementioned method used for forming the second crystalline silicon thin film 15B in Embodiment 1. To be more specific, the second crystalline silicon thin film 215B can be formed by crystallizing an amorphous silicon thin film using the second laser light 30B.

In the present embodiment, the first device unit 201A is a TFT including, as a channel, at least a part of the strip-shaped first area 51 of the first crystalline silicon thin film 215A (the first crystallized area 50A). The first device unit 201A includes a first gate electrode 211A, a first source electrode 217A, and a first drain electrode 218A. Moreover, the second device unit 201B is a TFT including, as a channel, the second crystallized area 50B of the second crystalline silicon thin film 215B. The second device unit 201B includes a second gate electrode 211B, a second source electrode 217B, and a second drain electrode 218B. For example, a bottom-gate type or top-gate type TFT can be used for each of the first device unit 201A and the second device unit 201B.

Note that the first device unit 201A and the second device unit 201B according to the present embodiment can be manufactured by a method similar to the method shown in FIG. 20 and FIG. 21 (in the case of a bottom-gate type TFT) according to Embodiment 1 or the method shown in FIG. 22 and FIG. 23 (in the case of a top-gate type TFT) according to Embodiment 1. Moreover, as in Embodiment 1, the first device unit 201A according to the present embodiment may be formed to have the channel direction crossing the longitudinal direction of the strip-shaped first area 51 (as shown in FIG. 14A and FIG. 14B) or to have the channel direction parallel to the longitudinal direction of the strip-shaped first area 51 (as shown in FIG. 15A and FIG. 15B).

With the thin-film device array substrate 202 according to the present embodiment, the first crystalline silicon thin film 215A of the first device unit 201A includes the first crystallized area 50A having the strip-shaped first areas 51, and the second crystalline silicon thin film 215B of the second device unit 201B includes the second crystallized area 50B different from the first crystallized area 50A in grain structure, as in Embodiment 1. Accordingly, the thin-film device including the first device unit 201A and the second device unit 201B different in device characteristics can be easily implemented.

Moreover, also in the present embodiment, the average grain size of the crystal grains in the second crystallized area (the third area) 50B is smaller than the average grain size of the crystal grains in the strip-shaped first area 51 of the first crystallized area 50A. Furthermore, the average grain size of the crystal grains in the second crystallized area (the third area) 50B is smaller than the average grain size of the crystal grains in the strip-shaped first area 51 of the first crystallized area 50A. With this, the charge carrier mobility in the channel of the first device unit 201A can be increased. Therefore, the first device unit 201A can be implemented as a TFT superior to the second device unit 201B in ON-state current characteristics.

Furthermore, also in the present embodiment, each of the strip-shaped first areas 51 includes the crystal grains that are in contact with each of the adjacent second areas 52. On this account, as the first device unit, a TFT that is excellent in ON-state current characteristics and in uniformity with less variation in charge carrier mobility can be implemented.

Moreover, according to the present embodiment, since the first device unit 201A is superior to the second device unit 201B in the ON-state current characteristics, the first device unit 201A can be used as the driver transistor in each of the gate driver circuit 250 and the source driver circuit 260 provided in the peripheral area 210b of the substrate 210. Furthermore, since the second device unit 201B is superior to the first device unit 203A in OFF-state current characteristics, the second device unit 201B can be used as the switching transistor of each pixel provided in the inner area 210a of the substrate 210.

[Display Panel]

Figure 32A:
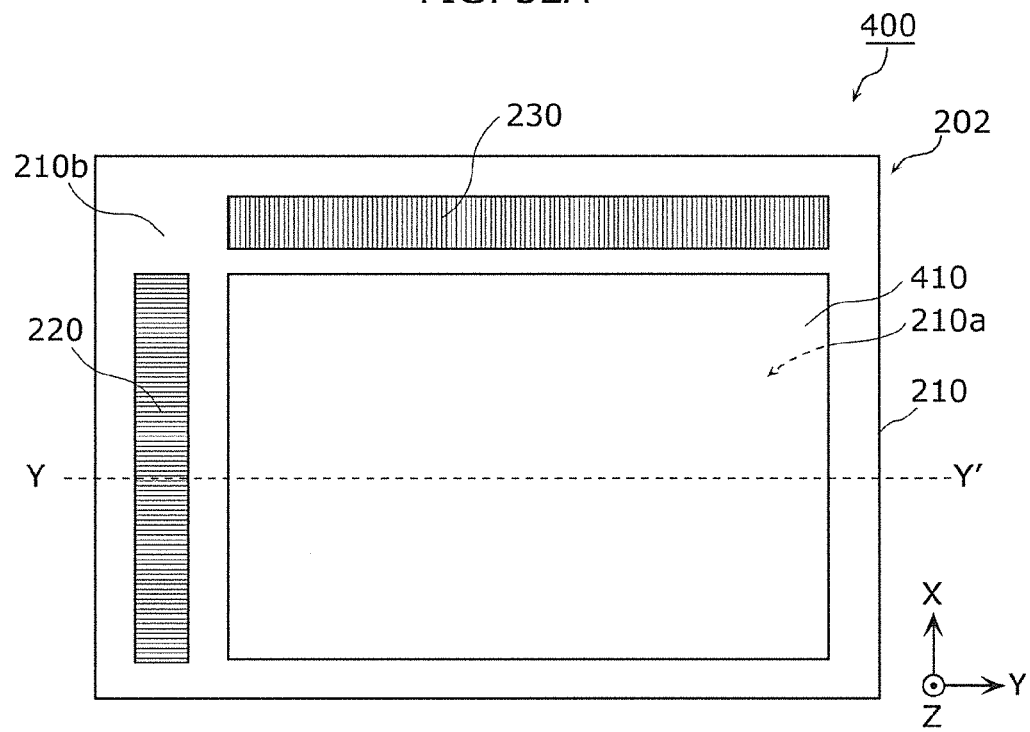
FIG. 32A is a plan view of a display panel according to Embodiment 2 of the present invention.
Figure 32B:
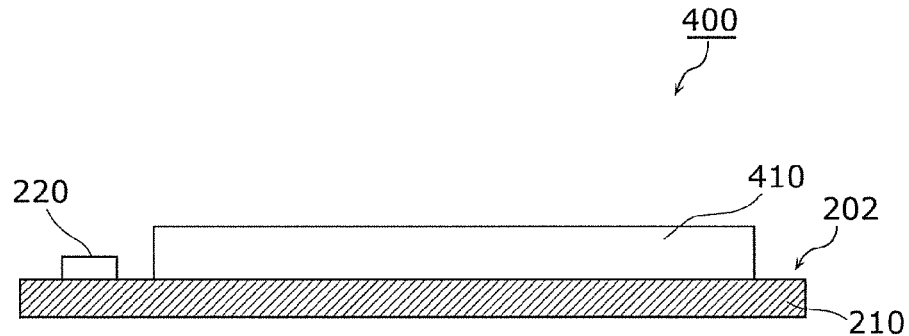
FIG. 32B is a cross-sectional view of the display panel along the line Y-Y' shown in FIG. 32A, according to Embodiment 2 of the present invention.

Next, a display panel 400 according to the present embodiment is described, with reference to FIG. 32A and FIG. 32B. FIG. 32A is a plan view of the display panel according to Embodiment 2 of the present invention. FIG. 32B is a cross-sectional view of the display panel along the line Y-Y' shown in FIG. 32A, according to Embodiment 2 of the present invention.

As shown in FIG. 32A and FIG. 32B, the display panel 400 according to the present embodiment includes the thin-film device array substrate 202 described above in the present embodiment and a display device 410 provided on the thin-film device array substrate 202.

The display device 410 is provided corresponding to the inner area (the pixel area) 210a on the substrate 210. For example, an OLED display device or a liquid crystal display device can be used as the display device 410.

The gate driver circuit 250 and the source driver circuit 260 are provided in the peripheral area 210b, on the thin-film device array substrate 202, where the display device 410 is not provided. In each of the gate driver circuit 250 and the source driver circuit 260, the first device unit 201A (not illustrated) is formed as the driver transistor for driving the display device 410. Moreover, in each of the pixels, the second device unit 201B (not illustrated) is formed as the switching transistor for selectively switching the display device 410 to be driven.

Note that the thin-film device array substrate 202 according to the present embodiment can be used as the active matrix substrate of the OLED display device shown in FIG. 16.

Embodiment 3

Figure 33A:
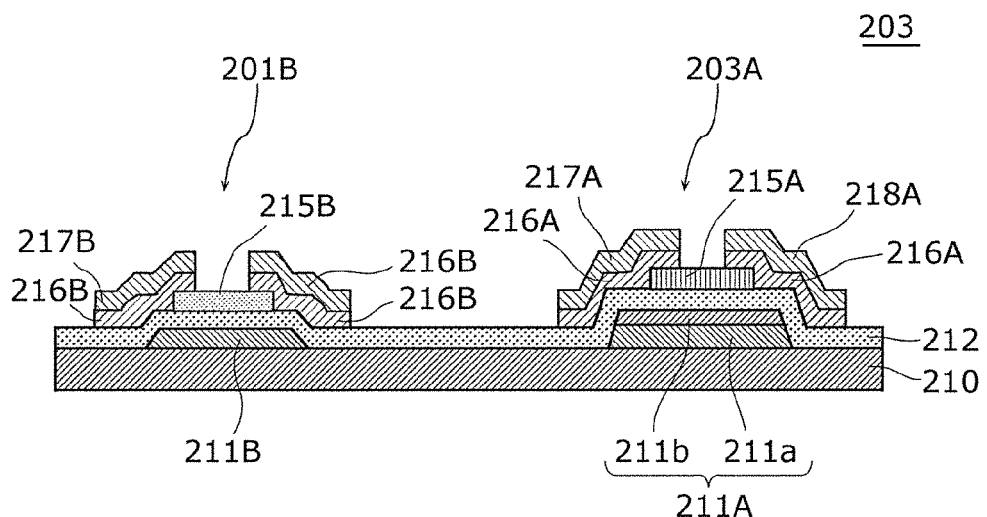
FIG. 33A is a cross-sectional view of a thin-film device according to Embodiment 3 of the present invention.
Figure 33B:
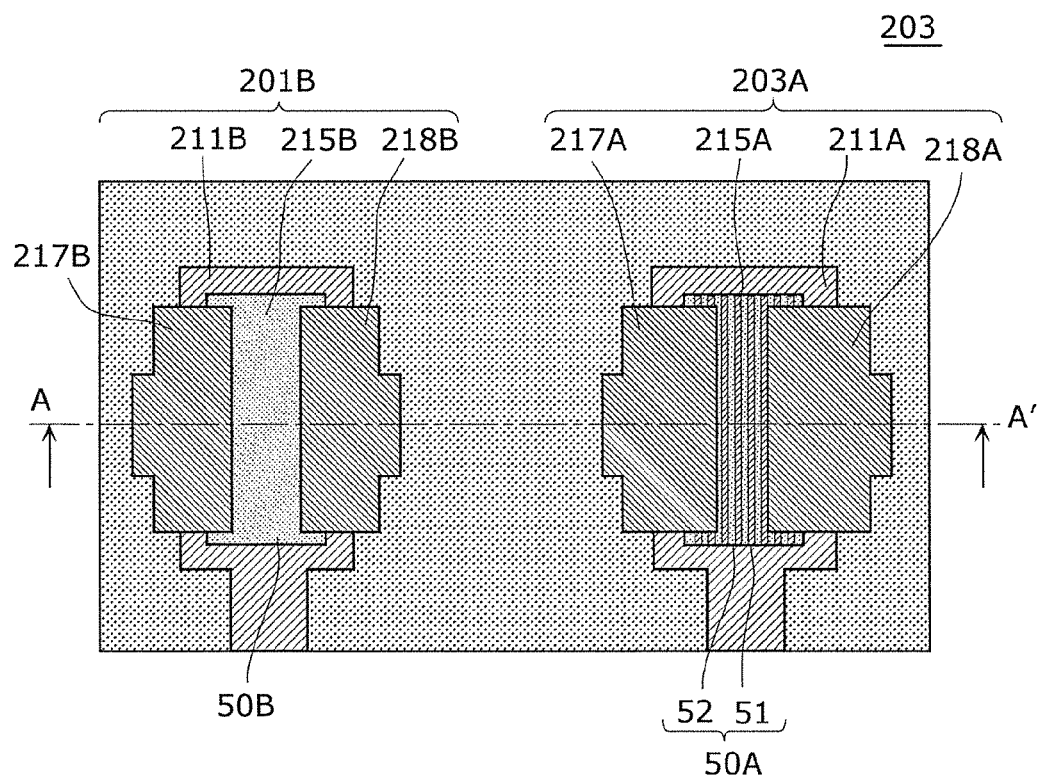
FIG. 33B is a plan view of the thin-film device according to Embodiment 3 of the present invention.

The following describes Embodiment 3 of the present invention. The present embodiment describes a thin-film device formed by the method of forming a crystalline thin film according to Embodiment 1. FIG. 33A is a cross-sectional view of the thin-film device according to Embodiment 3 of the present invention. FIG. 33B is a plan view of the thin-film device according to Embodiment 3 of the present invention. Note that FIG. 33A is the cross-sectional view of the thin-film device along the line A-A' shown in FIG. 33B.

As shown in FIG. 33A and FIG. 33B, a thin-film device 203 according to the present embodiment includes a first device unit 203A and a second device unit 201B. Moreover, the thin-film device 203 includes: a substrate 210; a first gate electrode 211A and a second gate electrode 211B formed above the substrate 210; a gate insulating film 212 covering the first gate electrode 211A and the second gate electrode 211B; a first crystalline silicon thin film (a first thin film) 215A formed on the gate insulating film 212 above the first gate electrode 211A; and a second crystalline silicon thin film (a second thin film) 215B formed on the gate insulating film 212 above the second gate electrode 211B.

In the present embodiment, the first device unit 203A is a bottom-gate type TFT (a first TFT) including, as a channel, at least a part of a strip-shaped first area 51 of the first crystalline silicon thin film 215A (a first crystallized area 50A). Moreover, the first device unit 203A includes the following that are formed sequentially on the substrate 210: the first gate electrode 211A, the gate insulating film 212, the first crystalline silicon thin film (a first crystalline semiconductor film) 215A, a pair of first contact layers 216A, a first source electrode 217A, and a first drain electrode 218B.

The second device unit 201B is a bottom-gate type TFT (a second TFT) including, as a channel, a second crystallized area 50B of the second crystalline silicon thin film 215B. Moreover, the second device unit 203B includes the following that are formed sequentially on the substrate 210: the second gate electrode 211B, the gate insulating film 212, the second crystalline silicon thin film (a second crystalline semiconductor film) 215B, a pair of second contact layers 216B, a second source electrode 217B, and a second drain electrode 218B.

The structural elements of the first device unit 203A and the second device unit 201B are described in detail as follows.

The substrate 210 is formed to be shared by the first device unit 203A and the second device unit 201B, and is a glass substrate for example as in Embodiment 1. Note that an undercoat film may be formed on the substrate 210.

The first gate electrode 211A and the second gate electrode 211B are formed in predetermined shapes by patterning performed on the substrate 210, and are formed apart from each other. More specifically, the first gate electrode 211A and the second gate electrode 211B are located at different positions. Each of the first gate electrode 211A and the second gate electrode 211B may have a single-layer structure comprising a conductive material or an alloy thereof or have a multilayer structure. For example, each of the first gate electrode 211A and the second gate electrode 211B may comprise a metal such as molybdenum (Mo), aluminum (Al), copper (Cu), tungsten (W), titanium (Ti), chromium (Cr), or molybdenum-tungsten (MoW).

In the present embodiment, the first gate electrode 211A and the second gate electrode 211B are formed so that a thin film to be crystallized into a crystalline silicon thin film (i.e., an amorphous silicon thin film) above the first gate electrode 211A is different in light absorptivity from a thin film to be crystallized into a crystalline silicon thin film (i.e., an amorphous silicon thin film) above the second gate electrode 211B. The light absorptivity of the amorphous silicon thin film formed above the first gate electrode 211A with respect to predetermined light is set higher than the light absorptivity of the amorphous silicon thin film formed above the second gate electrode 211B with respect to the predetermined light. To be more specific, the light absorptivity of the first crystalline silicon thin film 215A that has yet to be crystallized (i.e., the amorphous silicon thin film) with respect to the predetermined light is higher than the light absorptivity of the second crystalline silicon thin film 215B that has yet to be crystallized (i.e., the amorphous silicon thin film) with respect to the predetermined light.

To be more specific, a different material is used for each of the first gate electrode 211A and the second gate electrode 211B. The first gate electrode 211A is configured with a laminated film having a two-layer structure that includes a lower layer 211a and an upper layer 211b. The second gate electrode 211B is configured with a single-layer film having a single-layer structure. For example, the first gate electrode 211A may comprise a Cu film as the lower layer 211a having a thickness of 50 nm and a Mo film as the upper layer 211b having a thickness of 50 nm. Moreover, the second gate electrode 211B may comprise a Cu film having a thickness of 50 nm. Note that each of the first gate electrode 211A and the second gate electrode 211B may have a single-layer structure or a laminated structure. In order to have the amorphous silicon thin films different in light absorptivity, at least a layer that is closest to the amorphous silicon thin film (i.e., the uppermost layer) may comprise a different material for each of the first gate electrode 211A and the second gate electrode 211B.

The gate insulating film 212 is formed on the first gate electrode 211A and the second gate electrode 211B, and is formed entirely above the substrate 210 to cover the first gate electrode 211A and the second gate electrode 211B, as in Embodiment 1. The gate insulating film 212 may be a single-layer film comprising a silicon oxide ($SiO_y$) film, a silicon nitride ($SiN_x$) film, a silicon oxynitride ($SiO_yN_x$), an aluminum oxide ($AlO_z$) film, or a tantalum oxide ($TaO_w$) film, or may be a laminated film comprising these films.

Here, since the crystalline silicon thin film is used as a semiconductor thin film to be included as a channel area of the TFT, it is preferable to use silicon oxide for the gate insulating film 212. The reason for this is as follows. In order to maintain favorable threshold voltage characteristics of the TFT, it is preferable for the state of the interface between the gate insulating film 212 and the first and second crystalline silicon thin films 215A and 215B to be favorable. To keep the favorable interface, silicon oxide is suitable.

Each of the first crystalline silicon thin film 215A and the second crystalline silicon thin film 215B is a crystalline semiconductor thin film including a crystallized area formed by crystallizing an amorphous silicon thin film with predetermined light such as laser light. The first crystalline silicon thin film 215A and the second crystalline silicon thin film 215B are different in grain structure. Moreover, in the present embodiment, the first crystalline silicon thin film 215A and the second crystalline silicon thin film 215B different in grain structure are formed at the same time in the same step of crystallization as described later.

The first crystalline silicon thin film 215A is the crystalline silicon thin film formed above the first gate electrode 211A, and has the first crystallized area 50A including the strip-shaped first area 51 and the second area 52 that is adjacent to the strip-shaped first area 51. The first crystalline silicon thin film 215A is formed opposite to the first gate electrode 211A with the gate insulating film 212 in between. In the first crystallized area 50A of the first crystalline silicon thin film 215A, the average grain size in the strip-shaped first area 51 is larger than the average grain size in the second area 52. Note that the first crystallized area 50A functions as a first channel area where the charge carrier mobility is controlled by the voltage of the first gate electrode 211A. In this case, since the first crystallized area 50A includes the strip-shaped first areas 51 having the larger average grain size, the crystalline silicon thin film having a higher carrier mobility can be implemented.

Moreover, it is preferable for each of the strip-shaped first areas 51 in the first crystalline silicon thin film 215A to be continuous within the length of the channel area. With this, the charge carrier mobility can be increased and, therefore, the ON-state current characteristics can be enhanced. Furthermore, the crystalline silicon thin film superior in in-plane uniformity can also be implemented.

On the other hand, the second crystalline silicon thin film 215B is the crystalline silicon thin film formed above the second gate electrode 211B, and has the second crystallized area 50B different in grain structure from the first crystallized area 50 of the first crystalline silicon thin film 215A. The second crystalline silicon thin film 215B is formed opposite to the second gate electrode 211B with the gate insulating film 212 in between. The second crystallized area 50B of the second crystalline silicon thin film 215B has the grain structure where the strip-shaped first area 51 is not formed, unlike the first crystalline silicon thin film 215A. The average grain size of the second crystallized area 50B according to the present embodiment is equal to the average grain size of the second area 52 included in the first crystallized area 50A of the first crystalline silicon thin film 215A described above. Note that the second crystallized area 50B functions as a second channel area where the charge carrier mobility is controlled by the voltage of the second gate electrode 211B.

The pair of the first contact layers 216A is formed on the first silicon thin film 215A, and the pair of the second contact layers 216B is formed on the second crystalline silicon thin film 215B. Each of the first contact layers 216A and each of the second contact layers 216B comprises an amorphous semiconductor film including impurities in high concentration. In the present embodiment, each of the first contact layers 216A and each of the second contact layers 216B comprises an n-type semiconductor layer obtained by doping an amorphous silicon film with phosphorus (P) as dopant, and is an $n^+$ layer including dopant in high concentration at $1*10^{19}$ (atm/cm$^3$) or higher.

The first contact layers 216A are formed to cover the respective end portions of the first crystalline silicon thin film 215A, and are arranged opposite to each other with a predetermined spacing. Moreover, the second contact layers 216B are formed to cover the respective end portions of the second crystalline silicon thin film 215B, and are arranged opposite to each other with a predetermined spacing.

The first source electrode 217A and the first drain electrode 218B are formed on the first contact layers 216A, and are arranged opposite to each other with a predetermined spacing. Moreover, the second source electrode 217B and the second drain electrode 218B are formed on the second contact layers 216B, and are arranged opposite to each other with a predetermined spacing.

Each of the first source electrode 217A, the first drain electrode 218B, the second source electrode 217B, and the second drain electrode 218B may have a single-layer structure comprising a conductive material or an alloy thereof or have a multilayer structure. For example, each of the first source electrode 217A, the first drain electrode 218B, the second source electrode 217B, and the second drain electrode 218B may comprise aluminum (Al), molybdenum (Mo), tungsten (W), copper (Cu), titanium (Ti), or chromium (Cr).

The thin-film device 203 configured as described thus far can be easily formed using the method of forming a crystalline thin film according to Embodiment 1. To be more specific, formation of the strip-shaped first areas 51 results from the energy of the laser light with which the amorphous silicon thin film is irradiated. On account of this, based on a difference in light absorptivity between the amorphous silicon thin films, the crystalline silicon thin film having different grain structures can be easily formed.

Thus, the thin-film device 203 according to the present embodiment can achieve an advantageous effect similar to that of Embodiment 1.

More specifically, in the thin-film device 203 according to the present embodiment, the first crystalline silicon thin film 215A of the first device unit 203A includes the first crystallized area 50A having the strip-shaped first areas 51, and the second crystalline silicon thin film 215B of the second device unit 201B includes the second crystallized area 50B different from the first crystallized area 50A in grain structure. Accordingly, the thin-film device including the first device unit 203A and the second device unit 201B different in device characteristics can be easily implemented.

Moreover, also in the present embodiment, the first crystalline silicon thin film 215A included in the first device unit 203A has the first crystallized area 50A including the strip-shaped first areas 51 formed larger in average grain size than the second crystallized area 50B of the second crystalline silicon thin film 215B included in the second device unit 201B. To be more specific, the average grain size of the crystal grains included in the second crystallized area 50B is smaller than the average grain size of the crystal grains included in the strip-shaped first area 51 of the first crystallized area 50A. Moreover, the average grain size of the crystal grains included in the second crystallized area 50B is smaller than the average grain size of the crystal grains included in the first area 51 of the first crystallized area 50A. Therefore, the charge carrier mobility in the channel of the first device unit 203A can be increased. Hence, the first device unit 203A can serve as the TFT superior to the second device unit 201B in ON-state current characteristics.

Furthermore, also in the present embodiment, each of the strip-shaped first areas 51 includes the crystal grains that are in contact with each of the adjacent second areas 52. On this account, as the first device unit 203A, a TFT that is excellent in ON-state current characteristics and in uniformity with less variation in charge carrier mobility can be implemented.

Moreover, with the thin-film device according to the present embodiment, the light absorptivity of the first crystalline silicon thin film 215A that is formed above the first gate electrode 211A and has yet to be crystallized (i.e., the amorphous silicon thin film) with respect to the predetermined light is higher than the light absorptivity of the second crystalline silicon thin film 215B that is formed above the second gate electrode 211B and has yet to be crystallized (i.e., the amorphous silicon thin film) with respect to the predetermined light. As a result, the crystalline silicon thin film formed by crystallizing the amorphous silicon thin film with the predetermined light includes the first crystalline silicon thin film 215A and the second crystalline silicon thin film 215B different in grain structure (in crystalline state). Thus, by forming the device units including, as the respective channels, the first crystalline silicon thin film 215A and the second crystalline thin film 215B different from each other in grain structure, the thin-film device 203 including the first device unit 203A and the second device unit 201B different in device characteristics can be implemented.

Furthermore, also in the present embodiment, the channel direction of the first device unit 203A may be perpendicular to the longitudinal direction of the strip shape of the first area 51 or parallel to the longitudinal direction of the strip shape of the first area 51. Here, in order to increase the charge carrier mobility, it is preferable for the first device unit 203A to be formed to have the channel direction that is substantially parallel to the strip shape of the first area 51.

[OLED Display Device]

The following describes an example where the thin-film device 203 described above in the present embodiment is applied to a display device. The present embodiment describes the example where the thin-film device 203 is applied to the OLED display device 300 shown in FIG. 16.

Figure 34:
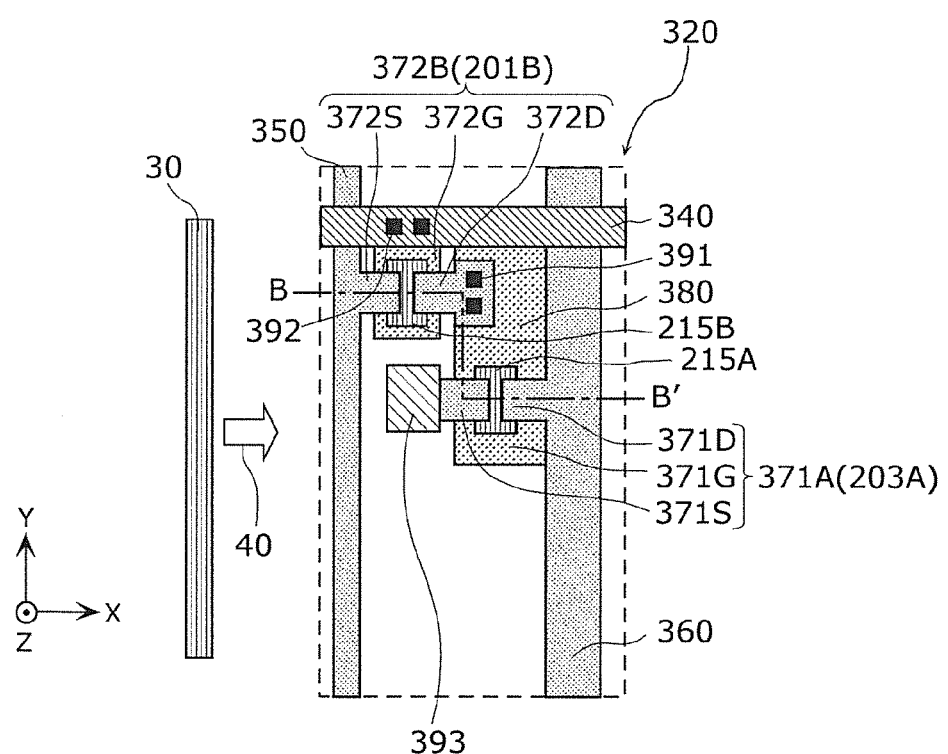
FIG. 34 is a plan view showing a configuration of a unit pixel included in an OLED display device according to Embodiment 3 of the present invention.

FIG. 34 is a plan view showing a configuration of a unit pixel included in the OLED display device according to Embodiment 3 of the present invention.

As shown in FIG. 34, pixels 320 are partitioned by scanning lines 340 and video signal lines 350 perpendicular to each other, as in the case of the pixels 320 shown in FIG. 17. Each of the pixels 320 includes a driver transistor 371A serving as the first device unit 203A of the thin film device 203, a switching transistor 372B serving as the second device unit 201B of the thin film device 203, a condenser (capacitor) 380, and an OLED device 330.

In the present embodiment, as shown in FIG. 34, with a single scanning operation by a laser light 30, the channel layer of the driver transistor 371A (the first crystalline silicon thin film 215A) and the channel layer of the switching transistor 372B (the second crystalline silicon thin film 215B) can be crystallized in the same step.

[Method of Manufacturing Thin-Film Device]

Figure 35:
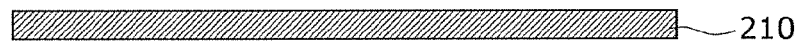
FIG. 35 (a)-(e) shows cross-sectional views schematically showing steps of a method of manufacturing a thin-film device according to Embodiment 3 of the present invention.
Figure 35:
Figure 35:
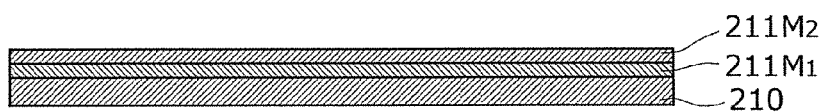
Figure 35:
Figure 35:
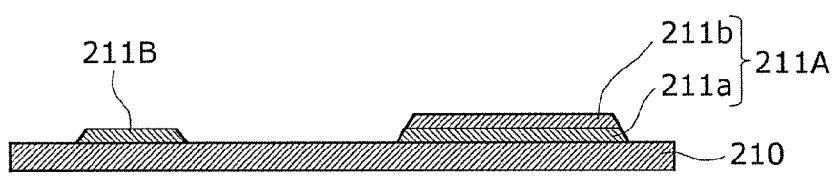
Figure 35:
Figure 35:
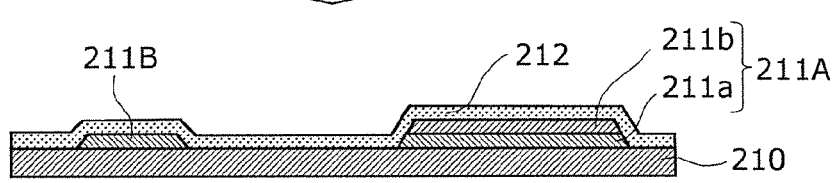
Figure 35:
Figure 35:
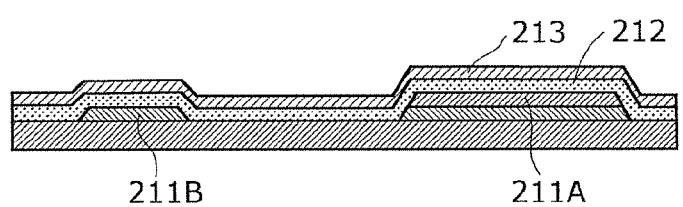
Figure 36:
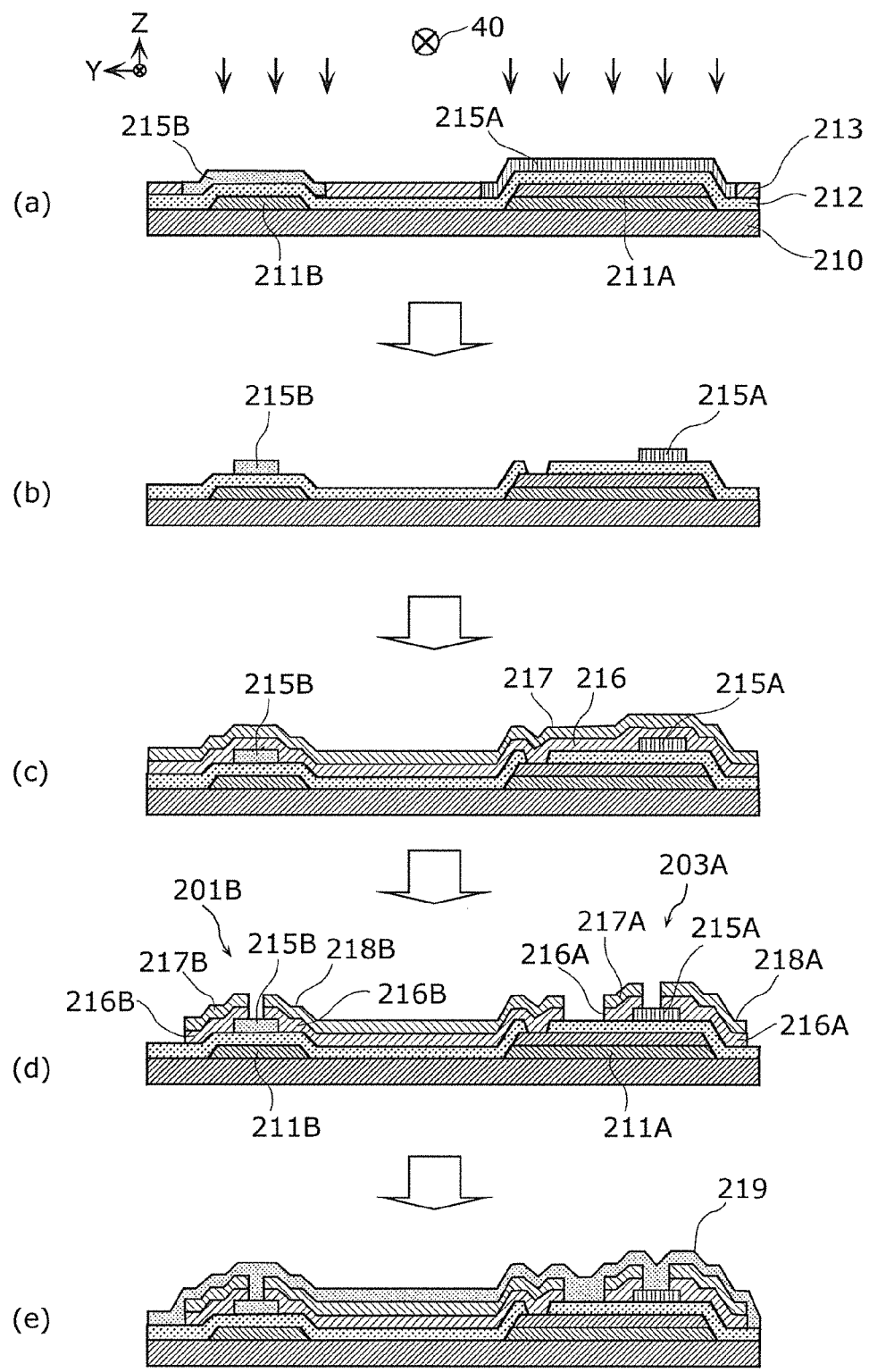
FIG. 36 (a)-(e) shows cross-sectional views schematically showing steps of a method of manufacturing a thin-film device according to Embodiment 3 of the present invention.

Next, a method of manufacturing the thin-film device 203 according to Embodiment 3 of the present invention is described, with reference to FIG. 35 and FIG. 36. Each of FIG. 35 and FIG. 36 shows cross-sectional views schematically showing steps of the method of manufacturing a thin-film device according to Embodiment 3 of the present invention. Note that each of FIG. 35 and FIG. 36 is the cross-sectional view along the line B-B' shown in FIG. 34.

As shown in (a) of FIG. 35, a substrate 210 is firstly prepared as in (a) of FIG. 20 according to Embodiment 1 (a step of preparing a substrate).

Next, as shown in (b) of FIG. 35, a first gate metal film 211M$_1$ and a second gate metal film 211M$_2$ are sequentially formed entirely above the substrate 210. The first gate metal film 211M$_1$ and the second gate metal film 211M$_2$ can be formed by, for example, sputtering. In the present embodiment, a Cu film having a thickness of 50 nm is formed as the first gate metal film 211M$_1$ and, following this, an Mo film having a thickness of 50 nm is formed as the second gate metal film 211M$_2$.

Next, as shown in (c) of FIG. 35, patterning is performed on the first gate metal film 211M$_1$ and the second gate metal film 211M$_2$ by photolithography and wet etching to form the first gate electrode 211A and the second gate electrode 211B apart from each other in predetermined shapes. In the present embodiment, pattering is performed in order for the first gate electrode 211A to be a gate electrode having a two-layer structure that includes the first gate metal film 211M$_1$ as the lower layer 211a and the second gate metal film 211M$_2$ as the upper layer 211b. Moreover, pattering is performed in order for the second gate electrode 211B to include only the first gate metal film 211M$_1$.

Here, in the present embodiment, for patterning to obtain the first gate electrode 211A and the second gate electrode 211B as shown in (c) of FIG. 35, the etching process is performed after the first gate metal film 211M$_1$ and the second gate metal film 211M$_2$ are sequentially formed. However, this is not intended to be limiting. For example, after patterning is firstly performed on the first gate metal film 211M$_1$ by etching, the second gate metal film 211M$_2$ may be formed and patterning may be performed on the second gate metal film 211M$_2$. With this manner, the first gate electrode 211A and the second gate electrode 211B may be accordingly formed.

Next, as shown in (d) of FIG. 35, the gate insulating film 212 is formed on the first gate electrode 211A and the second gate electrode 211B, as in (c) of FIG. 20 according to Embodiment 1 (a step of forming a gate insulting film).

Next, as shown in (e) of FIG. 35, the amorphous silicon thin film 213 is formed above the substrate 210, as in (d) of FIG. 20 according to Embodiment 1 (a step of forming a silicon thin film).

Next, as shown in (a) of FIG. 36, the amorphous silicon thin film 213 above the first gate electrode 211A is crystallized through relative scan with a first laser beam at a predetermined speed while the amorphous silicon thin film 213 is being irradiated from above the first gate electrode 211A (the step of crystallizing with a first laser beam). Moreover, as shown in this diagram, the amorphous silicon thin film 213 above the second gate electrode 211B is crystallized through relative scan with a second laser beam at a predetermined speed while the amorphous silicon thin film 213 is being irradiated from above the second gate electrode 211B (the step of crystallizing with a second laser beam).

In the present embodiment, the same laser light is used as the first laser beam and the second laser beam. Moreover, the step of crystallizing with a first laser beam and the step of crystallizing with a second laser beam are performed at the same time. To be more specific, by causing the laser light used in the step of crystallizing with a first laser beam to be equal in scanning speed to the laser light used in the step of crystallizing with a second laser beam, the amorphous silicon thin film 213 is irradiated with the single laser beam at predetermined regions on the amorphous silicon thin film 213.

This step can be performed similarly to the step of crystallization in the method of manufacturing a crystalline thin film according to Embodiment 1.

To be more specific, the amorphous silicon thin film 213 located above the first gate electrode 211A is irradiated through relative scan using the laser light in the X direction (perpendicular to the plane of the diagram) under the conditions for laser irradiation corresponding to the crystallized area in the region C or D shown in FIG. 4. Here, the layer included in the first gate electrode 211A and closest to the amorphous silicon thin film 213 and the layer included in the second gate electrode 211B and closest to the amorphous silicon thin film 213 are different in material. With this, the light absorptivity of the amorphous silicon thin film 213 located above the first gate electrode 211A with respect to the laser light is higher than the light absorptivity of the amorphous silicon thin film 213 located above the second gate electrode 211B with respect to the laser light. In other words, the light absorptivity of the amorphous silicon thin film 213 located above the second gate electrode 211B with respect to the laser light is lower than the light absorptivity of the amorphous silicon thin film 213 located above the first gate electrode 211A with respect to the laser light.

As a result, in the step of crystallizing with a first laser beam, the amorphous silicon thin film 213 located above the first gate electrode 211A is crystallized into the first crystalline silicon thin film 215A having the crystallized area (the first crystallized area 50A) including the strip-shaped first areas 51 and the second areas 52 both extending in the direction crossing the scanning direction of the laser light. To be more specific, the amorphous silicon thin film 213 located above the first gate electrode 211A is crystallized to have the grain structure including the crystallized area where the strip-shaped first areas 51 are formed at irregular pitches (the grain structure shown in FIG. 5C) or the grain structure including the crystallized area where the strip-shaped first areas 51 are formed at regular pitches (the grain structure shown in FIG. 5D). Note that the first crystalline silicon thin film 215A according to the present embodiment has the grain structure including the crystallized area where the strip-shaped first areas 51 are formed at regular pitches.

On the other hand, in the step of crystallizing with a second light beam, the amorphous silicon thin film 213 located above the second gate electrode 211B is crystallized to have the second crystallized area 50B different in grain structure from the first crystallized area 50A of the first crystalline silicon thin film 215A. In the present embodiment, the amorphous silicon thin film 213 located above the second gate electrode 211B is crystallized into the second crystalline silicon thin film 215B having the grain structure where the strip-shaped first area 51 is not formed (the grain structure shown in FIG. 5B).

Next, as shown in (b) of FIG. 36, pattering is selectively performed on the amorphous silicon thin film 213 crystallized with laser irradiation, by photolithography and wet etching to form each of the first crystalline silicon thin film 215A and the second crystalline silicon thin film 215B in the shape of an island, as in (a) of FIG. 21 according to Embodiment 1.

After this, as shown in this diagram, contact holes may be formed in the gate insulating film 212 in order for the first gate electrode 211A of the first device unit 203A to be connected to the second drain electrode 218B of the second device unit 201B.

Next, as shown in (c) of FIG. 36, a contact layer 216 is formed that is an n$^+$ layer doped with dopant, as in (b) of FIG. 21 according to Embodiment 1. After this, a source-drain metal film 217 is formed on the contact layer 216.

Next, as shown in (d) of FIG. 36, pattering is performed on the source-drain metal film 217 to form a pair of the first source electrode 217A and the first drain electrode 218A and a pair of the second source electrode 217B and the second drain electrode 218B, as in (c) of FIG. 21 according to Embodiment 1 (a step of forming a source electrode and a drain electrode).

After this, the contact layer 216 is divided to form the pair of the first contact layers 216A opposite to each other and the pair of the second contact layers 216B opposite to each other, as in Embodiment 1. As a result, the first device unit 203A and the second device unit 201B can be manufactured as the bottom-gate type TFTs, as shown in this diagram.

After this, as shown in (e) of FIG. 36, a passivation film 219 may be formed to entirely cover the first device unit 203A and the second device unit 201B, as in Embodiment 1.

As described thus far, by using the method of manufacturing a thin-film device according to the present embodiment, the device units different in device characteristics can be manufactured. The device units are formed by: forming the crystalline silicon thin film including the crystallized areas different in grain structure; and patterning the crystalline silicon thin film based on the difference in grain structure.

Moreover, in the present embodiment, as the conditions for laser irradiation to crystallize the amorphous silicon thin film 213, the beam minor axis width and the scanning speed of the laser light are controlled according to the conditions corresponding to the region C or D shown in FIG. 4. As a result, the first crystalline silicon thin film 215A can be formed to have the grain structure including the strip-shaped first areas 51 larger in average grain size than the second area 52 (the grain structure shown in FIG. 5C or FIG. 5D). At the same time, the second crystalline silicon thin film 215B can be formed to have the grain structure where the strip-shaped first area 51 is not formed (the grain structure shown in FIG. 5B). Thus, the following can be formed at the same time: the first crystalline silicon thin film 215A having the first crystallized area 50A including the strip-shaped first areas 51 larger in grain size; and the second crystalline silicon thin film 215B having the second crystallized area 50B where the grain size is smaller than in the strip-shaped first area 51. Hence, the following can be manufactured at a higher throughput: the first device unit 203A excellent in ON-state current characteristics and suitable for the driver transistor; and the second device unit 201B superior to the first device unit 203A in OFF-state current characteristics and suitable for the switching transistor.

Here, it is more preferable for the first crystalline silicon thin film 215A of the first device unit 203A to be formed under the conditions for laser irradiation corresponding to the region D shown in FIG. 4. When the amorphous silicon thin film 213 is crystallized under the conditions corresponding to the region D to form the first crystalline silicon thin film 215A, the strip-shaped first areas 51 can be formed at regular pitches. With this, the TFT array including the TFTs having TFT characteristics excellent in in-plane uniformity can be implemented.

Next, the following describes a relationship, in the thin-film device 203 according to the present embodiment, between: the grain structure of the amorphous silicon thin film 213 to be crystallized into the first crystalline silicon thin film 215A and the second crystalline silicon thin film 215B; and the light absorptivity of the amorphous silicon thin film 213.

The light absorptivity of the multilayer thin film included in, for example, the TFT can be obtained by calculating the amplitude reflectance and the amplitude transmittance for each layer. FIG. 37 is a diagram explaining a method of calculating the amplitude reflectance and the amplitude transmittance, and also shows a multilayer model structure for the structure of the TFT.

The model structure shown in FIG. 37 includes a fourth layer 504, a third layer 503, a second layer 502, and a first layer 501 that are laminated in this order from the bottom. In this model structure: the first layer 501 is $d_1$ in film thickness and $N_1$ in complex refractive index; the second layer 502 is $d_2$ in film thickness and $N_2$ in complex refractive index; the third layer 503 is $d_3$ in film thickness and $N_3$ in complex refractive index; and the fourth layer 504 is $d_4$ in film thickness and $N_4$ in complex refractive index. Moreover, the region where the complex refractive index is $N_0$ in the diagram is located outside the model structure, and indicates the side on which the laser light is incident. The region where the complex refractive index is $N_0$ refers to a region in an atmosphere of air or nitrogen ($N_2$), for example.

Suppose that the complex refractive index of an n-th layer is $N_n$ in FIG. 37. In this case, the complex refractive index can be expressed by a refractive index n (the real part) and an extinction coefficient k (the real part). On this account, the complex refractive indexes of the first layer 501, the second layer 502, the third layer 503, and the fourth layer 504 can be expresses as $N_1=n_1-ik_1$, $N_2=n_2-ik_2$, $N_3=n_3-ik_3$, and $N_4=n_4-ik_4$, respectively. Here, the complex refractive index of the outside can be expressed as $N_0=n_0-ik_0$.

Moreover, suppose that the incident angle on the n-th layer is $\theta_n$ in FIG. 37. In this case, the incident angle on the first layer 501 from the outside, the incident angle on the second layer 502 from the first layer 501, the incident angle on the third layer 503 from the second layer 502, and the incident angle on the fourth layer 504 from the third layer 503 can be expressed as $\theta_0$, $\theta_1$, $\theta_2$, and $\theta_3$, respectively.

Here, Equation 1 below is established according to Snell's law.

[Math. 1]

$$N_0 \sin\theta_0 = N_1 \sin\theta_1 = N_2 \sin\theta_2 = N_3 \sin\theta_3 = N_4 \sin\theta_4 \qquad \text{Equation 1}$$

Furthermore, suppose that the amplitude reflection coefficient of the light incident from an m-th layer to the n-th layer is $\rho_{mn}$ in FIG. 37. In this case, the amplitude reflection coefficient $\rho_{01}$ of the light incident from the outside to the first layer 501, the amplitude reflection coefficient $\rho_{12}$ of the light incident from the first layer 501 to the second layer 502, the amplitude reflection coefficient $\rho_{23}$ of the light incident from the second layer 502 to the third layer 503, and the amplitude reflection coefficient $\rho_{34}$ of the light incident from the third layer 503 to the fourth layer 504 can be expressed by Equation 2 to Equation 4 below, respectively.

[Math. 2]

$$\rho_{01} = \frac{N_0\cos\theta_1 - N_1\cos\theta_0}{N_0\cos\theta_1 + N_1\cos\theta_0} \qquad \text{Equation 2}$$

[Math. 3]

$$\rho_{12} = \frac{N_1\cos\theta_2 - N_2\cos\theta_1}{N_1\cos\theta_2 + N_2\cos\theta_1} \qquad \text{Equation 3}$$

[Math. 4]

$$\rho_{23} = \frac{N_2\cos\theta_3 - N_3\cos\theta_2}{N_2\cos\theta_3 + N_3\cos\theta_2} \qquad \text{Equation 4}$$

Moreover, suppose that the amplitude transmission coefficient of the light incident from the m-th layer to the n-th layer is $\tau_{mn}$ in FIG. 37. In this case, the amplitude transmission coefficient $\tau_{01}$ of the light incident from the outside to the first layer 501, the amplitude transmission coefficient $\tau_{12}$ of the light incident from the first layer 501 to the second layer 502, the amplitude transmission coefficient $\tau_{23}$ of the light incident from the second layer 502 to the third layer 503, and the amplitude transmission coefficient $\tau_{34}$ of the light incident from the third layer 503 to the fourth layer 504 can be expressed by Equation 5 to Equation 7 below, respectively.

[Math. 5]

$$\tau_{01} = \frac{2N_0\cos\theta_1}{N_0\cos\theta_1 + N_1\cos\theta_0} \qquad \text{Equation 5}$$

[Math. 6]

$$\tau_{12} = \frac{2N_1\cos\theta_2}{N_1\cos\theta_2 + N_2\cos\theta_1} \qquad \text{Equation 6}$$

[Math. 7]

$$\tau_{23} = \frac{2N_2\cos\theta_3}{N_2\cos\theta_3 + N_3\cos\theta_2} \qquad \text{Equation 7}$$

Here, suppose two layers of the third layer 503 and the second layer 502 as a single layer, and also suppose that the amplitude reflection coefficient and the amplitude transmission coefficient of this single layer are $\rho_{123}$ and $\tau_{123}$, respectively. Moreover, suppose three layers of the third layer 503, the second layer 502, and the first layer 501 as a single layer, and also suppose that the amplitude reflection coefficient and the amplitude transmission coefficient of this single layer are $\rho_{0123}$ and $\tau_{0123}$, respectively. In this case, $\rho_{123}$, $\tau_{123}$, $\rho_{0123}$, and $\tau_{0123}$ are calculated by Equation 8 to Equation 13 as follows. It should be noted that λ represents the wavelength of the laser light incident on the first layer 501.

[Math. 8]

$$\rho_{0123} = \frac{\rho_{01} + \rho_{123}e^{-i2\delta_1}}{1 + \rho_{01}\rho_{123}e^{-i2\delta_1}} \qquad \text{Equation 8}$$

[Math. 9]

$$\rho_{123} = \frac{\rho_{12} + \rho_{23}e^{-i2\delta_2}}{1 + \rho_{12}\rho_{23}e^{-i2\delta_2}} \qquad \text{Equation 9}$$

[Math. 10]

$$\tau_{0123} = \frac{\tau_{01} + \tau_{123}e^{-i\delta_1}}{1 + \tau_{01}\tau_{123}e^{-i2\delta_1}} \qquad \text{Equation 10}$$

[Math. 11]

$$\tau_{123} = \frac{\tau_{12} + \tau_{23}e^{-i2\delta_2}}{1 + \tau_{12}\tau_{23}e^{-i2\delta_2}} \qquad \text{Equation 11}$$

[Math. 12]

$$\delta_1 = \frac{2\pi d_1 N_1 \cos\theta_1}{\lambda} \qquad \text{Equation 12}$$

[Math. 13]

$$\delta_2 = \frac{2\pi d_2 N_2 \cos\theta_2}{\lambda} \qquad \text{Equation 13}$$

When Equation 2 to Equation 7 are substituted into Equation 8 to Equation 13, reflectances $R_1$ and $R_2$ and transmittances $T_1$ and $T_2$ can be calculated by Equation 14 to Equation 17 as follows.

[Math. 14]

$$R_1 = |\rho_{0123}|^2 \qquad \text{Equation 14}$$

[Math. 15]

$$R_2 = |\rho_{123}|^2 \qquad \text{Equation 15}$$

-continued

[Math. 16]

$$T_1 = \left(\frac{\text{Re}(n_3)\cos\theta_0}{\text{Re}(n_0)\cos\theta_3}\right)|\tau_{0123}|^2 \qquad \text{Equation 16}$$

[Math. 17]

$$T_2 = \left(\frac{\text{Re}(n_3)\cos\theta_1}{\text{Re}(n_1)\cos\theta_3}\right)|\tau_{123}|^2 \qquad \text{Equation 17}$$

Moreover, the light absorptivity A of the first layer 501 can be expressed by Equation 18 below using $R_1$ and $T_1$.

[Math. 18]

$$A=1-(R_1+T_1) \qquad \text{Equation 18}$$

Suppose that the laser light having the wavelength λ is incident on the model structure in FIG. 37 perpendicularly, or more specifically, at an incident angle $\theta_0$ within a range where $\theta_0=0°$ (sin $\theta_0=0$) holds approximately. In this case, the light absorptivity of the amorphous silicon thin film above the gate electrode can be calculated using the aforementioned calculation method.

As shown in FIG. 38A, a model structure of a thin-film semiconductor device according to the present embodiment has the following configuration. A gate electrode 511 corresponding to the fourth layer 504 is formed on a substrate 510. A first gate insulating film 512a corresponding to the third layer 503 is formed on the gate electrode 511. A second gate insulating film 512b corresponding to the second layer 502 is formed on the first gate insulating film 512a. An amorphous semiconductor thin film 513 corresponding to the first layer 501 is formed on the second gate insulating film 512b. In this configuration, the light absorptivity A of the amorphous semiconductor thin film 513 corresponding to the first layer 501 can be calculated by Equation 18 described above.

Moreover, as shown in FIG. 38B, suppose that: the gate electrode 511 (the fourth layer) comprises molybdenum-tungsten (MoW); the first gate insulating film 512a (the third layer) comprises silicon nitride (SiN); the second gate insulating film 512b (the second layer) comprises a silicon oxide film ($SiO_2$); and the amorphous semiconductor thin film 513 (the first layer) comprises an amorphous silicon film (a-Si film). Then, the light absorptivity of the amorphous silicon film is calculated using Equation 18 above, under the conditions 1 to 4 for the thicknesses of the layers. In this case, the light absorptivities of the amorphous silicon film under the condition 1, the condition 2, the condition 3, and the condition 4 are 44.9(%), 59.0(%), 63.1(%), and 70.1(%), respectively, as shown in this diagram.

Figure 39A:
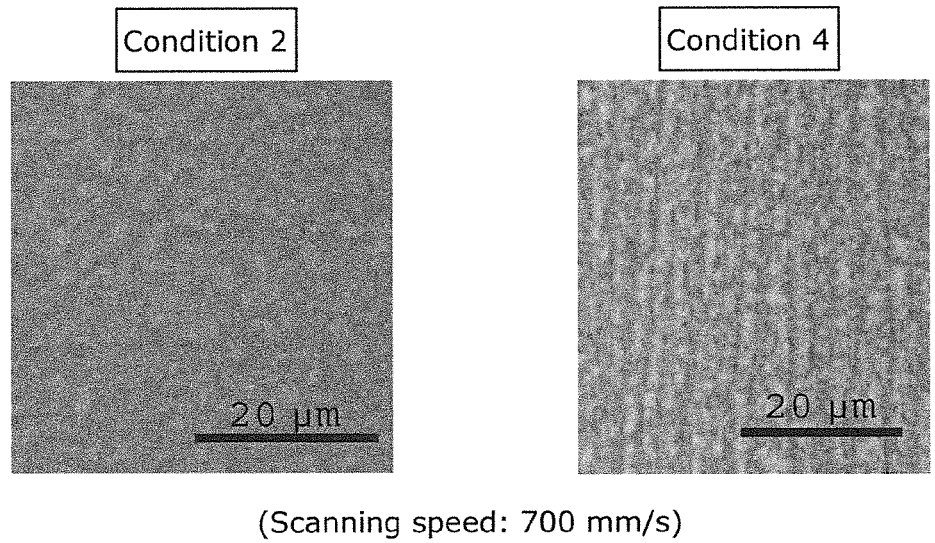
FIG. 39A shows optical microscopic images of the surfaces of the crystalline silicon thin films crystallized by the laser irradiation applied to the amorphous silicon films included in the thin-film semiconductor devices manufactured under the conditions 2 and 4 shown in FIG. 38B.
Figure 39B:
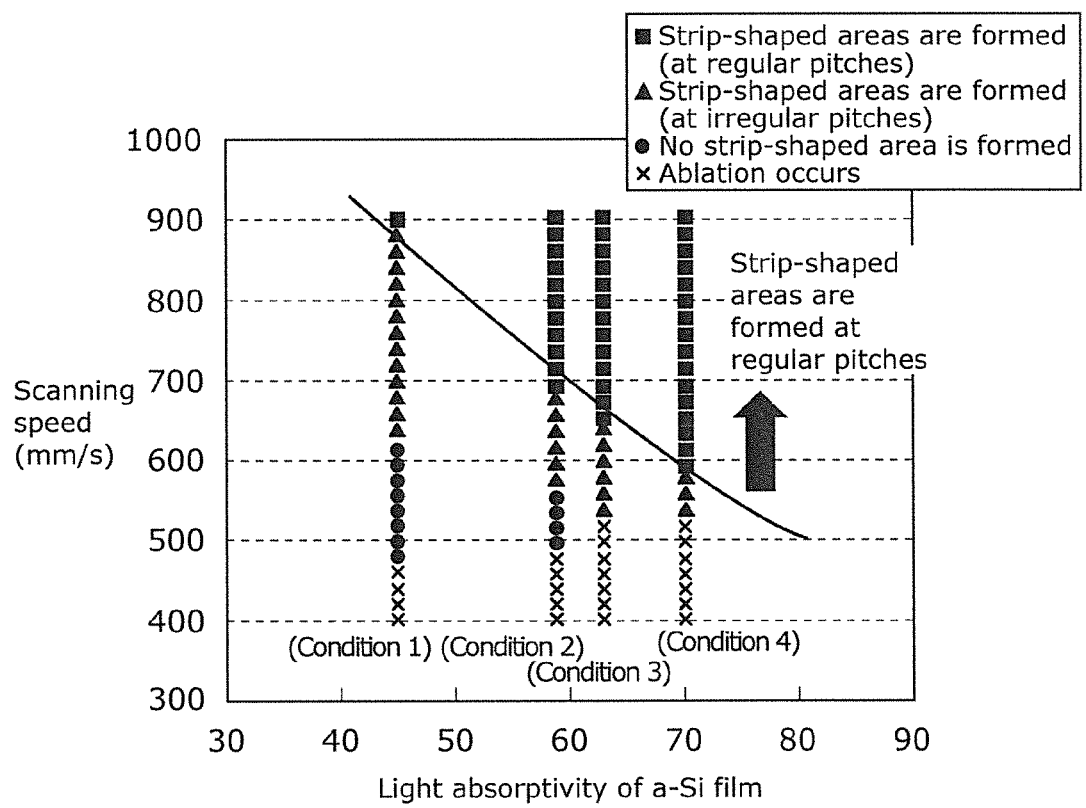
FIG. 39B is a diagram showing the result of observing each of the grain structures of the crystalline silicon films with respect to the light absorptivity of the amorphous silicon film and the scanning speed of the laser, in the case where the amorphous silicon films are crystallized by the laser irradiation under the four conditions shown in FIG. 38B.

Next, the following describes the experimental result obtained by actually manufacturing the thin-film semiconductor device shown in FIG. 38A for each of the four conditions shown in FIG. 38B and forming the crystalline silicon thin film by irradiating the amorphous semiconductor thin film 513 (the amorphous silicon film) corresponding to the first layer with the laser light, with reference to FIG. 39A and FIG. 39B. In this experiment, the state of the grain structure is evaluated by observing the grain structure of the crystallized amorphous silicon, i.e., the grain structure of the crystalline silicon thin film, with an optical microscope. Moreover, in this experiment: the scanning speed is 400 (mm/s) to 900 (mm/s); the beam minor axis width of the laser light is 32 μm; and the power density of the laser light is 90 (kW/cm²).

FIG. 39A shows optical microscopic images of the surfaces of the crystalline silicon thin films crystallized by the laser irradiation applied to the amorphous silicon films included in the thin-film semiconductor devices manufactured under the condition 2 (where the light absorptivity of the a-Si film is 59.0%) and the condition 4 (where the light absorptivity of the a-Si film is 70.1%) as shown in FIG. 38B. Note that, in each of the cases shown in FIG. 39A, the scanning speed of the laser light is 700 (mm/s).

FIG. 39B is a diagram showing the result of observing each of the grain structures of the crystalline silicon films with respect to the light absorptivity of the amorphous silicon film and the scanning speed of the laser, in the case where the amorphous silicon films are crystallized by the laser irradiation under the four conditions 1 to 4. As shown in FIG. 39B, in this experiment, while the scanning speed of the laser is being changed within the range from 400 (mm/s) to 900 (mm/s), the grain structure of the crystallized amorphous silicon film is observed by the optical microscope to plot the states of the grain structure for each of the conditions. With reference to FIG. 5A to FIG. 5D, the grain structure is evaluated by determining which one of the grain structures shown in FIG. 5A to FIG. 5D the resulting grain structure corresponds to. In FIG. 39B, a filled square indicates the grain structure where the strip-shaped first areas 51 are formed at regular pitches (the grain structure shown in FIG. 5D). Moreover, a filled triangle indicates the grain structure where the strip-shaped first areas 51 are formed at irregular pitches (the grain structure shown in FIG. 5C). Furthermore, a filled circle indicates the grain structure where the strip-shaped first area 51 is not formed (the grain structure shown in FIG. 5B). Moreover, x indicates the grain structure where ablation occurs (the grain structure shown in FIG. 5A).

As shown in FIG. 39B, in the relationship between the light absorptivity of the amorphous silicon film and the scanning speed of the laser, the condition indicating a boundary between the condition under which the grain structure includes the strip-shaped first areas 51 formed at regular pitches (shown by the filled square) and the condition under which the grain structure includes the strip-shaped first areas 51 formed at irregular pitches (shown by the filled triangle) can be approximated by the straight line shown in FIG. 39B.

Here, the light absorptivity of the amorphous silicon film correlates highly with the irradiation time of the laser light (the scanning speed). Thus, suppose that the beam minor axis width is fixed and that the scanning speed in FIG. 39B is replaced by the laser irradiation time expressed as "irradiation time=minor-axis width (32 μm)/scanning speed" as in FIG. 6A and FIG. 6B. In this case, the straight line shown in FIG. 39B can be expressed as the straight line L1 shown in FIG. 40. To be more specific, the straight line L1 shown in FIG. 40 indicates the boundary between the condition under which the grain structure includes the strip-shaped first areas 51 formed at regular pitches (the grain structure shown in FIG. 5D) and the condition under which the grain structure includes the strip-shaped first areas 51 formed at irregular pitches (the grain structure shown in FIG. 5C).

Figure 40:
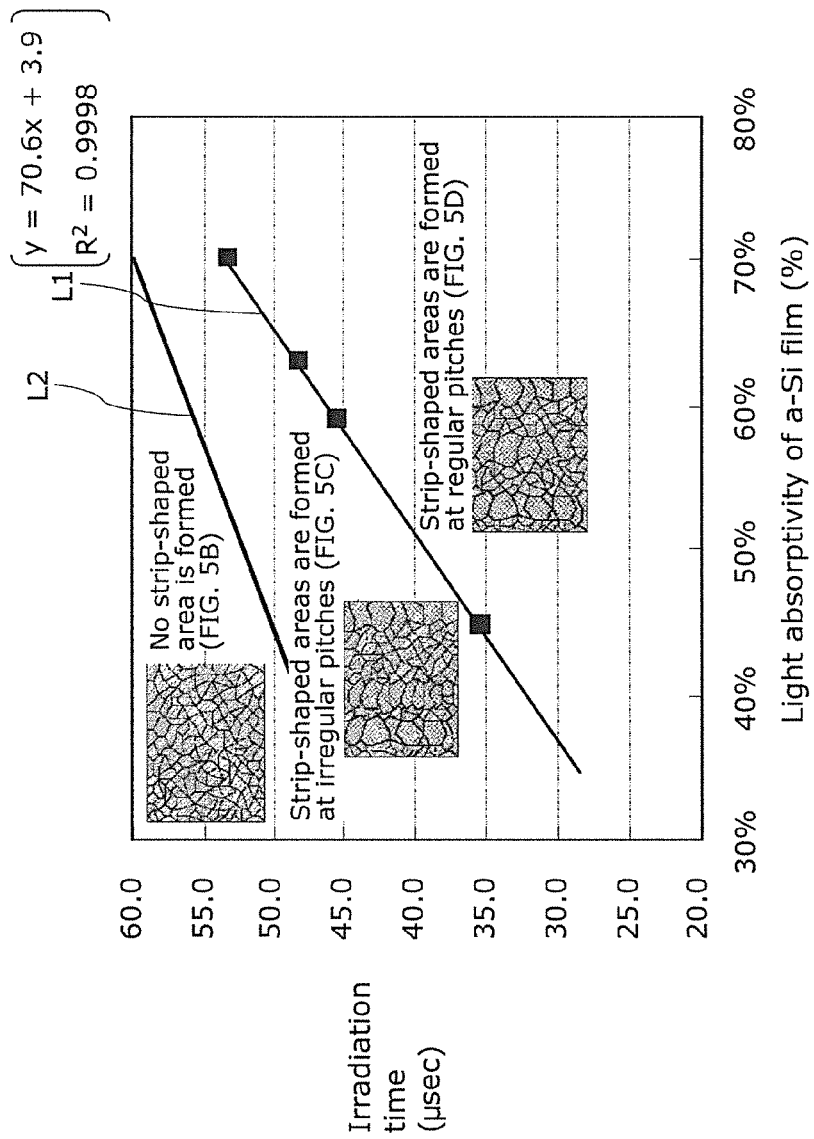
FIG. 40 is a diagram showing a relationship among the light absorptivity of the amorphous silicon film, the irradiation time of the laser light, and the grain structure of the crystalline silicon thin film.

In FIG. 40, when the light absorptivity of the amorphous silicon film is represented by x and the irradiation time of the laser light is represented by y, the straight line L1 can be calculated by y=70.6x+3.9. Therefore, the condition for forming the strip-shaped first areas 51 at regular pitches is satisfied in a region where a relational expression of y<70.6x+3.9 is satisfied. On the other hand, the condition for forming the strip-shaped first areas 51 at irregular pitches is satisfied in a region where a relational expression of y>70.6x+3.9 is satisfied.

It can be understood from this experimental result that, even when the irradiation times (the scanning speeds) of the laser light are the same, the crystalline silicon films different in grain structure can be formed according to a difference in light absorptivity between the amorphous silicon films. The light absorptivity of the amorphous silicon film can be changed by, for example, changing a material used for the gate electrode. To be more specific, based on a difference in optical constants (n, k) between the electrode materials used for the gate electrodes, the materials for the gate electrodes may be selected in order for the light absorptivities of the amorphous silicon films to satisfy the above relational expressions. As a result, the grain structure where the strip-shaped first areas 51 are formed at regular pitches and the grain structure where the strip-shaped first areas 51 are formed at irregular pitches can be separately formed. Accordingly, the following can be separately manufactured: the TFT including, as the channel, the crystalline silicon thin film having the grain structure where the strip-shaped first areas 51 are formed at regular pitches; and the TFT including, as the channel, the crystalline silicon thin film having the grain structure where the strip-shaped first areas 51 are formed at irregular pitches. Therefore, the TFTs different from each other in TFT characteristics can be separately formed with high in-plane uniformity.

Note that, as shown in FIG. 40, the straight line L2 indicating the boundary between the condition under which the grain structure includes no strip-shaped first area 51 (the grain structure shown in FIG. 5B) and the condition under which the grain structure includes the strip-shaped first areas 51 formed at irregular pitches (the grain structure shown in FIG. 5C) can be calculated according to a method similar to the method for calculating the straight line L1, based on the experimental result shown in FIG. 39B. Thus, by selecting the materials used for the gate electrodes, the grain structure where the strip-shaped first area 51 is not formed and the grain structure where the strip-shaped first areas 51 are formed can be separately formed.

Next, a relationship between the type of material used for the gate electrode and the light absorptivity of the amorphous silicon film is described, with reference to FIG. 41A, FIG. 41B, FIG. 42A, FIG. 42B, and FIG. 42C.

Figures 41A, 41B:
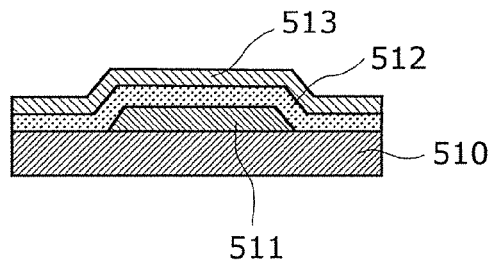
FIG. 41A is a cross-sectional view of a model structure of a thin-film semiconductor device according to Embodiment 3 of the present invention.
FIG. 41B is a diagram showing optical constants for each material to be used for layers of the thin-film semiconductor device shown in FIG. 41A.

As shown in FIG. 41A, a model structure of the thin-film semiconductor device includes the gate electrode 511, the gate insulting film 512, and the amorphous semiconductor thin film 513 that are sequentially formed on the substrate 510. FIG. 41B shows optical constants for each material to be used for layers of the thin-film semiconductor device shown in FIG. 41A. To be more specific, when an amorphous silicon film is used as a material for the amorphous semiconductor thin film 513, the refractive index is 4.979 and the extinction coefficient is 0.688. Moreover, when SiO is used as a material for the gate insulating film 512, the refractive index is 1.46. When SiN is used as a material for the gate insulating film 512, the refractive index is 1.9. Furthermore, when Al is used as a material for the gate electrode 511, the refractive index is 0.867 and the extinction coefficient 6.42. When Cu is used as a material for the gate electrode 511, the refractive index is 1.04 and the extinction coefficient 2.59. When Mo is used as a material for the gate electrode 511, the refractive index is 3.79 and the extinction coefficient 3.3.

Figure 42A:
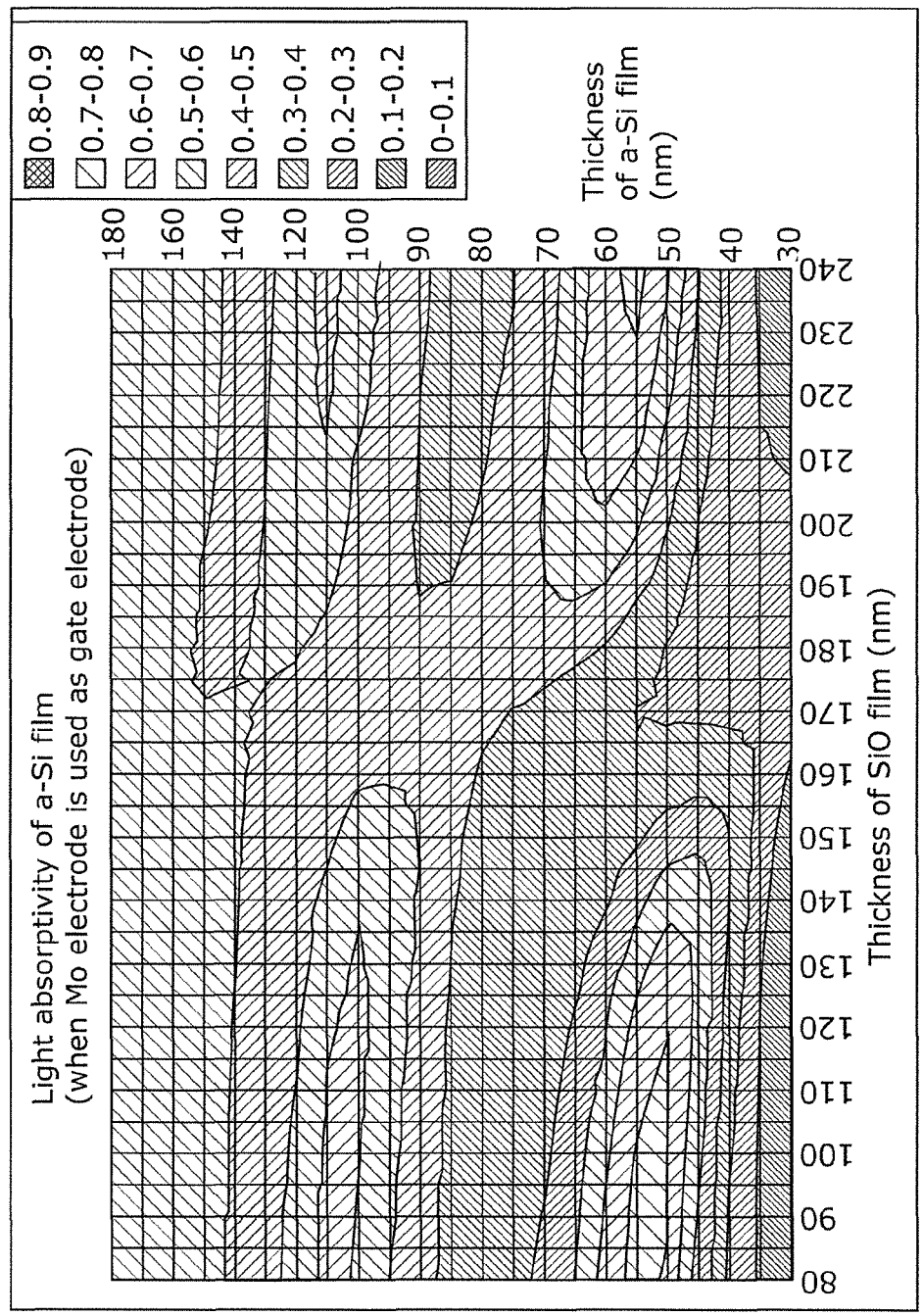
FIG. 42A is a diagram showing a distribution of the light absorptivity of the amorphous silicon film when a gate electrode is molybdenum (Mo) and a gate insulating film is silicon oxide (SiO) in the case where the thin-film semiconductor device has the configuration shown in FIG. 41A.
Figure 42B:
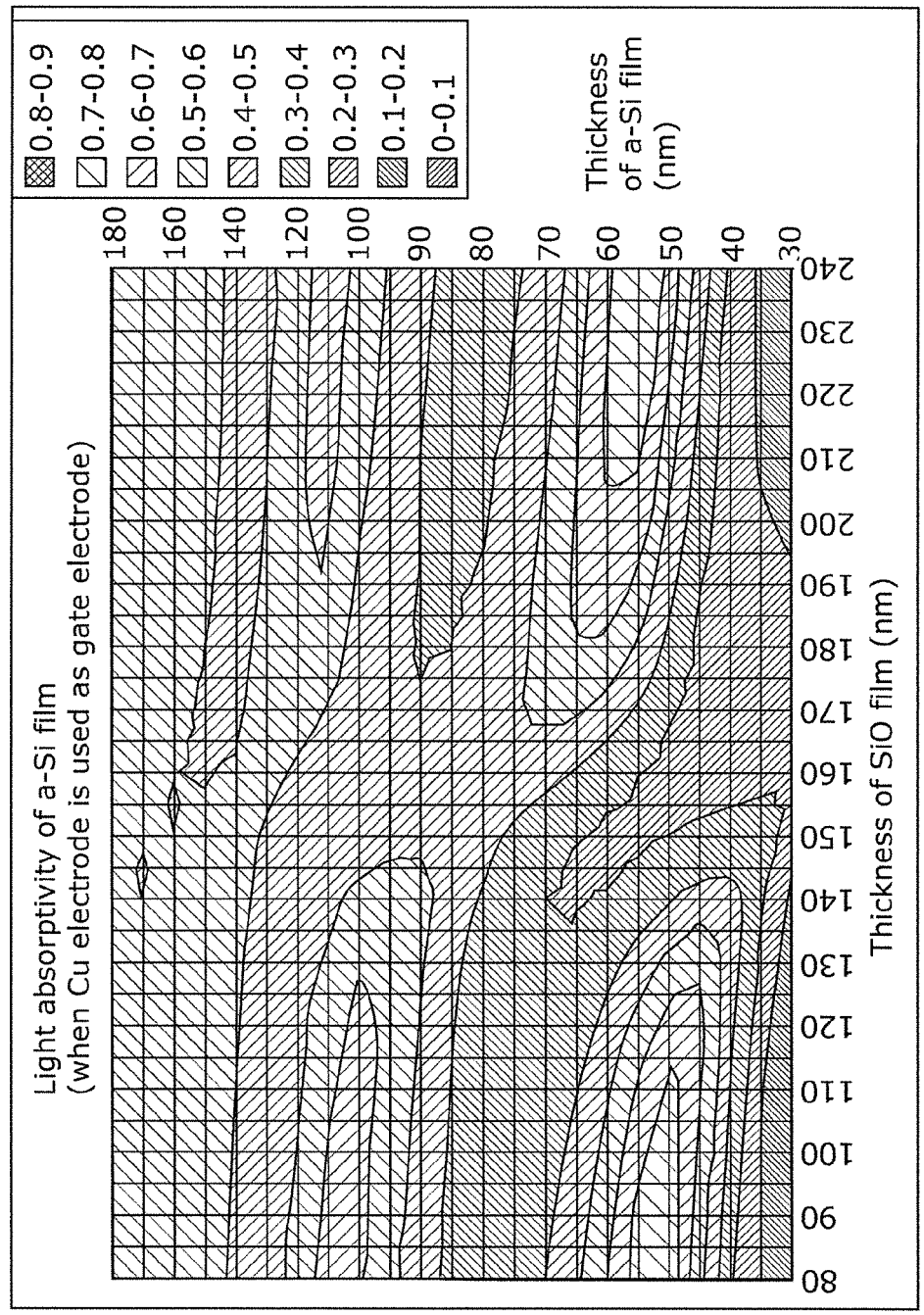
FIG. 42B is a diagram showing a distribution of the light absorptivity of the amorphous silicon film when the gate electrode is copper (Cu) and the gate insulating film is silicon oxide (SiO) in the case where the thin-film semiconductor device has the configuration shown in FIG. 41A.

Here, the light absorptivity of the amorphous silicon film used as the amorphous semiconductor thin film 513 is calculated. When the gate electrode 511 comprises Mo and the gate insulating film 512 comprises SiO for example, the light absorptivity of the amorphous silicon film has the distribution as shown in FIG. 42A depending on the thickness of the SiO film and the thickness of the amorphous silicon film. Moreover, when the gate electrode 511 comprises Cu and the gate insulating film 512 comprises SiO, the light absorptivity of the amorphous silicon film has the distribution as shown in FIG. 42B depending on the thickness of the SiO film and the thickness of the amorphous silicon film. Furthermore, when the gate electrode 511 comprises Al and the gate insulating film 512 comprises SiO, the light absorptivity of the amorphous silicon film has the distribution as shown in FIG. 42C depending on the thickness of the SiO film and the thickness of the amorphous silicon film.

Figure 42C:
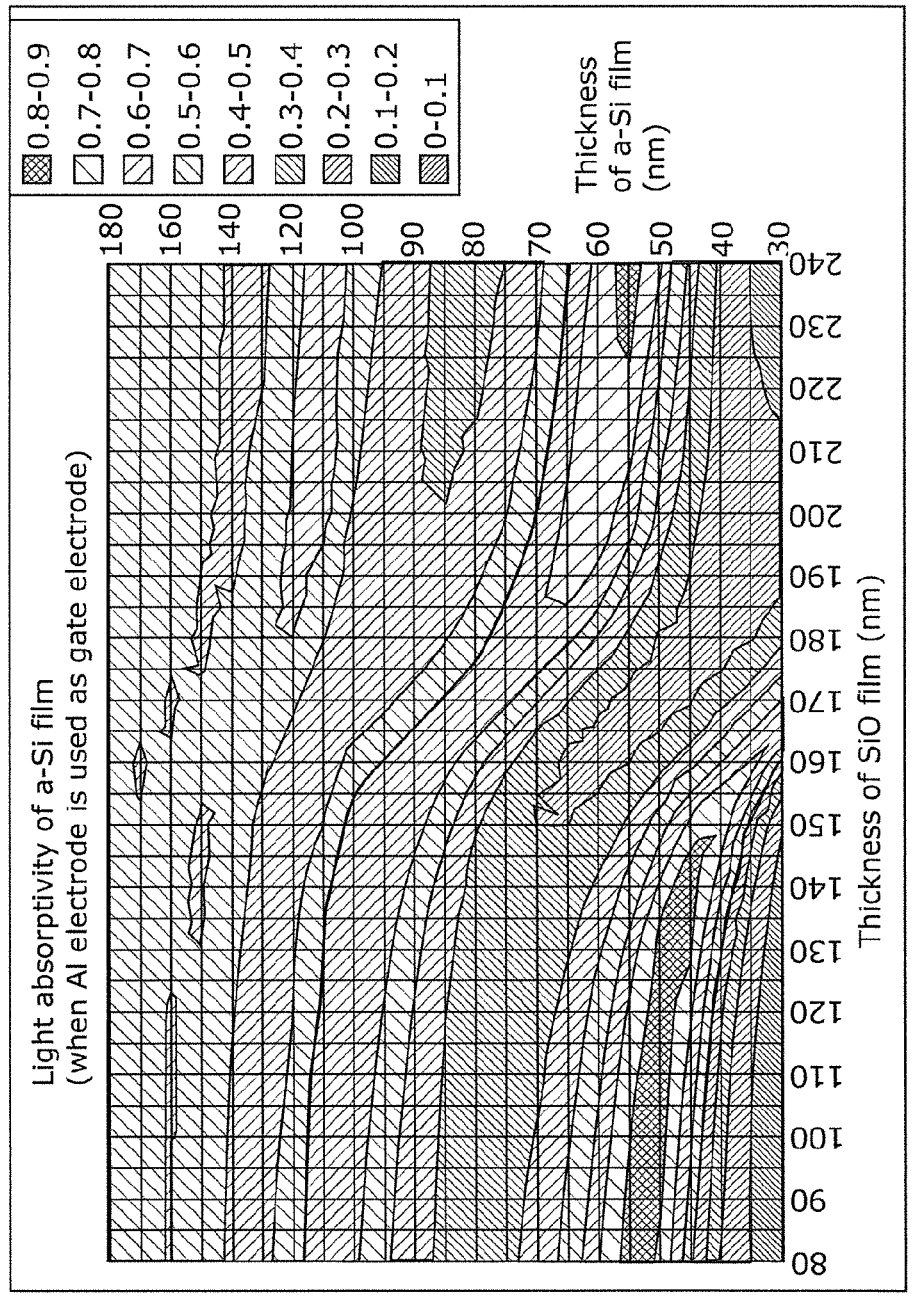
FIG. 42C is a diagram showing a distribution of the light absorptivity of the amorphous silicon film when the gate electrode is aluminum (Al) and the gate insulating film is silicon oxide (SiO) in the case where the thin-film semiconductor device has the configuration shown in FIG. 41A.
Figure 43A:
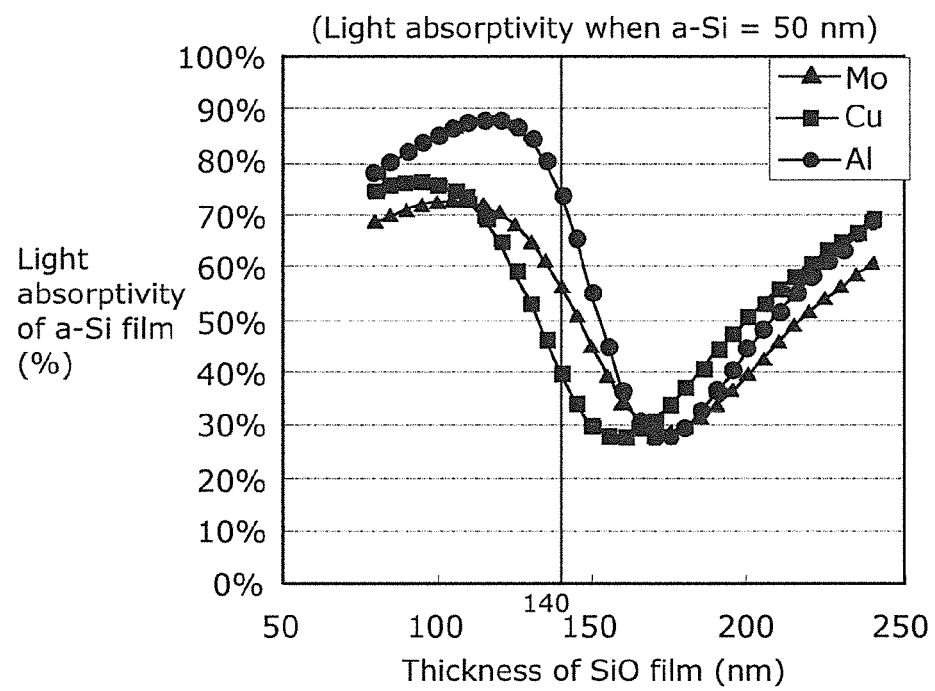
FIG. 43A is a diagram showing the light absorptivity of the amorphous silicon film (50 nm) with respect to the film thickness of SiO.

FIG. 43A shows the light absorptivity of the amorphous silicon film having a thickness of 50 nm, as an example among the light absorptivities of the amorphous silicon films shown in FIG. 42A to FIG. 42C. It can be seen from FIG. 43A that, even when the amorphous silicon films are the same in thickness and the SiO films are the same in the thickness, the amorphous silicon films are different in light absorptivity because of a difference among the materials used for the gate electrode. For example, as can be seen from FIG. 43A, in the case where the SiO film has a thickness of 140 nm, the light absorptivity of the amorphous silicon film is 56.1% when the gate electrode comprises Mo (Mo electrode). Moreover, in this case, the light absorptivity of the amorphous silicon film is 39.5% when the gate electrode comprises Cu (Cu electrode). Furthermore, in this case, the light absorptivity of the amorphous silicon film is 73.6% when the gate electrode comprises Al (Al electrode).

Figure 43B:
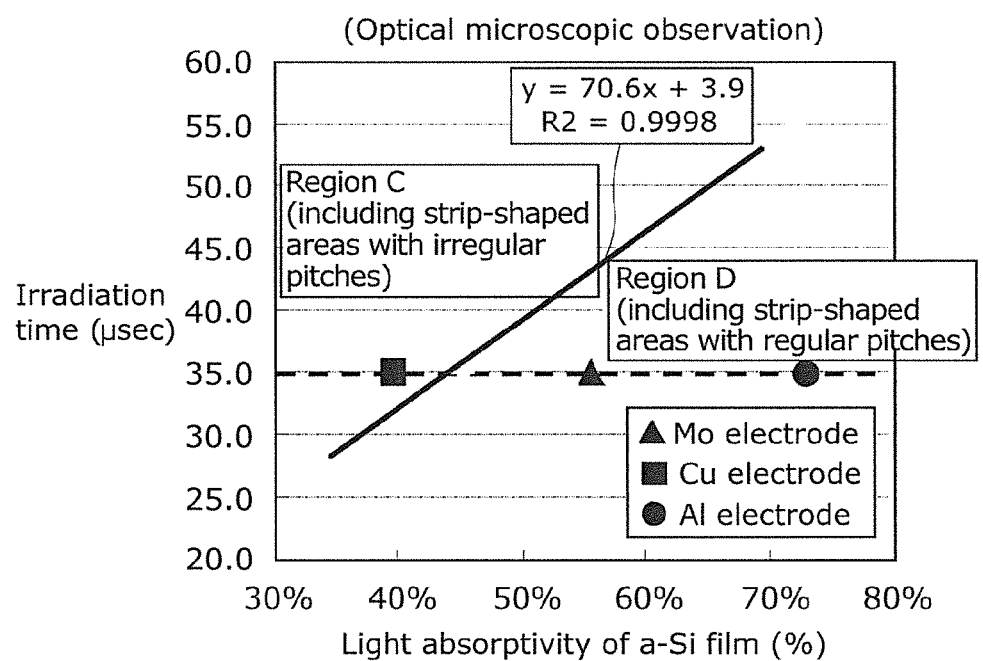
FIG. 43B is a diagram showing a relationship among the light absorptivity of the amorphous silicon film, the irradiation time of the laser light, and the grain structure of the crystalline silicon thin film.

Here, FIG. 43B shows a result of plotting the light absorptivities of the amorphous silicon films in the case where the SiO film has a thickness of 140 nm, at the irradiation time of 35 µm in FIG. 40. To be more specific, as can be seen from FIG. 43B, when Cu is used as a material for the gate electrode, the amorphous silicon film irradiated with the laser light is crystallized into the crystalline silicon thin film having the grain structure where the strip-shaped first areas 51 are formed at irregular pitches (the grain structure shown in FIG. 5C). Moreover, when Mo or Al is used as a material for the gate electrode, the amorphous silicon film irradiated with the laser light is crystallized into the crystalline silicon thin film having the grain structure where the strip-shaped first areas 51 are formed at regular pitches (the grain structure shown in FIG. 5D).

Figure 44A:
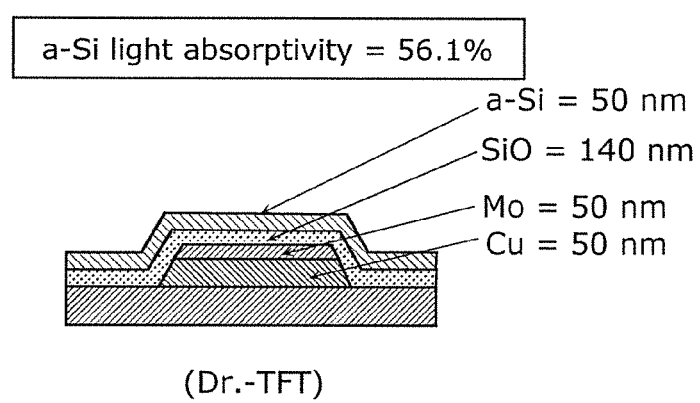
FIG. 44A is a cross-sectional view showing an example of a configuration of a thin-film semiconductor device according to Embodiment 3 of the present invention.

Therefore, from the result shown in FIG. 43B, in the case of the TFT that includes the gate electrode having the two-layer structure of Cu (50 nm) and Mo (50 nm) and also includes the gate insulating film comprising SiO (140 nm), the light absorptivity of the amorphous silicon film (50 nm) is 56.1%, as shown in FIG. 44A for example. Then, this amorphous field film is crystallized by laser irradiation into the crystalline silicon thin film having the grain structure where the strip-shaped first areas 51 are formed at regular pitches. The TFT including, as the channel, the crystalline silicon thin film having such a grain structure is excellent in ON-state current characteristics and thus suitable for the driver transistor.

Moreover, in the case of the TFT that includes the gate electrode having the single-layer structure of Cu (50 nm) and also includes the gate insulating film comprising SiO (140 nm), the light absorptivity of the amorphous silicon film (50 nm) is 39.5%, as shown in FIG. 44A for example. Then, this amorphous field film is crystallized by laser irradiation into the crystalline silicon thin film having the grain structure where the strip-shaped first areas 51 are formed at irregular pitches. The TFT including, as the channel, the crystalline silicon thin film having such a grain structure is superior to the TFT shown in FIG. 43A in OFF-state current characteristics and thus suitable for the switching transistor.

Figure 44B:
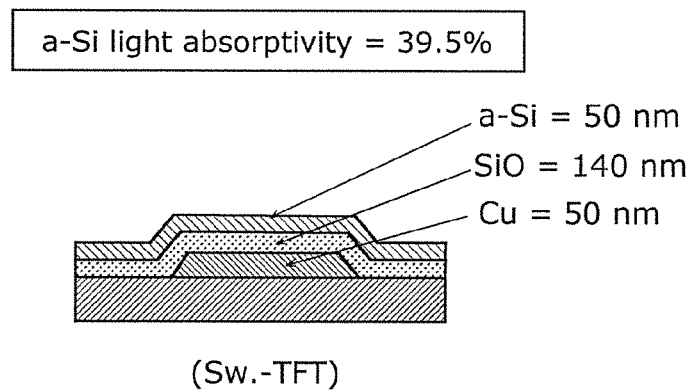
FIG. 44B is a cross-sectional view showing another example of the configuration of the thin-film semiconductor device according to Embodiment 3 of the present invention.

In FIG. 44A and FIG. 44B, as the conditions for laser irradiation: the power density is 90 (kW/cm$^2$); the scanning speed is 900 (mm/s); the minor axis width of the laser light is 32 (μm); and the laser irradiation time is 35 (μsec). Moreover, in the configuration examples shown in FIG. 44A and FIG. 44B, the gate electrode of the driver transistor has the two-layer structure and the gate electrode of the switching transistor has the single-layer structure. However, as long as the grain structures different in light absorptivity of the amorphous silicon film can be separately formed, each of the driver transistor and the switching transistor may have a single-layer structure or a laminated structure.

Example of Embodiment 3

Next, an example of the method of manufacturing a thin-film device according to the present invention is explained, with reference to FIG. 35 and FIG. 36 described above.

Firstly, as shown in (a) of FIG. 35, a glass substrate is prepared as the substrate 210. Then, an undercoat (not illustrated) comprising an insulating film of a silicon oxide film is formed with a thickness of 500 nm on the glass substrate by plasma CVD. After this, as shown in (b) of FIG. 35, each of a first gate metal film $211M_1$ comprising Cu and a second gate metal film $211M_2$ comprising Mo is deposited with a thickness of 50 nm on the undercoat film by sputtering. Then, pattering is performed on the first gate metal film $211M_1$ and the second gate metal film $211M_2$ to form the first gate electrode 211A having the two-layer structure and the second gate electrode 211B having the single-layer structure as shown in (c) of FIG. 35. Following this, as shown in (d) of FIG. 35, the gate insulating film comprising a silicon oxide film having a thickness of 140 nm is formed on the first gate electrode 211A and the second gate electrode 211B by plasma CVD. On this film, as shown in (e) of FIG. 35, the amorphous silicon thin film 213 comprising an amorphous silicon film is further formed with a thickness of 55 nm by continuous deposition. After this, the hydrogen content atomic percentage of the amorphous silicon film is set to 3.0 atomic percent or lower by dehydrogenation treatment performed at 500° C.

After this, as shown in (a) of FIG. 36, the substrate 210 on which the amorphous silicon thin film 213 is formed is fixed onto the substrate support unit (stage) 110 of the crystalline semiconductor thin film formation apparatus 100 shown in FIG. 11 and then the amorphous silicon thin film 213 (the amorphous silicon film) is irradiated with the laser light. As a result, the amorphous silicon thin film 213 is crystallized to include the first crystalline silicon thin film 215A and the second crystalline silicon thin film 215B.

In the present example, as the conditions for laser irradiation: the power density is 90 (kW/cm²); the scanning speed is 900 (mm/s); the beam minor axis width is 32 (μm); and the laser irradiation time is 35 (μsec).

Thus, as described above with reference to FIG. 43B, the amorphous silicon film above the first gate electrode 211A is crystallized into the first crystalline silicon thin film 215A including the first crystallized area 50A having the grain structure where the strip-shaped first areas 51 are formed at regular pitches (the grain structure shown in FIG. 5D). Moreover, the amorphous silicon film above the second gate electrode 211B is crystallized into the second crystalline silicon thin film 215B including the second crystallized area having the grain structure where the strip-shaped first areas 51 are formed at irregular pitches (the grain structure shown in FIG. 5C).

Here, a Raman FWHM with respect to the scanning speed of the laser light is described in relation to: the first crystalline silicon thin film 215A (where both the first areas and the second areas are formed) formed under the conditions for laser irradiation according to the present example; and the crystalline silicon thin film (where only the second area is formed with no first area) formed under the conditions for laser irradiation according to the comparative example.

As the conditions for laser irradiation according to the present example: the power density is 70.0 kW/cm²; the stage scanning speed is 580 mm/s; the irradiation time is 49.0 μsec; and the input energy density is 3.5 J/cm². Moreover, as the conditions for laser irradiation according to the comparative example: the power density is 60 kW/cm²; the stage scanning speed is 400 mm/s; the irradiation time is 80.0 μsec; and the input energy density is 4.8 J/cm². In these examples, the beam minor axis width W1 of the laser light is fixed at 32 μm, and the gate electrodes and the like are equal in material used, film thicknesses, and so forth.

The results similar to the results shown in FIG. 25A and FIG. 25B are obtained in the present example as well. To be more specific, it can be seen that the first crystalline silicon thin film 215A formed under the conditions for laser irradiation according to the present example and including both the first areas 51 and the second areas 52 is smaller in the FWHM of the Raman scattering peak spectrum than the crystalline silicon thin film formed under the conditions for laser irradiation according to the comparative example and including only the second area 52 with no first area 51. Such a smaller Raman FWHM indicates that the grain structure of the crystalline silicon thin film includes silicon particles larger in grain size.

Moreover, the FWHM of the Raman shift peak in the first crystalline silicon thin film 215A formed under the conditions for laser irradiation according to the present example is 4.8 cm$^{-1}$ to 5.5 cm$^{-1}$, inclusive. To be more specific, when the FWHM of Raman shift peak in the first crystalline silicon thin film 215A is 4.8 cm$^{-1}$ to 5.5 cm$^{-1}$, inclusive, the crystalline silicon thin film can have the grain structure including the first area 51 where the grain size is large.

Next, referring back to FIG. 36, pattering is performed, by photolithography and wet etching, on the substrate on which the first crystalline silicon thin film 215A and the second crystalline silicon thin film 215B shown in (a) of FIG. 36 are formed. As a result, each of the first crystalline silicon thin film 215A and the second silicon thin film 215B is formed in the shape of an island, as shown in (b) of FIG. 36.

Next, as shown in (c) of FIG. 36, an intrinsic amorphous silicon film (not illustrated) is formed with a thickness of 50 nm by, for example, plasma CVD. Following this, also by plasma CVD, the contact layer 216 is formed with a thickness of 30 nm on the amorphous silicon film. The contact layer 416 is an n$^+$ layer comprising an amorphous silicon film doped with dopant such as phosphorus. After this, as shown in this diagram, the source-drain metal film 217 having a three-layer structure of MoW (50 nm), Al (400 nm), and MoW (50 nm) is formed on the contact layer 216 by sputtering.

Next, pattering is performed to divide the source-drain metal film 217 by photolithography and dry etching to form the pair of the first source electrode 217A and the first drain electrode 218A and the pair of the second source electrode 217B and the second drain electrode 218B.

Next, the contact layer 216 is divided by dry etching, leaving a resist for patterning the source-drain metal film 217, to form the pair of the first contact layers 216A opposite to each other and the pair of the second contact layers 216B opposite to each other as shown in (d) of FIG. 36. After this, the resist is removed. As a result, the first device unit 203A and the second device unit 201B as the bottom-gate type TFTs can be manufactured.

After this, a silicon nitride film may be formed with a thickness of 400 nm by, for example, plasma CVD. Then, contact holes may be formed in the silicon nitride film by photolithography and dry etching. Following this, an indium tin oxide (ITO) film serving as a transparent electrode may be deposited with a thickness of 100 nm by sputtering, and then patterning may be performed on the ITO film by photolithography and dry etching.

Embodiment 4

Figure 45A:
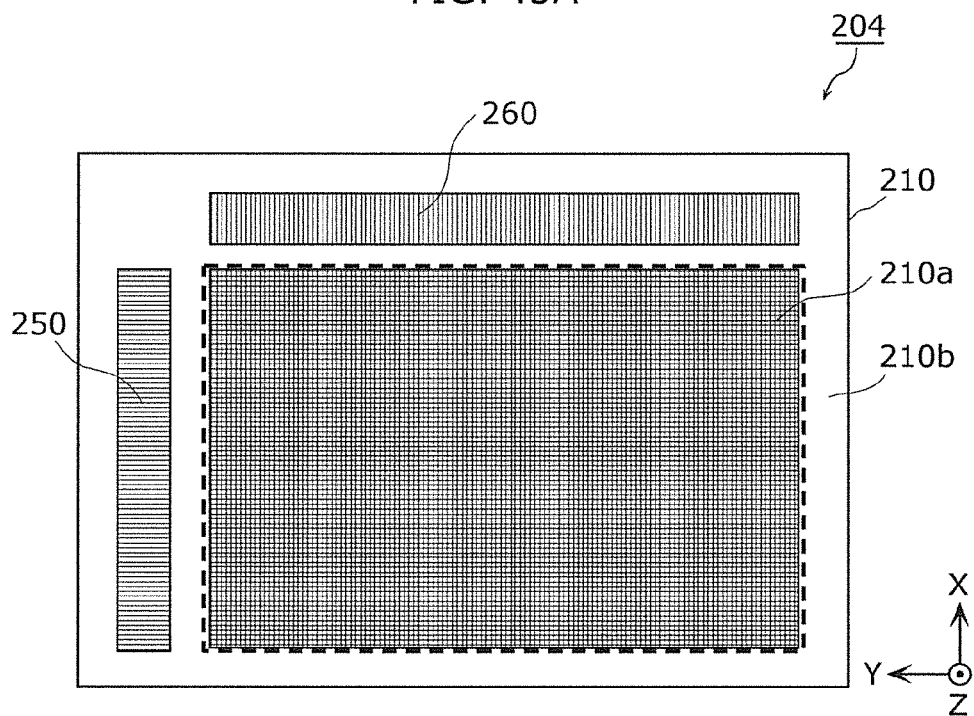
FIG. 45A is a schematic plan view showing a configuration of a thin-film device array substrate according Embodiment 4 of the present invention.

The following describes Embodiment 4 of the present invention. The present embodiment describes a thin-film device array substrate (a thin-film device array) including the first device unit 203A and the second device unit 201B of the thin-film device 203 according to Embodiment 3. The thin-film device array substrate according to the present embodiment can be formed using the method of forming a crystalline thin film according to Embodiment 1. FIG. 45A is a schematic plan view showing a configuration of the thin-film device array substrate according to Embodiment 4 of the present invention.

As shown in FIG. 45A, a thin-film device array substrate 204 according to the present embodiment includes a substrate 210 having a plane area that is divided into an inner area 210a and a peripheral area 210B, a gate driver circuit 250, and a source driver circuit 260, as in Embodiment 2. In FIG. 45A, the inner area 210a refers to the area inside the dashed-line box and the peripheral area 210b refers to the area outside the dashed-line box.

The inner area 210a is a rectangular area that corresponds to a pixel area (a display area) where a plurality of pixels are arranged in a matrix (with rows and columns) on the substrate 210 and is surrounded by the peripheral area 210b, as in Embodiment 2. On the other hand, the peripheral area 210b surrounds the pixel area (the inner area 210a) on the substrate 210 and is in the shape of a picture frame (a frame-like area). Here, note that each of the pixels in the inner area 210a includes TFTs such as a switching transistor.

The respective configurations of the gate driver circuit 250 and the source driver circuit 260 are the same as those described in Embodiment 2 and, therefore, the explanation of these circuits are omitted here.

Each of the TFTs in the pixels of the inner area 210a, the gate driver circuit 250, and the source driver circuit 260 according to the present embodiment is also formed using the LTPS (low temperature poly-silicon) technology.

Figure 45B:
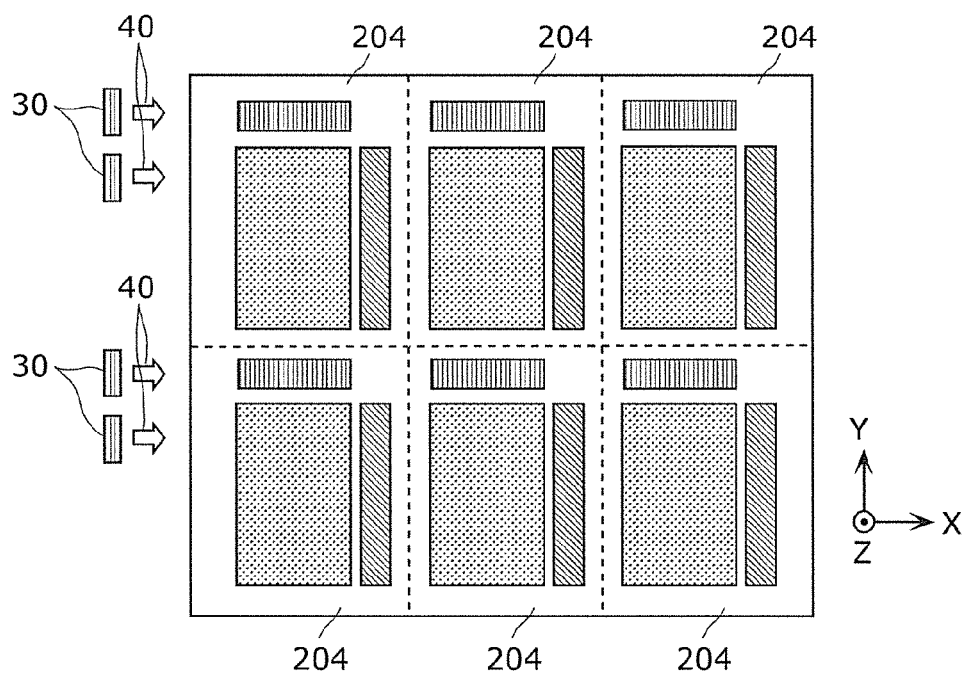
FIG. 45B is a plan view of a mother substrate included in the thin-film device array substrate according to Embodiment 4 of the present invention.

FIG. 45B is a diagram showing a mother substrate of thin-film device array substrates according to Embodiment 4. FIG. 45B shows an example where six substrate pieces are to be cut out. By cutting this mother substrate, six thin-film device array substrates 204 can be obtained. In the present embodiment, an amorphous silicon thin film formed on a mother substrate before cutting is irradiated with a laser light 30 as shown in FIG. 45B. As a result, a crystalline silicon thin film is formed.

Figure 46A:
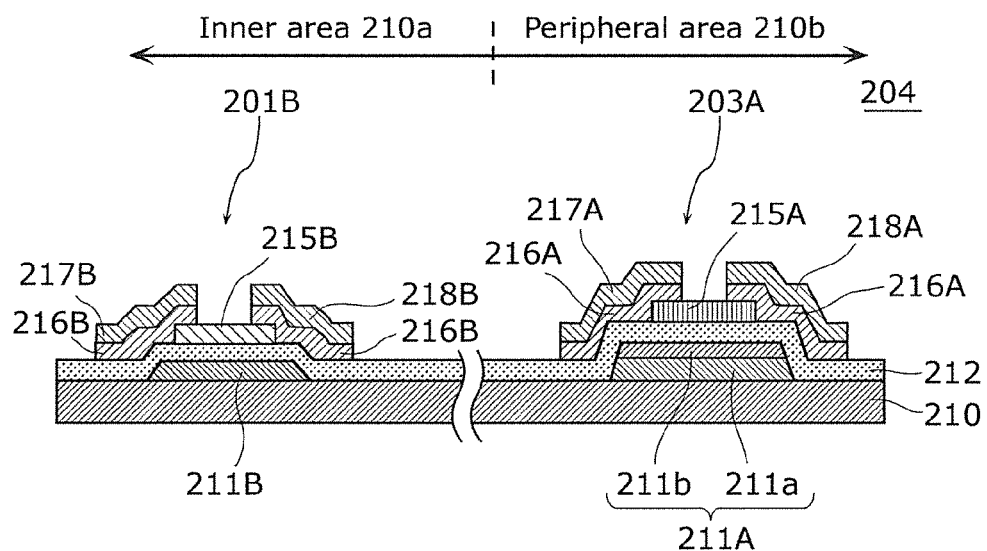
FIG. 46A is a cross-sectional view showing device units and surrounding areas on the thin-film device array substrate according to Embodiment 4 of the present invention.
Figure 46B:
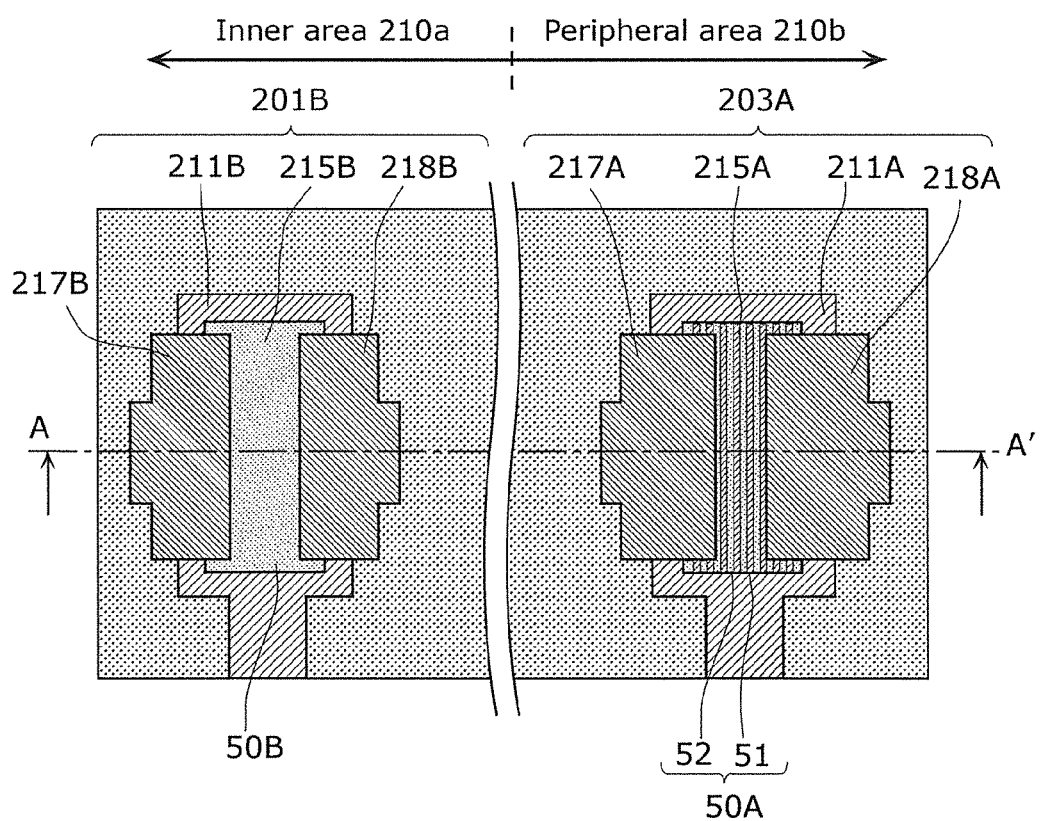
FIG. 46B is a plan view showing device units and surrounding areas on the thin-film device array substrate according to Embodiment 4 of the present invention.

Next, configurations of device units of the thin-film device array substrate 204 according to Embodiment 4 of the present invention are described, with reference FIG. 46A and FIG. 46B. FIG. 46A is a cross-sectional view showing the device units and surrounding areas on the thin-film device array substrate according to Embodiment 4 of the present invention. FIG. 46B is a plan view showing the device units and surrounding areas on the thin-film device array substrate according to Embodiment 4 of the present invention. Note that FIG. 46A is the cross-sectional view along the line A-A' shown in FIG. 46B.

As shown in FIG. 46A and FIG. 46B, the thin-film device array substrate 204 according to the present embodiment includes a first device unit 203A formed in the peripheral area 210b of the substrate 210 and a second device unit 201B formed in the inner area 210a of the substrate 210. In the present embodiment, the first device unit 203A is a driver transistor included in each of the gate driver circuit 250 and the source driver circuit 260 provided in the peripheral area 210b of the substrate 210. Moreover, the second device unit 201B is a switching transistor provided for each pixel included in the inner area 210a of the substrate 210.

As in Embodiment 3, the thin-film device array substrate 204 includes: the substrate 210; a first gate electrode 211A formed in the inner area 210a on the substrate 210; a second gate electrode 211B formed in the inner area 210a on the substrate 210 and located apart from the first gate electrode 211A; a gate insulating film 212 covering the first gate electrode 211A and the second gate electrode 211B; a first crystalline silicon thin film (a first thin film) 215A formed above the first gate electrode 211A on the gate insulating film 212; and a second crystalline silicon thin film (a second thin film) 215B formed above the second electrode 211B on the gate insulating film 212.

The first device unit 203A is a bottom-gate type TFT (a first TFT) including, as a channel, at least a part of a strip-shaped first area 51 of the first crystalline silicon thin film 215A (a first crystallized area 50A). Moreover, the first device unit 203A includes the following that are formed sequentially on the substrate 210: the first gate electrode 211A, the gate insulating film 212, the first crystalline silicon thin film (a first crystalline semiconductor film) 215A, a pair of first contact layers 216A, a first source electrode 217A, and a first drain electrode 218B.

The second device unit 201B is a bottom-gate type TFT (a second TFT) including, as a channel, the second crystalline silicon thin film 215B (a second crystallized area 50B). Moreover, the second device unit 203B includes the following that are formed sequentially on the substrate 210: the second gate electrode 211B, the gate insulating film 212, the second crystalline silicon thin film (a second crystalline semiconductor film) 215B, a pair of second contact layers 216B, a second source electrode 217B, and a second drain electrode 218B.

It should be noted that the configurations of the first device unit 203A and the second device unit 201B and the methods of manufacturing the first device unit 203A and the second device unit 201B according to the present embodiment are the same as the configurations of the first device unit 203A and the second device unit 201B and the methods of manufacturing the first device unit 203A and the second device unit 201B according to the Embodiment 3.

As described thus far, the thin-film device array substrate 204 according to the present embodiment can achieve an advantageous effect similar to that of Embodiment 1.

More specifically, in the thin-film device 204 according to the present embodiment, the first crystalline silicon thin film 215A of the first device unit 203A includes the first crystallized area 50A having the strip-shaped first areas 51, and the second crystalline silicon thin film 215B of the second device unit 201B includes the second crystallized area 50B different from the first crystallized area 50A in grain structure. Accordingly, the thin-film device including the first device unit 203A and the second device unit 201B different in device characteristics can be easily implemented.

Moreover, also in the present embodiment, the average grain size of the crystal grains in the second crystallized area (the third area) 50B is smaller than the average grain size of the crystal grains in the strip-shaped first area 51 of the first crystallized area 50A. Furthermore, the average grain size of the crystal grains in the second crystallized area (the third area) 50B is smaller than the average grain size of the crystal grains in the strip-shaped first area 51 of the first crystallized area 50A. With this, the charge carrier mobility in the channel of the first device unit 203A can be increased. Therefore, the first device unit 203A can be implemented as a TFT superior to the second device unit 201B in ON-state current characteristics.

Furthermore, also in the present embodiment, each of the strip-shaped first areas 51 includes the crystal grains that are in contact with each of the adjacent second areas 52. On this account, as the first device unit 203A, a TFT that is excellent in ON-state current characteristics and in uniformity with less variation in charge carrier mobility can be implemented.

Moreover, as in Embodiment 3, with the thin-film device array substrate 204 according to the present embodiment, the light absorptivity of the first crystalline silicon thin film 215A that is formed above the first gate electrode 211A and has yet to be crystallized (i.e., the amorphous silicon thin film) with respect to the predetermined light is higher than the light absorptivity of the second crystalline silicon thin film 215B that is formed above the second gate electrode 211B and has yet to be crystallized (i.e., the amorphous silicon thin film) with respect to the predetermined light. As a result, the crystalline silicon thin film formed by crystallizing the amorphous silicon thin film with the predetermined light includes the first crystalline silicon thin film 215A and the second crystalline silicon thin film 215B different in grain structure (in crystalline state). Thus, by forming the device units including, as the respective channels, the first crystalline silicon thin film 215A and the second crystalline thin film 215B different from each other in grain structure, the thin-film array substrate including the first device unit 203A and the second device unit 201B different in device characteristics can be implemented.

Moreover, according to the present embodiment, since the first device unit 203A is superior to the second device unit 201B in ON-state current characteristics, the first device unit 203A can be used as the driver transistor in each of the gate driver circuit 250 and the source driver circuit 260 provided in the peripheral area 210b of the substrate 210. Furthermore, since the second device unit 201B is superior to the first device unit 203A in OFF-state current characteristics, the second device unit 201B can be used as the switching transistor of each pixel provided in the inner area 210a of the substrate 210.

It should be noted that the thin-film device array substrate 204 according to the present embodiment can be used for the display panel 400 shown in FIG. 32A and FIG. 32B.

Embodiment 5

Figure 47A:
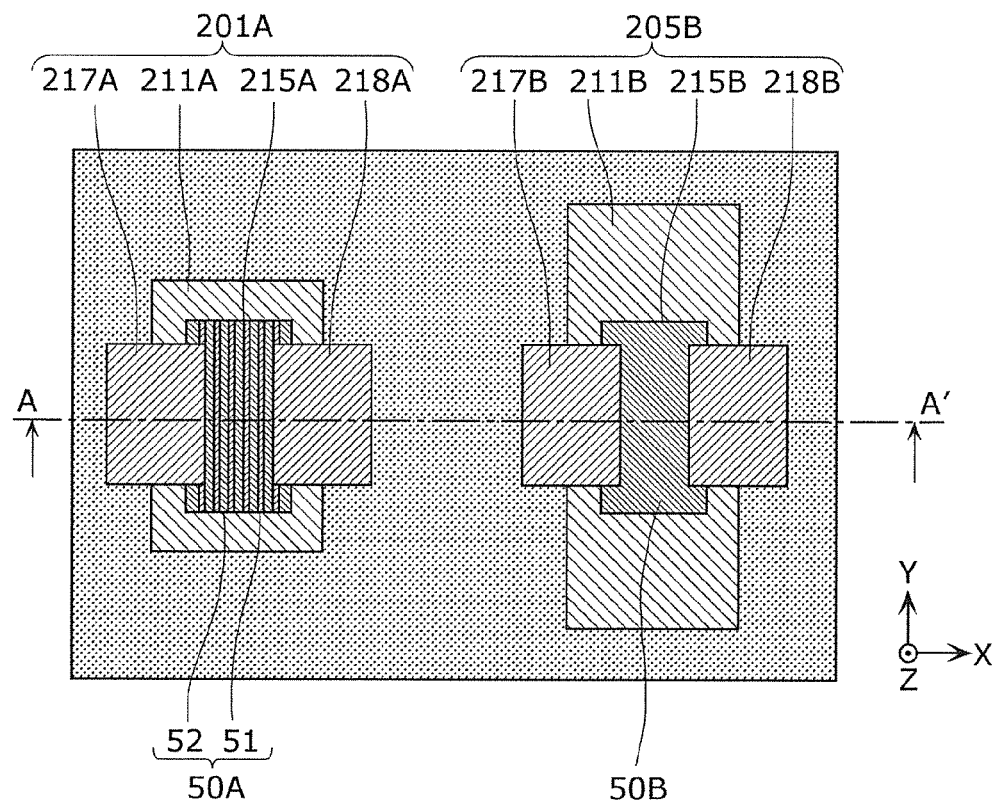
FIG. 47A is a plan view of a thin-film device according to Embodiment 5 of the present invention.
Figure 47B:
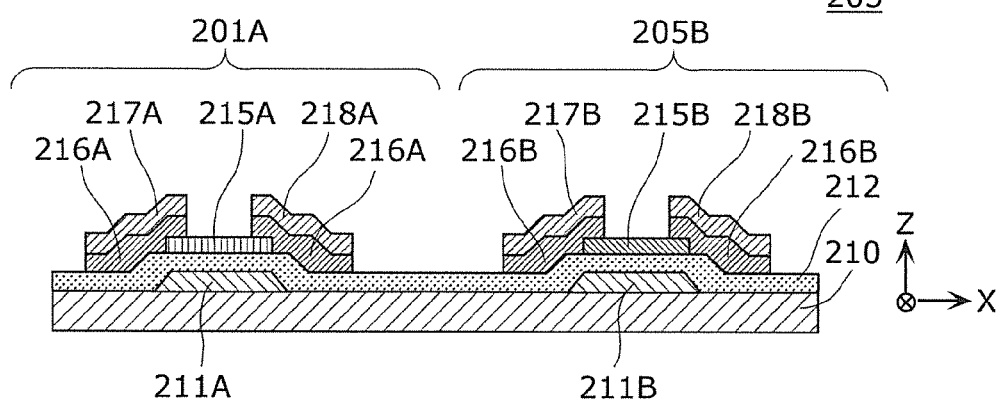
FIG. 47B is a cross-sectional view of the thin-film device along the line A-A' shown in FIG. 47A according to Embodiment 5 of the present invention.

The following describes Embodiment 5 of the present invention. The present embodiment describes a thin-film device formed by the method of forming a crystalline thin film according to Embodiment 1. FIG. 47A is a plan view of the thin-film device according to Embodiment 5 of the present invention. FIG. 47B is a cross-sectional view of the thin-film device shown in FIG. 47A according to Embodiment 5 of the present invention. Note that FIG. 47B is the cross-sectional view along the line A-A' shown in FIG. 47A.

As shown in FIG. 47A and FIG. 47B, a thin-film device 205 according to the present embodiment includes a first device unit 201A and a second device unit 205B. Moreover, the thin-film device 205 includes a substrate 210; a first gate electrode 211A and a second gate electrode 211B formed on the substrate 210; a gate insulating film 212 covering the first gate electrode 211A and the second gate electrode 211B; a first crystalline silicon thin film (a first thin film) 215A formed on the substrate 210 and including a first crystallized area 50A; and a second crystalline silicon thin film (a second thin film) 215B formed on the substrate 210 and including a second crystallized area 50B.

In the present embodiment, the first device unit 201A is a bottom-gate type TFT (a first TFT) including, as a channel, at least a part of a strip-shaped first area 51 of the first crystalline silicon thin film 215A (a first crystallized area 50A). Moreover, the first device unit 203A includes the following that are formed sequentially on the substrate 210: the first gate electrode 211A, the gate insulating film 212, the first crystalline silicon thin film (a first crystalline semiconductor film) 215A, a pair of first contact layers 216A, a first source electrode 217A, and a first drain electrode 218B.

The second device unit 205B is a bottom-gate type TFT (a second TFT) including, as a channel, a second crystallized area 50B of the second crystalline silicon thin film 215B. Moreover, the second device unit 203B includes the following that are formed sequentially on the substrate 210: the second gate electrode 211B, the gate insulating film 212, the second crystalline silicon thin film (a second crystalline semiconductor film) 215B, a pair of second contact layers 216B, a second source electrode 217B, and a second drain electrode 218B.

The structural elements of the first device unit 201A and the structural elements of the second device unit 205B are described in detail as follows.

The substrate 210 is formed to be shared by the first device unit 201A and the second device unit 201B, and is a glass substrate for example as in Embodiment 1. Note that an undercoat film may be formed on the substrate 210.

The first gate electrode 211A and the second gate electrode 211B are formed in predetermined shapes by patterning performed on the substrate 210, and are formed apart from each other. More specifically, the first gate electrode 211A and the second gate electrode 211B are located at different positions.

Suppose that a first direction in the present embodiment crosses the direction (the channel direction) in which charge carriers move in a channel area (a first channel area) of the first device unit 201A. In this case, the length of the second gate electrode 211B in the first direction is made longer than the length of the first gate electrode 211A in the first direction. In the present embodiment, the gate width of the second gate electrode 211B is longer than the gate width of the first gate electrode 211A as shown in FIG. 47A. Here, the gate width refers to the width of the gate electrode in the direction substantially perpendicular to the channel direction (the gate longitudinal direction) of the channel area between the first source electrode 217A (the second source electrode 217B) and the first drain electrode 218A (the second drain electrode 218B).

Each of the first gate electrode 211A and the second gate electrode 211B may have a single-layer structure comprising a conductive material or an alloy thereof or have a multilayer structure. For example, each of the first gate electrode 211A and the second gate electrode 211B may comprise a metal such as molybdenum (Mo), aluminum (Al), copper (Cu), tungsten (W), titanium (Ti), chromium (Cr), or molybdenum-tungsten (MoW).

The gate insulating film 212 is formed on the first gate electrode 211A and the second gate electrode 211B, and is formed on the entire surface of the substrate 210 to cover the first gate electrode 211A and the second gate electrode 211B, as in Embodiments 1 and 3. The gate insulating film 212 can be formed using a material similar to the material used in Embodiment 1 or 3. In the present embodiment, it is also preferable to use a silicon oxide film for the gate insulating film 212.

Each of the first crystalline silicon thin film 215A and the second crystalline silicon thin film 215B is a crystalline semiconductor thin film formed as a result of crystallizing, with predetermined light such as laser light, an amorphous silicon thin film that is a precursor film of the first crystalline silicon thin film 215A and the second crystalline silicon thin film 215B. The first crystalline silicon thin film 215A and the second crystalline silicon thin film 215B are different from each other in grain structure. Moreover, in the present embodiment, the first crystalline silicon thin film 215A and the second crystalline silicon thin film 215B different in grain structure are formed at the same time in the same step of crystallization as described later.

The first crystalline silicon thin film 215A is the crystalline silicon thin film formed above the first gate electrode 211A, and has the first crystallized area 50A including the strip-shaped first area 51 and the second area 52 that is adjacent to the strip-shaped first area 51. The first crystalline silicon thin film 215A is formed opposite to the first gate electrode 211A with the gate insulating film 212 in between. Each of the strip-shaped areas 51 is formed to extend in the width direction of the gate width of the first gate electrode 211A (the direction perpendicular to the channel direction). To be more specific, the longitudinal direction of the first area 51 refers to the width direction of the gate width of the first gate electrode 211A (the second gate electrode 211B) (i.e., the vertical direction on the plane of the diagram of FIG. 47A).

In the first crystallized area 50A, the average grain size of the crystals included in the strip-shaped first area 51 is different from the average grain size of the crystals included in the second area 52. As described above with reference to FIG. 2, the average grain size of the crystals included the strip-shaped first area 51 is made larger than the average grain size of the crystals included in the second area 52. Here, the average grain size of the crystal grains included in the first crystallized area 50A is the average between the average grain size of the crystals included in the first area 51 and the average grain size of the crystals included in the second area 52. The first crystallized area 50A functions as the channel area (the first channel area) where the charge carrier mobility is controlled by the voltage of the first gate electrode 211A. In this case, since the first crystallized area 50A includes the strip-shaped first area 51 having the larger average grain size, the crystalline silicon thin film having a higher carrier mobility can be implemented.

Moreover, it is preferable for each of the strip-shaped first areas 51 in the first crystalline silicon thin film 215A to be continuous within the length of the channel area. With this, the charge carrier mobility can be increased and, therefore, the ON-state current characteristics can be enhanced. Furthermore, the crystalline silicon thin film superior in in-plane uniformity can also be implemented.

On the other hand, the second crystalline silicon thin film 215B is the crystalline silicon thin film formed above the second gate electrode 211B, and has the second crystallized area 50B different in grain structure from the first crystallized area 50 of the first crystalline silicon thin film 215A. The second crystalline silicon thin film 215B is formed opposite to the second gate electrode 211B with the gate insulating film 212 in between. The second crystallized area 50B has the grain structure where the strip-shaped first area 51 is not present, unlike the first crystalline silicon thin film 215A. The average grain size of the second crystallized area 50B is smaller lower than or equal to the average grain size of the second area 52 included in the first crystallized area 50A of the first crystalline silicon thin film 215A described above. The average grain size of the second crystallized area 50B according to the present embodiment is equal to the average grain size of the second area 52. The second crystallized area 50B functions as a channel area (a second channel area) where the charge carrier mobility is controlled by the voltage of the second gate electrode 211B.

Suppose that: D1 represents the average grain size of the crystals included in the first area 51 of the first crystallized area 50A in the first crystalline silicon thin film 215A; D2 represents the average grain size of the crystals included in the second area 52; and D3 represents the average grain size of the crystal grains included in the second crystallized area 50B of the second crystalline silicon thin film 215B. In this case, the first crystalline silicon thin film 215A and the second crystalline silicon thin film 215B different in grain size as described above are formed to satisfy $D1>D2 \geq D3$. Note that, in the present embodiment, $D1>D2=D3$ is satisfied.

As in Embodiment 1 and 3, the pair of the first contact layers 216A is formed on the first silicon thin film 215A and the pair of the second contact layers 216B is formed on the second crystalline silicon thin film 215B. Each of the first contact layers 216A and each of the second contact layers 216B comprises an amorphous semiconductor film including impurities in high concentration. For example, each of the first contact layers 216A and each of the second contact layers 216B is an $n^+$ layer obtained by doping an amorphous silicon film with phosphorus (P) as dopant.

The first source electrode 217A and the first drain electrode 218B are formed on the first contact layers 216A, and are arranged opposite to each other with a predetermined spacing. Moreover, the second source electrode 217B and the second drain electrode 218B are formed on the second contact layers 216B, and are arranged opposite to each other with a predetermined spacing.

The first source electrode 217A, the first drain electrode 218B, the second source electrode 217B, and the second drain electrode 218B can be formed using respective materials similar to the materials used in Embodiment 1 or 3.

Thus, the thin-film device 205 according to the present embodiment can achieve an advantageous effect similar to that of Embodiment 1.

More specifically, in the thin-film device 205 according to the present embodiment, the first crystalline silicon thin film 215A of the first device unit 201A includes the first crystallized area 50A having the strip-shaped first areas 51, and the second crystalline silicon thin film 215B of the second device unit 205B includes the second crystallized area 50B different from the first crystallized area 50A in grain structure. Accordingly, the thin-film device including the first device unit 201A and the second device unit 205B different in device characteristics can be easily implemented.

Moreover, also in the present embodiment, the first crystalline silicon thin film 215A included in the first device unit 201A has the first crystallized area 50A including the strip-shaped first areas 51 formed larger in average grain size than the second crystallized area 50B of the second crystalline silicon thin film 215B included in the second device unit 205B. To be more specific, the average grain size of the crystal grains included in the second crystallized area 50B is smaller than the average grain size of the crystal grains included in the strip-shaped first area 51 of the first crystallized area 50A. Moreover, the average grain size of the crystal grains included in the second crystallized area 50B is smaller than the average grain size of the crystal grains included in the first area 51 of the first crystallized area 50A. Therefore, the charge carrier mobility in the channel of the first device unit 201A can be increased. Hence, the first device unit 201A can serve as the TFT superior to the second device unit 201B in ON-state current characteristics.

Furthermore, also in the present embodiment, each of the strip-shaped first areas 51 includes the crystal grains that are in contact with each of the adjacent second areas 52. On this account, as the first device unit 201A, a TFT that is excellent in ON-state current characteristics and in uniformity with less variation in charge carrier mobility can be implemented.

Moreover, the thin-film device 205 according to the present embodiment can be easily formed using the method of forming a crystalline thin film according to Embodiment 1. Then, based on a difference in width between the two gate electrodes and on a difference in light absorptivity of the amorphous silicon thin film between above and not above the gate electrode, the crystalline silicon thin film having different grain structures can be formed. To be more specific, in order to cause a difference in influence by the laser light between the amorphous silicon thin film 213 around above the first gate electrode 211A and the amorphous silicon thin film 213 around above the second gate electrode 211B, the gate width of the first gate electrode 211A is made smaller than the gate width of the second gate electrode 211B.

As a result, the crystalline silicon thin film 215 formed by laser irradiation includes the first crystallized area 50A and the second crystallized area 50B different in grain structure (in crystalline state). Thus, the thin-film device 205 can be implemented that includes the first device unit 201A and the second device unit 205B different in the device characteristics by including, as the respective channels, the first crystallized area 50A and the second crystallized area 50B different in grain structure.

Moreover, in the present embodiment, the channel direction of the first device unit 201A may be perpendicular to the longitudinal direction of the strip shape of the first area 51 or parallel to the longitudinal direction of the strip shape of the first area 51. To be more specific, in the first device unit 201A, the direction in which the first source electrode 217A and the first drain electrode 218A are arranged side by side may be perpendicular to the longitudinal direction of the strip-shaped first area 51. For example, the direction in which the first source electrode 217A and the first drain electrode 218A are arranged side by side can be made perpendicular to the longitudinal direction of the strip-shaped first area 51.

Furthermore, in the present embodiment, it is preferable for the channel direction of the first device unit 201A to be substantially parallel to the longitudinal direction of the strip shape of the first area 51 (the direction in which the strip extends) as shown in FIG. 47A. To be more specific, in the first device unit 201A, it is preferable for the direction in which the first source electrode 217A and the first drain electrode 218A are arranged side by side to be substantially parallel to the longitudinal direction of the strip-shaped first area 51.

Thus, the charge carriers moving in the first silicon thin film 215A can pass through the first area 51 where the grain size is large and the number of crystal grain boundaries is small, instead of passing through the second area 52 where the grain size is small and the number of crystal grain boundaries is large. Therefore, the number of crystal grain boundaries is smaller on the carrier transfer pathway between the source electrode and the drain electrode. This can further reduce the probability that the charge carriers may be trapped, thereby increasing the charge carrier mobility. Hence, the thin-film device 205 including the TFT (the first device unit 201A) more excellent in ON-state current characteristics can be implemented.

[OLED Display Device]

The following describes an example where the thin-film device 205 described above in the present embodiment is applied to a display device. The present embodiment describes the example where the thin-film device 205 is applied to the OLED display device 300 shown in FIG. 16.

Figure 48:
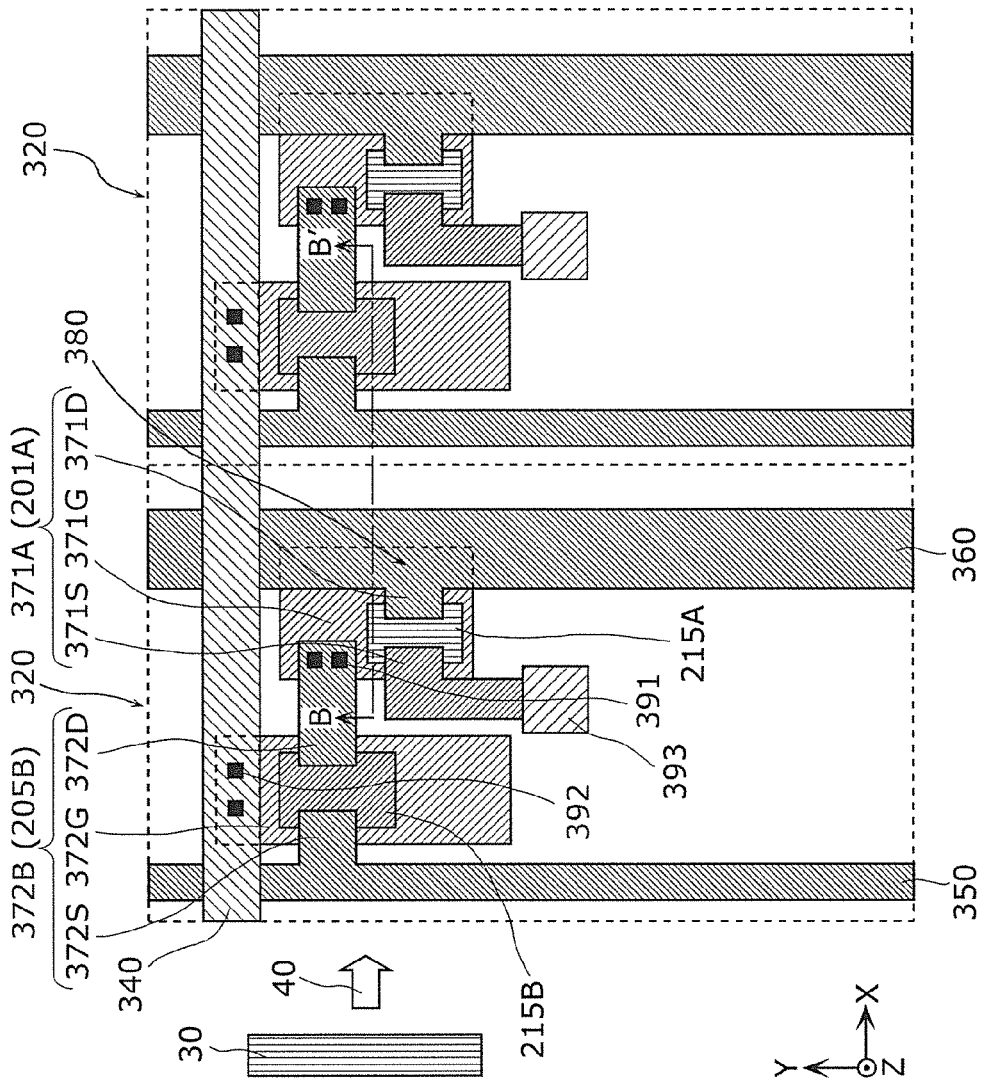
FIG. 48 is a plan view showing a configuration of a pixel in an OLED display device according to Embodiment 5 of the present invention.

FIG. 48 is a plan view showing a configuration of pixels (two pixels) in the OLED display device according to Embodiment 5 of the present invention.

As shown in FIG. 48, pixels 320 are partitioned by scanning lines 340 and video signal lines 350 perpendicular to each other, as in the case of the pixels 320 shown in FIG. 17. Each of the pixels 320 includes a driver transistor 371A serving as the first device unit 201A of the thin film device 205, a switching transistor 372B serving as the second device unit 205B of the thin film device 205, a condenser (capacitor) 380, and an OLED device 330.

In the present embodiment, as shown in FIG. 48, with a single scanning operation by a laser light 30, the channel layer of the driver transistor 371A (the first crystalline silicon thin film 215A) and the channel layer of the switching transistor 372B (the second crystalline silicon thin film 215B) can be crystallized in the same step.

[Method of Manufacturing Thin-Film Device]

Figure 49:
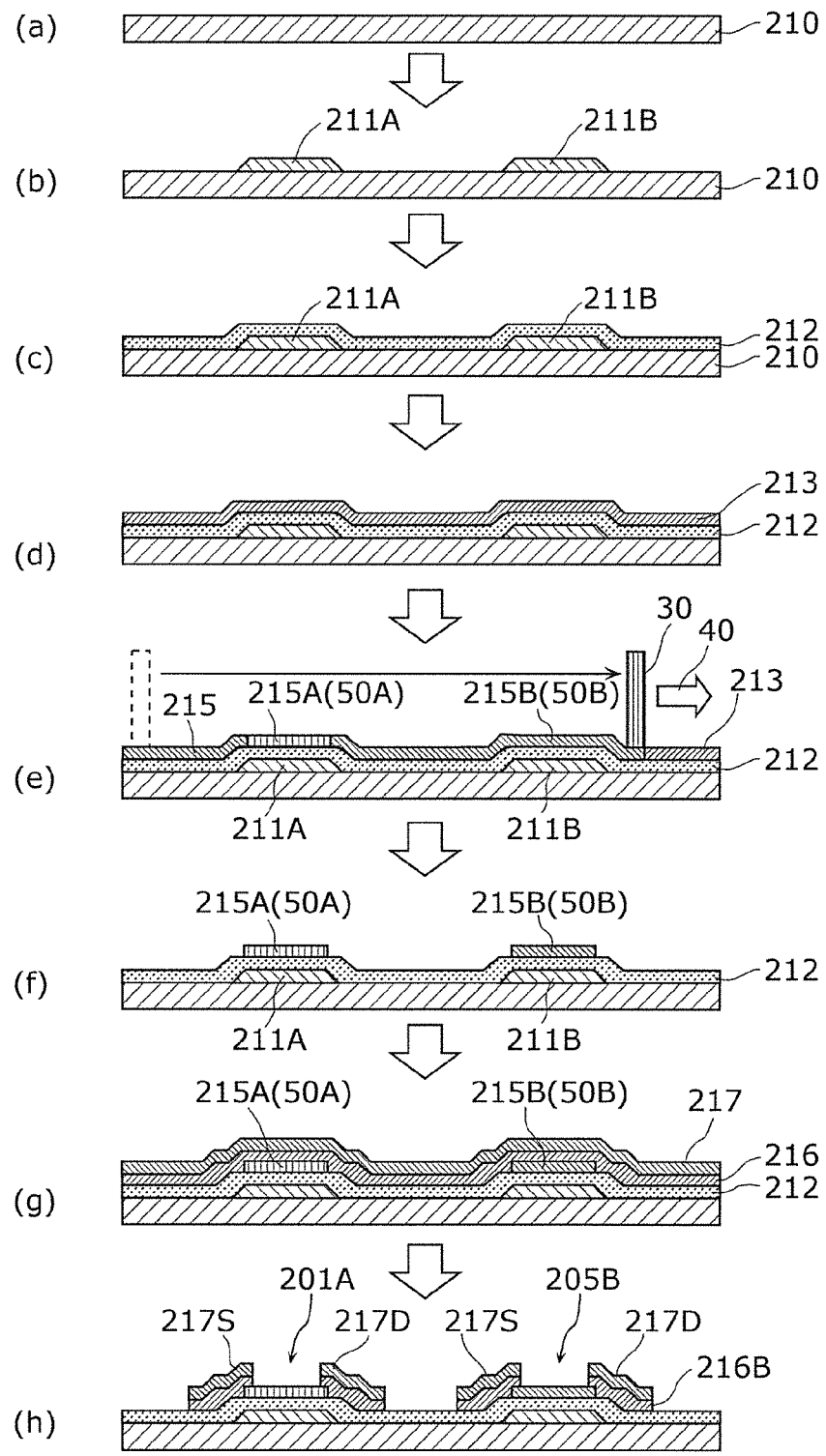
FIG. 49 (a)-(h) shows cross-sectional views schematically showing steps of a method of manufacturing a thin-film device according to Embodiment 5 of the present invention.

Next, a method of manufacturing a thin-film device according to Embodiment 5 of the present invention is described, with reference to FIG. 49. FIG. 49 shows cross-sectional views schematically showing steps of the method of manufacturing a thin-film device according to Embodiment 5 of the present invention. Note that FIG. 49 is the cross-sectional view along the line B-B' shown in FIG. 48.

As shown in (a) of FIG. 49, a substrate 210 is firstly prepared as in (a) of FIG. 20 according to Embodiment 1 (a step of preparing a substrate).

Next, as shown in (b) of FIG. 49, the first gate electrode 211A and the second gate electrode 211B are formed by patterning performed on the substrate 210 (a step of forming a gate electrode). For example, a gate metal film having a thickness of 10 nm to 500 nm and comprising, for instance, MoW is formed on the entire surface of the substrate 210 by sputtering. Then, patterning is performed on the gate metal film by photolithography and wet etching to form the first gate electrode 211A and the second gate electrode 211B in predetermined shapes. Here, patterning is performed on the gate metal film, thereby making the gate width of the first gate electrode 211A smaller than the gate width of the second gate electrode 211B as shown in FIG. 47A.

Next, as shown in (c) of FIG. 49, the gate insulating film 212 is formed on the first gate electrode 211A and the second gate electrode 211B as in (c) of FIG. 20 according to Embodiment 1 (a step of forming a gate insulting film).

Next, the first channel area is formed on the gate insulating film 212 above the first gate electrode 211A, and the second channel area is formed on the gate insulating film 212 above the second gate electrode 211B (a step of forming channel areas). The step of forming channel areas includes a step of forming a precursor film and a step of crystallization described as follows.

To be more specific, as shown in (d) of FIG. 49, the amorphous silicon thin film 213 is formed as the precursor film of the crystalline silicon thin film 215 above the substrate 210 (the step of forming a precursor film). For example, an amorphous silicon film having a thickness of 10 nm to 200 nm is formed as the amorphous silicon thin film 213 on the gate insulating film 212 by plasma CVD.

The gate insulating film 212 and the amorphous silicon thin film 213 have the respective thicknesses to have predetermined light absorptivities with respect to the laser light emitted for crystallizing the amorphous silicon thin film 213. In the present embodiment, the gate insulating film 212 and the amorphous silicon thin film 213 are formed with the respective thicknesses so that the light absorptivity of the amorphous thin film with respect to the laser light above the first gate electrode 211A is lower than the light absorptivity of the amorphous thin film with respect to the laser light that is not above the first gate electrode 211A.

Next, as shown in (e) of FIG. 49, the amorphous silicon thin film 213 is crystallized through relative scan with the laser light at a predetermined speed while a predetermined area of the amorphous silicon thin film 13 is being irradiated with the laser light (the step of crystallization). As a result, the crystalline silicon thin film 215 including the first crystallized area 50A and the second crystallized area 50B can be formed.

Figure 50A:
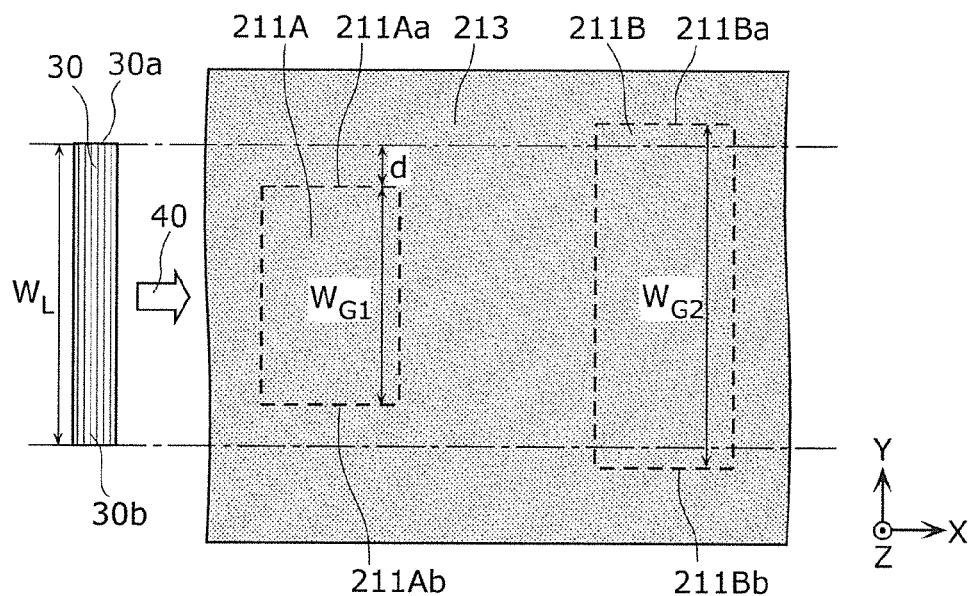
FIG. 50A is a plan view explaining a step of crystallization (before the laser light is emitted) in the method of manufacturing a thin-film device according to Embodiment 5 of the present invention.
Figure 50B:
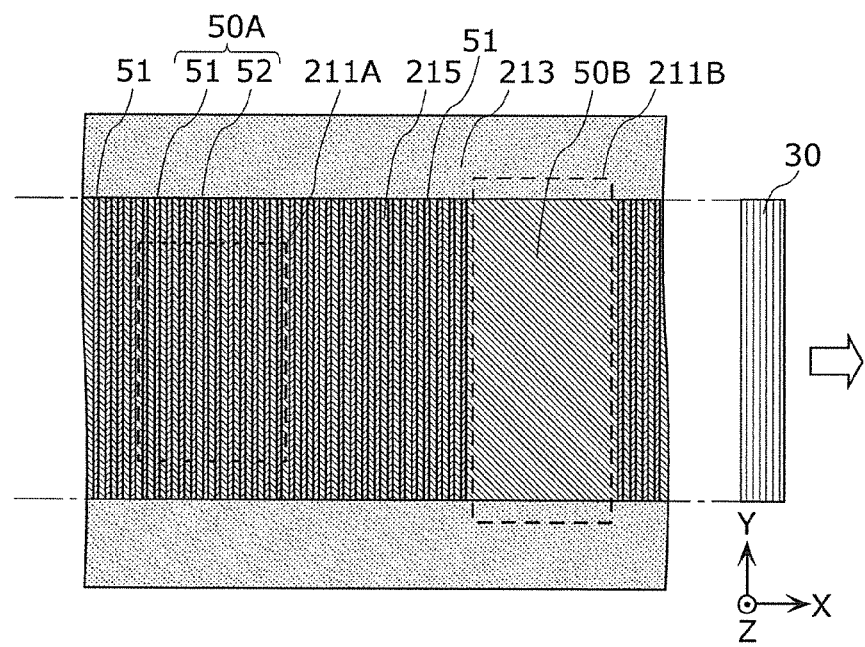
FIG. 50B is a plan view explaining the step of crystallization (after the laser light is emitted) in the method of manufacturing a thin-film device according to Embodiment 5 of the present invention.

The step of crystallization can be performed similarly to the step of crystallization with laser light (the step of crystallization) in the above-described method of manufacturing a thin-film-formed substrate. The step of crystallization according to the present embodiment is described in detail as follows, with reference to FIG. 50A and FIG. 50B. Each of FIG. 50A and FIG. 50B is a plan view explaining the step of crystallization in the method of manufacturing a thin-film device according to Embodiment 5 of the present invention. FIG. 50A shows the state before laser light irradiation, and FIG. 50B shows the state after laser light irradiation.

In the step of crystallization, the amorphous silicon thin film 213 is irradiated with the laser light under the condition where the strip-shaped first areas 51 are formed on the amorphous silicon thin film 213 at an area that is not above the first gate electrode 211A or the second gate electrode 211B (or more specifically, on the amorphous silicon thin film 213 above an area where neither the first gate electrode 211A nor the second gate electrode 211B is formed). To be more specific, the amorphous silicon thin film 213 is irradiated with the laser light in the scanning direction 40 (the X axis direction), under the conditions for laser irradiation where the amorphous silicon thin film 213 that is not above the first gate electrode 211A or the second gate electrode 211B is crystallized into the crystallized area as shown in the region C or D in FIG. 4. More specifically, laser irradiation is performed, thereby crystallizing the amorphous silicon thin film 213 located above the area where neither the first gate electrode 211A nor the second gate electrode 211B is formed into the crystalline silicon thin film 215 including the strip-shaped first areas 51.

Suppose that, in the step of crystallization, the direction crossing the scanning direction 40 of the laser light 30 is the first direction (the gate width direction in the present embodiment). In this case, laser irradiation is performed in the following manner as shown in FIG. 50A and FIG. 50B. When the laser light 30 is positioned above the first gate electrode 211A, at least one of one end portion 211Aa and the other end portion 211Ab of the first gate electrode 211A in the gate width direction is located within the emission width (within the area to be irradiated) in the longitudinal direction of the laser light 30. Moreover, when the laser light 30 is positioned above the second gate electrode 211B, both one end portion 211Ba and the other end portion 211Bb of the second gate electrode 211B in the gate width direction are located outside the emission width (outside the area to be irradiated) in the longitudinal direction of the laser light 30. To be more specific, in the planar view, laser irradiation is performed, thereby causing light emission of the laser light 30 to cover beyond the gate width of the first gate electrode 211A when the laser light 30 passes over the first gate electrode 211A and causing light emission of the laser light 30 to be within the gate width of the second gate electrode 211B when the laser light 30 passes over the second gate electrode 211B.

In the present embodiment, laser irradiation is performed, thereby causing both the one end portion 211Aa and the other end portion 211Ab of the first gate electrode 211A to be located within the emission width in the longitudinal direction of the laser light 30. To be more specific, as shown in FIG. 50A and FIG. 50B, the laser light is emitted, thereby making an irradiation width $W_L$ in the longitudinal direction of the laser light 30 larger than a gate width $W_{G1}$ of the first gate electrode 211A and making the irradiation width $W_L$ in the longitudinal direction of the laser light 30 larger than a gate width $W_{G2}$ of the second gate electrode 211B. In other words, a relationship expressed as $W_{G1}<W_L<W_{G2}$ is satisfied.

When the laser light is emitted in this way, one end portion 30a of the laser light in the longitudinal direction (the upper end portion as viewed in the diagram) passes outside the width of the first gate electrode 211A beyond the one end portion 211Aa of the first gate electrode 211A and passes within the width of the second gate electrode 211 more inside than the one end portion 211Ba of the second gate electrode 211B. Similarly, the other end portion 30b of the laser light in the longitudinal direction (the lower end portion as viewed in the diagram) passes outside the width of the first gate electrode 211A beyond the other end portion 211Ab of the first gate electrode 211A and passes within the width of the second electrode 211B more inside than the other end portion 211Ba of the second gate electrode 211B.

Here, as described above, the amorphous silicon thin film located above the first gate electrode 211A and the second gate electrode 211B is made lower in light absorptivity with respect to the laser light than the amorphous silicon thin film that is not above the first gate electrode 211A nor the second gate electrode 211B.

Therefore, when the laser light irradiation is performed under the conditions for laser irradiation under which the amorphous silicon thin film 213 located above the first gate electrode 211A and the second gate electrode 211B is crystallized into the crystallized area as shown in the region C or D in FIG. 4, the crystalline silicon thin film 213 is crystallized as follows depending on the presences of the gate electrodes as shown in FIG. 50B.

Firstly, the amorphous silicon thin film 213 located above the area where the first gate electrode 211A and the second gate electrode 211B are not formed is crystallized into the crystalline silicon thin film 215 where the strip-shaped first areas 51 are formed.

Moreover, the amorphous silicon thin film 213 located above the second gate electrode 211B is crystallized into the state where the strip-shaped first area 51 is not formed. This is because the amorphous silicon thin film 213 located above the second gate electrode 211B is lower in light absorptivity than the amorphous silicon thin film that is not above the second gate electrode 211B.

On the other hand, as is the case with the second gate electrode 211B, the amorphous silicon thin film 213 located above the first gate electrode 211A is lower in light absorptivity than the amorphous silicon thin film 213 that is not above the first gate electrode 211A. However, the amorphous silicon thin film 213 located above the first gate electrode 211A is crystallized into the crystalline silicon thin film 215 where the strip-shaped first areas 51 are formed, unlike the amorphous silicon thin film 213 located above the second gate electrode 211B.

This is because no gate electrode material is present in: an area between the one end portion 211Aa of the first gate electrode 211A and the one end portion 30a of the laser light (i.e., the area having the width d); and an area between the other end portion 211Ab of the first gate electrode 211A and the other end portion 30b of the laser light. Here, the strip-shaped first areas 51 are formed on the crystalline silicon thin film 215 located above this area. Once the strip-shaped first areas 51 are formed in this area, crystallization proceeds to extend the strip-shaped area in the longitudinal direction to above the first gate electrode 211A. More specifically, the strip-shaped first areas 51 above the area where the first gate electrode 211A is not formed are extended, like being pulled, to above the area where the first gate electrode 211A is formed.

Accordingly, the crystalline silicon thin film 215 is formed to include: the first crystallized area 50A including the strip-shaped first areas 51 above the first gate electrode 211A; and the second crystallized area 50B including no strip-shaped first area 51 above the second gate electrode 211B.

Moreover, it is preferable for both of the end portions 211Aa and 211Ab of the first gate electrode 211A to be located within the length between the end portions 30a and 30b of the laser light 30, as shown in FIG. 50A (i.e., $W_{G1}<W_L$). With this, the strip-shaped first areas 51 extend from both sides of the first gate electrode 211A. Hence, the strip-shaped first areas 51 can be formed above the first gate electrode 211A more reliably and more uniformly.

Next, referring back to FIG. 49, patterning is selectively performed, by photolithography and wet etching, on the crystalline silicon thin film 215 crystallized by laser irradiation. As a result, each of the first crystalline silicon thin film 215A including the first crystallized area 50A and the second silicon thin film 215B including the second crystallized area 50B is formed in the shape of an island, as shown in (f) of FIG. 49. After this, although not illustrated in this diagram, contact holes may be formed in the gate insulating film 212 in order for the first gate electrode 211A of the first device unit 201A to be connected to the second drain electrode 218B of the second device unit 205B.

Next, as shown in (g) of FIG. 49, a contact layer 216 is formed that is an n⁺ layer doped with dopant, as in (b) of FIG. 21 according to Embodiment 1. After this, a source-drain metal film 217 is formed on the contact layer 216.

Next, as shown in (h) of FIG. 49, patterning is performed on the source-drain metal film 217 to form a pair of the first source electrode 217A and the first drain electrode 218A and a pair of the second source electrode 217B and the second drain electrode 218B, as in (c) of FIG. 21 according to Embodiment 1 (a step of forming a source electrode and a drain electrode).

After this, the contact layer 216 is divided to form the pair of the first contact layers 216A opposite to each other and the pair of the second contact layers 216B opposite to each other, as in Embodiment 1. As a result, the thin-film device can be manufactured to include: the first device unit 201A having the first crystalline silicon thin film 215A as the first channel area; and the second device unit 205B having the second crystalline silicon thin film 215B as the second channel area, as shown in this diagram.

After this, a passivation film may be formed to entirely cover the first device unit 201A and the second device unit 205B, as in Embodiment 1.

As described thus far, by using the method of manufacturing the thin-film device 205 according to the present embodiment, the device units different in device characteristics can be manufactured. The device units are formed by: forming the crystalline silicon thin film including the crystallized areas different in grain structure; and patterning the crystalline silicon thin film based on the difference in grain structure. Then, in the present embodiment, based on a difference in gate width between the two gate electrodes and on a difference in light absorptivity of the amorphous silicon thin film 213 between above and not above the gate electrode, the crystallized areas different in grain structure are separately formed by a single operation of laser light scanning.

To be more specific, the light absorptivity of the crystalline silicon thin film 213 above the first gate electrode 211A (or the second gate electrode 211B) is firstly set lower than the light absorptivity of the crystalline silicon thin film 213 that is not above the first gate electrode 211A (nor the second gate electrode 211B). In addition to this, the irradiation width $W_L$ in the longitudinal direction of the laser light 30, the gate width $W_{G1}$ of the first gate electrode 211A, and the gate width $W_{G2}$ of the second gate electrode 211B are set to satisfy the relationship expressed as $W_{G1}<W_L<W_{G2}$. Then, the conditions for laser irradiation to crystallize the amorphous silicon thin film 213 are adjusted by controlling the beam minor axis width and the scanning speed according to the conditions for laser irradiation corresponding to the region C or the region D of FIG. 4.

Thus, the first crystallized area 50A having the grain structure where the strip-shaped first areas 51 are formed and the second crystallized area 50B having the grain structure where the strip-shaped first area 51 is not formed can be formed in the same step. To be more specific, the following can be formed in the same step: the first crystalline silicon thin film 215A having the first crystallized area 50A including the strip-shaped first areas 51 larger in grain size; and the second crystalline silicon thin film 215B having the second crystallized area 50B where the grain size is smaller than in the strip-shaped first area 51. Hence, the following can be manufactured in the same step at a higher throughput: the first device unit 201A excellent in ON-state current characteristics and thus suitable for the driver transistor; and the second device unit 205B superior to the first device unit 201A in the OFF-state current characteristics and thus suitable for the switching transistor.

Here, it is more preferable for the first crystalline silicon thin film 215A of the first device unit 201A to be formed under the conditions for laser irradiation corresponding to the region D shown in FIG. 4. When the amorphous silicon thin film 213 is crystallized under the conditions corresponding to the region D to form the first crystalline silicon thin film 215A, the strip-shaped first areas 51 can be formed at regular pitches. With this, the TFT array (the thin-film device array) including the TFTs having TFT characteristics excellent in in-plane uniformity can be implemented.

The following describes in detail a study and an experimental result on a difference in light absorptivity between amorphous silicon thin films. In the experiment, green laser light is used as laser light.

As in Embodiment 3, suppose that the laser light having the wavelength λ is incident on the model structure shown in FIG. 37 perpendicularly, or more specifically, at an incident angle $\theta_0$ within a range where $\theta_0=0°$ (sin $\theta_0=0$) holds approximately. In this case, the light absorptivity of the amorphous silicon thin film above the gate electrode can be calculated using Equation 1 to Equation 18 in the present embodiment as well.

As shown in FIG. 51A, a model structure of a thin-film semiconductor device according to the present embodiment has the following configuration. A gate electrode 511 corresponding to the fourth layer 504 is formed on a substrate 510. A first gate insulating film 512a corresponding to the third layer 503 is formed on the gate electrode 511. A second gate insulating film 512b corresponding to the second layer 502 is formed on the first gate insulating film 512a. An amorphous semiconductor thin film 513 corresponding to the first layer 501 is formed on the second gate insulating film 512b. In this configuration, the light absorptivity A of the amorphous semiconductor thin film 513 corresponding to the first layer 501 can be calculated by Equation 18 described above.

In the present experiment, seven test samples No. 1 to No. 7 are actually manufactured. Each of these test samples has the following structure. The gate electrode 511 (the fourth layer) comprises molybdenum-tungsten (MoW). The first gate insulating film 512a (the third layer) comprises silicon nitride (SiN). The second gate insulating film 512b (the second layer) comprises a silicon oxide film ($SiO_2$). The amorphous semiconductor thin film 513 (the first layer) comprises an amorphous silicon film (a-Si film).

For each of the test samples, the film thickness is measured for each layer and the light absorptivity of the amorphous silicon film is calculated using Equation 18. The results are obtained as shown in FIG. 51B and FIG. 51C. In FIG. 51B and FIG. 51C, "Above MoW" refers to the light absorptivity of the film above the gate electrode 511. Moreover, "Not above MoW" refers to the light absorptivity of the film that is not above the gate electrode 511. Furthermore, each of "Not above MoW–above MoW" and "Not above MoW–above" refers to a value obtained by subtracting the light absorptivity of the film above the gate electrode 511 from the light absorptivity of the film that is not above the gate electrode 511.

As shown in FIG. 51B and FIG. 51C, seven different base film structures are prepared. Differences in light absorptivity between the amorphous semiconductor thin film 513 located above the gate electrode 511 and the amorphous semiconductor thin film 513 not located the gate electrode 511 in these structures are −15.4% to 21.7%.

Figure 52A:
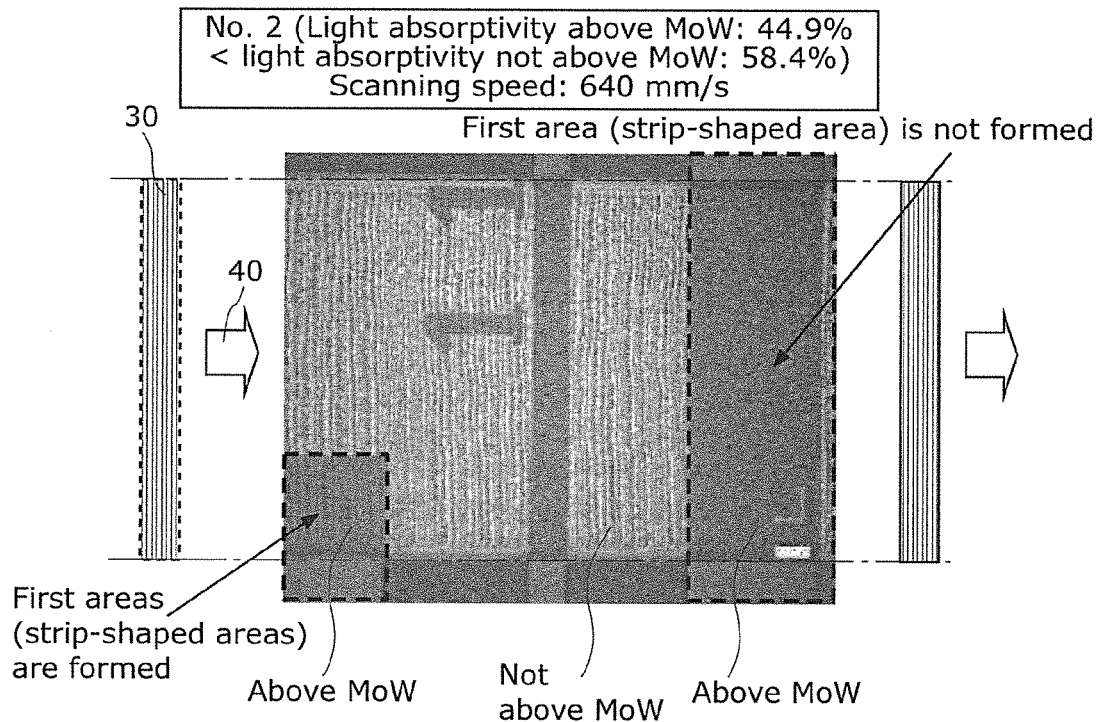
FIG. 52A shows an optical microscopic image of the surface of the crystalline silicon thin film crystallized as a result of irradiating, with the laser, the amorphous silicon film having a base film structure manufactured under the condition No. 2 shown in FIG. 51B.
Figure 52B:
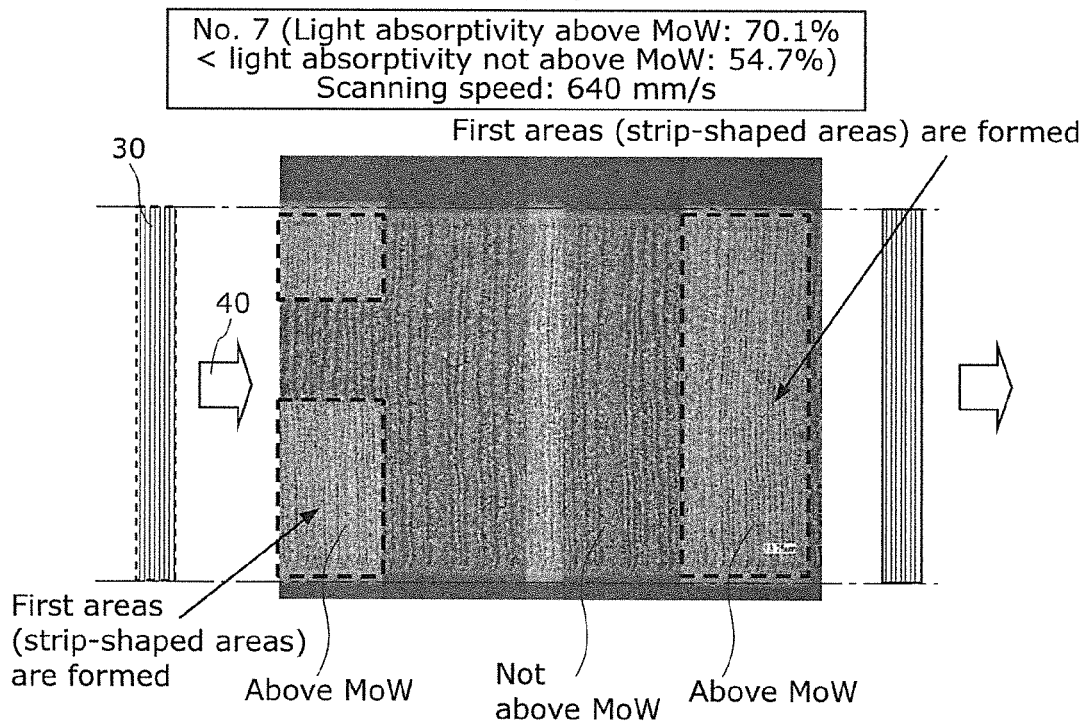
FIG. 52B shows an optical microscopic image of the surface of the crystalline silicon thin film crystallized as a result of irradiating, with the laser, the amorphous silicon film having a base film structure manufactured under the condition No. 7 shown in FIG. 51B.

Crystallization is performed using the green laser light on each of the amorphous semiconductor thin films 513 included in the seven test samples different in base thickness structure. FIG. 52A and FIG. 52B show optical microscopic images of the surfaces of the crystalline silicon thin films of the test samples No. 2 and No. 7, respectively, among the test samples No. 1 to No. 7.

The test sample No. 2 is irradiated with the green laser light (the beam minor axis width: 32 μm, the power density: 80 kw/$cm^2$) at the scanning speed of 640 mm/s. Note that, in the test sample No. 2, the light absorptivity of the amorphous silicon film above the gate electrode (above MoW) is lower than the light absorptivity of the amorphous silicon film that is not above the gate electrode (Not above MoW). In this case, as can be seen from FIG. 52A, in the area including both the amorphous silicon thin film and the gate electrode and irradiated with this laser light (indicated as "Above MoW" on the left-hand side of the diagram), the strip-shaped first areas are formed. In contrast, as can also be seen from the diagram, in the area where only the gate electrode is irradiated with the laser light and the amorphous silicon thin film is not irradiated (indicated as "Above MoW" on the right-hand side of the diagram), the strip-shaped first area is not formed.

Similarly, the test sample No. 7 is irradiated with the green laser light (the beam minor axis width: 32 μm, the power density: 80 kw/$cm^2$) at the scanning speed of 640 mm/s. Note that, in the test sample No. 7, the light absorptivity of the amorphous silicon film above the gate electrode (Above MoW) is higher than the light absorptivity of the amorphous silicon film that is not above the gate electrode (Not above MoW). In this case, as can be seen from FIG. 52B, the strip-shaped first areas are formed in both: the area including both the amorphous silicon thin film and the gate electrode and irradiated with this laser light (indicated as "Above MoW" on the left-hand side of the diagram); and the area where only the gate electrode is irradiated with the laser light and the amorphous silicon thin film is not irradiated (indicated as "Above MoW" on the right-hand side of the diagram).

In FIG. 52A, although the strip-shaped first area is not formed in the area corresponding to "Above MoW" on the right-hand side of the diagram, the strip-shaped first areas are formed in the area corresponding to "Above MoW" on the left-hand side of the diagram. The reason for this is as follows. When the light absorptivity of the amorphous silicon film above the gate electrode (Above MoW) is lower than the light absorptivity of the amorphous silicon film that is not above the gate electrode (Not above MoW), the strip-shaped first areas are more likely to be formed on the film that is not above the gate electrode (Not above MoW) than on the film above the gate electrode (Above MoW). Thus, the grain structure above the gate electrode (Above MoW) is thought to be influenced by the strip-shaped first areas formed on the film that is not above the gate electrode (Not above MoW). In other words, crystallization of the amorphous silicon thin film depends on the area having a higher light absorptivity in the major axis direction of the laser light.

On the other hand, when the light absorptivity of the amorphous silicon thin film above the gate electrode (Above MoW) is higher than the light absorptivity of the amorphous silicon thin film that is not above the gate electrode (Not above MoW), the strip-shaped first areas are formed on the crystalline silicon thin film both above the gate electrode (Above MoW) and not above the gate electrode (Not above MoW) as shown in FIG. 52B. This is because the grain structure above the gate electrode (Above MoW) is not influenced by the grain structure of the film that is not above the gate electrode (Not above MoW).

In this way, the light absorptivity of the amorphous silicon thin film above the gate electrode is set lower than the light absorptivity of the amorphous silicon thin film that is not above the gate electrode. With this, the crystalline silicon thin film has grain structures different between the areas above the two gate electrodes.

Figure 53A:
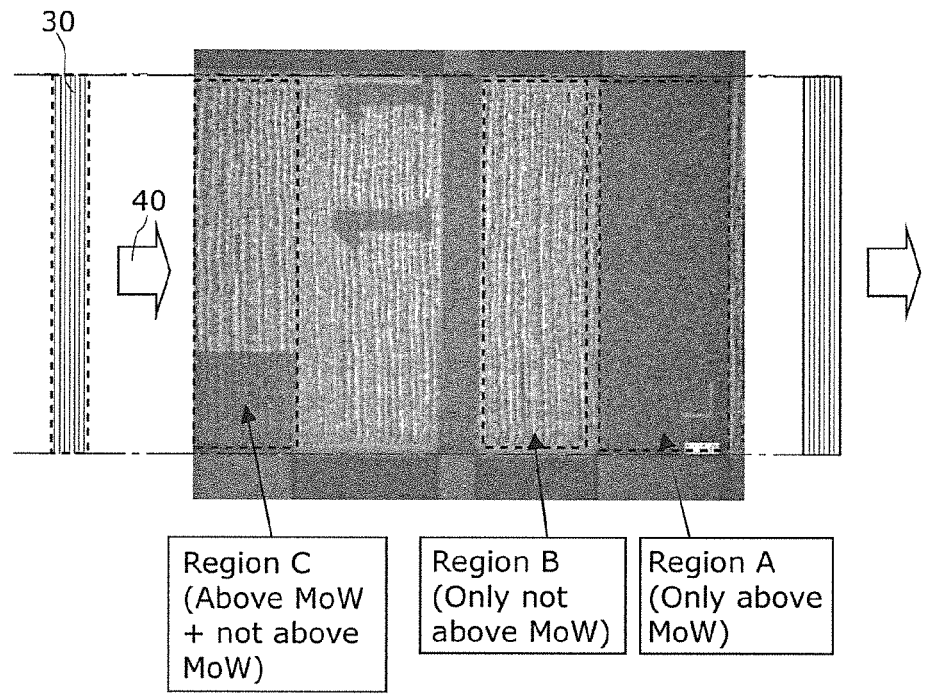
FIG. 53A is a diagram showing an area irradiated with the laser light in association with the gate electrode (molybdenum-tungsten (MoW)) in an experiment carried out as to whether or not the strip-shaped first areas are formed depending on a difference in light absorptivity between the amorphous silicon thin film above the gate electrode and the amorphous silicon thin film that is not above the gate electrode.
Figure 53B:
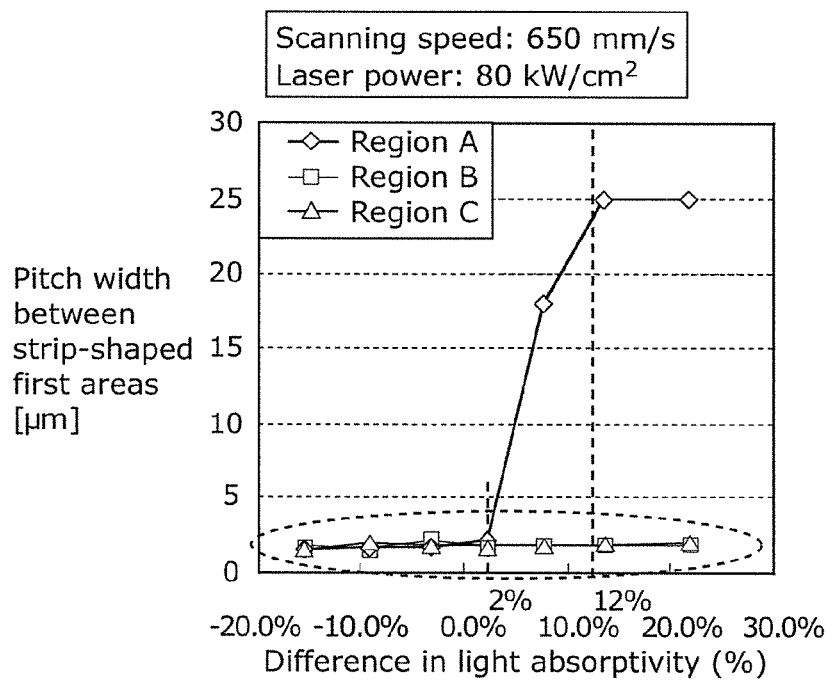
FIG. 53B is a diagram showing the pitch between the strip-shaped first areas formed when the amorphous silicon thin films are crystallized on the thin-film devices having seven different film-thickness conditions.

Next, using the aforementioned seven different base film structures, an experiment is carried out as to whether or not the strip-shaped first areas are formed above the gate electrode depending on a difference in light absorptivity between the amorphous silicon thin film above the gate electrode and the amorphous silicon thin film that is not above the gate electrode. FIG. 53A is a diagram showing the area irradiated with the laser light in association with the gate electrode (MoW) in the base film structures used in this experiment. FIG. 53B is a diagram showing the pitch between the strip-shaped first areas formed when the amorphous silicon thin film is crystallized using the green laser light (the beam minor axis width: 32 μm, the power density: 80 kW/$cm^2$) at the scanning speed of 640 mm/s for each of the aforementioned seven test samples No. 1 to No. 7. Here, "Region A", "Region B", and "Region C" in FIG. 53B corresponds to "Region A", "Region B", and "Region C" in FIG. 53A, respectively.

As shown in FIG. 53A, only the gate electrode (MoW) is present in Region A in the major axis of the laser light. Moreover, only the amorphous silicon thin film is present in Region B in the major axis of the laser light. Furthermore, both the amorphous silicon thin film and the gate electrode are present in Region C in the major axis of the laser light.

As can be seen from FIG. 53B, the strip-shaped first areas are formed in each of Region B and Region C, regardless of the difference in light absorptivity. In Region A, although the strip-shaped first areas are formed when the difference in light absorptivity is below 2%, the strip-shaped first area is not formed any more when the difference in light absorptivity reaches 2%. In particular, when the difference in light absorptivity reaches 12%, it can be obviously seen that the strip-shaped first area is not formed any more in Region A and, in addition to this, the pitch between the strip-shaped first areas does not change any more. In the present experiment, it is determined that the strip-shaped first areas are formed when the pitch is 2.1 μm or smaller, and that the strip-shaped first area is not formed when the pitch is larger than 2.0 μm.

From the result shown in FIG. 53B, it is preferable for the difference in light absorptivity to be 2% or higher, and more preferably 12% or higher, between the amorphous silicon thin film above the first gate electrode 211A (or the second gate electrode 211B) and the amorphous silicon thin-film that is not above the first gate electrode 211A (or the second gate electrode 211B) in the thin-film device 205 shown in FIG. 47A and FIG. 47B. To be more specific, the difference mentioned here refers to the difference obtained by subtracting the light absorptivity of the amorphous silicon thin film 213 above the first gate electrode 211A (or the second gate electrode 211B) from the light absorptivity of the amorphous silicon thin film that is not above the first gate electrode 211A (or the second gate electrode 211B). In this way, the grain structure of the crystalline silicon thin film 215 above the first gate electrode 211A can be easily formed to be different from the grain structure of the crystalline silicon thin film 215 above the second gate electrode 211B. More specifically, the first crystallized area 50A including the strip-shaped first areas 51 can be formed above the first gate electrode 211A, and the second crystallized area 50B including no strip-shaped first area 51 can be formed above the second gate electrode 211B.

The following describes a result of an experiment carried out as to whether or not the strip-shaped first areas are formed depending on the amount of laser light leaking from the gate electrode (MoW) in the step of crystallization, with reference to FIG. 54A to FIG. 54D. Each of FIG. 54A to FIG. 54D shows a relationship between the amount of laser light leaking from the gate electrode in the major axis direction of the laser light and the presence or absence of the first areas, and is an optical microscopic image of the surface of the crystalline silicon thin film crystallized with each different amount of laser light leakage.

Here, as shown in FIG. 50A, the amount of leakage of the laser light 30 from the gate electrode is defined by a distance d between the end portion 30a of the laser light 30 in the major axis direction of the emission width and the end portion 211Aa of the first gate electrode 211A (or the end portion 211Ba of the second gate electrode 211B). Note that the same can be said about in relation to the other end portion 30b of the laser light 30 in the major axis direction of the emission width. When an amount of light leakage d is positive (plus), this means that the end portions of the gate electrode are located within the emission width of the laser light (i.e., that the end portions of the laser light 30 are located outside the width of the gate electrode without overlapping with the gate electrode). In contrast, when the amount of light leakage is negative (minus), this means that the end portions of the gate electrode are located outside the emission width of the laser light (i.e., that the end portions of the laser light 30 overlap with the gate electrode and are located within the gate width of the gate electrode).

Moreover, in the present embodiment, the laser light 30 emits green laser light (the beam minor axis width: 32 μm, the power density: 80 kW/cm$^2$) at the scanning speed of 640 mm/s. Here, it is determined, in the present embodiment as well, that the strip-shaped first areas are formed when the pitch is 2.1 μm or smaller and that the strip-shaped first area is not formed when the pitch is larger than 2.0 μm.

Figure 54A:
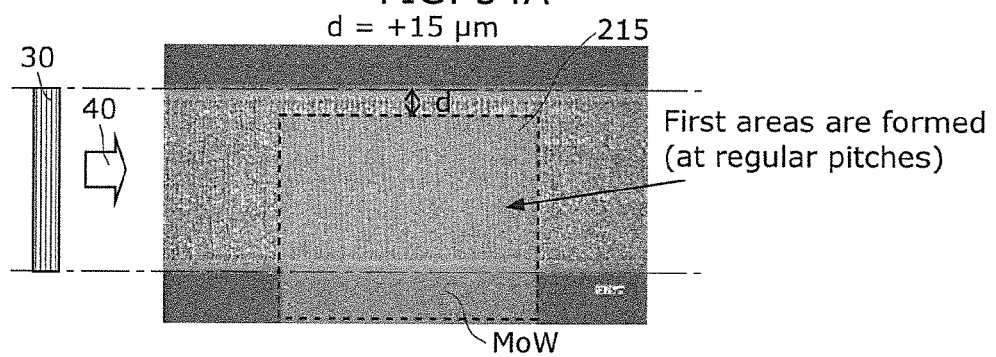
FIG. 54A shows an optical microscopic image of the surface of the crystalline silicon thin film crystallized in the step of crystallization in the method of manufacturing a thin-film device when the amount of laser light leakage is +15 µm, according to Embodiment 5 of the present invention.

As can be seen from FIG. 54A, when the amount of leakage d of the laser light 30 is +15 μm, the strip-shaped first areas 51 are formed at regular pitches on the crystalline silicon thin film 215 above the gate electrode (MoW).

Figure 54B:
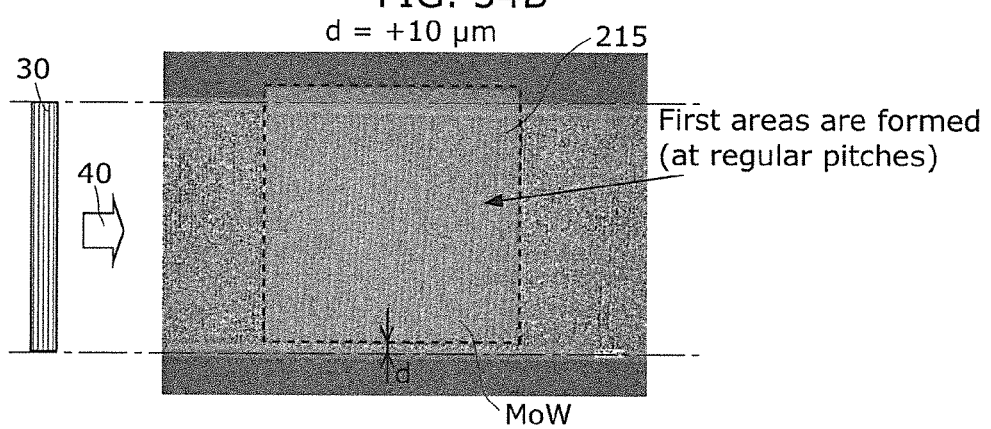
FIG. 54B shows an optical microscopic image of the surface of the crystalline silicon thin film crystallized in the step of crystallization in the method of manufacturing a thin-film device when the amount of laser light leakage is +10 µm, according to Embodiment 5 of the present invention.

Moreover, as can be seen from FIG. 54B, when the amount of leakage d of the laser light 30 is +10 μm, the strip-shaped first areas 51 are also formed at regular pitches on the crystalline silicon thin film 215 above the gate electrode (MoW).

Figure 54C:
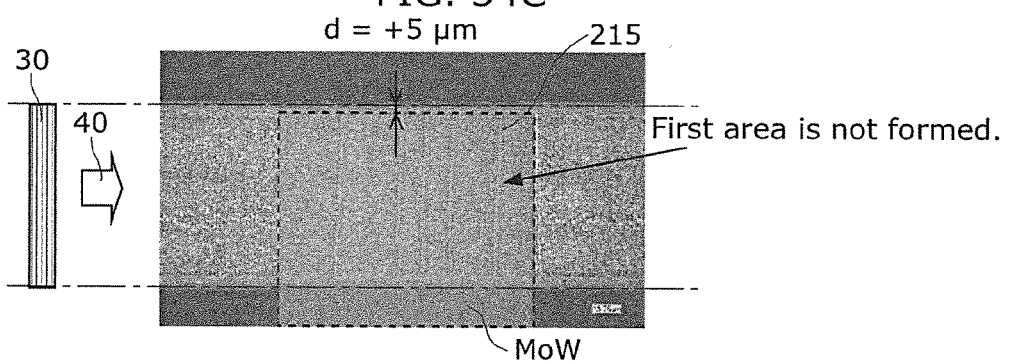
FIG. 54C shows an optical microscopic image of the surface of the crystalline silicon thin film crystallized in the step of crystallization in the method of manufacturing a thin-film device when the amount of laser light leakage is +5 µm, according to Embodiment 5 of the present invention.

Furthermore, as can be seen from FIG. 54C, when the amount of leakage d of the laser light 30 is +5 μm, the strip-shaped first area 51 is not formed on the crystalline silicon thin film 215 above the gate electrode (MoW).

Figure 54D:
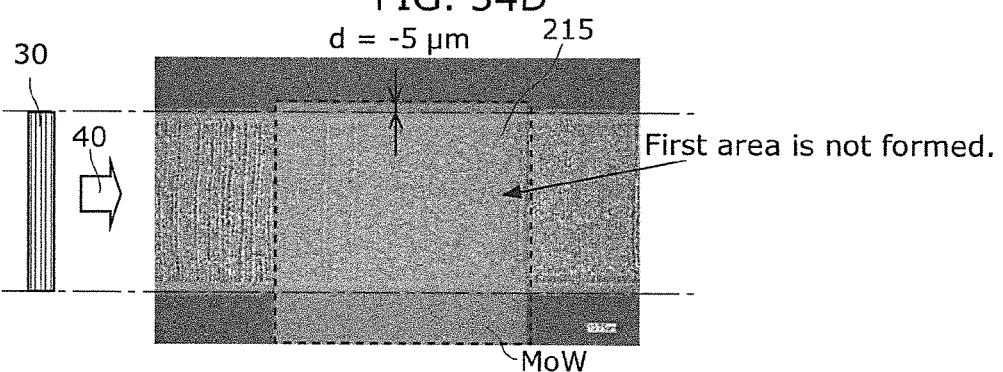
FIG. 54D shows an optical microscopic image of the surface of the crystalline silicon thin film crystallized in the step of crystallization in the method of manufacturing a thin-film device when the amount of laser light leakage is −10 µm, according to Embodiment 5 of the present invention.

Moreover, as can be seen from FIG. 54D, when the amount of leakage d of the laser light 30 is −5 μm, the strip-shaped first area 51 is not formed on the crystalline silicon thin film 215 above the gate electrode (MoW) either.

Thus, as can be seen from FIG. 54A to FIG. 54D, it is preferable for the amount of leakage d of the laser light 30 to be at least 10 μm in order to form the strip-shaped first areas 51 on the crystalline silicon thin film above the gate electrode (MoW).

Figure 55:
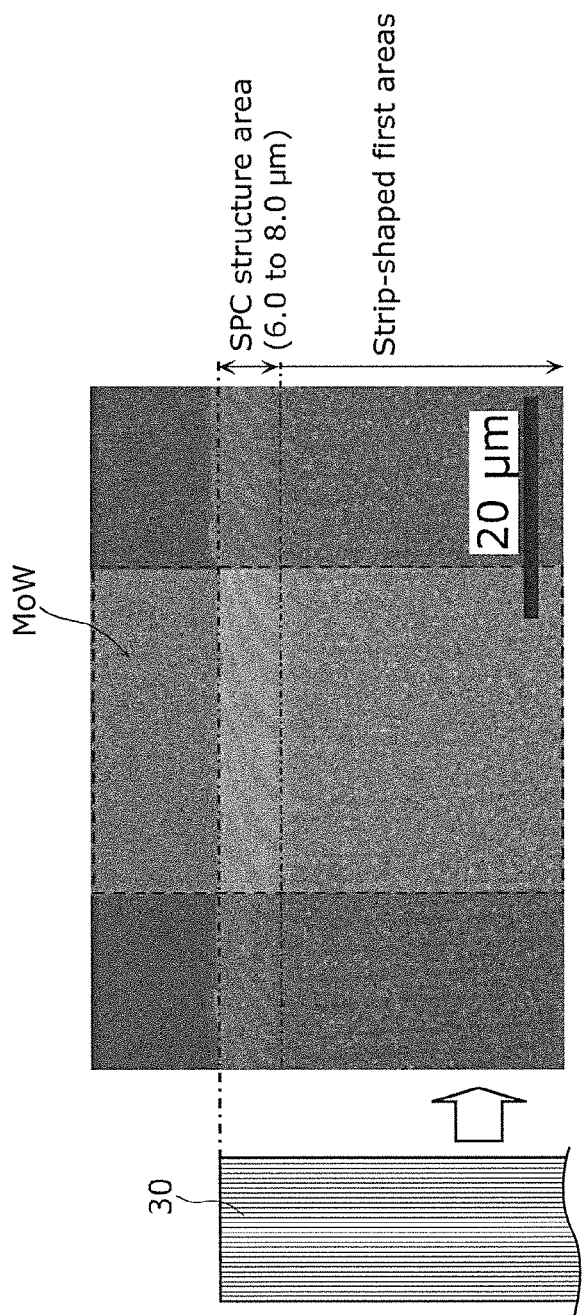
FIG. 55 is a plane SEM image of the crystalline silicon thin film around the end portions of the emission width of the laser light when the film is crystallized by the step of crystallization in the method of manufacturing a thin-film device according to Embodiment 5 of the present invention.

Moreover, as understood from the results shown in FIG. 54A to FIG. 54D, the strip-shaped first areas start being formed when the amount of leakage of the laser light 30 reaches 10 μm. This is because, as shown by the plane SEM image of the crystalline silicon thin film in FIG. 55, an area included in the region irradiated with the laser light 30 and having a certain distance (approximately 6.0 μm to 8.0 μm) from the end portion of the emission width of the laser light in the major axis direction has an SPC structure where the strip-shaped first area is not formed.

As described, whether or not to form the strip-shaped first areas can be controlled by the amount of leakage of the laser light 30. On this account, the two electrodes do not need to be arranged so that the respective end portions of the electrodes are located within or outside the emission width of the laser light 30 as shown in FIG. 50A. More specifically, even when all the end portions of the two electrodes are arranged to be located within the emission width of the laser light 30, the crystallized areas different in grain structure can be separately formed by controlling the amount of leakage of the laser light 30. The following describes a method of manufacturing a thin-film device in the case of controlling the amount of leakage of the laser light 30, according to another embodiment of the present invention Suppose that an amorphous silicon thin film is formed above the first gate electrode and the second gate electrode different in gate width as shown in FIG. 47A and FIG. 47B, and that the direction crossing the scanning direction of the laser light is the first direction (or the gate width direction). In this case, in the step of crystallization in FIG. 49 by the method of manufacturing a thin-film device according to another embodiment of the present invention, irradiation with the laser light 30 is performed to implement the following. When the laser light 30 is positioned above the first gate electrode: at least one of the both end portions of the first electrode in the gate width direction is located within the emission width of the laser light 30 in the gate width direction; and the distance between the one end portion of the first gate electrode and the corresponding end portion, closer to the one end portion of the first gate electrode, of the emission width of the laser light 30 is at least 10 μm (that is, the amount of leakage of the laser light 30 is at least +10 μm). Moreover, when the laser light 30 is positioned above the second gate electrode: the both end portions of the second gate electrode in the gate width are located within the emission width of the laser light 30 in the gate width direction; and each of the distances from the end portions of the second gate electrode to the corresponding end portions of the emission width of the laser light 30 is smaller than 10 μm (that is, the amount of leakage of the laser light 30 is smaller than +10 μm).

In this case, the light absorptivity of the amorphous silicon thin film above the first gate electrode is made smaller than the light absorptivity of the amorphous silicon thin film that is not above the first gate electrode as in the above-described embodiment. Moreover, the light absorptivity of the amorphous silicon thin film above the second gate electrode is made smaller than the light absorptivity of the amorphous silicon thin film that is not above the second gate electrode as in the above-described embodiment. Furthermore, the conditions for laser irradiation in the step of crystallization satisfy that the strip-shaped first areas are formed on the amorphous silicon thin film that is not above the first gate electrode nor the second gate electrode.

Then, also by another method of manufacturing a thin-film device according to Embodiment 5 of the present invention, based on a difference in gate width between the two gate electrodes and on a difference in light absorptivity of the amorphous silicon thin film between above and not above the gate electrode, the crystalline silicon thin film having the crystallized areas different in grain structure can be formed.

To be more specific, the light absorptivity of the crystalline silicon thin film above the first gate electrode (or the second gate electrode) is firstly set lower than the light absorptivity of the crystalline silicon thin film that is not above the first gate electrode (nor the second gate electrode). In addition to this, the irradiation width $W_L$ in the longitudinal direction of the laser light 30, the gate width $W_{G1}$ of the first gate electrode, and the gate width $W_{G2}$ of the second gate electrode are set to satisfy the relationship expressed as $W_{G1} < W_{G2} < W_L$. Furthermore, the amount of leakage d of the laser light 30 at the first gate electrode is made at least 10 μm and the amount of leakage d of the laser light 30 at the second gate electrode is made smaller than 10 μm. Then, the conditions for laser irradiation to crystallize the amorphous silicon thin film are adjusted by controlling the beam minor axis width and the scanning speed according to the conditions for laser irradiation corresponding to the region C or the region D of FIG. 4.

Thus, as in the above-described embodiment, the first crystallized area 50A having the grain structure where the strip-shaped first areas 51 are formed and the second crystallized area 50B having the grain structure where the strip-shaped first area 51 is not formed can be formed in the same step. To be more specific, the following can be formed in the same step: the first crystalline silicon thin film having the first crystallized area 50A including the strip-shaped first areas 51 larger in grain size; and the second crystalline silicon thin film having the second crystallized area 50B where the grain size is smaller than in the strip-shaped first area 51. Hence, the following can be manufactured in the same step at a higher throughput in the present embodiment as well: the first device unit excellent in ON-state current characteristics and thus suitable for the driver transistor; and the second device unit superior to the first device unit in the OFF-state current characteristics and thus suitable for the switching transistor.

Next, the following describes a relationship between the temperature of the amorphous silicon thin film and the crystallinity of the crystalline silicon thin film in the step of crystallization in the manufacturing method of the above-described embodiment.

In the step of crystallization, the amorphous silicon thin film is annealed with the laser light and thus crystallized into the crystalline silicon thin film. In general, when an amorphous silicon thin film is irradiated with laser light to form a crystalline silicon thin film, an end-point temperature reached by the amorphous silicon thin film through heat generation has a correlation with the crystallinity of the resulting crystalline silicon thin film. When the end-point temperature reached by the amorphous silicon thin film through heat generation is higher, the crystallinity of the resulting crystalline silicon thin film is higher. Thus, in order to crystallize, fully and uniformly, the amorphous silicon thin film at the channel area of the TFT (i.e., above the area where the gate electrode is formed), it is necessary for distribution of the end-point temperature reached by the amorphous silicon thin film through heat generation to be consistent in the channel area of the TFT.

However, in the case of the bottom-gate type TFT, the gate electrode is located below the amorphous silicon thin film with the gate insulating film in between, and the metal included in the gate electrode is higher in thermal conductivity than the gate insulating film. For this reason, heat of the amorphous silicon thin film generated through laser light irradiation is instantly transferred to the gate electrode via the gate insulating film. As a result, the amorphous silicon thin film above the gate electrode may lack heat generation, thereby causing the end-point temperature of the amorphous silicon thin film to vary between the areas located above and not located above the gate electrode. This may result in variation in crystallinity (variation in crystallization) on the crystalline silicon thin film between the areas above and not above the gate electrode.

Therefore, in order to avoid a phenomenon in which variation occurs in crystallization, it is preferable for the amorphous silicon thin film that is not above the area where the gate electrode is formed to be higher in temperature reached through the laser light irradiation than the amorphous silicon thin film above the gate electrode, in the step of crystallization according to the present embodiment. This preferable temperatures can be set according to: a reflectivity of the gate electrode (the first gate electrode or the second gate electrode) with respect to the laser light; an optical film thickness of the gate insulating film with respect to the laser light; and an absorptivity of the amorphous silicon thin film as a precursor film with respect to the laser light.

With this, heat generated by the amorphous silicon thin film above the area where the gate electrode is not formed can be made larger than heat generated by the amorphous silicon thin film above the area where the gate electrode is formed.

More specifically, heat generated through laser light irradiation by the amorphous silicon thin film that is not above the gate electrode (i.e., the amorphous silicon thin film located above the area where the gate electrode is not formed) is firstly transferred to the gate electrode before the laser light reaches the amorphous silicon thin film above the gate electrode (i.e., the amorphous silicon thin film above the area where the gate electrode is formed) and thus increases the temperature of the gate electrode. In other words, the gate electrode is preheated before being heated by the laser light. The reason for this is as follows. With the aforementioned configuration, when the amorphous silicon thin film above the area where the gate electrode is not formed is irradiated with the laser light to generate heat, the temperature of the amorphous silicon thin film above the area where the gate electrode is not formed becomes higher than the temperature of the amorphous silicon thin film above the gate electrode where the laser light has not reached yet. For this reason, heat generated by the amorphous silicon thin film that is located above the area where the gate electrode is not formed is transferred to the gate electrode and accordingly increases the temperature of the gate electrode. When the laser light reaches the amorphous silicon thin film above the gate electrode, this amorphous silicon thin film generates heat. Then, heat corresponding to the heat generated by the amorphous silicon thin film above the gate electrode is transferred to the gate electrode (the application of heat by the laser light). With this heat application by the laser light and the aforementioned preheating, the gate electrode becomes thermally saturated. Here, when the gate electrode is thermally saturated, this means that the in-plane temperature of the gate electrode is consistent.

By setting the temperatures of the amorphous silicon thin film located above and not above the gate electrode through the laser light as described above, the gate electrode can be made thermally saturated when the amorphous silicon thin film is crystallized. Thus, heat of the laser light for crystallizing the amorphous silicon thin film is used for forming the crystalline silicon thin film, instead of being absorbed by the gate electrode. As a result, the crystalline silicon thin film having no variation in crystallization can be formed. In other words, the strip-shaped first areas having no variation in crystallization can be formed.

Example of Embodiment 5

Next, an example of the method of manufacturing a thin-film device according to the present invention is explained, with reference to FIG. 49 described above.

Firstly, as shown in (a) of FIG. 49, a glass substrate is prepared as the substrate 210. Then, an undercoat (not illustrated) comprising an insulating film of a silicon oxide film and having a thickness of 500 nm is formed on the glass substrate by plasma CVD. After this, a metal film comprising molybdenum-tungsten (MoW) is deposited with a thickness of 50 nm on the undercoat film by sputtering. Then, patterning is performed on the metal film to form the first gate electrode 211A and the second gate electrode 211B as shown in (b) of FIG. 49. Following this, as shown in (c) of FIG. 49, the gate insulating film 212 comprising a laminated film including a 70-nm-thick silicon oxide film and a 85-nm-thick silicon nitride film is formed to cover the first gate electrode 211A and the second gate electrode 211B by plasma CVD. On this film, as shown in (d) of FIG. 49, the amorphous silicon thin film 213 comprising an amorphous silicon film is further formed with a thickness of 50 nm by continuous deposition. After this, the hydrogen content atomic percentage of the amorphous silicon film is set to 3.0 atomic percent or lower by dehydrogenation treatment performed at 500° C.

After this, as shown in (e) of FIG. 49, the substrate 210 on which the amorphous silicon thin film 213 is formed is fixed onto the substrate support unit (stage) 110 of the crystalline semiconductor thin film formation apparatus 100 shown in FIG. 11 and then the amorphous silicon thin film 213 (the amorphous silicon film) is irradiated with the laser light. As a result, the amorphous silicon thin film 213 is crystallized to include the first crystalline silicon thin film 215A and the second crystalline silicon thin film 215B.

Here, a Raman FWHM with respect to the scanning speed of the laser light is described in relation to: the first crystalline silicon thin film 215A including the first crystallized area 50A (where both the first areas and the second areas are formed) formed under the conditions for laser irradiation according to the present example; and the crystalline silicon thin film (where only the second area is formed with no first area) formed under the conditions for laser irradiation according to the comparative example.

As the conditions for laser irradiation according to the present example: the power density is 70.0 kW/cm$^2$; the stage scanning speed is 580 mm/s; the irradiation time is 49.0 μsec; and the input energy density is 3.5 J/cm$^2$. Moreover, as the conditions for laser irradiation according to the comparative example: the power density is 60 kW/cm$^2$; the stage scanning speed is 400 mm/s; the irradiation time is 80.0 μsec; and the input energy density is 4.8 J/cm$^2$. In these examples, the beam minor axis width W1 of the laser light is fixed at 32 μm, and the gate electrodes and the like are equal in material used, film thicknesses, and so forth.

The results similar to the results shown in FIG. 25A and FIG. 25B are obtained in the present example as well. To be more specific, it can be seen that the first crystalline silicon thin film 215A formed under the conditions for laser irradiation according to the present example and including both the first areas 51 and the second areas 52 is smaller in the FWHM of the Raman scattering peak spectrum than the crystalline silicon thin film formed under the conditions for laser irradiation according to the comparative example and including only the second area 52 with no first area 51. Such a smaller Raman FWHM indicates that the grain structure of the crystalline silicon thin film includes silicon particles larger in grain size.

Moreover, the FWHM of the Raman shift peak in the first crystalline silicon thin film 215A formed under the conditions for laser irradiation according to the present example is 4.8 cm$^{-1}$ to 5.5 cm$^{-1}$, inclusive. To be more specific, when the FWHM of Raman shift peak in the first crystalline silicon thin film 215A is 4.8 cm$^{-1}$ to 5.5 cm$^{-1}$, inclusive, the crystalline silicon thin film can have the grain structure including the first area 51 where the grain size is large.

Next, referring back to FIG. 49, photolithography and wet etching are performed on the substrate on which the first crystalline silicon thin film 215A including the first crystallized area 50A and the second crystallized area 50B is formed as shown in (e) of FIG. 49. As a result, each of the first crystalline silicon thin film 215A and the second silicon thin film 215B is formed in the shape of an island, as shown in (f) of FIG. 49.

Next, as shown in (g) of FIG. 49, an intrinsic amorphous silicon film (not illustrated) is formed with a thickness of 50 nm by, for example, plasma CVD. Following this, also by plasma CVD, the contact layer 216 is formed with a thickness of 30 nm on the amorphous silicon film. The contact layer 416 is an n$^+$ layer comprising an amorphous silicon film doped with dopant such as phosphorus. After this, as shown in this diagram, the source-drain metal film 217 having a three-layer structure of MoW (50 nm), Al (400 nm), and MoW (50 nm) is formed on the contact layer 216 by sputtering.

Next, patterning is performed to divide the source-drain metal film 217 by photolithography and dry etching to form the pair of the first source electrode 217A and the first drain electrode 218A and the pair of the second source electrode 217B and the second drain electrode 218B.

Next, the contact layer 216 is divided by dry etching, leaving a resist for patterning the source-drain metal film 217, to form the pair of the first contact layers 216A opposite to each other and the pair of the second contact layers 216B opposite to each other as shown in (h) of FIG. 49. After this, the resist is removed. As a result, the first device unit 201A and the second device unit 205B as the bottom-gate type TFTs can be manufactured.

After this, a silicon nitride film may be formed with a thickness of 400 nm by, for example, plasma CVD. Then, contact holes may be formed in the silicon nitride film by photolithography and dry etching. Following this, an indium tin oxide (ITO) film serving as a transparent electrode may be deposited with a thickness of 100 nm by sputtering, and then patterning may be performed on the ITO film by photolithography and dry etching.

Embodiment 6

Figure 56A:
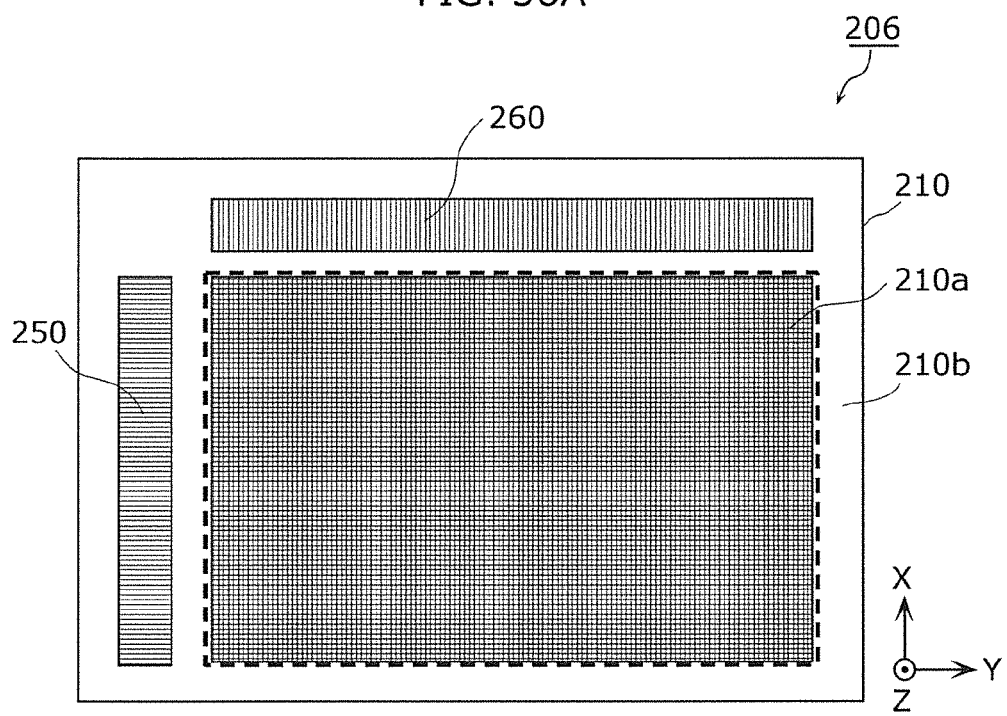
FIG. 56A is a schematic plan view showing a configuration of a thin-film device array substrate according to Embodiment 6 of the present invention.

The following describes Embodiment 6 of the present invention. The present embodiment describes a thin-film device array substrate (a thin-film device array) including the first device unit 201A and the second device unit 205B of the thin-film device 205 according to Embodiment 5. The thin-film device array substrate according to the present embodiment can be formed using the method of forming a crystalline thin film according to Embodiment 1. FIG. 56A is a schematic plan view showing a configuration of the thin-film device array substrate according to Embodiment 6 of the present invention.

As shown in FIG. 56A, a thin-film device array substrate 206 according to the present embodiment includes a substrate 210 having a plane area that is divided into an inner area 210a and a peripheral area 210B, a gate driver circuit 250, and a source driver circuit 260, as in Embodiment 2. In FIG. 56A, the inner area 210a refers to the area inside the dashed-line box and the peripheral area 210b refers to the area outside the dashed-line box.

The inner area 210a is a rectangular area that corresponds to a pixel area (a display area) where a plurality of pixels are arranged in a matrix (with rows and columns) on the substrate 210 and is surrounded by the peripheral area 210b, as in Embodiment 2. On the other hand, the peripheral area 210b surrounds the pixel area (the inner area 210a) on the substrate 210 and is in the shape of a picture frame (a frame-like area). Here, note that each of the pixels in the inner area 210a includes TFTs such as a switching transistor.

The respective configurations of the gate driver circuit 250 and the source driver circuit 260 are the same as those described in Embodiment 2 and, therefore, the explanation of these circuits are omitted here.

Each of the TFTs in the pixels of the inner area 210a, the gate driver circuit 250, and the source driver circuit 260 according to the present embodiment is also formed using the LTPS (low temperature poly-silicon) technology.

Figure 56B:
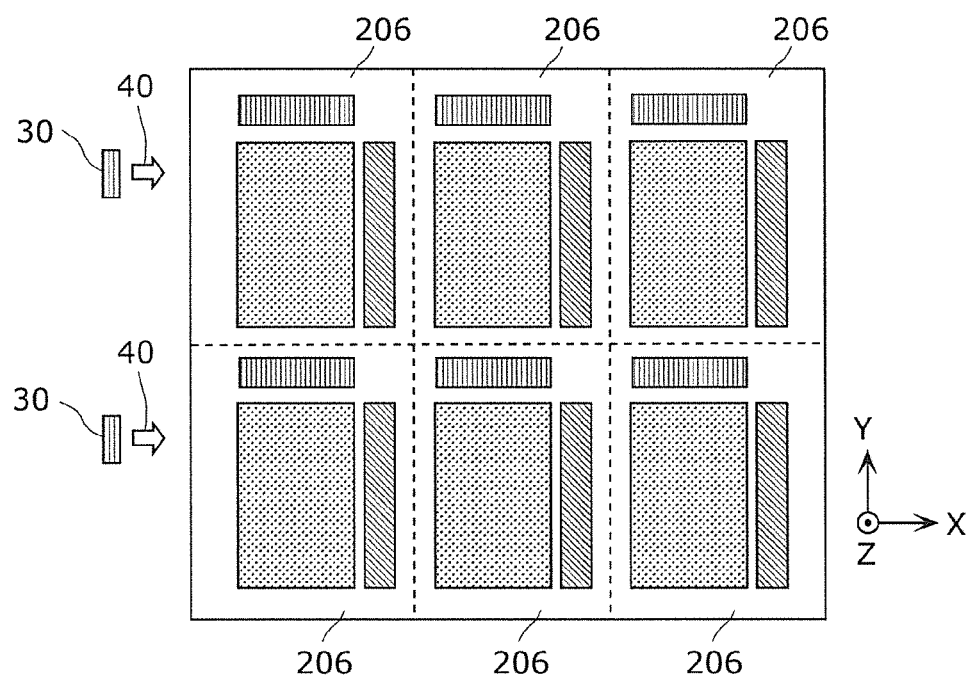
FIG. 56B is a plan view of a mother substrate of the thin-film device array substrate according to Embodiment 6 of the present invention.

FIG. 56B is a diagram showing a mother substrate of thin-film device array substrates according to Embodiment 6 of the present invention. FIG. 56B shows an example where six substrate pieces are to be cut out, as in the above embodiment. By cutting this mother substrate, six thin-film device array substrates 206 can be obtained. In the present embodiment, an amorphous silicon thin film formed on a mother substrate before cutting is irradiated with a laser light 30 as shown in FIG. 56B. As a result, a crystalline silicon thin film is formed.

Figure 57A:
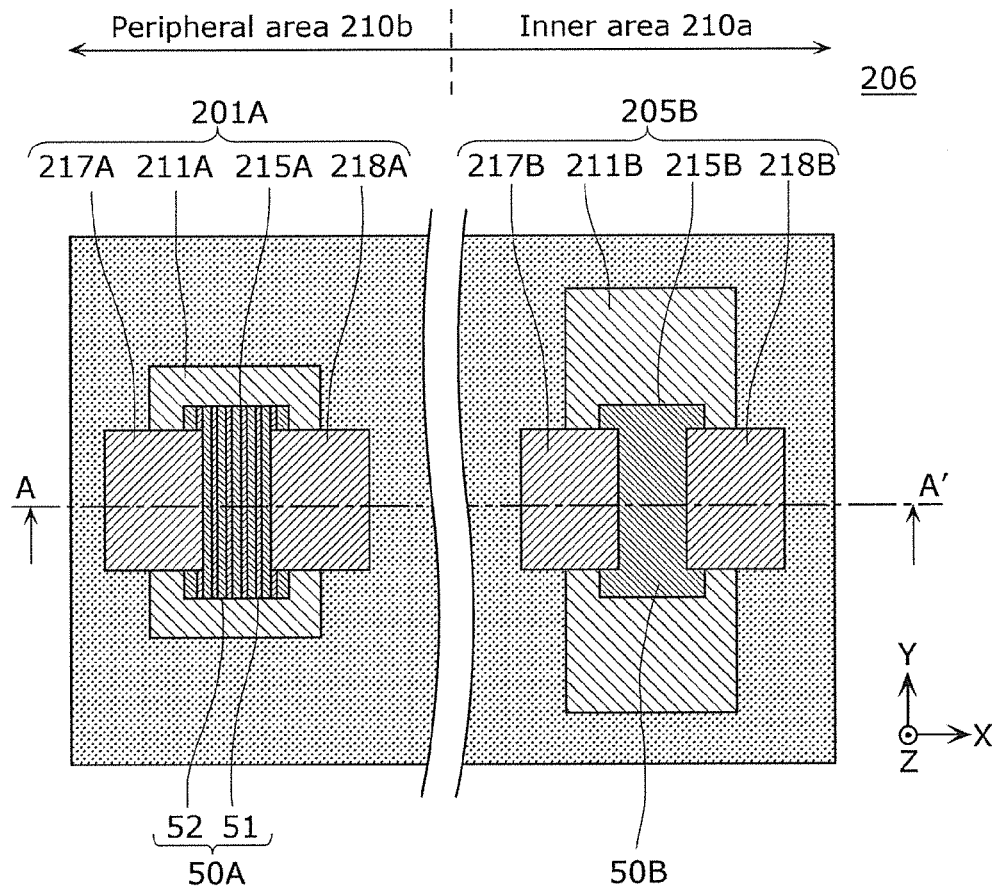
FIG. 57A is a plan view of the thin-film device array substrate according to Embodiment 6 of the present invention.
Figure 57B:
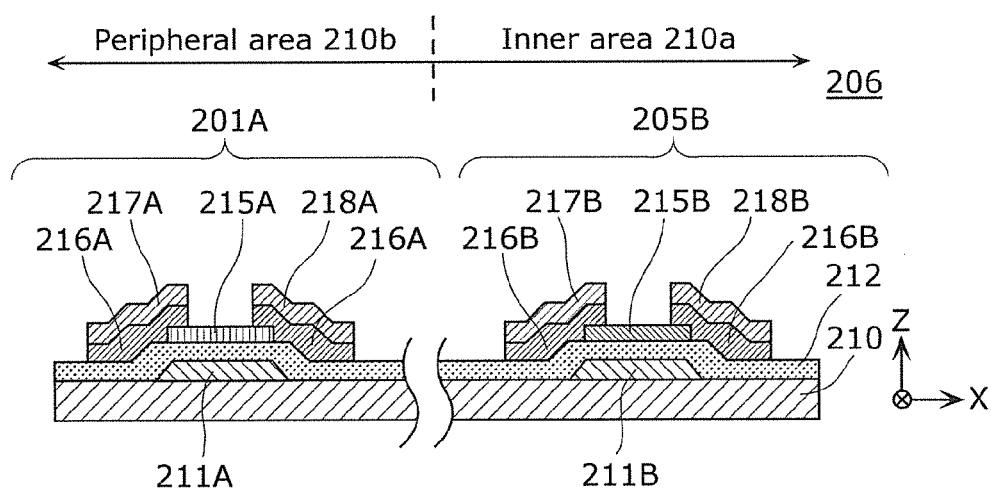
FIG. 57B is a cross-sectional view of the thin-film device array substrate along the line A-A' shown in FIG. 57A.

Next, configurations of device units of the thin-film device array substrate 206 according to Embodiment 6 of the present invention are described, with reference FIG. 57A and FIG. 57B. FIG. 57A is a plan view showing the device units and surrounding areas on the thin-film device array substrate according to Embodiment 6 of the present invention. FIG. 57B is a cross-sectional view of the device units and surrounding areas on the thin-film device array substrate according to Embodiment 6 of the present invention. Note that FIG. 57B is the cross-sectional view along the line A-A' shown in FIG. 57A.

As shown in FIG. 57A and FIG. 57B, the thin-film device array substrate 206 according to the present embodiment includes a first device unit 201A formed in the peripheral area 210b of the substrate 210 and a second device unit 205B formed in the inner area 210a of the substrate 210. The first device unit 201A is a driver transistor included in each of the gate driver circuit 250 and the source driver circuit 260 provided in the peripheral area 210b of the substrate 210, in the present embodiment as well. Moreover, the second device unit 205B is a switching transistor provided for each pixel included in the inner area 210a of the substrate 210.

As in Embodiment 5, the thin-film device array substrate 206 includes the first device unit 201A and the second device unit 205B, and further includes: the substrate 210; a first gate electrode 211A formed in the inner area 210a on the substrate 210; a second gate electrode 211B formed in the inner area 210a on the substrate 210; a gate insulating film 212 covering the first gate electrode 211A and the second gate electrode 211B; a first crystalline silicon thin film (a first thin film) 215A formed above the substrate 210 and including a first crystallized area 50A; and a second crystalline silicon thin film (a second thin film) 215B formed above the substrate 210 and including the second crystallized area 50B.

The first device unit 201A is a bottom-gate type TFT (a first TFT) including, as a channel, at least a part of a strip-shaped first area 51 of the first crystalline silicon thin film 215A (a first crystallized area 50A). Moreover, the first device unit 201A includes the following that are formed sequentially on the substrate 210: the first gate electrode 211A, the gate insulating film 212, the first crystalline silicon thin film (a first crystalline semiconductor film) 215A, a pair of first contact layers 216A, a first source electrode 217A, and a first drain electrode 218B.

The second device unit 205B is a bottom-gate type TFT (a second TFT) including, as a channel, the second crystalline silicon thin film 215B (a second crystallized area 50B). Moreover, the second device unit 205B includes the following that are formed sequentially on the substrate 210: the second gate electrode 211B, the gate insulating film 212, the second crystalline silicon thin film (a second crystalline semiconductor film) 215B, a pair of second contact layers 216B, a second source electrode 217B, and a second drain electrode 218B.

It should be noted that the configurations of the first device unit 201A and the second device unit 205B and the methods of manufacturing the first device unit 201A and the second device unit 205B according to the present embodiment are the same as the configurations of the first device unit 201A and the second device unit 201B and the methods of manufacturing the first device unit 201A and the second device unit 201B according to the Embodiment 5.

As described thus far, the thin-film device array substrate 206 according to the present embodiment can achieve an advantageous effect similar to that of Embodiment 1.

More specifically, in the thin-film device 206 according to the present embodiment, the first crystalline silicon thin film 215A of the first device unit 201A includes the first crystallized area 50A having the strip-shaped first areas 51, and the second crystalline silicon thin film 215B of the second device unit 201B includes the second crystallized area 50B different from the first crystallized area 50A in grain structure. Accordingly, the thin-film device including the first device unit 203A and the second device unit 201B different in device characteristics can be easily implemented.

Moreover, also in the present embodiment, the average grain size of the crystal grains in the second crystallized area (the third area) 50B is smaller than the average grain size of the crystal grains in the strip-shaped first area 51 of the first crystallized area 50A. Furthermore, the average grain size of the crystal grains in the second crystallized area (the third area) 50B is smaller than the average grain size of the crystal grains in the strip-shaped first area 51 of the first crystallized area 50A. With this, the charge carrier mobility in the channel of the first device unit 201A can be increased. Therefore, the first device unit 201A can be implemented as a TFT superior to the second device unit 205B in ON-state current characteristics.

Furthermore, also in the present embodiment, each of the strip-shaped first areas 51 includes the crystal grains that are in contact with each of the adjacent second areas 52. On this account, as the first device unit 203A, a TFT that is excellent in ON-state current characteristics and in uniformity with less variation in charge carrier mobility can be implemented.

Moreover, according to the present embodiment, since the first device unit 201A is superior to the second device unit 205B in ON-state current characteristics, the first device unit 201A can be used as the driver transistor in each of the gate driver circuit 250 and the source driver circuit 260 provided in the peripheral area 210b of the substrate 210. Furthermore, since the second device unit 205B is superior to the first device unit 201A in OFF-state current characteristics, the second device unit 205B can be used as the switching transistor of each pixel provided in the inner area 210a of the substrate 210.

Furthermore, also in the present embodiment, the channel direction of the first device unit 201A may be perpendicular to the longitudinal direction of the strip shape of the first area 51 or parallel to the longitudinal direction of the strip shape of the first area 51. Here, in order to increase the charge carrier mobility, it is preferable for the first device unit 201A to be formed to have the channel direction that is substantially parallel to the strip shape of the first area 51.

It should be noted that the thin-film device array substrate 206 according to the present embodiment can be used for the display panel 400 shown in FIG. 32A and FIG. 32B.

The present invention in an aspect or aspects has been described by way of the embodiments, examples, and modifications on the basis of a thin-film device and a manufacturing method thereof, a thin-film device array substrate and a manufacturing method thereof, and an OLED display device, for example. However, the present invention is not limited to the embodiments and the like described above.

For example, a silicon thin film is used as a semiconductor thin film in Embodiments 1 to 6 above. However, a semiconductor thin film that is not a silicon thin film can be used instead. For example, a crystalline semiconductor thin film can be formed by crystallizing an amorphous semiconductor thin film comprising germanium (Ge) or silicon germanium (SiGe).

Moreover, the shape of the projection (or, the shape of the intensity distribution) of the laser light emitted to the amorphous silicon thin film is a rectangle having the major axis and the minor axis, in Embodiments 1 to 6 above. However, this shape is not intended to be limiting. For example, the shape of the projection (or, the shape of the intensity distribution) of the laser light emitted to the amorphous silicon thin film may be any other shape such as an oval, as long as the shape has the major axis and the minor axis, or may be a circle or a square.

Furthermore, the thin-film device array substrate manufactured according to Embodiments 1 to 6 above may be included not only in the OLED display device but also in a display device such as a liquid crystal display device. Moreover, the display device may be used as a flat-panel display and thus can be applied to an electronic device, such as a television set, a personal computer, or a mobile phone.

Furthermore, the crystalline silicon thin film formed according to each of Embodiments 1 to 6 above is applicable not only to a TFT but also to various electronic devices including a photoelectric conversion device such as a solar cell or an image sensor.

The crystalline silicon thin film according to each of Embodiments 1 to 6 may be either an n-type semiconductor or a p-type semiconductor.

Figure 58A:
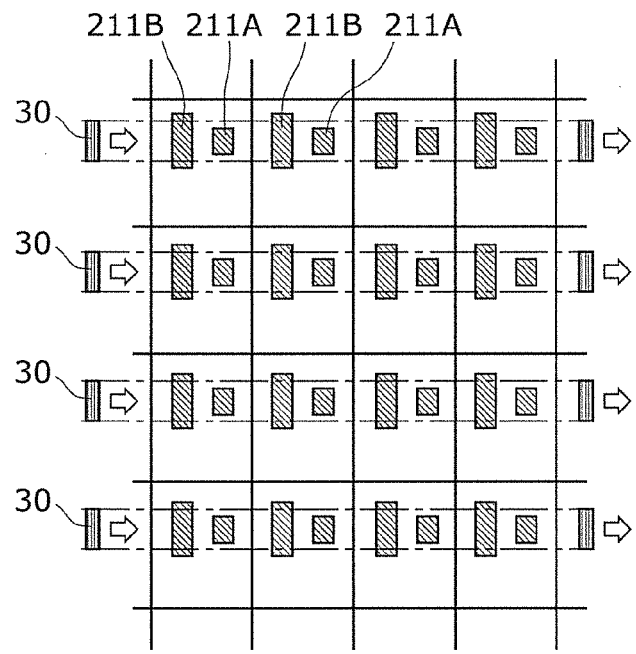
FIG. 58A is a cross-sectional view schematically showing an example of a step of crystallization in a method of manufacturing a thin-film device according to Modification 1 of the present invention.
Figure 58B:
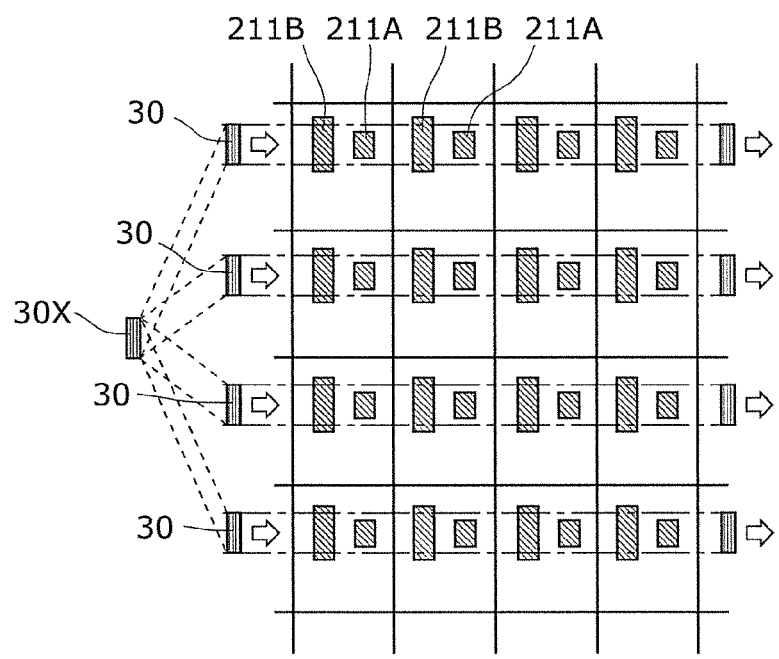
FIG. 58B is a cross-sectional view schematically showing another example of the step of crystallization in the method of manufacturing a thin-film device according to Modification 2 of the present invention.

Moreover, in Embodiments 1 to 6 above, as the method of irradiation using the laser light 30, the laser light 30 may scan pixel rows one by one in sequence. Alternatively, a plurality of laser lights 30 may be provided and a plurality of pixel rows may be set as one block so that each block is scanned by a different one of the laser lights 30. In the latter case, each of the lines along which the first gate electrodes 211A and the second gate electrodes 211B are arranged may be irradiated with a corresponding one of the laser lights emitted from respective different laser light sources, as shown in FIG. 58A. Or, each of the lines along which the first gate electrodes 211A and the second gate electrodes 211B are arranged may be irradiated with a corresponding one of the laser lights 30 separately emitted from a single laser light source 30X, as shown in FIG. 58B.

Furthermore, in Embodiments 1 to 6 above, the grain structure of the second crystallized area 50B may be one of the following: an SPC structure obtained according to SPC at a temperature of the melting point of amorphous silicon (1100° C.) or lower, or more specifically, at about 600° C. to 1100° C.; a structure of explosive nucleation (Ex) obtained through a supercooled liquid state at a temperature between the melting point of amorphous silicon and the melting point of silicon (1414° C.); and a structure of molten silicon crystal including polycrystalline silicon (p-Si) crystallized at a temperature of the melting point of silicon (1414° C.) or higher.

Moreover, in Embodiments 1 to 6 above, the first crystallized area 50A and the second crystallized area 50B are formed on the respective thin films formed separately, that is, the first crystalline silicon thin film 215A and the second crystalline silicon thin film 215B. However, the first crystallized area 50A and the second crystallized area 50B may be formed on the same thin film. To be more specific, the first crystalline silicon thin film (the first thin film) and the second crystalline silicon thin film (the second thin film) do not need to be separately formed and may be formed as one thin film. Therefore, this single crystalline silicon thin film may include both the first crystallized area 50A and the second crystallized area 50B.

Furthermore, in Embodiments 1 and 2 above, each of the first laser light and the second laser light has the beam minor axis width that is shorter than the beam major axis width. However, the beam minor axis width may be made longer than the beam major axis width. Even in this case, the scanning direction of the laser light is the same as in the present embodiments. In other words, laser light scanning is performed so that the minor axis direction of the laser light corresponds to the scanning direction.

Moreover, in Embodiments 3 to 6 above, the beam minor axis width W1 of the laser light is made shorter than the beam major axis width W2. However, the beam minor axis width W1 may be made longer than the beam major axis width W2.

Even in this case, the scanning direction of the laser light is the same as in the present embodiments. In other words, laser light scanning is performed so that the minor axis direction of the laser light corresponds to the scanning direction.

Furthermore, in Embodiments 1 and 2 above, the crystalline silicon thin film having different grain structures is formed by separately using the first laser light 30A and the second laser light 30B different in beam minor axis width. However, this is not intended to be limiting. For example, the crystalline silicon thin film having different grain structures can be formed by using a single laser that includes parts different in beam minor axis width. To be more specific, the light intensity distribution of the laser light in the minor axis direction includes a first part having a beam minor axis width $W_{1A}$ and a second part having a beam minor axis width $W_{1B}$. Here, beam shaping is performed, thereby making the beam minor axis width $W_{1A}$ shorter than the beam minor axis width $W_{1B}$. With this, crystalline silicon thin film having different grain structures can be formed using the single laser in the same step and, therefore, throughput can be increased.

Moreover, in Embodiments 3 and 4 above, the areas different in light absorptivity are formed on the amorphous film according to the difference between the materials used for the gate electrodes. However, this is not intended to be limiting. For example, the first gate electrode and the second electrode may be formed using the same material, and then a light absorption layer or a light interference layer may be formed on either one of the gate electrodes. With this, the light absorptivity of the amorphous silicon film above the first gate electrode can be made different from the light absorptivity of the amorphous silicon film above the second electrode. Alternatively, light absorption layers different in light absorptivity or light interference layers different in light interference may be formed respectively on the first gate electrode and the second gate electrode. With this, areas different in light absorptivity can also be formed on the amorphous silicon film.

It should be noted that other embodiments implemented through various changes and modifications conceived by those skilled in the art or through a combination of the structural elements and functions in different embodiments described above may be included in the scope of the present invention unless such changes, modifications, and combination depart from the scope of the present invention.

INDUSTRIAL APPLICABILITY

The thin-film device and the method of manufacturing a thin-film device according to the present invention is useful for a TFT, a solar cell, and an electronic device including a crystalline silicon thin film such as a sensor. Moreover, the thin-film device and the method of manufacturing a thin-film device according to the present invention are widely applicable, for example, to a display device such as a television set, a personal computer, or a mobile phone, and to other electric appliances.

REFERENCE SIGNS LIST 10, 210, 510 Substrate
10S Surface
13, 213 Amorphous silicon thin film
15, 215 Crystalline silicon thin film
15A, 215A First crystalline silicon thin film
15B, 215B Second crystalline silicon thin film
30, 30C Laser light
30A First laser light
30B Second laser light
30X Laser light source
40, 40C Scanning direction
40A First scanning direction
40B Second scanning direction
41 First direction
50 Crystallized area
50A First crystallized area
50B Second crystallized area
51 First area
52 Second area
53 SPC grain structure
54 Ablation
100 Crystalline semiconductor thin film formation apparatus
110 Substrate support unit
120 Laser light oscillation unit
130 Optical system unit
131 Homogenizer
132 Condenser lens
133 DOE lens
140 Control unit
141 Scanning control unit
142 Laser light intensity distribution adjustment unit
201, 203, 205 Thin-film device
201A, 203A First device unit
201B, 205B Second device unit
202, 204, 206 Thin-film device array substrate
210 Substrate
210a Inner area
210b Peripheral area
211A, 371G First gate electrode
211Aa, 211Ab, 211Ba, 211Bb, 30a, 30b End portion
211a Lower layer
211b Upper layer
211B, 372G Second gate electrode
211M$_1$ First gate metal film
211M$_2$ Second gate metal film
212, 512 Gate insulating film
216A First contact layer
216B Second contact layer
217 Source-drain metal film
217A, 371S First source electrode
217B, 372S Second source electrode
218A, 371D First drain electrode
218B, 372D Second drain electrode
219 Passivation film
220 Undercoat film
221 LDD area
222 Interlayer insulating film
240 Carrier transfer pathway
250 Gate driver circuit
260 Source driver circuit
300 OLED display device
310 Active matrix substrate
320 Pixel
330 OLED device
331 Anode
332 OLED layer
333 Cathode
340 Scanning line
350 Video signal line
360 Power line
371A Driver transistor
372B Switching transistor
380 Condenser
391, 392 Contact hole
393 Relay electrode 400 Display panel
410 Display device
501 First layer
502 Second layer
503 Third layer
504 Fourth layer
511 Gate electrode
512a First gate insulating film
512b Second gate insulating film
513 Amorphous semiconductor thin film

The invention claimed is:

1. A thin-film device, comprising:
a substrate; and
a first device and a second device which are located above the substrate,
the first device including:
a first gate electrode formed above the substrate;
a first gate insulating film covering the first gate electrode; and
a first thin film located opposite to the first gate electrode with the first gate insulating film in between, and
the second device including:
a second gate electrode located at a position different from a position where the first gate electrode is formed;
a second gate insulating film covering the second gate electrode; and
a second thin film located opposite to the second gate electrode with the second gate insulating film in between,
wherein the first thin film includes a strip-shaped first area and a strip-shaped second area located on each widthwise side of the strip-shaped first area, the strip-shaped second area including crystal grains having an average grain size smaller than an average grain size of crystal grains included in the strip-shaped first area,
the first device has a channel which is a part including a plurality of the strip-shaped first areas and a plurality of the strip-shaped second areas formed to appear alternately,
the second thin film includes a third area including crystal grains having an average grain size smaller than the average grain size in the strip-shaped first area,
the second device has a channel which is the third area, and
the strip-shaped first area includes crystal grains which are in contact with the strip-shaped second area on the each side of the strip-shaped first area.

2. The thin-film device according to claim 1,
wherein the crystal grains included in the strip-shaped first area and in contact with the second area on the each side of the strip-shaped first area account for at least 80% of the strip-shaped first area in a longitudinal direction.

3. The thin-film device according to claim 1,
wherein each of the first thin film and the second thin film is crystallized by predetermined light having a wavelength of 405 nm to 632 nm, inclusive, and
the first thin film before crystallization has a higher light absorptivity with respect to the predetermined light than the second thin film before crystallization.

4. The thin-film device according to claim 1,
wherein, when the channel of the first device writ has a channel direction crossing a first direction, the second gate electrode is longer than the first gate electrode in the first direction.

5. The thin-film device according to claim 1,
wherein the average grain size in the third area of the second thin film is smaller than or equal to the average grain size in the second area of the first thin film.

6. The thin-film device according to claim 1,
wherein the first gate insulating film and the second gate insulating film are continuous with each other.

7. The thin-film device according to claim 1,
wherein the strip-shaped first area of the first device is continuous within a length of the channel.

8. The thin-film device according to claim 1,
wherein the second thin film does not include the strip-shaped first area.

9. The thin-film device according to claim 1,
wherein the channel of the first device has a channel direction substantially parallel to the longitudinal direction of the strip-shaped first area.

10. The thin-film device according to claim 1,
wherein the channel of the first device has a channel direction crossing the longitudinal direction of the strip-shaped first area.

11. The thin-film device according to claim 1,
wherein pitches between the plurality of strip-shaped first areas are approximately regular.

12. The thin-film device according to claim 11,
wherein the regular pitch between adjacent ones of the strip-shaped first areas is 2.0 μm or shorter.

13. The thin-film device according to claim 1,
wherein the average grain size of the crystal grains included in the strip-shaped first area is 100 nm to 500 nm, inclusive.

14. The thin-film device according to claim 1,
wherein the strip-shaped first area has a Raman shift peak having a full width at half maximum of 4.8 $cm^{-1}$ to 5.5 $cm^{-1}$, inclusive, in a Raman scattering spectrum measured using Raman spectroscopy.

15. The thin-film device according to claim 1,
wherein the substrate has a plurality of pixels in a matrix,
the first device and the second device are included in each of the pixels,
the first device is a driver transistor that drives the pixel, and
the second device is a switching transistor that selectively switches pixels to be driven among the pixels arranged in the matrix.

16. A thin-film device array comprising the thin-film device according to claim 1, the thin-film device array including a plurality of the thin-film devices formed above the substrate.

17. The thin-film device array according to claim 16,
wherein the first thin film is located in a peripheral area above the substrate, and
the second thin film is located in an inner area surrounded by the peripheral area above the substrate.

* * * * *